US011482549B2

(12) United States Patent
Yanagita et al.

(10) Patent No.: US 11,482,549 B2
(45) Date of Patent: Oct. 25, 2022

(54) SOLID-STATE IMAGING DEVICE

(71) Applicant: Sony Semiconductor Solutions Corporation, Kanagawa (JP)

(72) Inventors: Takeshi Yanagita, Tokyo (JP); Tomohiko Asatsuma, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 266 days.

(21) Appl. No.: 16/610,288

(22) PCT Filed: Apr. 6, 2018

(86) PCT No.: PCT/JP2018/014750
§ 371 (c)(1),
(2) Date: Nov. 1, 2019

(87) PCT Pub. No.: WO2018/225367
PCT Pub. Date: Dec. 13, 2018

(65) Prior Publication Data

US 2021/0366961 A1 Nov. 25, 2021

(30) Foreign Application Priority Data

Jun. 9, 2017 (JP) ................................ 2017-114068

(51) Int. Cl.
*H01L 27/146* (2006.01)
*G02B 5/30* (2006.01)

(52) U.S. Cl.
CPC ...... *H01L 27/14612* (2013.01); *G02B 5/3058* (2013.01); *H01L 27/14621* (2013.01);
(Continued)

(58) Field of Classification Search
CPC ......... H01L 27/14612; H01L 27/14621; H01L 27/14623; H01L 27/14627; H01L 27/14643; G02B 5/3058
See application file for complete search history.

(56) References Cited

U.S. PATENT DOCUMENTS

2004/0238908 A1* 12/2004 Hashimoto ....... H01L 27/14643 257/432
2006/0151773 A1* 7/2006 Kai ...................... H01L 27/148 257/9
(Continued)

FOREIGN PATENT DOCUMENTS

JP 2003-338613 A 11/2003
JP 2012-023251 A 2/2012
(Continued)

*Primary Examiner* — Thanh Luu
*Assistant Examiner* — Monica T Taba
(74) *Attorney, Agent, or Firm* — Michael Best & Friedrich LLP

(57) ABSTRACT

A solid-state imaging device includes an imaging element group in which imaging elements each having a photoelectric conversion portion 10 formed on or above a semiconductor substrate 70 and further having a wire grid polarizer 91 and an on-chip microlens 15 are arrayed in a two-dimensional matrix, and a first interlayer insulating layer 83 and a second interlayer insulating layer 84 provided on a light incident side of the photoelectric conversion portions 10. The wire grid polarizer 91 is provided between the first interlayer insulating layer 83 and the second interlayer insulating layer 84, and the on-chip microlens 15 is provided on the second interlayer insulating layer 84. The first interlayer insulating layer 83 and the second interlayer insulating layer 84 include an oxide material or a resin material, and the on-chip microlens includes SiN or SiON.

7 Claims, 127 Drawing Sheets

(52) U.S. Cl.
CPC .. *H01L 27/14623* (2013.01); *H01L 27/14627* (2013.01); *H01L 27/14643* (2013.01)

(56) References Cited

U.S. PATENT DOCUMENTS

| | | | | |
|---|---|---|---|---|
| 2010/0282945 | A1* | 11/2010 | Yokogawa | H04N 5/335 250/208.1 |
| 2012/0319222 | A1* | 12/2012 | Ozawa | H01L 27/14605 257/432 |
| 2014/0092227 | A1* | 4/2014 | Kanamori | G01J 4/04 348/68 |
| 2014/0367668 | A1* | 12/2014 | Fujii | H01L 27/14636 257/40 |
| 2016/0254303 | A1* | 9/2016 | Takimoto | G01J 3/0259 257/432 |

FOREIGN PATENT DOCUMENTS

| | | | | |
|---|---|---|---|---|
| JP | 2012-080065 | A | | 4/2012 |
| JP | 2016-072266 | A | | 5/2016 |
| JP | 2016-164956 | A | | 9/2016 |
| JP | 2016164956 | A | * | 9/2016 |
| JP | 2017-076684 | A | | 4/2017 |
| WO | 2014/148276 | A1 | | 9/2014 |

* cited by examiner

SOLID-STATE IMAGING DEVICE

TECHNICAL FIELD

The present disclosure relates to a solid-state imaging device, and more particularly relates to a solid-state imaging device that includes a wire grid polarizer.

BACKGROUND ART

A solid-state imaging device that includes a plurality of imaging elements (photoelectric conversion elements) in which a wire grid polarizer (WGP) is provided is known, for example, from Japanese Patent Laid-Open No. 2016-164956. The imaging element includes, for example, a CCD element (Charge Coupled Device) or a CMOS (Complementary Metal Oxide Semiconductor) image sensor. The wire grid polarizer has a line-and-space structure. The direction in which the line-and-space structure extends is referred to as to "first direction" for the convenience of description, and the repetition direction of line portions (direction orthogonal to the first direction) is referred to as "second direction" for the convenience of description.

As depicted in a conceptual diagram of FIG. 127, in the case where the formation pitch $P_0$ of wire grids is significantly smaller than the wavelength $\lambda_0$ of incident electromagnetic waves, electromagnetic waves that oscillate in a plane parallel to the extension direction of the wire grids (first direction) are selectively reflected or absorbed by the wire grids. Here, the distance between a line portion and another line portion (distance or length of a space portion along the second direction) is the formation pitch $P_0$ of the wire grids. Thus, although an electromagnetic wave (light) arriving at the wire grid polarizer includes a vertically polarized light component and a horizontally polarized light component as depicted in FIG. 127, the electromagnetic wave having passed through the wire grid polarizer is linearly polarized light in which the vertically polarized light component is dominant. Then, considering with attention paid to the visible light wavelength band, in the case where the formation pitch $P_0$ of the wire grids is significantly smaller than the effective wavelength $\lambda_{eff}$ of the electromagnetic wave incident to the wire grid polarizer, the polarized light component polarized to a plane parallel to the first direction is reflected or absorbed by the surface of the wire grids. On the other hand, if an electromagnetic wave having a polarized light component polarized to a plane parallel to the second direction is incident to the wire grid, then an electric field propagating along the surface of the wire grid penetrates the wire grid and goes out (is emitted) from the rear face of the wire grid while keeping a wavelength same as the incident wavelength and a same polarization direction. It is to be noted that, when the average refractive index determined on the basis of a material existing at the space portions is represented by $n_{ave}$, the effective wavelength $\lambda_{eff}$ is represented by $(\lambda_0/n_{ave})$. The average refractive index $n_{ave}$ is a value obtained by adding the products of the refractive index and the volume of materials existing at the space portions and dividing the sum by the volume of the space portions. In the case where the value of the wavelength $\lambda_0$ is fixed, as the value of $n_{ave}$ decreases, the value of the effective wavelength $\lambda_{eff}$ increases, and accordingly, the value of the formation pitch $P_0$ can be increased. Further, as the value of $n_{ave}$ increases, this leads to decrease of the transmittance and decrease of the extinction ratio of the wire grid polarizer.

The wire grid polarizer includes a metal layer of, for example, aluminum. Accordingly, in order to prevent the wire grid polarizer from suffering from corrosion, it is necessary to form a protective film (passivation film) including SiN on or above the wire grid polarizer (for example, refer to Japanese Patent Laid-Open No. 2012-080065).

CITATION LIST

Patent Literature

[PTL 1]
Japanese Patent Laid-Open No. 2016-164956
[PTL 2]
Japanese Patent Laid-Open No. 2012-080065

SUMMARY

Technical Problem

However, in the case where a protective film is formed as disclosed in Japanese Patent Laid-Open No. 2012-080065, depending upon the configuration or structure of the imaging element, there is the possibility that it may become difficult to make the thickness of a portion positioned above thinner.

Accordingly, the object of the present disclosure resides in provision of a solid-state imaging device that includes an imaging element that is configured or structured such that the thickness of a portion positioned above can be made further thinner.

Solution to Problem

Solid-state imaging devices according to a first aspect and a second aspect of the present disclosure for achieving the object described above include:

an imaging element group in which imaging elements each having a photoelectric conversion portion formed on or above a semiconductor substrate and further having a wire grid polarizer and an on-chip microlens are arrayed in a two-dimensional matrix; and a first interlayer insulating layer and a second interlayer insulating layer provided on a light incident side of the photoelectric conversion portion, in which the wire grid polarizer is provided between the first interlayer insulating layer and the second interlayer insulating layer, and the on-chip microlens is provided on the second interlayer insulating layer.

Further, in the solid-state imaging device according to the first aspect of the present disclosure, the first interlayer insulating layer and the second interlayer insulating layer include an oxide material or a resin material, and the on-chip microlens includes silicon nitride (SiN) or silicon oxynitride (SiON).

Meanwhile, in the solid-state imaging device according to the second aspect of the present disclosure, where the refractive index of a material configuring the first interlayer insulating layer is $n_1$, the refractive index of a material configuring the second interlayer insulating layer is $n_2$, and the refractive index of a material configuring the on-chip microlens is $n_0$, $$n_0-n_1 \geq 0 \text{ and}$$

$$n_0-n_2 \geq 0$$

are satisfied.

Advantageous Effect of Invention

If a metal material or an alloy material (hereinafter referred to sometimes as "metal material or the like") configuring a wire grid polarizer contacts with outside air, then there is the possibility that the corrosion resistance of the metal material or the like may be deteriorated by adhesion of moisture from the outside air or organic matter and the long-term reliability of the imaging element may be deteriorated. Especially, if moisture adheres to a line portion (hereinafter described) of a metal material or the like—insulating material—metal material or the like, then since $CO_2$ or $O_2$ dissolves in the moisture, there is the possibility that the moisture may act as electrolyte and a local battery may be formed between the two different metals. Then, if such a phenomenon as just described occurs, then since a reduction reaction such as hydrogen generation proceeds on the cathode (positive electrode) side while an oxidation reaction proceeds on the anode (negative electrode) side, abnormal precipitation of the metal material or the like or shape change of the wire grid polarizer occurs, resulting in the possibility that an originally expected performance of the wire grid polarizer or the imaging element may be impaired. For example, in the case where aluminum (Al) is used for a light reflection layer, there is the possibility that such abnormal precipitation of aluminum as indicated by a reaction formula given below may occur. However, by defining the materials for configuring the first interlayer insulating layer, the second interlayer insulating layer, and the on-chip microlens, especially the material configuring the on-chip microlens, or by defining the refractive index difference, occurrence of such a problem as described above can be avoided with certainty and besides the thickness of the portion of the imaging element positioned above the photoelectric conversion portion can be made further thinner. Then, as a result of that the thickness of the portion of the imaging element positioned above the photoelectric conversion portion can be made further thinner, reduction of optical crosstalk, suppression of the extinction ratio deterioration or the sensitivity deterioration, and prevention of occurrence of ripples can be achieved efficiently. It is to be noted that the effects described in the present specification are exemplary to the last and are not restrictive, and additional effects may be provided.

$$Al \rightarrow Al^{3+} + 3e^-$$

$$Al^{3+} + 3OH^- \rightarrow Al(OH)_3$$

BRIEF DESCRIPTION OF DRAWINGS

FIG. 120 is a view depicting an example of a schematic configuration of an endoscopic surgery system.

FIG. 121 is a block diagram depicting an example of a functional configuration of a camera head and a camera control unit (CCU).

FIG. 122 is a block diagram depicting an example of a schematic configuration of an in-vivo information acquisition system.

FIGS. 123A, 123B, 123C, and 123D are schematic partial end views of a first interlayer insulating layer and so forth illustrating a fabrication method of a wire grid polarizer in the imaging element configuring the solid-state imaging device of the working example 1.

Figure 124:
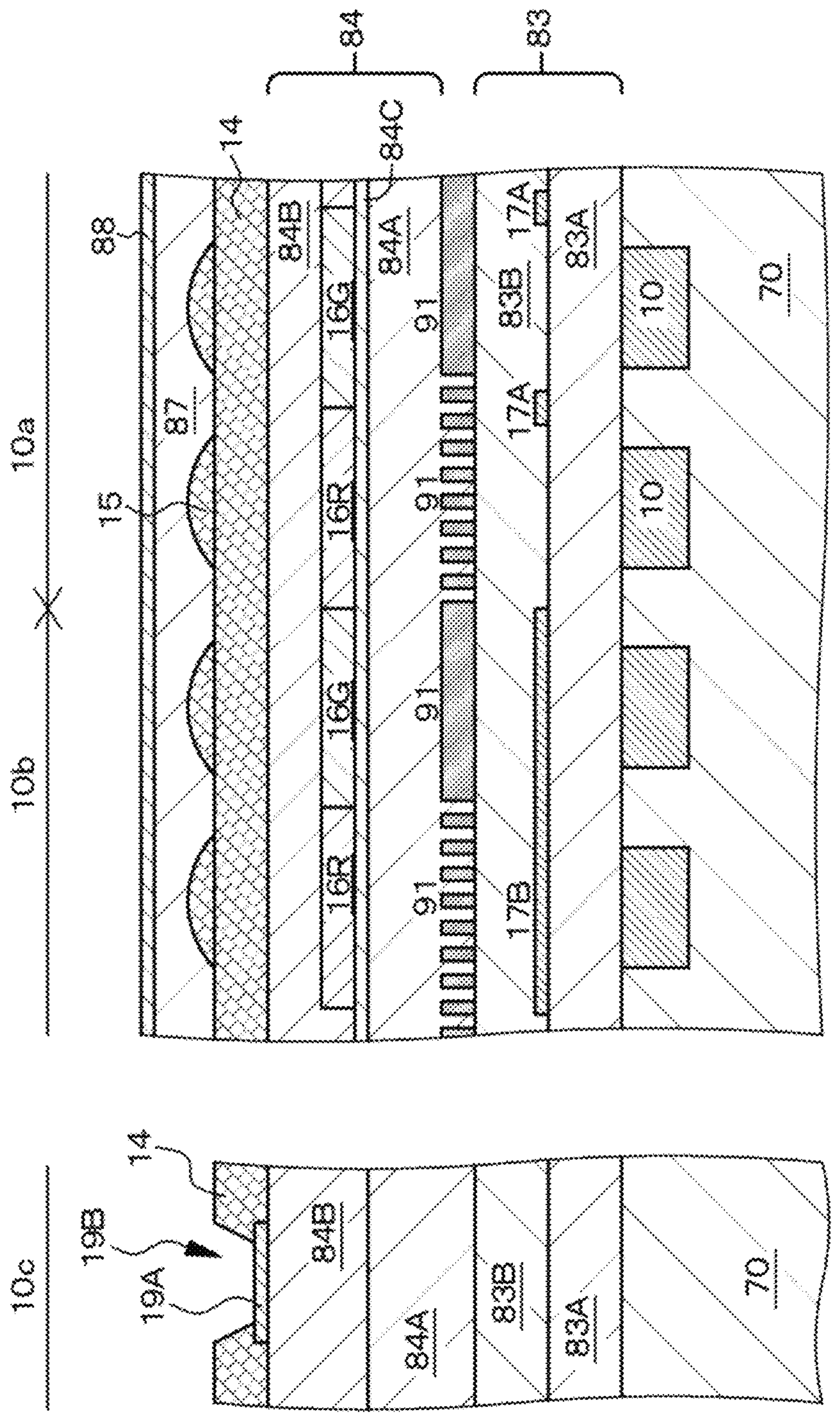

FIG. 124 is a schematic partial sectional view of an effective pixel region, an optical black pixel region, and a peripheral region in the solid-state imaging device of the working example 1.

Figure 125:
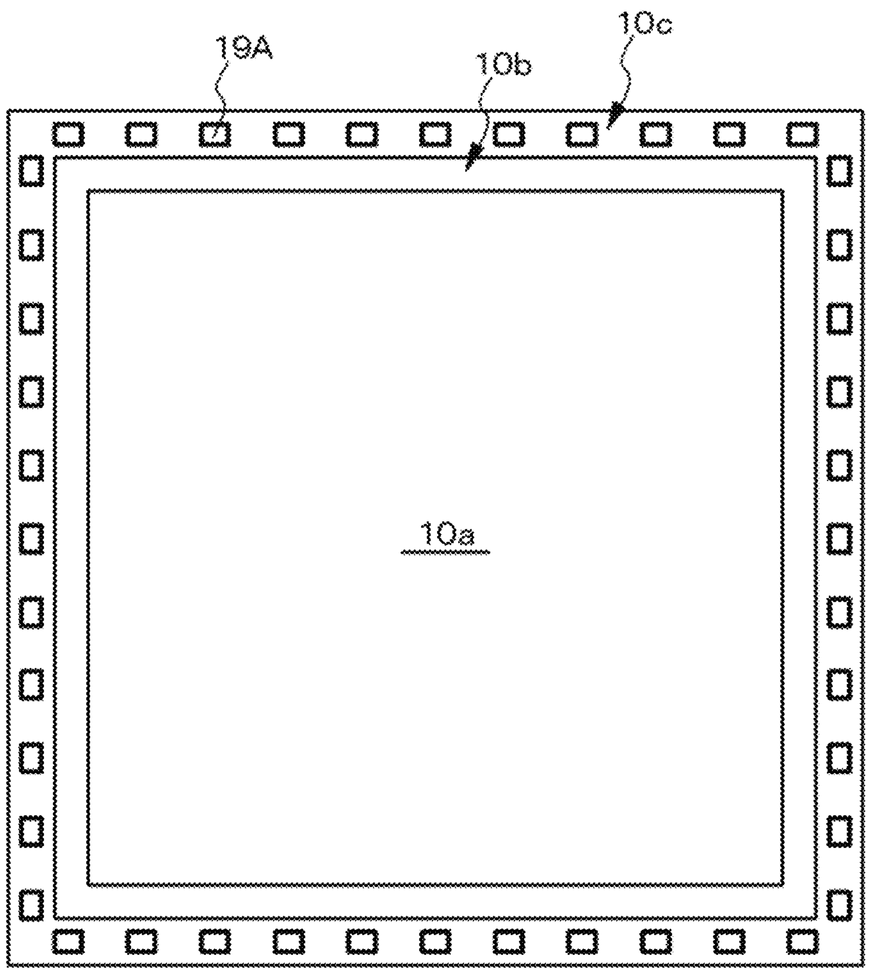

FIG. 125 is a view schematically depicting disposition of the effective pixel region, the optical black pixel region, and the peripheral region in the solid-state imaging device of the working example 1.

Figure 126:
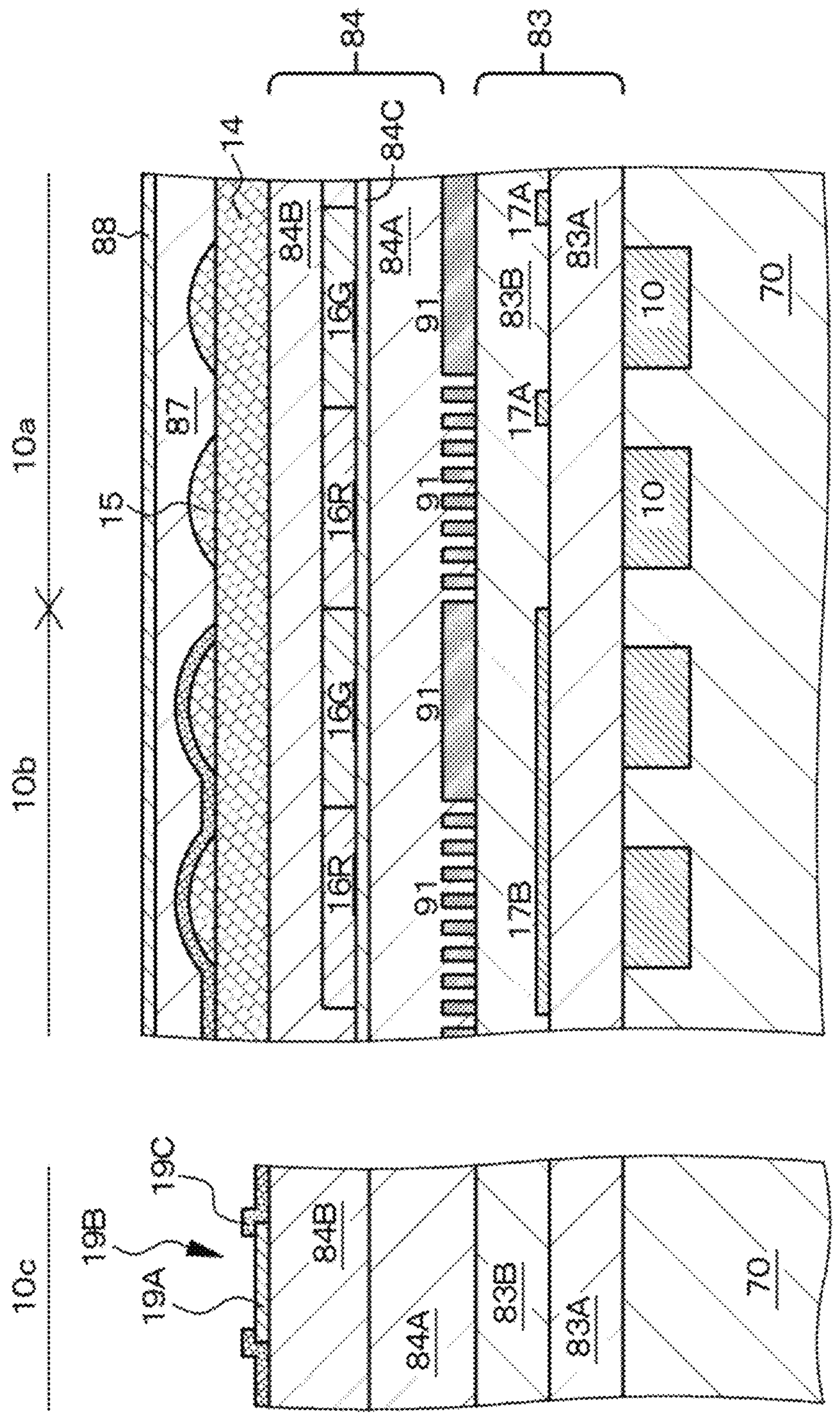

FIG. 126 is a schematic partial sectional view of the effective pixel region, the optical black pixel region, 0 and the peripheral region in a modification of the solid-state imaging device of the working example 1.

Figure 127:
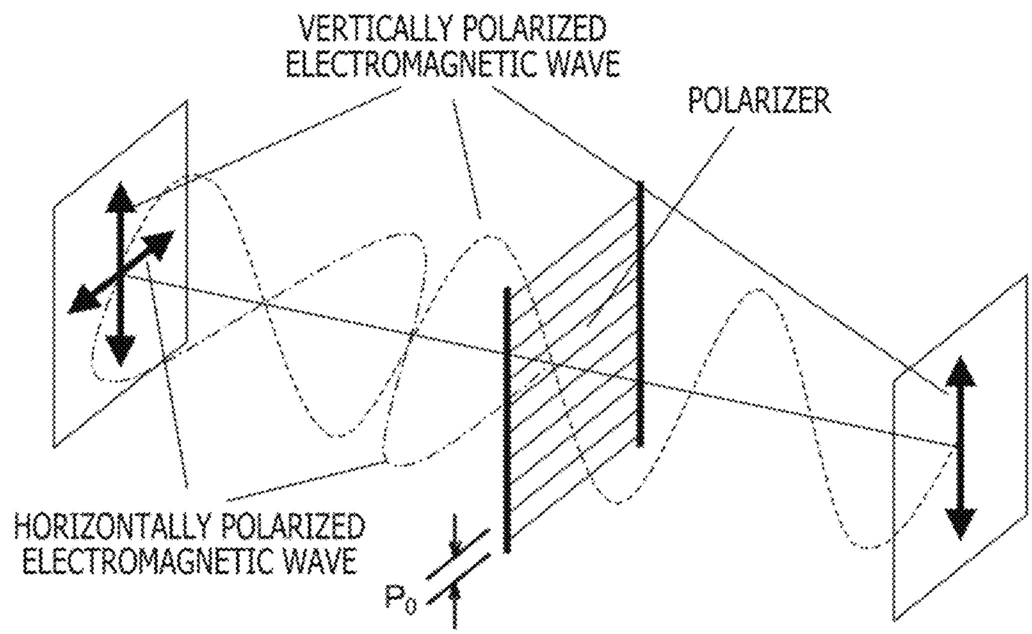

FIG. 127 is a conceptual diagram illustrating light passing through a wire grid polarizer and so forth.

Figure 128:
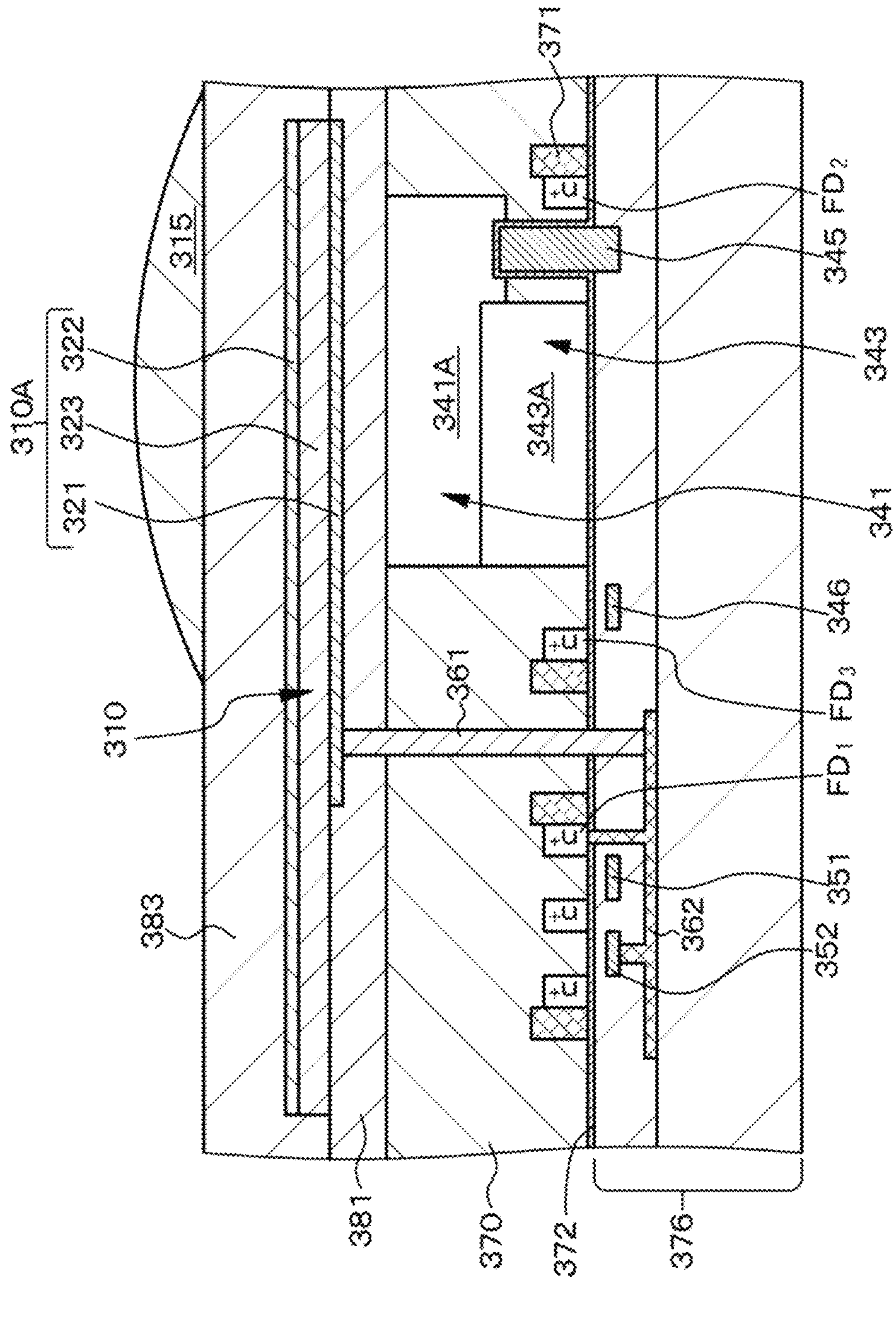

FIG. 128 is a conceptual diagram of a conventional stacked-type imaging element (stacked-type solid-state imaging device).

DESCRIPTION OF EMBODIMENTS

Although the present disclosure is described below on the basis of working examples with reference to the drawings, the present disclosure is not restricted to the working examples, and various numerical values and materials in the working examples are exemplary. It is to be noted that the description is given in the following order.

1. Description of solid-state imaging device and general matters relating to first to second aspects of present disclosure
2. Working example 1 (solid-state imaging devices of first to second aspects of present disclosure)

3. Working example 2 (modification of working example 1)
4. Working example 3 (another modification of working example 1)
5. Working example 4 (further modification of working example 1)
6. Working example 5 (modification of working examples 1 to 4)
7. Working example 6 (modification of solid-state imaging device of working example 5)
8. Working example 7 (modification of working examples 5 to 6)
9. Working example 8 (modification of working example 7)
10. Working example 9 (modification of working examples 7 to 8)
11. Working example 10 (modification of working examples 7 to 9, imaging element including transfer controlling electrode)
12. Working example 11 (modification of working examples 7 to 10, imaging element including discharging electrode)
13. Working example 12 (modification of working examples 7 to 11, imaging element including plural charge accumulation electrode segments)
14. Working example 13 (imaging element of first configuration and imaging element of sixth configuration)
15. Working example 14 (imaging element of second configuration and imaging element of sixth configuration)
16. Working example 15 (imaging element of third configuration)
17. Working example 16 (imaging element of fourth configuration)
18. Working example 17 (imaging element of fifth configuration)
19. Working example 18 (imaging element of sixth configuration)
20. Working example 19 (solid-state imaging devices of first to second configurations)
21. Working example 20 (modification of working example 19)
22. Working example 21 (application example to mobile body)
23. Working example 22 (application example to mobile body)
24. Working example 23 (application example to in-vivo information acquisition system)
25. Others <Description of Solid-State Imaging Device and General Matters Relating to First to Second Aspects of Present Disclosure>

A solid-state imaging device according to a first aspect or a second aspect of the present disclosure can be formed such that a first interlayer insulating layer is structured such that a first interlayer insulating layer-lower layer and a first interlayer insulating layer-upper layer are stacked, a light shielding portion is provided at a location between the first interlayer insulating layer-lower layer and the first interlayer insulating layer-upper layer positioned above a region between adjacent imaging elements, a second interlayer insulating layer is structured such that a second interlayer insulating layer-lower layer and a second interlayer insulating layer-upper layer are stacked, and a color filter layer is provided at a location between the second interlayer insulating layer-lower layer and the second interlayer insulating layer-upper layer positioned above each photoelectric conversion portion. By providing the light shielding portion in this manner, reduction of optical cross-talk can be achieved. This applies similarly also in the following description.

Alternatively, the solid-state imaging device according to the first aspect or the second aspect of the present disclosure can be formed such that a first interlayer insulating layer is structured such that a first interlayer insulating layer-lower layer, a first interlayer insulating layer-intermediate layer, and a first interlayer insulating layer-upper layer are stacked, a light shielding portion is provided at a location between the first interlayer insulating layer-lower layer and the first interlayer insulating layer-intermediate layer positioned above a region between adjacent imaging elements, and a color filter layer is provided at a location between the first interlayer insulating layer-intermediate layer and the first interlayer insulating layer-upper layer positioned above each photoelectric conversion portion.

Alternatively, the solid-state imaging device according to the first aspect or the second aspect of the present disclosure can be formed such that, at a location between a wire grid polarizer and another wire grid polarizer positioned above a region between adjacent imaging elements, a light shielding portion extending from the wire grid polarizer is provided, a second interlayer insulating layer is structured such that a second interlayer insulating layer-lower layer and a second interlayer insulating layer-upper layer are stacked, and a color filter layer is provided at a location between the second interlayer insulating layer-lower layer and the second interlayer insulating layer-upper layer positioned above each photoelectric conversion portion.

Alternatively, the solid-state imaging device according to the first aspect or the second aspect of the present disclosure can be formed such that a first interlayer insulating layer is structured such that a first interlayer insulating layer-lower layer and a first interlayer insulating layer-upper layer are stacked, a color filter layer is provided at a location between the first interlayer insulating layer-lower layer and the first interlayer insulating layer-upper layer positioned above each photoelectric conversion portion, and, at a location between a wire grid polarizer and another wire grid polarizer positioned above a region between adjacent imaging elements, a light shielding portion extending from the wire grid polarizer is provided.

As the value of the refractive index $n_1$ of a material configuring the first interlayer insulating layer, $$1.2 \leq n_1 \leq 2.5$$

can be exemplified, and as the value of the refractive index $n_2$ of a material configuring the second interlayer insulating layer, $$1.2 \leq n_1 \leq 2.5$$

can be exemplified, and besides, as the refractive index $n_0$ of a material configuring an on-chip microlens, $$1.4 \leq n_0 \leq 2.5$$

can be exemplified. As oxide materials configuring the first interlayer insulating layer and the second interlayer insulating layer, insulating materials such as $SiO_2$, SiON, SiN, SiC, SiOC, and SiCN and metal oxides such as aluminum oxide ($AlO_x$), hafnium oxide ($HfO_x$), zirconium oxide ($ZrO_x$), and tantalum oxide ($TaO_x$) can be exemplified, and as resin materials configuring the first interlayer insulating layer and the second interlayer insulating layer, polymethylmethacrylate (PMMA); polyvinylphenol (PVP), polyvinyl alcohol (PVA); polyimide; polycarbonate (PC), polyethylene terephthalate (PET); polystyrene; silanol derivatives (silane coupling agents) such as N-2 (aminoethyl) 3-aminopropyltrimethoxysilane (AEAPTMS), 3-mercaptopropyltrimethoxysilane (MPTMS), and octadecyltrichlorosilane (OTS); novolac phenolic resins; fluorine resins; and organic insulating materials (organic polymers) exemplified by linear hydrocarbons having, at one end thereof, a functional group that can be coupled to a control electrode such as octadecanethiol or dodecyl isocyanate can be exemplified. Further, as a material for configuring the light shielding portion, chromium (Cr), copper (Cu), aluminum (Al), tungsten (W), an amorphous silicon film, a polysilicon film, a germanium (Ge) film, a gallium nitride (GaN) film, a cadmium-tellurium (CdTe) film, a gallium-arsenic (GaAs) film, an indium-phosphorus (InP) film, a carbon film of a non-conductor structure, a resin impermeable to light (for example, a polyimide resin or black resist material), and an organic photoelectric conversion film can be exemplified. Further, the light shielding portion extending from a wire grid polarizer can be configured such that it has a structure same as that of a line portion configuring the wire grid polarizer as hereinafter described and can be configured such that it has a structure same as that of a frame portion as hereinafter described.

The wire grid polarizer can be made common to a plurality of imaging elements. In particular, the wire grid polarizer can be formed such that it is common to all of the imaging elements configuring the solid-state imaging device and also can be formed such that, where the imaging elements configuring the solid-state imaging device are divided such that they belong to a plurality of blocks, the wire grid polarizer is common in each block.

The solid-state imaging device can be formed such that, although it has an effective pixel region in which an imaging element group is provided and a peripheral region positioned on the outer side of the effective pixel region, on-chip microlenses are formed over the peripheral region from above the effective pixel region.

A waveguide structure may be provided between an imaging element and another imaging element in the imaging element group or a condenser tube structure may be provided, by which reduction of optical crosstalk can be achieved. Here, the waveguide structure includes a thin film that is formed in a region (for example, a tubular region), which is positioned between an imaging element and another imaging element, of the interlayer insulating layer that covers the imaging elements and has a refractive index of a value smaller than the value of the refractive index of the material that configures the interlayer insulating layer, and light incident from above the imaging elements is totally reflected by the thin film and then reaches the imaging elements. In particular, an orthographic projection image of an imaging element to the substrate is positioned on the inner side of an orthographic projection image of the thin film configuring the waveguide structure to the substrate, and the orthographic projection image of the imaging element to the substrate is surrounded by the orthographic projection image of the thin film configuring the waveguide structure to the substrate. Further, the condenser tube structure includes a light shielding thin film including a metal material or an alloy material and formed in a region (for example, a tubular region), which is positioned between an imaging element and another imaging element, of the interlayer insulating layer that covers the imaging elements, and light incident from above the imaging elements is reflected by the thin film and reaches the imaging elements. In particular, an orthographic projection image of the imaging elements to the substrate is positioned on the inner side of the orthographic projection image of the thin film configuring the condenser tube structure to the substrate, and the orthographic projection image of the imaging elements to the substrate is surrounded by the orthographic projection image of the thin film configuring the condenser tube structure to the substrate.

As the color filter layer (wavelength selection means), a filter layer can be exemplified which transmits specific wavelengths such as red, green, and blue wavelengths as well as, as occasion demands, cyan, magenta, yellow, or/and like wavelengths. The color filter layer not only can include a color filter layer of an organic material using an organic compound such as pigment or dye but also can include a thin film including an inorganic material such as a wavelength selection element to which photonic crystal or plasmon is applied (a color filter layer having a conductor lattice structure, in which a lattice-like hole structure is provided in a conductor thin film. For example, refer to Japanese Patent Laid-Open No. 2008-177191), amorphous silicon, or the like.

Although, in the solid-state imaging device of the first aspect or the second aspect of the present disclosure including the preferred forms described above (which are sometimes referred to collectively simply as "solid-state imaging device and so forth of the present disclosure"), a plurality of imaging elements is arrayed in a two-dimensional matrix, and one of the array directions of the imaging elements is referred to as "$x_0$ direction" and the other array direction is referred to as "$y_0$ direction" for the convenience of description. Preferably, the $x_0$ direction and the $y_0$ direction are orthogonal to each other. The $x_0$ direction is a so-called row direction or a so-called column direction, and the $y_0$ direction is a so-called column direction or a so-called row direction.

In the solid-state imaging device and so forth of the present disclosure, the wire grid polarizer has a line-and-space structure. In particular, the wire grid polarizer can be formed such that a plurality of stack structures of at least a belt-shaped light reflection layer and a belt-shaped light absorption layer (the light absorption layer is positioned on the light incident side) is juxtaposed in a spaced relation from each other. Alternatively, the wire grid polarizer can be formed such that a plurality of stack structures of a light reflection layer, an insulating film, and a light absorption layer of a belt-like shape (the light absorption layer is positioned on the light incident side) is juxtaposed in a spaced relation from each other. In this case, the wire grid polarizer can be configured such that the light reflection layer and the light absorption layer in the stack structure are spaced from each other by the insulating film (namely, configured such that the insulating film is formed over the overall top face of the light reflection layer and the light absorption layer is formed over the overall top face of the insulating film) or can be configured such that part of the insulating film is cut away and the light reflection layer and the light absorption layer contact with each other at the cutaway portion of the insulating film.

In this manner, the line portion of the wire grid polarizer can include a stack structure in which a light reflection layer including a first conductive material, an insulating film, and a light absorption layer including a second conductive material are stacked from the opposite side to the light incident side. Then, by configuring the wire grid polarizer in this manner, the overall region of the light absorption layer and the light reflection layer can be held at a predetermined potential, and as a result, occurrence of discharge can be prevented with certainty. Alternatively, the wire grid polarizer can be configured such that the insulating film is omitted and the light absorption layer and the light reflection layer are stacked from the light incident side. Here, the wire grid polarizer including such a stack structure as just described can be fabricated on the basis of steps of:

(A) providing, for example, after a photoelectric conversion portion is formed, above the photoelectric conversion portion, a light reflection layer formation layer including a first conductive material and electrically connected to a substrate or the photoelectric conversion portion;

(B) providing an insulating film formation layer on the light reflection layer formation layer and providing, on the insulating film formation layer, a light absorption layer formation layer including a second conductive material and contacting at least at part thereof with the light reflection layer formation layer; and (C) patterning the light absorption layer formation layer, the insulating film formation layer, and the light reflection layer formation layer to obtain a wire grid polarizer in which a plurality of line portions of a light reflection layer, an insulating film, and a light absorption layer of a belt shape is juxtaposed in a spaced relation from each other.

It is to be noted that the wire grid polarizer can be formed such that, at the step (B), a light absorption layer formation layer including the second conductive material is provided in a state in which the light reflection layer formation layer is set to a predetermined potential through the substrate or the photoelectric conversion portion; and at the step (C), the light absorption layer formation layer, the insulating film formation layer, and the light reflection layer formation layer are patterned in a state in which the light reflection layer formation layer is set to a predetermined potential through the substrate or the photoelectric conversion portion.

The underlayer for the light reflection layer can be configured such that Ti, TiN, or a stack structure of Ti/TiN is formed, and this can improve the light reflection layer formation layer or the light reflection layer against roughness.

The light reflection layer (or the light reflection layer formation layer) can be configured such that it includes a metal material, an alloy material, or a semiconductor material, and the light absorption layer can be configured such that it includes a metal material, an alloy material, or a semiconductor material. In particular, as an inorganic material for configuring the light reflection layer (light reflection layer formation layer), metal materials such as aluminum (Al), silver (Ag), gold (Au), copper (Cu), platinum (Pt), molybdenum (Mo), chromium (Cr), titanium (Ti), nickel (Ni), tungsten (W), iron (Fe), silicon (Si), germanium (Ge), and tellurium (Te), alloy materials containing such metals, and semiconductor materials can be exemplified.

As a material for configuring the light absorption layer (or the light absorption layer formation layer), metal materials, alloy materials, and semiconductor materials that have an extinction coefficient k that is not zero, namely, have a light absorption property, particularly, metal materials such as aluminum (Al), silver (Ag), gold (Au), copper (Cu), molybdenum (Mo), chromium (Cr), titanium (Ti), nickel (Ni), tungsten (W), iron (Fe), silicon (Si), germanium (Ge), tellurium (Te), and tin (Sn), alloy materials containing such metals, and semiconductor materials can be exemplified. Also silicide materials such as $FeSi_2$ (especially $\beta$-$FeSi_2$), $MgSi_2$, $NiSi_2$, $BaSi_2$, $CrSi_2$, and $CoSi_2$ can be exemplified. Especially, by using aluminum or an aluminum alloy, $\beta$-$FeSi_2$, or a semiconductor material containing germanium or tellurium as the material for configuring the light absorption layer (light absorption layer formation layer), a high contrast (high extinction ratio) can be obtained in the visible light region. It is to be noted that, in order to achieve a polarization characteristic in a wavelength region other than the visible light region, for example, in the infrared region, it is preferable to use silver (Ag), copper (Cu), gold (Au), or the like as the material for configuring the light absorption layer (light absorption layer formation layer). This is because the metals have a resonance wavelength in the proximity of the infrared region.

The light reflection layer formation layer and the light absorption layer formation layer can be formed based on a known method such as various chemical vapor deposition methods (CVD methods), various physical vapor deposition methods (PVD methods) including an application method, a sputtering method, and a vacuum deposition method, a sol-gel method, a plating method, an MOCVD method, and an MBE method. Further, as the patterning method of the light reflection layer formation layer and the light absorption layer formation layer, combinations of a lithography technology and an etching technology (for example, an anisotropic dry etching technology using tetrafluoromethane gas, sulfur hexafluoride gas, trifluoromethane gas, or xenon difluoride gas or a physical etching technology), a so-called liftoff technology, and a so-called self-aligned double patterning technology in which a side wall is used as a mask can be exemplified. As the lithography technology, a photolithography technology (a lithography technology that uses the g line of a high pressure mercury lamp, the i line, a KrF excimer laser, an ArF excimer laser, an EUV, or the like as a light source, and an immersion lithography technology, an electron beam lithography technology, or an X-ray lithography of them) can be exemplified. Alternatively, also it is possible to form the light reflection layer or the light absorption layer on the basis of a miniaturization technology by an ultra-short pulse laser such as a femtosecond laser or a nanoimprint method.

As a material for configuring the insulating film (or the insulating film formation layer), insulating materials that are transparent to incident light and do not have a light absorption characteristic, in particular, $SiO_x$-based materials (materials configuring a silicon-based oxide film) such as silicon oxide ($SiO_2$), NSG (non-doped silicate glass), BPSG (boron-phosphorus-silicate glass), PSG, BSG, PbSG, AsSG, SbSG, and SOG (spin on glass), SiN, silicon oxynitride (SiON), SiOC, SiOF, SiCN, a low-dielectric constant insulating material (for example, fluorocarbon, cycloperfluorocarbon polymer, benzocyclobutene, cyclic fluoropolymer, polytetrafluoroethylene, amorphous tetrafluoroethylene, polyaryl ether, fluorinated aryl ether, fluorinated polyimide, organic SOG, parylene, fullerene fluoride, amorphous carbon), polyimide-based resin, fluorine resin, Silk (trademark of The Dow Chemical Co., application type low-dielectric constant interlayer insulating film material), Flare (trademark of Honeywell Electronic Materials Co., polyallyl ether (PAE)-based material) can be exemplified, and they can be used singly or in a suitable combination. Alternatively, polymethyl methacrylate (PMMA); polyvinylphenol (PVP); polyvinyl alcohol (PVA); polyimide; polycarbonate (PC); polyethylene terephthalate (PET); polystyrene; silanol derivatives (silane coupling agents) such as N-2 (aminoethyl) 3-aminopropyltrimethoxysilane (AEAPTMS), 3-mercaptopropyltrimethoxysilane (MPTMS), and octadecyltrichlorosilane (OTS); novolac phenolic resins; fluorine resins; and organic insulating materials (organic polymers) exemplified by linear hydrocarbons having, at one end thereof, a functional group that can be coupled to a control electrode such as octadecanethiol or dodecyl isocyanate can be exemplified, and also it is possible to use combinations of them. The insulating film formation layer can be formed based on a known method such as various CVD methods, various PVD methods including an application method, a sputtering method, and a vacuum deposition method, various printing methods such as a screen printing method, and a sol-gel method. The insulating film functions as an underlayer of the light absorption layer and is formed in order to adjust the phase of polarized light reflected by the light absorption layer and polarized light transmitted through the light absorption layer and reflected by the light reflection layer to improve the extinction ratio and the transmittance by an interference effect and reduce the reflectivity. Accordingly, the insulating film preferably has such a thickness that the phase in one round trip is displaced by one half wavelength, and by this configuration, one of the polarized waves reflected, which is by the light absorption layer (for example, the TE wave), is cancelled and attenuated by interference with one of the polarized waves reflected by the light reflection layer (for example, the TE wave). In this manner, one of the polarized waves (for example, the TE wave) can be attenuated selectively. However, the light absorption layer absorbs the reflected light because it has a light absorption effects. Accordingly, even if the thickness of the insulating film is not optimized as described above, improvement in extinction ratio or contrast can be implemented. Therefore, in practical use, it is sufficient if the thickness of the insulating film is determined based on the balance between a desired polarization characteristic and an actual fabrication step, and, for example, $1\times10^{-9}$ to $1\times10^{-7}$ m, more preferably, $1\times10^{-8}$ to $8\times10^{-8}$ m, can be exemplified. Further, the refractive index of the insulating film preferably is greater than 1.0 but equal to smaller than 2.5 although this is not restrictive.

Incidentally, light is incident from the light absorption layer. Thus, the wire grid polarizer utilizes four reactions of transmission, reflection, and interference of light and selective light absorption of a polarized wave by optical anisotropy to attenuate a polarized wave having an electric field component parallel to a first direction (any one of the TE wave/S wave or the TM wave/P wave) and transmit a polarized wave having an electric field component parallel to a second direction (the other of the TE wave/S wave or the TM wave/P wave). In other words, one polarized wave (for example, the TE wave) is attenuated by a selective light absorption action of the polarized wave by optical anisotropy of the light absorption layer. In particular, the belt-shaped light reflection layer functions as a polarizer and reflects the one polarized wave (for example, the TE wave) having transmitted through the light absorption layer and the insulating film. The direction in which the belt-shaped light reflection layer extends (the first direction) coincides with the polarization direction of light to be extinguished, and the repetition direction of the belt-shaped light reflection layers (second direction) coincides with the polarization direction of light to be transmitted. In other words, the light reflection layer has a function as a polarizer and attenuates, from within light incident to the wire grid polarizer, a polarized wave having an electric field component in a direction parallel to the direction in which the light reflection layer extends (any one of the TE wave/S wave or the TM wave/P wave) while transmitting a polarized wave having an electric field component in a direction orthogonal to the direction in which the light reflection layer extends (in the repetition direction of the belt-shaped light reflection layer) (the other of the TE wave/S wave or the TM wave/P wave). The direction in which the light reflection layer extends becomes a light absorption axis of the wire grid polarizer while the direction orthogonal to the direction in which the light reflection layer extends (to the second direction) becomes a light transmission axis of the wire grid polarizer. The wire grid polarizer can be formed such that the second direction is parallel to the $x_0$ direction or the $y_0$ direction.

It is possible to make the length of the line-and-space structure along the first direction equal to the length along the first direction of a region of the imaging element by which photoelectric conversion is substantially performed or equal to the length of the imaging element or else equal to an integer multiple of the length of the imaging element along the first direction.

In the wire grid polarizers including the various preferred forms and configurations described above, the space portion of the wire grid polarizer can be formed so as to be a gap. In particular, the space portion can be formed so as to be filled at least with air. Such a wire grid polarizer as just described is referred to as "wire grid polarizer of the first configuration" for the convenience of description. By forming the space portion of the wire grid polarizer as a gap in this manner, the value of the average refractive index $n_{ave}$ can be made small. As a result, improvement of the transmittance and improvement of the extinction ratio of the wire grid polarizer can be anticipated. Further, since the value of the formation pitch $P_0$ can be made large, improvement of the production yield of wire grid polarizers can be anticipated.

The wire grid polarizer of the first configuration can be formed such that a protective film is formed at least on a side face of a line portion that faces a space portion of the wire grid polarizer. In particular, the space portion is filled with air, and in addition, the protective film exists at the space portion. Here, as the material for configuring the protective film, a material having a refractive index of 2 or less and an extinction coefficient proximate to zero is preferable, and insulating materials such as $SiO_2$ including TEOS-$SiO_2$, SiON, SiN, SiC, SiOC, and SiCN and metal oxides such as aluminum oxide ($AlO_x$), hafnium oxide ($HfO_x$), zirconium oxide ($ZrO_x$), and tantalum oxide ($TaO_x$) can be exemplified. Alternatively, perfluorodecyltrichlorosilane and octadecyltrichlorosilane can be exemplified. Although the protective film can be formed by known processes such as various CVD methods, various PVD methods including an application method, a sputtering method, and a vacuum deposition method, a sol-gel method, and so forth, it is more preferable to adopt a so-called single atom growth method (ALD method, Atomic Layer Deposition method) or an HDP-CVD method (high density plasma chemical vapor deposition). Although, by adopting the ALD method, a thin protective film can be formed conformally on a wire grid polarizer, from the point of view of forming a thinner protective film on a side face of a line portion, it is more preferable to adopt the HDP-CVD method. Alternatively, if the space portion is filled with a material configuring the protective film and besides a gap, a vacancy, a void, or the like is provided in the protective film, then the refractive index of the entire protective film can be decreased.

Further, any of the wire grid polarizers including the various preferred forms and configurations described above can be formed such that a frame portion surrounding the wire grid polarizer is provided, the frame portion and a line portion of the wire grid polarizer are connected to each other, and the frame portion has a structure same as that of the line portion of the wire grid polarizer. Such a wire grid polarizer as just described is referred to as "wire grid polarizer of the second configuration" for the convenience of description. In particular, the frame portion at least includes a light reflection layer and a light absorption layer and can include a so-called solid film structure that is a stack structure including, for example, a light reflection layer, an insulating film, and a light absorption layer and does not include a line-and-space structure. It is to be noted that, although it depends on a function required for a wire grid polarizer extension (namely, in the case where a light shielding function is not required), if the stack structure does not function as a wire grid polarizer, then a line-and-space structure may be provided as in the wire grid polarizer. In other words, the wire grid polarizer may be structured such that the formation pitch $P_0$ of the wire grid is sufficiently greater than the effective wavelength of an incident electromagnetic wave. Although the frame portion is not restricted, it preferably is disposed in a kind of a frame shape such that it surrounds the wire grid polarizer provided correspondingly to the imaging element.

By forming the wire grid polarizer such that the frame portion and the line portion of the wire grid polarizer are connected to each other and the frame portion has a structure same as that of the line portion of the wire grid polarizer in this manner, such a problem that exfoliation occurs at an outer peripheral portion of the wire grid polarizer corresponding to the four corners of the imaging element in the solid-state imaging device of the present disclosure, such a problem that a difference occurs between the structure of an outer peripheral portion of the wire grid polarizer and the structure of a central portion of the wire grid polarizer and the performance of the wire grid polarizer itself is degraded, and such a problem that light incident to the outer peripheral portion of the wire grid polarizer is liable to leak into the adjacent imaging element having a different polarization direction can be eliminated, and a solid-state imaging device having high reliability can be provided. Besides, as described hereinabove, the light shielding portion extending from the wire grid polarizer can include the frame portion.

In some cases, the wire grid polarizer can be formed such that a groove portion (a kind of an element isolation region) is formed, at an edge portion of the imaging element, which extends from one face to the other face of the substrate and further extends to below the wire grid polarizer and in which an insulating material or a light shielding material is filled. As the insulating material, a material that configures the insulating film (insulating film formation layer) or an interlayer insulating layer can be exemplified, and as the light shielding material, a material that configures the light shielding portion can be exemplified. By forming such a groove portion as described above, sensitivity deterioration, occurrence of polarized light crosstalk, and deterioration of the extinction ratio can be prevented.

Any of the wire grid polarizers including the various preferable forms and configurations described above can be configured such that the extension of the light reflection layer is electrically connected to the substrate or the photoelectric conversion portion. By electrically connecting the extension of the light reflection layer to the substrate or the photoelectric conversion portion in this manner, occurrence of such a problem that, upon formation of the wire grid polarizer, the light reflection layer formation layer or the light absorption layer formation layer is charged and a kind of discharge occurs and causes damage to the wire grid polarizer or the photoelectric conversion portion can be avoided with certainty. In some cases, the wire grid polarizer may be configured such that an insulating film is formed over an overall area of the top face of the light reflection layer and a light absorption layer is formed over an overall area of the top face of the insulating film. Also by such configurations, the overall regions of the light absorption layer and the light reflection layer are electrically connected to the substrate or the photoelectric conversion portion, and therefore, occurrence of discharge can be prevented with certainty. Alternatively, in some cases, the wire grid polarizer can be configured such that the insulating film is omitted and the light reflection layer and the light absorption layer are stacked from the opposite side to the light incident side.

The wire grid polarizer can be formed such that the region in which the substrate or the photoelectric conversion portion and the extension of the light reflection layer (or the light reflection layer formation layer) are electrically connected to each other is positioned in the imaging region or is positioned in an optical black pixel region (OPB) provided on the outer periphery of the imaging region or otherwise is positioned in a peripheral region provided on the outer side of the imaging region. It is to be noted that, in the case where the region in which the substrate or the photoelectric conversion portion and the extension of the light reflection layer (or the light reflection layer formation layer) are electrically connected to each other is positioned in the imaging region or is positioned in the optical black pixel region (OPB), the region may be provided in each imaging element, may be provided at one place for a plurality of imaging elements, may be provided at one place for all imaging elements, may be provided at one place or at a plurality of places for one imaging element. Further, in the case where the region is positioned in the peripheral region, it may be provided at one place or may be provided at a plurality of places.

The solid-state imaging device may be formed such that the light shielding portion is formed in the region between an imaging element and another imaging element and the extension of the light reflection layer contacts with the light shielding portion. Here, the length of the extension of the light reflection layer contacting with the light shielding portion can be made equal to the length of the photoelectric conversion region that substantially is a region of the imaging element in which photoelectric conversion is performed (length of a side of the photoelectric conversion region) or can be made a length from one half the length to the full length of the photoelectric conversion region. By adopting such a form as just described, also it is possible to prevent occurrence of color mixture from an adjacent imaging element. Further, the region in which the light reflection layer formation layer and the light absorption layer formation layer contact with each other may be a region between an imaging element and another imaging element at least at one location from among the four corners of the imaging element. The solid-state imaging device can be formed such that the light shielding portion is formed also in the peripheral region and the extension of the light reflection layer contacts with the light shielding portion.

In the peripheral region, formation of the wire grid polarizer is unnecessary. The peripheral region is preferably occupied by a structure same as that of the frame portion. The frame portion or the peripheral region may have a line-and-space pattern provided therein as in the wire grid polarizer if the line-and-space pattern does not function as the wire grid polarizer. In other words, the frame portion or the peripheral region may be structured such that the formation pitch $P_0$ of the wire grid is sufficiently greater than the effective wavelength of an incident electromagnetic wave.

The photoelectric conversion portion to which the extension of the light reflection layer or the light reflection layer formation layer is electrically connected is, for example, the light shielding portion or a wiring (wiring layer). It is sufficient if, at the portion of the substrate to which the extension of the light reflection layer or the light reflection layer formation layer is electrically connected, for example, a high concentration impurity region, a metal layer, an alloy layer, or a wiring layer is formed.

In the solid-state imaging device and so forth of the present disclosure, for example, a combination of an imaging element in which the angle defined by an array direction of a plurality of imaging elements and the first direction is 0 degrees and another imaging element in which the angle is 90 degrees can be used, and also a combination of an imaging element in which the angle is 0 degrees, another imaging element in which the angle is 45 degrees, a further imaging element in which the angle is 90 degrees, and a still further imaging element in which the angle is 135 degrees can be used.

Furthermore, any of the solid-state imaging devices and so forth of the present disclosure including the various preferred forms described above can be formed such that the wire grid polarizer includes four polarizer segments including a first polarizer segment, a second polarizer segment, a third polarizer segment, and a fourth polarizer segment and arrayed in 2×2 (namely, two polarizer segments are arrayed in the $x_0$ direction and two polarizer segments are arrayed in the $y_0$ direction), the polarization direction of light to be transmitted by the first polarizer segment is $\alpha$ degrees, the polarization direction of light to be transmitted by the second polarizer segment is ($\alpha$+45) degrees, the polarization direction of light to be transmitted by the third polarizer segment is ($\alpha$+90) degrees, and the polarization direction of light to be transmitted by the fourth polarizer segment is ($\alpha$+135) degrees. Here, although "0" can be exemplified as the value of $\alpha$, this is not restrictive.

The solid-state imaging devices according to the first to second aspects of the present disclosure can be structured such that photoelectric conversion portions are stacked. It is to be noted that a solid-state imaging device of such a structure as just described is referred to as "stacked-type imaging element."

The imaging element in which an organic semiconductor material is used for the photoelectric conversion layer can photoelectrically convert a specific color (wavelength band). Further, because the imaging element has such a feature as just described, in the case where the imaging element is used as an imaging element in a solid-state imaging device, it is possible to obtain a structure (stacked-type imaging element) in which subpixels each include a combination of an on-chip color filter layer (OCCF) and an imaging element and are arrayed two-dimensionally, which is impossible with a conventional solid-state imaging device, and in which the subpixels are stacked (for example, refer to Japanese Patent Laid-Open No. 2011-138927). Further, since a demosaic process is not required, there is an advantage that a false color does not appear. In the following description, an imaging element that includes a photoelectric conversion portion provided on or above a semiconductor substrate is sometimes referred to as "imaging element of the first type" for the convenience of description, and a photoelectric conversion portion configuring an imaging element of the first type is sometimes referred to as "photoelectric conversion portion of the first type" for the convenience of description. Further, an imaging element provided in a semiconductor substrate is sometimes referred to as "imaging element of the second type" for the convenience of description, and a photoelectric conversion portion configuring an imaging element of the second type is sometimes referred to as "photoelectric conversion portion of the second type" for the convenience of description.

FIG. 128 depicts an example of a configuration of a conventional stacked-type imaging element (stacked-type solid-state imaging device). In the example depicted in FIG. 128, a third photoelectric conversion portion 343A and a second photoelectric conversion portion 341A that are photoelectric conversion portions of the second type configuring a third imaging element 343 and a second imaging element 341 that are imaging elements of the second type, respectively, are stacked and formed in a semiconductor substrate 370. Further, above the semiconductor substrate 370 (particularly, above the second imaging element 341), a first photoelectric conversion portion 310A that is a photoelectric conversion portion of the first type is disposed. Here, the first photoelectric conversion portion 310A includes a first electrode 321, a photoelectric conversion layer 323 including an organic material, and a second electrode 322 and configures a first imaging element 310 that is an imaging element of the first type. In the second photoelectric conversion portion 341A and the third photoelectric conversion portion 343A, for example, blue light and red light are photoelectrically converted, respectively, due to a difference in absorption coefficient. Further, in the first photoelectric conversion portion 310A, for example, green light is photoelectrically converted.

Charge generated by photoelectric conversion in the second photoelectric conversion portion 341A and the third photoelectric conversion portion 343A is accumulated once into the second photoelectric conversion portion 341A and the third photoelectric conversion portion 343A and is transferred to a second floating diffusion layer (Floating Diffusion) $FD_2$ and a third floating diffusion layer $FD_3$ by a vertical transistor (whose gate portion 345 is depicted) and a transfer transistor (whose gate portion 346 is depicted), respectively, and is further outputted to an external reading out circuit (not depicted). Also the transistors and the floating diffusion layers $FD_2$ and $FD_3$ are formed in the semiconductor substrate 370.

Charge generated by photoelectric conversion in the first photoelectric conversion portion 310A is accumulated into a first floating diffusion layer $FD_1$ formed in the semiconductor substrate 370 via a contact hole portion 361 and a wiring layer 362. The first photoelectric conversion portion 310A is connected also to a gate portion 352 of an amplification transistor, which converts a charge amount into a voltage, via the contact hole portion 361 and the wiring layer 362. The first floating diffusion layer $FD_1$ configures part of a reset transistor (whose gate portion 351 is depicted). Reference sign 371 denotes an element isolation region; reference sign 372 denotes an oxide film formed on the surface of the semiconductor substrate 370; reference signs 376 and 381 denote interlayer insulating layers; reference sign 383 denotes an insulating layer; and reference sign 315 denotes an on-chip microlens.

In the conventional stacked-type imaging element (stacked-type solid-state imaging device) depicted in FIG.

128, charge generated by photoelectric conversion in the second photoelectric conversion portion 341A and the third photoelectric conversion portion 343A is accumulated once into the second photoelectric conversion portion 341A and the third photoelectric conversion portion 343A and then is transferred to the second floating diffusion layer $FD_2$ and the third floating diffusion layer $FD_3$. Therefore, the second photoelectric conversion portion 341A and the third photoelectric conversion portion 343A can be depleted fully. However, charge generated by photoelectric conversion in the first photoelectric conversion portion 310A is accumulated directly into the first floating diffusion layer $FD_1$. Therefore, it is difficult to fully deplete the first photoelectric conversion portion 310A. As a result, kTC noise increases and random noise is degraded, which sometimes gives rise to deterioration of the image quality.

The solid-state imaging devices and so forth according to the present disclosure including the solid-state imaging devices according to the first to second aspects of the present disclosure including a stacked-type imaging element can be formed such that the photoelectric conversion portion includes a first electrode, a photoelectric conversion layer, and a second electrode stacked on each other and further includes an insulating layer and a charge accumulation electrode that is disposed in a spaced relation from the first electrode and in an opposing relation to the photoelectric conversion layer with the insulating layer interposed therebetween. The imaging element that includes the charge accumulation electrode is hereinafter referred to sometimes as "imaging element including the charge accumulation electrode" for the convenience of description.

Since the charge accumulation electrode disposed in a spaced relation from the first electrode and disposed in an opposing relation to the photoelectric conversion layer with the insulating layer interposed therebetween in this manner is provided, when light is irradiated on the photoelectric conversion layer and is photoelectrically converted by the photoelectric conversion layer, charge can be accumulated into the photoelectric conversion layer. Therefore, when exposure is started, it is possible to fully deplete the charge accumulation portion and erase the charge. As a result, since occurrence of such a phenomenon that kTC noise increases and random noise is degraded, resulting in deterioration of the image quality can be suppressed, both highly accurate polarization information acquisition and a good imaging characteristic can be achieved.

An imaging element including a charge accumulation electrode can be formed such that it includes a semiconductor substrate (including a concept of a semiconductor layer) such as, for example, a silicon semiconductor substrate or a compound semiconductor substrate such as an InGaAs substrate and the photoelectric conversion portion is disposed above the semiconductor substrate. It is to be noted that the first electrode, the charge accumulation electrode, and the second electrode are connected to a driving circuit hereinafter described.

The second electrode positioned on the light incident side may be common to a plurality of imaging elements. In other words, the second electrode can be made a so-called solid electrode. The photoelectric conversion layer may be made common to a plurality of imaging elements, and namely, one photoelectric conversion layer may be formed for a plurality of imaging elements or may be provided for each imaging element.

In the imaging elements, in which a charge accumulation electrode is provided, including the various preferred forms and configurations described above, the first electrode can be formed such that it extends in an opening provided in the insulating layer and is connected to the photoelectric conversion portion. Alternatively, the photoelectric conversion layer can be formed such that it extends in an opening provided in the insulating layer and is connected to the first electrode. In this case, it is possible to form the photoelectric conversion layer such that an edge portion of a top face of the first electrode is covered with the insulating layer, the first electrode is exposed to a bottom face of the opening, and where a face of the insulating layer contacting with the top face of the first electrode is a first face and a face of the insulating layer contacting with a portion of the photoelectric conversion layer opposing to the charge accumulation electrode is a second face, a side face of the opening has an inclination that expands from the first face toward the second face, and further, the side face of the opening having the inclination expanding from the first face toward the second face is positioned on the charge accumulation electrode side. It is to be noted that this includes a form that a different layer is formed between the photoelectric conversion layer and the first electrode (for example, a form that a material layer suitable for charge accumulation is formed between the photoelectric conversion layer and the first electrode).

Further, the imaging element that includes any of the charge accumulation electrodes including the various preferred forms and configurations described above can be formed such that it further includes a control portion provided on the semiconductor substrate and including a driving circuit, the first electrode and the charge accumulation electrode are connected to the driving circuit, during a charge accumulation period, from the driving circuit, a potential $V_{11}$ is applied to the first electrode, a potential $V_{12}$ is applied to the charge accumulation electrode, and charge is accumulated into the photoelectric conversion layer, and during a charge transfer period, from the driving circuit, a potential $V_{21}$ is applied to the first electrode, a potential $V_{22}$ is applied to the charge accumulation electrode, and charge accumulated in the photoelectric conversion layer is read out to the control portion via the first electrode. It is to be noted that, in the case where the potential of the first electrode is higher than the potential of the second electrode, $$V_{12} \geq V_{11}, \text{ and } V_{22} < V_{21}$$

are satisfied, but in the case where the potential of the first electrode is lower than the potential of the second electrode, $$V_{12} \leq V_{11}, \text{ and } V_{22} > V_{21}$$

are satisfied.

Furthermore, the imaging element that includes any of the charge accumulation electrodes including the various preferred forms and configurations described above can be formed such that it further includes a transfer controlling electrode (charge transfer electrode) disposed in a spaced relation from the first electrode and the charge accumulation electrode between the first electrode and the charge accumulation electrode and besides disposed in an opposing relation to the photoelectric conversion layer with the insulating layer interposed therebetween. An imaging element that includes a charge accumulation electrode of such a form as just described is referred to as "imaging element that includes a transfer controlling electrode" for the convenience of description.

Further, the imaging element that includes the transfer controlling electrode can be formed such that it further includes a control portion provided on the semiconductor substrate and including a driving circuit, the first electrode, the charge accumulation electrode, and the transfer controlling electrode are connected to the driving circuit, during a charge accumulation period, from the driving circuit, the potential $V_{11}$ is applied to the first electrode, the potential $V_{12}$ is applied to the charge accumulation electrode, a potential $V_{13}$ is applied to the transfer controlling electrode, and charge is accumulated into the photoelectric conversion layer, and during a charge transfer period, from the driving circuit, the potential $V_{21}$ is applied to the first electrode, the potential $V_{22}$ is applied to the charge accumulation electrode, a potential $V_{23}$ is applied to the transfer controlling electrode, and charge accumulated in the photoelectric conversion layer is read out to the control portion via the first electrode. It is to be noted that, in the case where the potential of the first electrode is higher than the potential of the second electrode, $$V_{12}>V_{13}, \text{ and } V_{22}\leq V_{23}\leq V_{21}$$

are satisfied, but in the case where the potential of the first electrode is lower than the potential of the second electrode, $$V_{12}<V_{13}, \text{ and } V_{22}\geq V_{23}\geq V_{21}$$

are satisfied.

Furthermore, the imaging element that includes any of the charge accumulation electrodes including the various preferred forms and configurations described above can be formed such that it further includes a discharging electrode connected to the photoelectric conversion layer and disposed in a spaced relation from the first electrode and the charge accumulation electrode. An imaging element that includes a charge accumulation electrode of such a form as just described is referred to as "imaging element that includes a discharging electrode" for the convenience of description. Further, in the imaging element that includes a discharging electrode, the discharging electrode can be formed such that it surrounds (namely, in a frame shape) the first electrode and the charge accumulation electrode. The discharging electrode can be shared by (made common to) a plurality of imaging elements. Further, in this case, the imaging element can be formed such that the photoelectric conversion layer extends in a second opening provided in the insulating layer and is connected to the discharging electrode, an edge portion of a top face of the discharging electrode is covered with the insulating layer, the discharging electrode is exposed to a bottom face of the second opening, and where a face of the insulating layer contacting with the top face of the discharging electrode is a third face and a face of the insulating layer contacting with a portion of the photoelectric conversion layer opposing to the charge accumulation electrode is a second face, a side face of the second opening can be formed such that it has an inclination that expands from the third face toward the second face.

Further, the imaging element that includes the discharging electrode can be formed such that a control portion provided on the semiconductor substrate and including a driving circuit is further provided, the first electrode, the charge accumulation electrode, and the discharging electrode are connected to the driving circuit, during a charge accumulation period, from the driving circuit, the potential $V_{11}$ is applied to the first electrode, the potential $V_{12}$ is applied to the charge accumulation electrode, the potential $V_{14}$ is applied to the discharging electrode, and charge is accumulated into the photoelectric conversion layer, and during a charge transfer period, from the driving circuit, the potential $V_{21}$ is applied to the first electrode, the potential $V_{22}$ is applied to the charge accumulation electrode, a potential $V_{24}$ is applied to the discharging electrode, and charge accumulated in the photoelectric conversion layer is read out to the control portion via the first electrode. It is to be noted that, in the case where the potential of the first electrode is higher than the potential of the second electrode, $$V_{14}>V_{11}, \text{ and } V_{24}<V_{21}$$

are satisfied, but in the case where the potential of the first electrode is lower than the potential of the second electrode, $$V_{14}<V_{11}, \text{ and } V_{24}>V_{21}$$

are satisfied.

Further, in the imaging element that includes any of the charge accumulation electrodes including the various preferred forms and configurations described above, the charge accumulation electrode can be formed such that it includes a plurality of charge accumulation electrode segments. An imaging element that includes a charge accumulation electrode having such a form as just described is referred to as "imaging element that includes a plurality of charge accumulation electrode segments" for the convenience of description. It is sufficient if the number of charge accumulation electrode segments is equal to or greater than 2. Further, the imaging element that includes a plurality of charge accumulation electrode segments can be formed such that, in the case where potentials different from each other are to be applied to N charge accumulation electrode segments, in the case where the potential of the first electrode is higher than the potential of the second electrode, the potential applied to a charge accumulation electrode segment (first photoelectric conversion portion segment) positioned nearest to the first electrode during a charge transfer period is higher than the potential applied to a charge accumulation electrode segment (Nth photoelectric conversion portion segment) positioned most remotely from the first electrode, and in the case where the potential of the first electrode is lower than the potential of the second electrode, the potential applied to the charge accumulation electrode segment (first photoelectric conversion portion segment) positioned nearest to the first electrode during a charge transfer period is lower than the potential applied to the charge accumulation electrode segment (Nth photoelectric conversion portion segment) positioned most remotely from the first electrode.

The imaging element that includes any of the charge accumulation electrodes including the various preferred forms and configurations described above can be configured such that at least a floating diffusion layer and an amplification transistor that configure the control portion are provided on the semiconductor substrate, and the first electrode is connected to the floating diffusion layer and the gate portion of the amplification transistor. Further, in this case, the imaging element can be configured such that a reset transistor and a selection transistor that configure the control portion are further provided in the semiconductor substrate, the floating diffusion layer is connected to one of the source/drain regions of the reset transistor, and one of the source/drain regions of the amplification transistor is connected to one of the source/drain regions of the selection transistor, and the other of the source/drain regions of the selection transistor is connected to a signal line.

Furthermore, the imaging element that includes any of the charge accumulation electrodes including the various preferred forms and configurations described above can be formed such that the size of the charge accumulation electrode is greater than that of the first electrode. Where the area of the charge accumulation electrode is $S_1'$ and the area of the first electrode is $S_1$, although this is not restrictive, preferably $$4 \leq S_1'/S_1$$

is satisfied.

Alternatively, as a modification of the imaging element that includes any of the charge accumulation electrodes including the various preferred forms described above, imaging elements of first to sixth configurations described below can be exemplified. In particular, in the imaging elements of the first to sixth configurations including the various preferred forms described above, the photoelectric conversion portion includes N (where N≥2) photoelectric conversion portion segments, the photoelectric conversion layer includes N photoelectric conversion layer segments, the insulating layer includes N insulating layer segments, in the imaging elements of the first to third configurations, the charge accumulation electrode includes N charge accumulation electrode segments, in the imaging elements of the fourth to fifth configurations, the charge accumulation electrode includes N charge accumulation electrode segments disposed in a spaced relation from each other, the nth (where n=1, 2, 3, . . . , N) photoelectric conversion portion segment includes the nth charge accumulation electrode segment, the nth insulating layer segment, and the nth photoelectric conversion layer segment, and a photoelectric conversion portion segment that has a higher value of n is positioned more remotely from the first electrode.

Further, in the imaging element of the first configuration, the thickness of the insulating layer segment gradually changes from the first photoelectric conversion portion segment to the Nth photoelectric conversion portion segment. In the imaging element of the second configuration, the thickness of the photoelectric conversion layer segment gradually changes from the first photoelectric conversion portion segment to the Nth photoelectric conversion portion segment. Furthermore, in the imaging element of the third configuration, the material configuring the insulating layer segment differs between adjacent ones of the photoelectric conversion portion segments. Further, in the imaging element of the fourth configuration, the material configuring the charge accumulation electrode segments differs between adjacent ones of the photoelectric conversion portion segments. Further, in the imaging element of the fifth configuration, the area of the charge accumulation electrode segments gradually decreases from the first photoelectric conversion portion segment to the Nth photoelectric conversion portion segment. The area may decrease gradually or may decrease stepwise.

Alternatively, in the imaging element of the sixth configuration that includes any of the preferred forms described above, where the stack direction of the charge accumulation electrode, the insulating layer, and the photoelectric conversion layer is a Z direction and the direction away from the first electrode is an X direction, the cross sectional area of the stacked portion of the charge accumulation electrode, the insulating layer, and the photoelectric conversion layer when the stacked portion is cut along a YZ virtual plane changes depending upon the distance from the first electrode. The change of the sectional area may be a continuous change or may be a stepwise change.

In the imaging elements of the first to second configurations, the N photoelectric conversion layer segments are provided continuously, also the N insulating layer segments are provided continuously, and also the N charge accumulation electrode segments are provided continuously. In the imaging elements of the third to fifth configurations, the N photoelectric conversion layer segments are provided continuously. Further, while, in the imaging elements of the fourth and fifth configurations, the N insulating layer segments are provided continuously, in the imaging element of the third configuration, the N insulating layer segments are provided individually correspondingly to the photoelectric conversion portion segments. Furthermore, in the imaging elements of the fourth to fifth configurations, in some cases, in the imaging element of the third configuration, the N charge accumulation electrode segments are provided individually correspondingly to the photoelectric conversion portion segments. Further, in the imaging elements of the first to sixth configurations, a same potential is applied to all of the charge accumulation electrode segments. Alternatively, in the imaging elements of the fourth to fifth configurations, in some cases, in the imaging element of the third configuration, different potentials may be applied individually to the N charge accumulation electrode segments.

In the imaging elements of the first to sixth configurations, the thickness of the insulating layer segments is defined; or the thickness of the photoelectric conversion layer segments is defined; or materials configuring the insulating layer segments are different; or materials configuring the charge accumulation electrode segments are different; or the area of the charge accumulation electrode segments is defined; or the sectional area of the stacked portion is defined. Therefore, a kind of charge transfer gradient is formed, and it is possible to transfer charge generated by photoelectric conversion more easily and certainly to the first electrode. As a result, occurrence of an afterimage and occurrence of transfer residue can be prevented.

In the imaging elements of the first to fifth configurations, although a photoelectric conversion portion segment having a higher value of n is positioned in a spaced relation by a greater distance from the first electrode, whether or not a photoelectric conversion portion segment is positioned in a spaced relation from the first electrode is decided based on the X direction. Further, in the imaging element of the sixth configuration, although the direction away from the first electrode is the X direction, the "X direction" is defined in the following manner. In particular, a pixel region in which a plurality of imaging elements or stacked-type imaging elements is arrayed includes a plurality of pixels arrayed in a two-dimensional array, namely, arrayed regularly in the X direction and the Y direction. In the case where the shape in plan of the pixels is a rectangle, the direction in which a side of the rectangle nearest to the first electrode extends is defined as the Y direction and a direction orthogonal to the Y direction is defined as the X direction.

Alternatively, in the case where the shape in plan of the pixels is an arbitrary shape, a general direction in which a line segment or a curved line nearest to the first electrode is included is defined as the Y direction and a direction orthogonal to the Y direction is defined as the X direction. Usually, the X direction is parallel to the $x_0$ direction or the $y_0$ direction, and the Y direction is parallel to the $y_0$ direction or the $x_0$ direction.

Although description of a case in which the potential of the first electrode is higher than the potential of the second electrode in the imaging elements of the first to sixth configurations is given below, in the case where the potential of the first electrode is lower than the potential of the second electrode, it is sufficient if the potential levels are reversed.

In the case where charge to be accumulated is electrons, it is sufficient if the configuration that the thickness of the insulating layer segments gradually increases is adopted, but in the case where charge to be accumulated is holes, it is sufficient if the configuration that the thickness of the insulating layer segments gradually decreases is adopted. In those cases, if such a condition as $|V_{12}|\geq|V_{11}|$ is entered during a charge accumulation period, then the nth photoelectric conversion portion segment can accumulate a greater amount of charge than the (n+1)th photoelectric conversion portion segment, and a stronger electric field is applied and a flow of charge from the first photoelectric conversion portion segment to the first electrode can be prevented with certainty. Then, if such a state as $|V_{22}|<|V_{21}|$ is entered during a charge transfer period, then a flow of charge from the first photoelectric conversion portion segment to the first electrode and a flow of charge from the (n+1)th photoelectric conversion portion segment to the nth photoelectric conversion portion segment can be assured with certainty.

In the imaging element of the second configuration, the thickness of the photoelectric conversion layer segments gradually changes from the first photoelectric conversion portion segment to the Nth photoelectric conversion portion segment. However, the thickness of the photoelectric conversion layer segments may gradually increase or decrease, and a kind of charge transfer gradient is formed by this.

In the case where the charge to be accumulated is electrons, it is sufficient if the configuration that the thickness of the photoelectric conversion layer segments gradually increases is adopted, but in the case where the charge to be accumulated is holes, it is sufficient if the configuration that the thickness of the photoelectric conversion layer segments gradually decreases is adopted. Then, in the case where the thickness of the photoelectric conversion layer segments gradually increases, if such a state as $V_{12}\geq V_{11}$ is entered during a charge accumulation period, and in the case where the thickness of the photoelectric conversion layer segments gradually decreases, if such a state as $V_{12}\leq V_{11}$ is entered during a charge accumulation period, then a stronger electric field is applied to the nth photoelectric conversion portion segment than to the (n+1)th photoelectric conversion portion segment, and a flow of charge from the first photoelectric conversion portion segment to the first electrode can be prevented with certainty. Then, in the case where the thickness of the photoelectric conversion layer segments indicate gradual increase, if such a state as $V_{22}<V_{21}$ is entered during a charge transfer period, and in the case where the thickness of the photoelectric conversion layer segments indicate gradual decrease, if such a state as $V_{22}>V_{21}$ is entered, then a flow of charge from the first photoelectric conversion portion segment to the first electrode and a flow of charge from the (n+1)th photoelectric conversion portion segment to the nth photoelectric conversion portion segment can be assured with certainty.

In the imaging element of the third configuration, the material for configuring an insulating layer segment is different between adjacent ones of the photoelectric conversion portion segments, and a kind of charge transfer gradient is formed by this. However, preferably the value of the dielectric constant ratio of a material configuring an insulating layer segment gradually decreases from the first photoelectric conversion portion segment to the Nth photoelectric conversion portion segment. Then, by adopting such a configuration as just described, if such a state as $V_{12}\geq V_{11}$ is entered during a charge accumulation period, then the nth photoelectric conversion portion segment can accumulate a greater amount of charge than the (n+1)th photoelectric conversion portion segment. Then, if such a state as $V_{22}<V_{21}$ is entered during a charge transfer period, then a flow of charge from the first photoelectric conversion portion segment to the first electrode and a flow of charge from the (n+1)th photoelectric conversion portion segment to the nth photoelectric conversion portion segment can be assured with certainty.

In the imaging element of the fourth configuration, the material for configuring a charge accumulation electrode segment is different between adjacent ones of the photoelectric conversion portion segments. While a kind of charge transfer gradient is formed by this, preferably the value of a work function of the material configuring an insulating layer segment gradually increases from the first photoelectric conversion portion segment to the Nth photoelectric conversion portion segment. Then, by adopting such a configuration as just described, a potential gradient that is advantageous for signal charge transfer can be formed without relying upon positive/negative of the voltage.

In the imaging element of the fifth configuration, the area of the charge accumulation electrode segments gradually decreases from the first photoelectric conversion portion segment to the Nth photoelectric conversion portion segment. Since a kind of charge transfer gradient is formed by this, if such a state as $V_{12}\geq V_{11}$ is entered during a charge accumulation period, then the nth photoelectric conversion portion segment can accumulate a greater amount of charge than the (n+1)th photoelectric conversion portion segment. Then, if such a state as $V_{22}<V_{21}$ is entered during a charge transfer period, then a flow of charge from the first photoelectric conversion portion segment to the first electrode and a flow of charge from the (n+1)th photoelectric conversion portion segment to the nth photoelectric conversion portion segment can be assured with certainty.

In the imaging element of the sixth configuration, the sectional area of the stacked portion changes depending upon the distance from the first electrode, and a kind of charge transfer gradient is formed by this. In particular, if the configuration is adopted that the thickness of the cross section of the stacked portion is fixed and the width of the cross section of the stacked portion decreases as the distance from the first electrode increases, then if such a state as $V_{12}\geq V_{11}$ is entered during a charge accumulation period, then the region near to the first electrode can accumulate a greater amount of charge than a remote region from the first electrode similarly as in the case of the imaging element of the fifth configuration described above. Accordingly, if such a state as $V_{22}<V_{21}$ is entered during a charge transfer period, then a flow of charge from a region near to the first electrode to the first electrode and a flow of charge from a remote region to a near region can be assured with certainty. On the other hand, if the configuration is adopted that the width of the cross section of the stacked portion is fixed and the thickness of the cross section of the stacked portion, more particularly, the thickness of the insulating layer segment, gradually increases, then if such a state as $V_{12} \geq V_{11}$ is entered during a charge accumulation period, then a region near to the first electrode can accumulate a greater amount of charge than a remote region from the first electrode similarly as in the case of the imaging element of the first configuration described above, and a strong electric field acts and a flow of charge from a region near to the first electrode to the first electrode can be prevented with certainty. Then, if such a state as $V_{22} < V_{21}$ is entered during a charge transfer period, then a flow of charge from a region near to the first electrode to the first electrode and a flow of charge from a remote region to a near region can be assured with certainty. Further, if the configuration is adopted that the thickness of the photoelectric conversion layer segments is gradually increased, then if such a state as $V_{12} \geq V_{11}$ is entered during a charge accumulation period, then a stronger electric field is applied to a region near to the first electrode than to a remote region similarly as in the case of the description of the imaging element of the second configuration, and a flow of charge from a region near to the first electrode to the first electrode can be prevented with certainty. Then, if such a state as $V_{22} < v_{21}$ is entered during a charge transfer period, then a flow of charge from a region near to the first electrode to the first electrode and a flow of charge from a remote region to a near region can be assured with certainty.

Two or more of the imaging elements of the first to sixth configurations described above can be suitably combined as desired.

As a modification of the solid-state imaging device according to any of the first to second aspects of the present disclosure, the solid-state imaging device can be configured such that it includes a plurality of imaging elements that includes a charge accumulation electrode (including the imaging elements of the first to sixth configurations), an imaging element block includes the plurality of imaging elements, and the first electrode is shared by the plurality of imaging elements configuring the imaging element block. A solid-state imaging device of such a configuration as just described is referred to as "solid-state imaging device of the first configuration" for the convenience of description.

Alternatively, as a modification of the solid-state imaging device of any of the first to second aspects of the present disclosure, the solid-state imaging device can be configured such that it includes a plurality of stacked-type imaging elements each of which includes at least one imaging element (including the imaging elements of the first to sixth configurations) that includes a charge accumulation electrode, an imaging element block includes a plurality of stacked-type imaging elements, and the first electrode is shared by the plurality of stacked-type imaging elements configuring the imaging element block. A solid-state imaging device of such a configuration as just described is referred to as "solid-state imaging device of the second configuration" for the convenience of description. If the first electrode is shared by the plurality of imaging elements configuring the imaging element block in this manner, then the configuration and structure in the pixel region in which a plurality of imaging elements is arrayed can be simplified and miniaturized.

In the solid-state imaging devices of the first to second configurations, one floating diffusion layer is provided for a plurality of imaging elements (one imaging element block). Here, the plurality of imaging elements provided for one floating diffusion layer may include a plurality of imaging elements of the first type or may include at least one imaging element of the first type and one, two or more imaging elements of the second type. Thus, by controlling the timing of a charge transfer period appropriately, it is possible for the plurality of imaging elements to share one floating diffusion layer. The plurality of imaging elements is operated in cooperation with each other and is connected as an imaging element block to the driving circuit. In particular, the plurality of imaging elements configuring the imaging element block is connected to one driving circuit. However, control of the charge accumulation electrode is performed for each imaging element. Further, the plurality of imaging elements can share one contact hole portion. In regard to the disposition relation between the first electrode shared by the plurality of imaging elements and the charge accumulation electrodes of the imaging elements, the first electrode is sometimes disposed adjacent the charge accumulation electrode of each imaging element. Alternatively, the first electrode is sometimes disposed adjacent the charge accumulation electrode of some of the plurality of imaging elements while it is not disposed adjacent the charge accumulation electrode of the remaining imaging elements, and in this case, when charge moves from the remaining ones of the plurality of imaging elements to the first electrode, it moves via the some of the plurality of imaging elements. That the distance between a charge accumulation electrode configuring an imaging element and another charge accumulation electrode configuring the imaging element (the distance is referred to as "distance A" for the convenience of description) is longer than the distance between the first electrode and a charge accumulation electrode in an imaging element adjacent the first electrode (the distance is referred to as "distance B" for the convenience of description) is preferable in order to make the movement of charge from each imaging element to the first electrode sure. Further, preferably the value of the distance A is set higher to an imaging element that is positioned farther from the first electrode.

Alternatively, as a modification of the solid-state imaging device according to any of the first to second aspects of the present disclosure, the solid-state imaging device can be configured such that imaging element units each including four stacked-type imaging elements arrayed in 2×2 and including a first stacked-type imaging element, a second stacked-type imaging element, a third stacked-type imaging element, and a fourth stacked-type imaging element are arrayed in a two-dimensional matrix. A solid-state imaging device of such a configuration as just described is referred to as "solid-state imaging device of the third configuration" for the convenience of description.

The solid-state imaging device solid-state imaging device of the third configuration can be configured such that, in each imaging element unit, the first stacked-type imaging element includes a photoelectric conversion portion having a sensitivity to red light and a photoelectric conversion portion having a sensitivity to near infrared light, the second stacked-type imaging element includes a photoelectric conversion portion having a sensitivity to green light and a photoelectric conversion portion having a sensitivity to near infrared light, the third stacked-type imaging element includes a photoelectric conversion portion having a sensitivity to blue light and a photoelectric conversion portion having a sensitivity to near infrared light, and the first stacked-type imaging element, the second stacked-type imaging element, and the third stacked-type imaging element include no wire grid polarizer. In this case, the fourth stacked-type imaging element can be configured including a photoelectric conversion portion having a sensitivity to white light and another photoelectric conversion portion having a sensitivity to near infrared light.

Alternatively, in the solid-state imaging device of the third configuration, each imaging element unit can be further configured such that it includes a wire grid polarizer on the light incident side of the first stacked-type imaging element, the second stacked-type imaging element, and the third stacked-type imaging element and the wire grid polarizers provided in the first stacked-type imaging element, the second stacked-type imaging element, the third stacked-type imaging element, and the fourth stacked-type imaging element have a same polarization direction. Furthermore, in this case, the solid-state imaging device of the third configuration can be configured such that the polarization direction the wire grid polarizer has is different between adjacent imaging element units.

Alternatively, the solid-state imaging device of the third configuration can be configured such that the first stacked-type imaging element includes a photoelectric conversion portion having sensitivity to red light and another photoelectric conversion portion having sensitivity to near infrared light, the second stacked-type imaging element includes a photoelectric conversion portion having sensitivity to green light and another photoelectric conversion portion having sensitivity to near infrared light, the third stacked-type imaging element includes a photoelectric conversion portion having sensitivity to blue light and another photoelectric conversion portion having sensitivity to near infrared light, an imaging element unit group includes four imaging element units arrayed in 2×2 and including a first imaging element unit, a second imaging element unit, a third imaging element unit, and a fourth imaging element unit (namely, two imaging element units arrayed in the $x_0$ direction and two imaging element units arrayed in the $y_0$ direction), the polarization direction of light to be transmitted by the first wire grid polarizer provided in the first imaging element unit is $\alpha$ degrees, the polarization direction of light to be transmitted by the second wire grid polarizer provided in the second imaging element unit is ($\alpha$+45) degrees, the polarization direction of light to be transmitted by the third wire grid polarizer provided in the third imaging element unit is ($\alpha$+90) degrees, and the polarization direction of light to be transmitted by the fourth wire grid polarizer provided in the fourth imaging element unit is ($\alpha$+135) degrees.

Alternatively, the solid-state imaging device of the third configuration can be configured such that the first stacked-type imaging element includes a photoelectric conversion portion having sensitivity to red light and another photoelectric conversion portion having sensitivity to near infrared light, the second stacked-type imaging element includes a photoelectric conversion portion having sensitivity to green light and another photoelectric conversion portion having sensitivity to near infrared light, the third stacked-type imaging element includes a photoelectric conversion portion having sensitivity to blue light and another photoelectric conversion portion having sensitivity to near infrared light, the fourth stacked-type imaging element includes a photoelectric conversion portion having sensitivity to white light and another photoelectric conversion portion having sensitivity to near infrared light, the wire grid polarizer provided on the light incident side of the fourth stacked-type imaging element includes four polarizer segments arrayed in 2×2 and including a fourth-first polarizer segment, a fourth-second polarizer segment, a fourth-third polarizer segment, and a fourth-fourth polarizer segment (namely, two polarizer segments are arrayed in the $x_0$ direction and two polarizer segments are arrayed in the $y_0$ direction), the polarization direction of light to be transmitted by the fourth-first polarizer segment polarizer is $\alpha$ degrees, the polarization direction of light to be transmitted by the fourth-second polarizer segment polarizer is ($\alpha$+45) degrees, the polarization direction of light to be transmitted by the fourth-third polarizer segment polarizer is ($\alpha$+90) degrees, and the polarization direction of light to be transmitted by the fourth-fourth polarizer segment polarizer is ($\alpha$+135) degrees.

Further, such a configuration as described above can include a configuration such that each imaging element unit further includes a wire grid polarizer provided on the light incident side of each of the first stacked-type imaging element, the second stacked-type imaging element, and the third stacked-type imaging element;

the wire grid polarizer provided on the light incident side of the first stacked-type imaging element includes four polarizer segments arrayed in 2×2 (namely, two polarizer segments are arrayed in the $x_0$ direction and two polarizer segments are arrayed in the $y_0$ direction) and including a first-first polarizer segment, a first-second polarizer segment, a first-third polarizer segment, and a first-fourth polarizer segments, the polarization direction of light to be transmitted by the first-first polarizer segment is $\beta$ degrees, the polarization direction of light to be transmitted by the first-second polarizer segment is ($\beta$+45) degrees, the polarization direction of light to be transmitted by the first-third polarizer segment is ($\beta$+90) degrees, and the polarization direction of light to be transmitted by the first-fourth polarizer segment is ($\beta$+135) degrees;

the wire grid polarizer provided on the light incident side of the second stacked-type imaging element includes four polarizer segments arrayed in 2×2 (namely, two polarizer segments are arrayed in the $x_0$ direction and two polarizer segments are arrayed in the $y_0$ direction) and including a second-first polarizer segment, a second-second polarizer segment, a second-third polarizer segment, and a second-fourth polarizer segments, the polarization direction of light to be transmitted by the second-first polarizer segment is $\gamma$ degrees, the polarization direction of light to be transmitted by the second-second polarizer segment is ($\gamma$+45) degrees, the polarization direction of light to be transmitted by the second-third polarizer segment is ($\gamma$+90) degrees, and the polarization direction of light to be transmitted by the second-fourth polarizer segment is ($\gamma$+135) degrees; and the wire grid polarizer provided on the light incident side of the third stacked-type imaging element includes four polarizer segments arrayed in 2×2 (namely, two polarizer segments are arrayed in the $x_0$ direction and two polarizer segments are arrayed in the $y_0$ direction) and including a third-first polarizer segment, a third-second polarizer segment, a third-third polarizer segment, and a third-fourth polarizer segments, the polarization direction of light to be transmitted by the third-first polarizer segment is δ degrees, the polarization direction of light to be transmitted by the third-second polarizer segment is (δ+45) degrees, the polarization direction of light to be transmitted by the third-third polarizer segment is (δ+90) degrees, and the polarization direction of light to be transmitted by the third-fourth polarizer segment is (δ+135) degrees.

As the values of α, β, γ, and δ, the angle "0 degrees" defined with respect to the $y_0$ direction can be exemplified. Further, though not restrictive, preferably α=β=γ=δ is satisfied.

The imaging element that includes any of the charge accumulation electrodes including the various preferred forms and configurations described above can be formed such that light is incident from the second electrode side and a light shielding layer is formed on the light incident side rather near to the second electrode. Alternatively, the imaging element can be formed such that light is incident from the second electrode side and is not incident to the first electrode (in some cases, to the first electrode and the transfer controlling electrode). Further, in this case, the imaging element can be configured such that a light shielding layer is formed on the light incident side rather near to the second electrode above the first electrode (in some cases, above the first electrode and the transfer controlling electrode) or can be configured such that light incident to the on-chip microlens is condensed to the charge accumulation electrode. Here, the light shielding layer may be disposed above the face of the second electrode on the light incident side or may be disposed on the face of the second electrode on the light incident side. In some cases, the light shielding layer may be formed on the second electrode. As the material for configuring the light shielding layer, chromium (Cr), copper (Cu), aluminum (Al), tungsten (W), and a resin that does not transmit light (for example, a polyimide resin) can be exemplified.

As an imaging element that includes a charge accumulation electrode, particularly, an imaging element (the imaging element is referred to as "blue light imaging element of the first type" for the convenience of description) that includes a photoelectric conversion layer that absorbs blue light (light of 425 to 495 nm) (the photoelectric conversion layer is referred to as "blue light photoelectric conversion layer of the first type" for the convenience of description) and has sensitivity to blue light, an imaging element (the imaging element is referred to as "green light imaging element of the first type" for the convenience of description) that includes a photoelectric conversion layer that absorbs green light (light of 495 to 570 nm) (the photoelectric conversion layer is referred to as "green light photoelectric conversion layer of the first type" for the convenience of description) and has sensitivity to green light, and an imaging element (the imaging element is referred to as "red light imaging element of the first type" for the convenience of description) that includes a photoelectric conversion layer that absorbs red light (light of 620 to 750 nm) (the photoelectric conversion layer is referred to as "red light photoelectric conversion layer of the first type" for the convenience of description) and has sensitivity to red light can be exemplified. Further, in the case of an imaging element that does not include a charge accumulation electrode, the imaging element having sensitivity to blue light is referred to as "blue light imaging element of the second type" for the convenience of description; the imaging element having sensitivity to green light is referred to as "green light imaging element of the second type" for the convenience of description; and the imaging element having sensitivity to red light is referred to as "red light imaging element of the second type" for the convenience of description. Further, a photoelectric conversion layer configuring the blue light imaging element of the second type is referred to as "blue light photoelectric conversion layer of the second type" for the convenience of description; a photoelectric conversion layer configuring the green light imaging element of the second type is referred to as "green light photoelectric conversion layer of the second type" for the convenience of description; and a photoelectric conversion layer configuring the red light imaging element of the second type is referred to as "red light photoelectric conversion layer of the second type" for the convenience of description. The photoelectric conversion layer having sensitivity to white light has sensitivity to light of 425 to 750 nm, for example.

As the stacked-type imaging element, particularly

[A] a stacked-type imaging element configured and structured such that a blue light photoelectric conversion portion of the first type, a green light photoelectric conversion portion of the first type, and a red light photoelectric conversion portion of the first type are stacked in the vertical direction, and control portions of a blue light imaging element of the first type, a green light imaging element of the first type, and a red light imaging element of the first type are individually provided on the semiconductor substrate;

[B] a stacked-type imaging element configured and structured such that a blue light photoelectric conversion portion of the first type and a green light photoelectric conversion portion of the first type are stacked in the vertical direction, a red light photoelectric conversion portion of the second type is disposed below the two layers of photoelectric conversion portions of the first type, and control portions of a blue light imaging element of the first type, a green light imaging element of the first type, and a red light imaging element of the second type are individually provided on the semiconductor substrate;

[C] a stacked-type imaging element configured and structured such that a blue light photoelectric conversion portion of the second type and a red light photoelectric conversion portion of the second type are disposed below a green light photoelectric conversion portion of the first type, and control portions of a green light imaging element of the first type, a blue light imaging element of the second type, and a red light imaging element of the second type are individually provided on the semiconductor substrate; and

[D] a stacked-type imaging element configured and structured such that a green light photoelectric conversion portion of the second type and a red light photoelectric conversion portion of the second type are disposed below a blue light photoelectric conversion portion of the first type, and control portions of a blue light imaging element of the first type, a green light imaging element of the second type, and a red light imaging element of the second type are individually provided on the semiconductor substrate can be exemplified. The disposition order of the photoelectric conversion portions of the imaging elements in the vertical direction preferably is the order of the blue light photoelectric conversion portion, the green light photoelectric conversion portion, and the red light photoelectric conversion portion from the light incident direction or the order of the green light photoelectric conversion portion, the blue light photoelectric conversion portion, and the red light photoelectric conversion portion from the light incident direction. This is because light of a shorter wavelength is absorbed in a higher efficiency by the incident surface side. Since red light has a wavelength longest among light of the three colors, preferably the red light photoelectric conversion portion is positioned in the lowermost layer as viewed from the light incident surface side. One pixel includes the stack structure of the imaging elements. Further, a near infrared light photoelectric conversion portion (or an infrared light photoelectric conversion portion) of the first type may be provided. Here, the photoelectric conversion layer of the infrared light photoelectric conversion portion of the first type preferably includes, for example, an organic material and is disposed in the lowermost layer of the stack structure of the imaging element of the first type but above the imaging element of the second type. Alternatively, a near infrared light photoelectric conversion portion (or an infrared light photoelectric conversion portion) of the second type may be provided below the photoelectric conversion portion of the first type.

Alternatively, in the stacked-type imaging element, the plurality of photoelectric conversion portions can be configured such that they include a photoelectric conversion portion having sensitivity to white light and another photoelectric conversion portion having sensitivity to near infrared light. It is to be noted that, where the photoelectric conversion portion on the light incident side is referred to as "upper layer photoelectric conversion portion" and the photoelectric conversion portion positioned below the upper layer photoelectric conversion portion is referred to as "lower layer photoelectric conversion portion," the upper layer photoelectric conversion portion may include a photoelectric conversion portion having sensitivity to white light and the lower layer photoelectric conversion portion may include a photoelectric conversion portion having sensitivity to near infrared light, or the upper layer photoelectric conversion portion may include a photoelectric conversion portion having sensitivity to near infrared light and the lower layer photoelectric conversion portion may include a photoelectric conversion portion having sensitivity to white light.

Alternatively, in the stacked-type imaging element, the plurality of photoelectric conversion portions can be configured such that they include a photoelectric conversion portion having sensitivity to red light, green light, or blue light and another photoelectric conversion portion having sensitivity to near infrared light. Here, the upper layer photoelectric conversion portion may include a photoelectric conversion portion having sensitivity to red light, green light, or blue light and the lower layer photoelectric conversion portion may include a photoelectric conversion portion having sensitivity to near infrared light, or the upper layer photoelectric conversion portion may include a photoelectric conversion portion having sensitivity to near infrared light and the lower layer photoelectric conversion portion may include a photoelectric conversion portion having sensitivity to red light, green light, or blue light. Such a configuration as just described may be configured such that a color filter layer (wavelength selection means) is disposed on the light incident side with respect to the wire grid polarizer. Alternatively, in such a configuration as described above, by suitably selecting the color filter layer (wavelength selection means), the photoelectric conversion portion having sensitivity to red light, green light, or blue light can be configured such that at least two different photoelectric conversion portions selected from a group including a red light photoelectric conversion portion having sensitivity to red light, a green light photoelectric conversion portion having sensitivity to green light, and a blue light photoelectric conversion portion having sensitivity to blue light are stacked.

In the imaging element of the first type, for example, the first electrode is formed on the interlayer insulating layer provided on the semiconductor substrate. The imaging element formed on the semiconductor substrate can be formed as that of the back-illuminated type and can be formed also as that of the front-illuminated type.

In the case where the photoelectric conversion layer includes an organic material, the photoelectric conversion layer can be configured in accordance with one of the following four aspects:

(1) the photoelectric conversion layer includes a p-type organic semiconductor;

(2) the photoelectric conversion layer includes an n-type organic semiconductor;

(3) the photoelectric conversion layer includes a stack structure of a p-type organic semiconductor layer/n-type organic semiconductor layer; the photoelectric conversion layer includes a stack structure of a p-type organic semiconductor layer/a mixture layer (bulk hetero structure) of p-type organic semiconductor and an n-type organic semiconductor/n-type organic semiconductor layer; the photoelectric conversion layer includes a stack structure of a p-type organic semiconductor layer/a mixture layer (bulk hetero structure) of p-type organic semiconductor and an n-type organic semiconductor; or the photoelectric conversion layer includes a stack structure of an n-type organic semiconductor layer/a mixture layer (bulk hetero structure) of p-type organic semiconductor and an n-type organic semiconductor; and (4) the photoelectric conversion layer includes a mixture (bulk hetero structure) of a p-type organic semiconductor and an n-type organic semiconductor. It is to be noted that photoelectric conversion layer can be configured such that the stacking order is exchanged suitably.

As the p-type organic semiconductor, naphthalene derivatives, anthracene derivatives, phenanthrene derivatives, pyrene derivatives, perylene derivatives, tetracene derivatives, pentacene derivatives, quinacridone derivatives, thiophene derivatives, thienotiophene derivatives, benzothiophene derivatives, benzothienobenzothiophene derivatives, triallylamine derivatives, carbazole derivatives, perylene derivatives, picene derivatives, crysene derivatives, fluoranthene derivatives, phthalocyanine derivatives, subphthalocyanine derivatives, subporphyrazine derivatives, metal complexes with heterocyclic compounds as ligands, polythiophene derivatives, polybenzothiadiazole derivatives, polyfluorene derivatives and so forth can be exemplified. As the n-type organic semiconductor, fullerenes and fullerene derivatives <fullerenes (higher fullerenes) such as, for example, C60, C70, C74, and so forth, endohedral fullerenes and so forth) or fullerene derivatives (for example, fullerene fluoride, PCBM fullerene compounds, fullerene multimers and so forth)>, organic semiconductors whose HOMO and LUMO are greater (deeper) than p-type organic semiconductors, and transparent inorganic metal oxides can be exemplified. As the n-type organic semiconductors, particularly heterocyclic compounds containing nitrogen atoms, oxygen atoms, and sulfur atoms, for example, organic molecules, organometallic complexes, and subphthalocyanine derivatives that have, at part of the molecular skeleton thereof, pyridine derivatives, pyrazine derivatives, pyrimidine derivatives, triazine derivatives, quinoline derivatives, quinoxaline derivatives, isoquinoline derivatives, acridine derivatives, phenazine derivatives, phenanthroline derivatives, tetrazole derivatives, pyrazole derivatives, imidazole derivatives, thiazole derivatives, oxazole derivatives, imidazole derivatives, benzoimidazole derivatives, benzotriazole derivatives, benzoxazole derivatives, benzoxazole derivatives, carbazole derivatives, benzofuran derivatives, dibenzofuran derivatives, subporphyrazine derivatives, polyphenylene vinylene derivatives, polybenzothiadiazole derivatives, polyfluorene derivatives and so forth can be exemplified. As a group or the like included in fullerene derivatives, halogen atoms; linear, branched or cyclic alkyl groups or phenyl groups; groups having a linear or spent aromatic compounds; groups having a halide; partial fluoroalkyl groups; perfluoroalkyl groups; silylalkyl groups; silylalkoxy groups; arylsilyl groups; arylsulfanyl groups; alkylsulfanyl groups; arylsulfonyl groups; alkylsulfonyl groups; aryl sulfide groups; alkyl sulfide groups; amino groups; alkylamino groups; arylamino groups; hydroxy groups; alkoxy groups; acylamino groups; acyloxy groups; carbonyl groups; carboxy groups; carboxamide groups; carboalkoxy groups; acyl groups; sulfonyl groups; cyano groups; nitro groups; groups having a chalcogenide; phosphine groups; phosphon groups; and derivatives of them can be exemplified. Although the thickness of the photoelectric conversion layer including an organic material (sometimes referred to as "organic photoelectric conversion layer") is not restrictive, for example, $1\times10^{-8}$ to $5\times10^{-7}$ m, preferably $2.5\times10^{-8}$ to $3\times10^{-7}$ m, more preferably $2.5\times10^{-8}$ to $2\times10^{-7}$ m, and most preferably $1\times10^{-7}$ to $1.8\times10^{-7}$ m can be exemplified. It is to be noted that, although organic semiconductors are frequently classified into the p-type and the n-type, the p-type signifies that holes can be transported readily and the n-type signifies that electrons can be transported readily and the organic semiconductor is not limited to an interpretation that it has holes or electrons as thermally excited majority carriers like inorganic semiconductors.

As an alternative, as the material that configures the organic photoelectric conversion layer for photoelectrically converting green light, for example, rhodamine dyes, melocyanin pigments, quinacridone derivatives, subphthalocyanine dyes (subphthalocyanine derivatives) and so forth can be exemplified. As the material that configures the organic photoelectric conversion layer for photoelectrically converting blue light, for example, coumaric acid dyes, tris(8-hydroxyquinoline)aluminum (Alq3), melocyanin pigments and so forth can be exemplified, and as the material that configures the organic photoelectric conversion layer for photoelectrically converting red light, for example, phthalocyanine dyes and subphthalocyanine dyes (subphthalocyaline derivatives) can be exemplified.

As an alternative, as the inorganic material that configures the photoelectric conversion layer, crystalline silicon, amorphous silicon, microcrystalline silicon, crystalline selenium, amorphous selenium, and compound semiconductors such as chalcopyrite compounds such as CIGS (CuInGaSe), CIS ($CuInSe_2$), $CuInS_2$, $CuAlS_2$, $CuAlSe_2$, $CuGaS_2$, $CuGaSe_2$, $AgAlS_2$, $AgAlSe_2$, $AgInS_2$, and $AgInSe_2$ or III-V compounds such as GaAs, InP, AlGaAs, InGaP, AlGaInP, InGaAsP, CdSe, CdS, $In_2Se_3$, $In_2S_3$, $Bi_2Se_3$, $Bi_2S_3$, ZnSe, ZnS, PbSe, and PbS can be exemplified. In addition, also it is possible to use quantum dots of the materials for the photoelectric conversion layer.

Alternatively, the photoelectric conversion layer can be configured in a stack structure of a lower layer semiconductor layer and an upper layer photoelectric conversion layer. By providing a lower layer semiconductor layer in this manner, recombination upon charge accumulation can be prevented, and the transfer efficiency of charge accumulated in the photoelectric conversion layer to the first electrode can be increased and besides generation of dark current can be suppressed. It is sufficient if the material for configuring the upper layer photoelectric conversion layer is suitably selected from among the various materials for configuring the photoelectric conversion layer described above. On the other hand, as the material for configuring the lower layer semiconductor layer, it is preferable to use a material whose band gap energy has a large value (for example, a value of the band gap energy equal or higher than 3.0 eV) and besides which has a mobility higher than that of the material that configures the photoelectric conversion layer. In particular, oxide semiconductor materials such as IGZO; transition metal dichalcogenide; silicon carbide; diamond; graphene; carbon nanotube; and organic semiconductor materials such as fused polycyclic hydrocarbon compounds and fused heterocyclic compounds can be exemplified. Alternatively, as the material for configuring the lower layer semiconductor layer, in the case where the charge to be accumulated is holes, a material that has an ionic potential lower than an ionic potential of the material that configures the photoelectric conversion layer can be exemplified, and in the case where the charge to be accumulated is electrons, a material having electron affinity higher than the electron affinity of the material that configures the photoelectric conversion layer can be exemplified. Alternatively, the impurity concentration of the material configuring the lower layer semiconductor layer preferably is $1\times10^{18}$ $cm^{-3}$ or less. The lower layer semiconductor layer may have a single layer configuration or may have a multilayer configuration. Further, the material for configuring the lower layer semiconductor layer positioned above the charge accumulation electrode and the material for configuring the lower layer semiconductor layer positioned above the first electrode may be different from each other.

The solid-state imaging device and so forth of the present disclosure can be used to configure a single-plate color solid-state imaging device.

All imaging elements configuring the solid-state imaging device and so forth of the present disclosure may include the wire grid polarizer or some of the imaging elements may include the wire grid polarizer.

In the solid-state imaging device and so forth of the present disclosure, if, different from a solid-state imaging device that includes imaging elements of a Bayer array (namely, spectroscopy of blue, green, and red is not performed using a color filter layer), imaging elements having sensitivity to light of a plurality of different wavelengths are stacked in the incident direction of light in the same pixel to configure one pixel, then improvement in sensitivity and improvement in pixel density per unit volume can be achieved. Further, since organic materials have high absorption coefficients, the film thickness of the organic photoelectric conversion layer can be reduced in comparison with conventional Si-based photoelectric conversion layers, and leakage of light from an adjacent pixel and restriction of the incident angle of light are moderated. Further, although a conventional Si-based imaging element suffers from a false color because an interpolation process is performed among pixels of three colors to generate a color signal, in the solid-state imaging devices according to the first to second aspects of the present disclosure that include the stacked-type imaging element, appearance of a false color is suppressed. Since the organic photoelectric conversion layer itself functions also as a color filter layer, even if a color filter layer is not disposed, color separation is possible.

Alternatively, in the solid-state imaging device and so forth of the present disclosure, by using a color filter layer, the demand for a spectral characteristic into blue, green, and red can be moderated and high mass productivity can be achieved. As the array of imaging elements in such a solid-state imaging device as just described, in addition to the Bayer array, an interline array, a G stripe RB checkered array, a G stripe RB complete checkered array, a checkered complementary color array, a stripe array, a diagonal stripe array, a primary color difference array, a field color difference sequential array, a frame color difference sequential array, an MOS type array, an improved MOS type array, a frame interleave array, and a field interleave array can be exemplified. Here, one pixel (or one subpixel) includes one imaging element.

For example, in the case of a Bayer array, one imaging element unit (one pixel) can be formed such that it includes four imaging elements of the present disclosure. Further, 2×2 subpixel regions can be configured such that a red color filter layer, a green color filter layer, and a blue color filter layer are disposed in three of the subpixel regions and, in the remaining one subpixel region in which a green color filter layer is to be disposed originally, no color filter layer is disposed and a wire grid polarizer is disposed in the remaining one subpixel region (white subpixel region). Alternatively, in the case of a Bayer array, also it is possible to configure the 2×2 subpixel regions such that a red color filter layer, a green color filter layer, and a blue color filter layer are disposed in three of the subpixel regions and a green color filter layer and a wire grid polarizer are disposed in the remaining one subpixel region. In the case where color separation or spectroscopy is not intended or in the case where the imaging element itself is of the type that has sensitivity to a specific wavelength, a color filter layer may not be necessitated. Further, in a subpixel region in which a color filter layer (wavelength selection means) is not disposed, in order to assure the flatness with a subpixel region in which a color filter layer is disposed, a transparent resin layer may be formed in place of a color filter layer. In other words, the imaging element may include a combination of a red light imaging element having sensitivity to red light, a green light imaging element having sensitivity to green light, and a blue light imaging element having sensitivity to blue light. Further, in addition, the solid-state imaging device may include a combination of a near infrared light imaging element or an imaging element for infrared light having sensitivity to near infrared light or infrared light, or may be configured as a solid-state imaging device for obtaining an image of a single color, or else may be a solid-state imaging device for obtaining a combination of an image of a single color and an image based on near infrared rays or infrared rays.

The pixel region in which a plurality of imaging elements according to the present disclosure is arrayed includes a plurality of pixels arrayed regularly in a two-dimensional array. A pixel region usually includes an effective pixel region in which light is actually received and signal charge generated by photoelectric conversion is amplified and read out to a driving circuit and a black reference pixel region (also called optical black pixel region (OPB)) for outputting optical black that is used as a reference for a black level as described hereinabove. The black reference pixel region is usually disposed on an outer peripheral portion of the effective pixel region. Further, the peripheral region is usually disposed in an outer peripheral portion of the black reference pixel region.

In the imaging element according to the present disclosure including any of the various preferred forms and configurations described above, light is irradiated and photoelectric conversion occurs in the photoelectric conversion layer, and positive holes (holes) and electrons are separated as carriers. Then, an electrode from which holes are extracted is made an anode and an electrode from which electrons are extracted is made a cathode. Not only a form in which the first electrode configures the anode and the second electrode configures the cathode but also a form in which the first electrode configures the cathode and the second electrode configures the anode are available.

The imaging element can be configured such that the first electrode, the charge accumulation electrode, the transfer controlling electrode, the discharging electrode, and the second electrode include a transparent conductive material. The first electrode, the charge accumulation electrode, the transfer controlling electrode, and the discharging electrode are sometimes referred to collectively as "first electrode and so forth." Alternatively, in the case where the imaging element in the present disclosure is disposed in a plane, for example, like a Bayer array, the imaging element can be configured such that the second electrode includes a transparent conductive material and the first electrode and so forth include a metal material. In this case, the imaging element can be configured such that the second electrode positioned on the light incident side includes a transparent conductive material and the first electrode and so forth include, for example, Al—Nd (alloy of aluminum and neodymium) or ASC (alloy of aluminum, samarium, and copper). An electrode including a transparent conductive material is sometimes referred to as "transparent electrode." Here, here, the band gap energy of the transparent conductive material is equal to or higher than 2.5 eV, preferably, equal to or higher than 3.1 eV. As the transparent conductive material configuring the transparent electrode, metal oxides having conductivity can be exemplified, and more particularly, indium oxide, indium-tin oxide (ITO, Indium Tin Oxide, including Sn-doped $In_2O_3$, crystalline ITO, and amorphous ITO), indium-zinc oxide (IZO, Indium Zinc Oxide) in which indium is added as dopant to zinc oxide, indium-gallium oxide (IGO) in which indium is added as dopant to gallium oxide, indium-gallium-zinc oxide (IGZO, In—$GaZnO_4$) in which indium and gallium are added as dopant to zinc oxide, indium-tin-zinc oxide (ITZO) in which indium and tin are added as dopant to zinc oxide, IFO (F-doped $In_2O_3$), tin oxide ($SnO_2$), ATO (Sb-doped $SnO_2$), FTO (F-doped $SnO_2$), zinc oxide (including ZnO in which another element is doped), aluminum-zinc oxide (AZO) in which aluminum is added as dopant to zinc oxide, gallium-zinc oxide (GZO) in which gallium is added as dopant to zinc oxide, titanium oxide ($TiO_2$), niobium-titanium oxide (TNO) in which niobium is added as dopant to titanium oxide, antimony oxide, spinel oxides, and oxides having a $YbFe_2O_4$ structure can be exemplified. Alternatively, a transparent electrode in which the mother layer includes gallium oxide, titanium oxide, niobium oxide, nickel oxide, or the like can be exemplified. As the thickness of the transparent electrode, $2\times10^{-8}$ to $2\times10^{-7}$ m, preferably, $3\times10^{-8}$ to $1\times10^{-7}$ m, can be exemplified. In the case where transparency is required for the first electrode, also the discharging electrode preferably includes a transparent conductive material from the point of view of simplification of the manufacturing process.

Alternatively, in the case where transparency is not required, as the conductive material for configuring the anode having a function as an electrode from which holes are to be extracted, preferably the anode includes a conductive material having a high work function (for example, φ=4.5 to 5.5 eV), and particularly, gold (Au), silver (Ag), chromium (Cr), nickel (Ni), palladium (Pd), platinum (Pt), iron (Fe), iridium (Ir), germanium (Ge), osmium (Os), rhenium (Re), and tellurium (Te) can be exemplified. On the other hand, as the conductive material for configuring the cathode having a function as an electrode from which electrons are to be extracted, preferably the cathode includes a conductive material having a low work function (for example, φ=3.5 to 4.5 eV), and particularly, alkali metals (for example, Li, Na, K, and so forth) and fluorides or oxides of them, alkaline earth metals (for example, Mg, Ca, and so forth) and fluorides or oxides of them, rare earth metals such as aluminum (Al), zinc (Zn), tin (Sn), thallium (Tl), an sodium-potassium alloy, an aluminum-lithium alloy, a magnesium-silver alloy, indium, and ytterbium, alloys of them and so forth can be exemplified. Alternatively, as the material for configuring the anode and the cathode, such metals as platinum (Pt), gold (Au), palladium (Pd), chromium (Cr), nickel (Ni), aluminum (Al), silver (Ag), tantalum (Ta), tungsten (W), copper (Cu), titanium (Ti), indium (In), tin (Sn), iron (Fe), cobalt (Co), and molybdenum (Mo), alloys containing those metal elements, conductive particles including those metals, conductive particles of alloys containing those metals, and conductive materials such as polycrystalline silicon containing impurities, carbon materials, oxide semiconductors, carbon nanotube, graphene and so forth can be exemplified, and the anode and the cathode may have a stack structure of layers including those elements. Furthermore, as the material for configuring the anode and the cathode, also it is possible to exemplify such organic materials (conductive high molecules) as poly (3,4-ethylenedioxythiophene)/polystyrene sulfonic acid [PEDOT/PSS]. Further, such conductive materials may be mixed into a binder (high molecules) to form paste or ink, which is hardened so as to be used as an electrode.

As a formation (film formation) method for the first electrode and so forth or the second electrode (anode or cathode), it is possible to use a dry method or a wet method. As the dry method, a physical vapor deposition method (PVD method) and a chemical vapor deposition method (CVD method) can be exemplified. As a formation (film formation) method that uses the principle of the PVD method, a vacuum deposition method that uses resistance heating or high frequency heating, an EB (electron beam) deposition method, various sputtering methods (magnetron sputtering method, RF-DC coupling type bias sputtering method, ECR sputtering method, opposite target sputtering method, high frequency sputtering method), an ion plating method, a laser abrasion method, a molecular beam epitaxy method, and a laser transfer method can be exemplified. Further, as the CVD method, a plasma CVD method, a thermal CVD method, an organic metal (MO) CVD method, and an optical CVD method can be exemplified. On the other hand, as the wet method, an electrolytic plating method, an electroless plating method, a spin coating method, an ink jet method, a spray coating method, a stamp method, a micro contact printing method, a flexo printing method, an offset printing method, a gravure printing method, a dip method, and so forth can be exemplified. As the patterning method, chemical etching such as shadow mask, laser transfer, photolithography or the like, physical etching by ultraviolet rays, a laser or the like and so forth can be exemplified. As a flattening technology of the first electrode and so forth or the second electrode, a laser flattening method, a reflow method, a CMP (Chemical Mechanical Polishing) method, and so forth can be used.

As the material for configuring the insulating layer, not only inorganic insulating materials exemplified by metal oxides high-dielectric insulating materials such as silicon oxide materials; silicon nitride ($SiN_Y$); aluminum oxide ($Al_2O_3$) and so forth but also organic insulating materials (organic polymers) exemplified by polymethylmethacrylate (PMMA); polyvinylphenol (PVP); polyvinyl alcohol (PVA); polyimide; polycarbonate (PC); polyethylene terephthalate (PET); polystyrene; sinanol derivatives (silane coupling agents) such as N-2 (aminoethyl) 3-aminopropyltrimethoxysilane (AEAPTMS), 3-mercaptopropyltrimethoxysilane (MPTMS), and octadecyltrichlorosilane (OTS); novolac phenolic resins; fluorine resins; and linear hydrocarbons that have, at one end thereof, a functional group that is coupleable to a control electrode, such as octadecanethiol, dodecyl isocyanate or the like can be exemplified, and also it is possible to use a combination of them. As the silicon oxide materials, silicon oxide ($SiO_x$), BPSG, PSG, BSG, AsSG, PbSG, silicon oxynitride (SiON), SOG (spin on glass), and low-dielectric constant insulating materials (for example, polyaryl ether, cycloperfluorocarbon polymer and benzocyclobutene, cyclic fluoropolymers, polytetrafluoroethylene, fluorinated aryl ether, fluorinated polyimide, amorphous carbon, organic SOG) can be exemplified.

The configuration and structure of the floating diffusion layer, the amplification transistor, the reset transistor, and the selection transistor that configure the control portion can be made similarly to those of a conventional floating diffusion layer, amplification transistor, reset transistor, and selection transistor. Also the driving circuit can be made in a well-known configuration and structure.

Although the first electrode is connected to the floating diffusion layer and the gate portion of the amplification transistor, it is sufficient if a contact hole portion is formed for connection between the first electrode and the floating diffusion layer and gate portion of the amplification transistor. As the material for configuring the contact hole portion, polycrystalline silicon doped with impurity, refractory metals or metal silicides such as tungsten, Ti, Pt, Pd, Cu, TiW, TiN, TiNW, $WSi_2$, and $MoSi_2$ and stack structures of layers including those materials (for example, Ti/TiN/W) can be exemplified.

A first carrier blocking layer may be provided between the photoelectric conversion layer and the first electrode, and a second carrier blocking layer may be provided between the organic photoelectric conversion layer and the second electrode. Further, a first charge injection layer may be provided between the first carrier blocking layer and the first electrode, and a second charge injection layer may be provided between the second carrier blocking layer and the second electrode. For example, as the material for configuring the electron injection layer, for example, alkali metals such as, for example, lithium (Li), sodium (Na), and potassium (K) and fluorides and oxides of the alkali metals and alkaline earth metals such as magnesium (Mg) and calcium (Ca) and fluorides and oxides of the alkaline earth metals can be exemplified.

As the formation (film formation) method of various organic layers, a dry film formation method and a wet film formation method are available. As the dry film formation method, a vacuum deposition method that uses resistance heating, high frequency heating or electron beam heating, a flash deposition method, a plasma deposition method, an EB deposition method, various sputtering methods (a 2-pole sputtering method, a DC sputtering method, a DC magnetron sputtering method, a high frequency sputtering method, a magnetron sputtering method, an RF-DC coupling type bias sputtering method, an ECR sputtering method, an opposite target sputtering method, a high frequency sputtering method, an ion beam sputtering method), a DC (Direct Current) method, an RF method, a multi cathode method, an activation reaction method, an electrodeposition method, various ion plating methods such as a high frequency ion plating method and a reactive ion plating method, a laser abrasion method, a molecular beam epitaxy method, a laser transfer method, and a molecular beam epitaxy method (MBE method) can be exemplified. Further, as the CVD method, a plasma CVD method, a thermal CVD method, an MOCVD method, and an optical CVD method can be exemplified. On the other hand, as the wet method, particularly a spin coating method; an immersion method; a cast method; a micro contact printing method; a drop cast method; various printing methods such as a screen printing method, an ink jet printing method, an offset printing method, a gravure printing method, and a flexo printing method; a stamp method; a spray method; and various coating methods such as an air doctor coater method, a blade coater method, a rod coater method, a knife coater method, a squeeze coater method, a reverse roll coater method, a transfer roll coater method, a gravure coater method, a kiss coater method, a cast coater method, a spray coater method, a slit orifice coater method, and a calendar coater method can be exemplified. In the application method, as the solvent, nonpolar or low polarity organic solvents such as toluene, chloroform, hexane, and ethanol can be exemplified. As the patterning method, chemical etching such as shadow mask, laser transfer, and photolithography and physical etching by ultraviolet rays, a laser beam, and so forth can be exemplified. As the flattening technology for the various organic layers, a laser flattening method, a reflow method, and so forth can be used.

In the imaging element or the solid-state imaging device, a light shielding layer may be provided as occasion demands as described above, and driving circuits and wirings for driving the imaging element are provided. As occasion demands, a shutter for controlling incidence of light to the imaging element may be disposed, and an optical cut filter may be provided in accordance with an object of the solid-state imaging device.

Further, the solid-state imaging devices of the first to second configurations can be formed such that one on-chip microlens is disposed above one of the imaging elements of the present disclosure or can be formed such that an imaging element block includes two of the imaging elements of the present disclosure and one on-chip microlens is disposed above the imaging element block.

For example, in the case where the solid-state imaging device is stacked with a reading out integrated circuit (ROIC), they can be stacked by superimposing a driving substrate on which the reading out integrated circuit and a connection portion including copper (Cu) are formed and an imaging element on which a connection portion is formed such that the connection portions contact with each other and then joining the connection portions to each other, and also it is possible to join the connection portions to each other using a solder bump or the like.

Further, a driving method for driving any of the solid-state imaging devices of the first to second aspects of the present disclosure can be made a driving method for a solid-state imaging device, repeating the steps of:

discharging, while charge is accumulated into a photoelectric conversion layer all at once in all imaging elements, the charge in a first electrode to the outside of the system; and transferring the charge accumulated in the photoelectric conversion layer all at once in all imaging elements to the first electrode and, after completion of the transfer, sequentially reading out the charge transferred to the first electrode from the imaging elements.

In such a driving method for the solid-state imaging device, each imaging element is structured such that light incident from the second electrode side is not incident to the first electrode, and while charge is accumulated into the photoelectric conversion layer all at once in all imaging elements, the charge in the first electrode is discharged to the outside of the system. Consequently, resetting of the first electrode can be performed simultaneously with certainty in all imaging elements. Thereafter, the charge accumulated in the photoelectric conversion layer is transferred all at once from all imaging elements to the first electrode, and after completion of the transfer, the charge transferred from the imaging elements to the first electrode is read out sequentially. Therefore, a so-called global shutter function can be implemented readily.

As the imaging element in the present disclosure, a CCD element, a CMOS image sensor, and a signal amplification type image sensor of the CIS (Contact Image Sensor) or CMD (Charge Modulation Device) type can be exemplified. From the solid-state imaging devices according to the first to second aspects of the present disclosure and the solid-state imaging devices of the first to third configurations, for example, a digital still camera, a video camera, a camcorder, a surveillance camera, an in-vehicle camera, a smartphone camera, a user-interface camera for a game, and a biometric authentication camera can be configured. Further, the solid-state imaging devices can be configured such that they can acquire polarization information simultaneously in addition to ordinary imaging. Further, the solid-state imaging devices can be configured so as to image a 3D image.

Working Example 1

Figure 1:
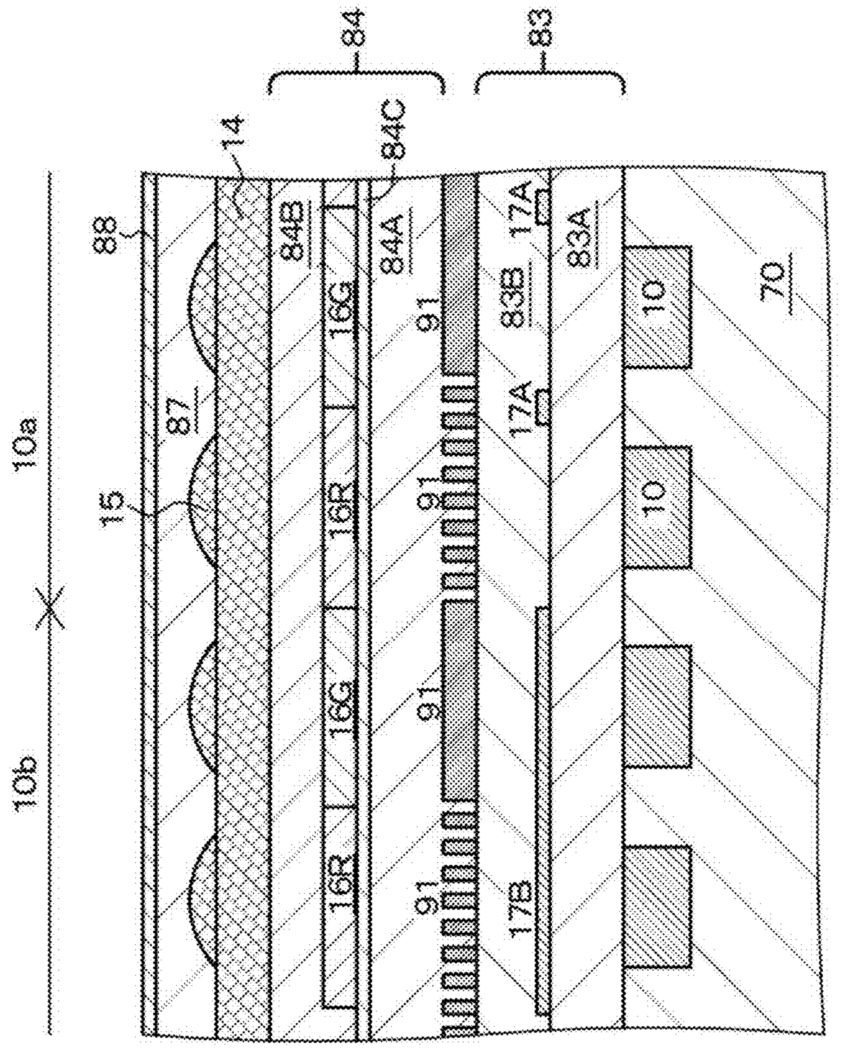
FIG. 1 is a schematic partial sectional view of a solid-state imaging device of a working example 1.
Figure 2:
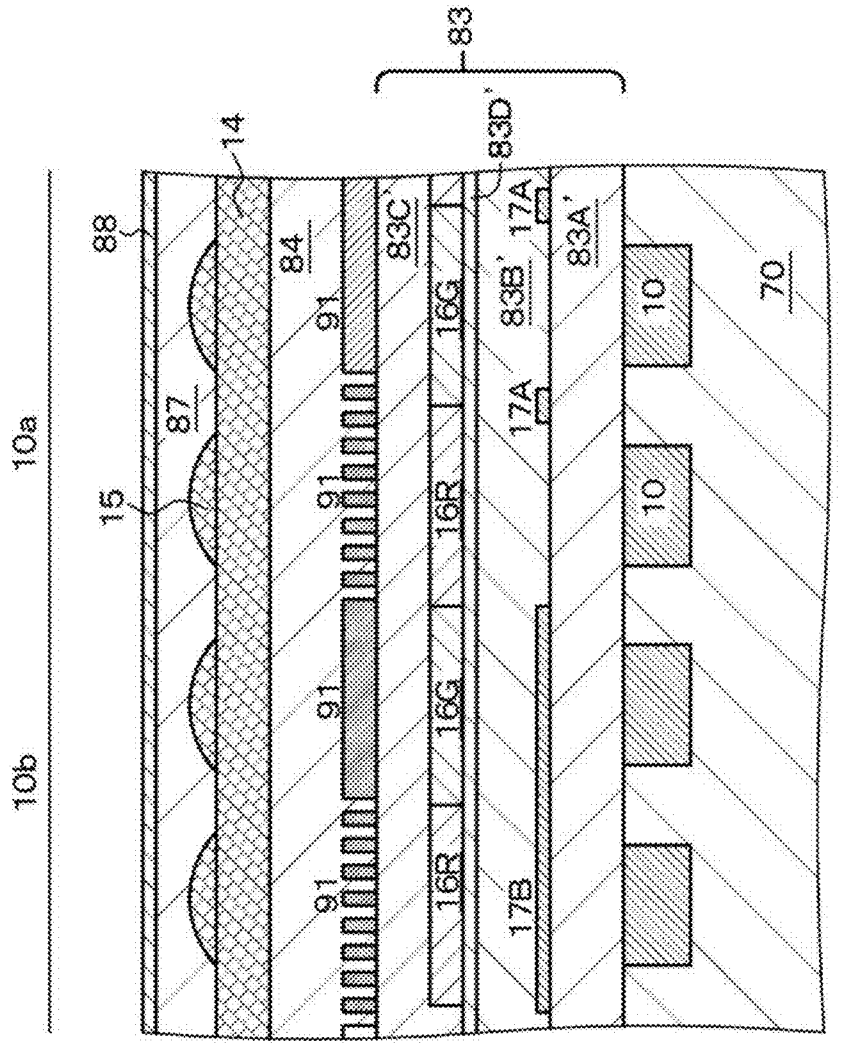
FIG. 2 is a schematic partial sectional view of a solid-state imaging device of a working example 2.
Figure 3:
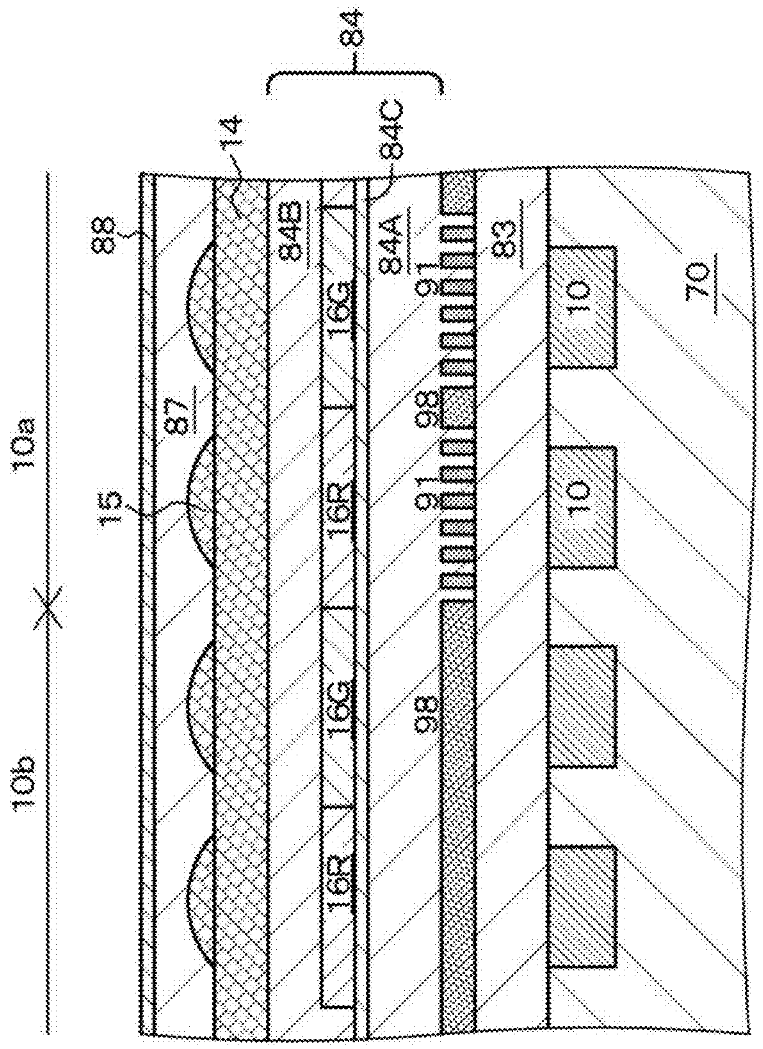
FIG. 3 is a schematic partial sectional view of a solid-state imaging device of a working example 3.
Figure 4:
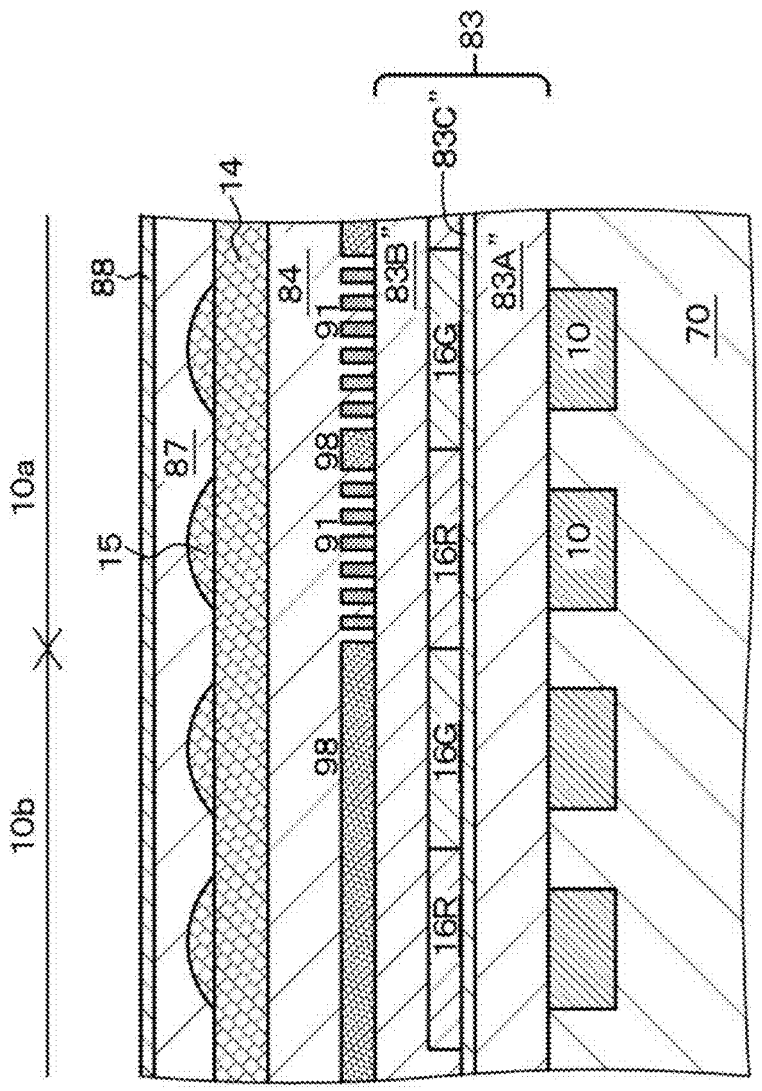
FIG. 4 is a schematic partial sectional view of a solid-state imaging device of a working example 4.
Figure 5:
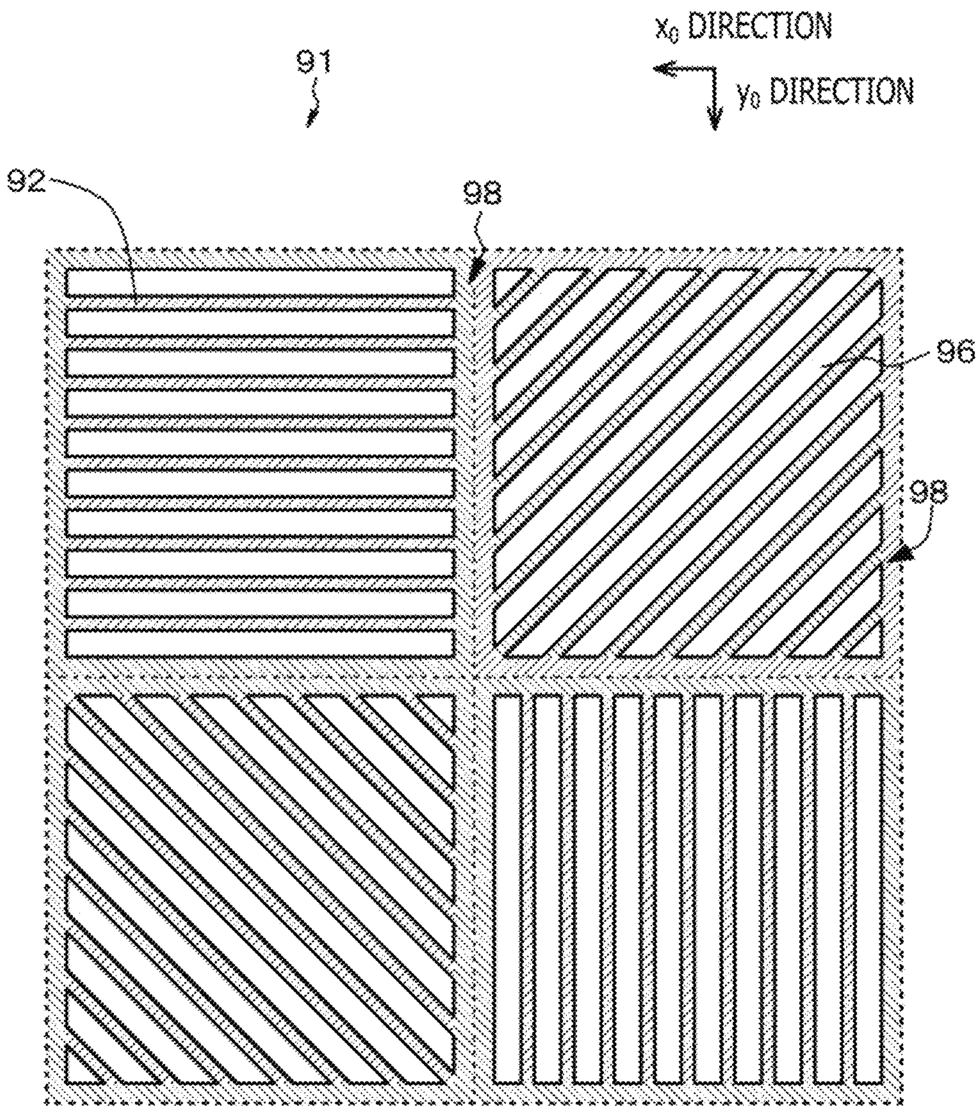
FIG. 5 is a schematic partial plan view of a wire grid polarizer that configures the imaging element in the present disclosure.
Figure 6:
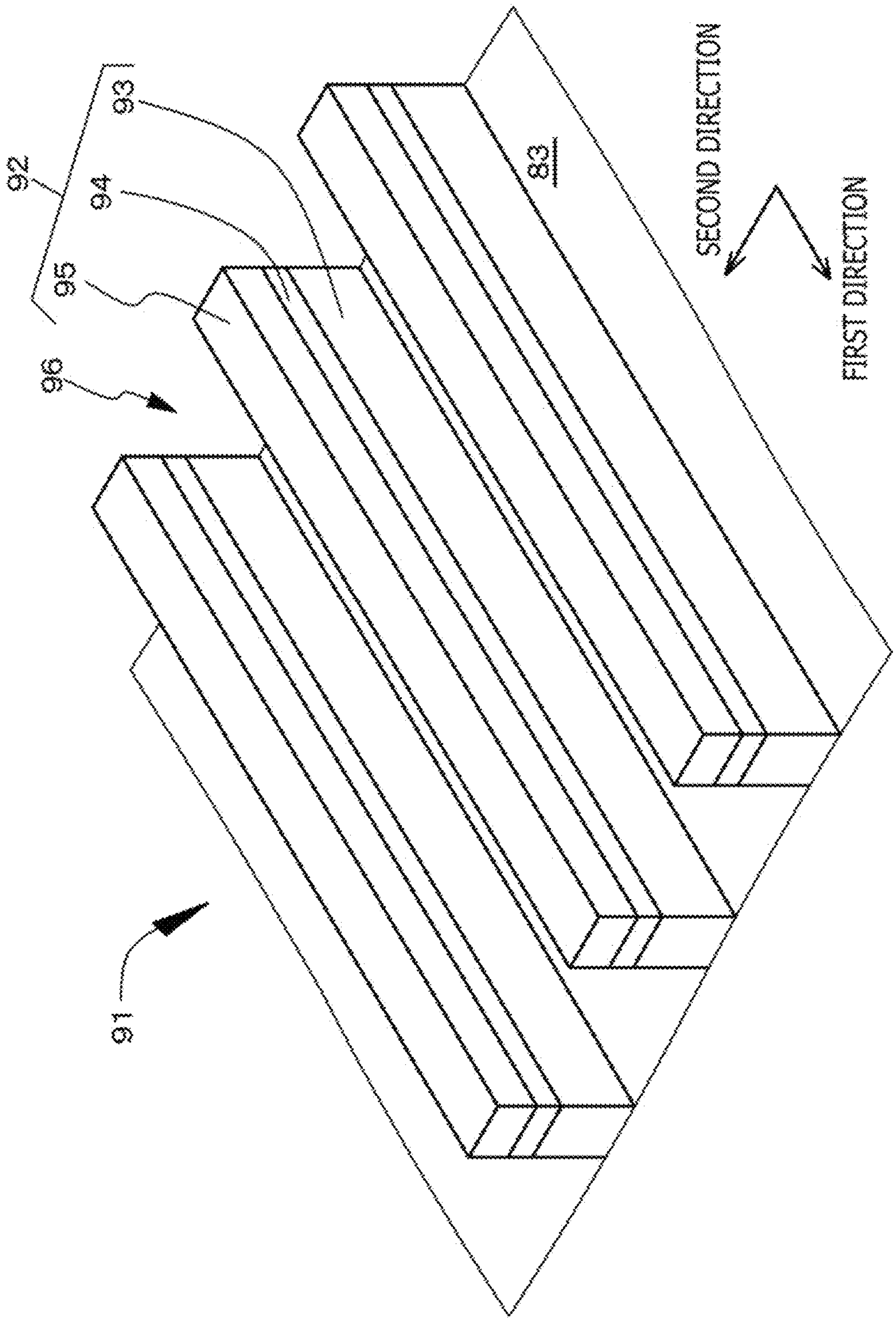
FIG. 6 is a schematic partial perspective view of the wire grid polarizer that configures the imaging element in the present disclosure.
Figure 8A:
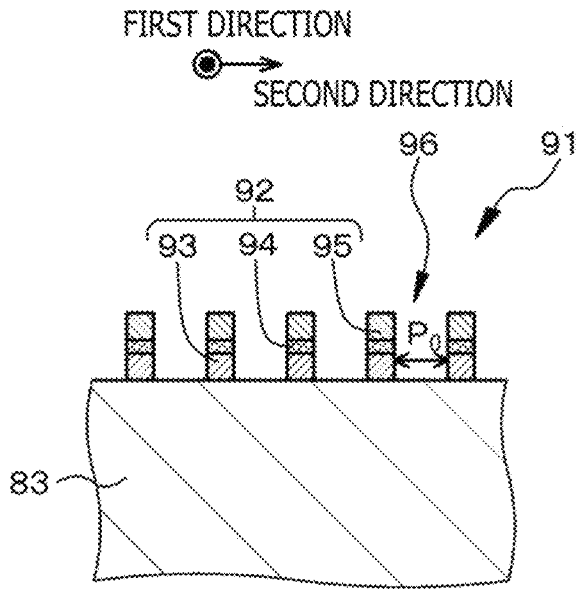
FIGS. 8A and 8B are schematic partial end views of the wire grid polarizer and the modification that configure the imaging element in the present disclosure.
Figure 10A:
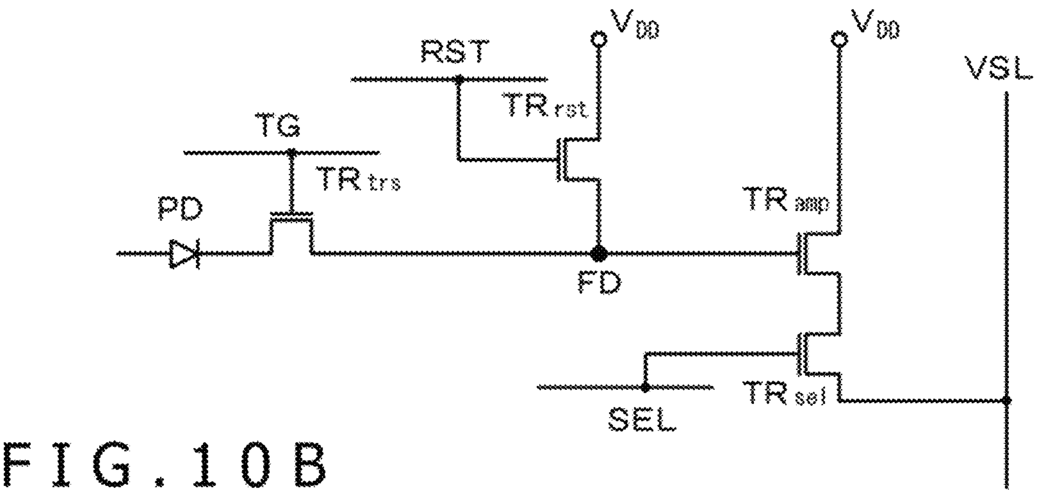
FIGS. 10A and 10B are equivalent circuit diagrams of imaging elements in solid-state imaging devices of working examples 1 and 5, respectively.

The working example 1 relates to a solid-state imaging device according to the first aspect and the second aspect of the present disclosure. A schematic partial end view of the solid-state imaging device of the working example 1 is depicted in FIG. 1. Further, a schematic partial plan view of a wire grid polarizer configuring an imaging element of the working example 1 is depicted in FIG. 5; a partial perspective view is depicted in FIG. 6; and a schematic partial end view is depicted in FIG. 8A. Further, an equivalent circuit diagram to the imaging element in the solid-state imaging device of the working example 1 is depicted in FIG. 10A.

The solid-state imaging device of the working example 1 includes an effective pixel region 10*a* and a peripheral region (not depicted), and an optical black pixel region (OPB) 10*b* is provided between the effective pixel region 10*a* and the peripheral region. Further, the solid-state imaging device of the working example 1 includes an imaging element group in which imaging elements each having a photoelectric conversion portion 10 formed on or above a semiconductor substrate 70 (in the working example 1, particularly on the semiconductor substrate 70)

and further having a wire grid polarizer 91 and an on-chip microlens 15 are arrayed in a two-dimensional matrix, and a first interlayer insulating layer 83 (83A, 83B) and a second interlayer insulating layer 84 (84A, 84B) provided on the light incident side of the photoelectric conversion portions 10, the wire grid polarizer 91 is provided between the first interlayer insulating layer 83 (83A, 83B) and the second interlayer insulating layer 84 (84A, 84B), and the on-chip microlens 15 is provided on the second interlayer insulating layer 84. It is to be noted that the first interlayer insulating layer 83 (83A, 83B) and the second interlayer insulating layer 84 (84A, 84B) are provided from the photoelectric conversion portion side.

Further, in the solid-state imaging device of the working example 1, the first interlayer insulating layer 83 (83A, 83B) and the second interlayer insulating layer 84 (84A, 84B) include an oxide material or a resin material, and the on-chip microlens 15 includes silicon nitride (SiN) or silicon oxynitride (SiON), and particularly includes, in the working example 1, SiN. It is to be noted that, although it is widely known, for example, from Japanese Patent Laid-Open No. 2012-023251 that the on-chip microlens 15 includes SiN, the patent document states that SiN is used as the material having a higher refractive index and does not intend to cause the on-chip microlens 15 to function as a passivation film for the protection of the wire grid polarizer 91.

Further, in the solid-state imaging device of the working example 1, where the first interlayer insulating layers 83A and 83B include a material having a refractive index $n_1$, the second interlayer insulating layers 84A and 84B include a material having a refractive index $n_2$, and the on-chip microlens 15 includes a material having a refractive index $n_0$, $$n_0-n_1\geq 0 \text{ and}$$

$$n_0-n_2\geq 0$$

are satisfied.

In the solid-state imaging device of the working example 1, the imaging elements are arrayed in a two-dimensional matrix in the $x_0$ direction and the $y_0$ direction. The $x_0$ direction is a so-called row direction or a so-called column direction, and the $y_0$ direction is a column direction or a row direction. From the solid-state imaging devices of the working example 1, for example, a digital still camera, a video camera, a camcorder, a surveillance camera, a vehicle-carried camera (in-vehicle camera), a smartphone camera, a user-interface camera for a game, a biometric authentication camera, and so forth are configured.

Further, in the solid-state imaging device of the working example 1, the first interlayer insulating layer 83 is structured such that a first interlayer insulating layer-lower layer 83A and a first interlayer insulating layer-upper layer 83B are stacked, a light shielding portion 17A is provided at a location between the first interlayer insulating layer-lower layer 83A and the first interlayer insulating layer-upper layer 83B positioned above a region between adjacent ones of the imaging elements, the second interlayer insulating layer 84 is structured such that a second interlayer insulating layer-lower layer 84A and a second interlayer insulating layer-upper layer 84B are stacked, and color filter layers (wavelength selection means) 16R and 16G are provided at a location between the second interlayer insulating layer-lower layer 84A and the second interlayer insulating layer-upper layer 84B positioned above the photoelectric conversion portions 10. The wire grid polarizers 91 are covered with the second interlayer insulating layer-lower layer 84A.

Here, as the value of the refractive index $n_1$ of the material configuring the first interlayer insulating layers 83A and 83B, $$1.2\leq n_1\leq 2.5$$

can be exemplified, and particularly is $$n_1\text{(average value)}=1.45$$

and as the value of the refractive index $n_2$ of the material configuring the second interlayer insulating layers 84A and 84B, $$1.2\leq n_2\leq 2.5$$

can be exemplified, and particularly is $$n_2\text{ (average value)}=1.45.$$

Further, where the refractive index of the material configuring the on-chip microlenses 15 is represented as $n_0$, $$1.4\leq n_0\leq 2.5$$

can be exemplified, and particularly is $$n_0=1.9.$$

Here, the first interlayer insulating layer-lower layer 83A, the first interlayer insulating layer-upper layer 83B, and the second interlayer insulating layer-lower layer 84A include $SiO_2$, and the second interlayer insulating layer-upper layer 84B includes an acrylic resin. Between the second interlayer insulating layer-lower layer 84A and the color filter layers 16R and 16G, a color filter layer-underlayer 84C including an acrylic resin (refractive index=1.45) is formed.

The wire grid polarizers 91 are formed over from the effective pixel region 10*a* to the optical black pixel region 10*b*. A light shielding portion 17B is formed also in the optical black pixel region (OPB) 10*b*. Further, as depicted in a schematic partial plan view of FIG. 5, frame portions 98 that individually surround the wire grid polarizers 91 are provided, and the frame portions 98 and line portions 92 of the wire grid polarizers 91 are connected to each other. The frame portions 98 have a structure same as the line portions 92 of the wire grid polarizers 91. It is to be noted that, in FIGS. 1 to 4, the frame portions 98 are not depicted. In the example depicted in FIG. 5, an imaging element in which the angle defined by an array direction of the plurality of imaging elements and the first direction is 0 degrees, another imaging element in which the angle is 45 degrees, a further imaging element in which the angle ($\alpha$) is 90 degrees, and a still further imaging element in which the angle is 135 degrees are combined. Under the on-chip microlenses 15, an on-chip microlens underlayer 14 including SiN is formed integrally with the on-chip microlenses 15.

The on-chip microlens 15 can be produced by a well-known method. In particular, after an on-chip microlens underlayer 14 is formed on a second interlayer insulating layer 84, a resist layer is formed on the on-chip microlens underlayer 14 and is patterned. Then, the resist film is heated to provide a shape similar to that of the on-chip microlenses to the resist layer, and the on-chip microlenses 15 can thereafter be formed by etching back the resist film and the on-chip microlens underlayer 14.

The wire grid polarizer 91 has a line-and-space structure. A space portion is denoted by reference sign 96. A line portion 92 of the wire grid polarizer 91 includes a stack structure (first stack structure) in which, from the opposite side to the light incident side (in the working example 1, from the photoelectric conversion portion side), a light reflection layer 93 including a first conductive material (particularly, aluminum (Al)), an insulating film 94 including $SiO_2$, and a light absorption layer 95 including a second conductive material (particularly, tungsten (W)) are stacked. The insulating film 94 is formed over the overall area of a top face of the light reflection layer 93, and the light absorption layer 95 is formed over the overall area of a top face of the insulating film 94. In particular, the light reflection layer 93 includes aluminum (Al) of 150 nm thick; the insulating film 94 includes $SiO_2$ of 25 or 50 nm thick; and the light absorption layer 95 includes tungsten (W) of 25 nm thick. The light reflection layer 93 has a function as a polarizer, and attenuates a polarized wave having an electric field component in a direction parallel to a direction in which the light reflection layer 93 extends (first direction) from within light incident to the wire grid polarizer 91 but transmits a polarized wave having an electric field component in a direction orthogonal to the direction in which the light reflection layer 93 extends (in the second direction). The first direction is a light absorption axis of the wire grid polarizer 91 and the second direction is a light transmission axis of the wire grid polarizer 91. Although an underlayer including Ti, Tin or a stack structure of Ti/TiN between the first interlayer insulating layer-upper layer 83B and the light reflection layer 93, the underlayer is not depicted.

In the solid-state imaging device of the working example 1, the light reflection layer 93, the insulating film 94, and the light absorption layer 95 are common to the imaging elements. The optical black pixel region (OPB) is occupied by a structure same as that of the frame portions 98 (refer to FIG. 5) including the light reflection layer 93, the insulating film 94, and the light absorption layer 95.

The wire grid polarizer 91 can be produced by the following method. In particular, an underlayer (not depicted) including Ti, TiN or a stack structure of Ti/TiN and a light reflection layer formation layer 93A including a first conductive material (particularly, aluminum) are provided on the basis of a vacuum deposition method on a first interlayer insulating layer-upper layer 83B (refer to FIGS. 123A and 123B). Then, an insulating film formation layer 94A is provided on the light reflection layer formation layer 93A, and a light absorption layer formation layer 95A including a second conductive material is provided on the insulating film formation layer 94A. In particular, an insulating film formation layer 94A including $SiO_2$ is formed on the basis of a CVD method on the light reflection layer formation layer 93A (refer to FIG. 123C). Then, a light absorption layer formation layer 95A including tungsten (W) is formed on the insulating film formation layer 94A by a sputtering method. A structure depicted in FIG. 123D can be obtained in this manner.

Thereafter, by patterning the light absorption layer formation layer 95A, the insulating film formation layer 94A, the light reflection layer formation layer 93A, and the underlayer on the basis of a lithography technology and a dry etching technology, a wire grid polarizer 91 having a line-and-space structure in which a plurality of line portions (stack structures) 92 of the belt-shaped light reflection layer 93, the insulating film 94, and the light absorption layer 95 is juxtaposed in a spaced relation from each other. It is sufficient if a second interlayer insulating layer 84 is thereafter formed on the basis of a CVD method so as to cover the wire grid polarizer 91. The space between a wire grid polarizer 91 and another wire grid polarizer 91 is occupied by the frame portion 98 (refer to FIG. 5) including the light reflection layer 93, the insulating film 94, and the light absorption layer 95, and the optical black pixel region (OPB) and the peripheral region are occupied by stack structures of a configuration same as that of the frame portions 98.

By connecting the frame portions 98 and the line portion 92 of the wire grid polarizer 91 to each other in this manner, and by configuring the frame portions 98 in a same structure as that of the line portions 92 of the wire grid polarizer 91, the wire grid polarizer 91 that is homogeneous and uniform can be formed stably. Therefore, such problems that exfoliation occurs at portions of an outer periphery of the wire grid polarizer 91 corresponding to the four corners of the imaging element, that a difference occurs between the structure of an outer peripheral portion of the wire grid polarizer 91 and a central portion of the wire grid polarizer 91 and the performance of the wire grid polarizer 91 itself is deteriorated and that light incident to the outer peripheral portion of the wire grid polarizer 91 is liable to leak into an adjacent imaging element having a different polarization direction can be eliminated, and an imaging element and a solid-state imaging device having high reliability can be provided.

The on-chip microlens 15 and the on-chip microlens underlayer 14 are covered with a low refractive index layer 87 of a refractive index of 1.41, and a protective layer 88 including $SiO_2$ is formed on the low refractive index layer 87. A glass plate (not depicted) is disposed on the protective layer 88. As the material for configuring the light shielding portions 17A and 17B, chromium (Cr), copper (Cu), aluminum (Al), tungsten (W) and a resin that is impervious to light (for example, a polyimide resin) can be exemplified, and in the working example 1, the light shielding portions 17A and 17B particularly include, for example, aluminum (Al) or tungsten (W) or from the material described above. Also it is possible to cause the light shielding portions 17A and 17B to function as wiring layers (wirings).

The imaging element of the working example 1 depicted in FIG. 1 is an imaging element of the front-illuminated type. Further, the photoelectric conversion portions 10 having a well-known configuration and structure are formed by a well-known method in the semiconductor substrate 70. Further, a circuit for driving the photoelectric conversion portions 10 can be a well-known circuit.

In particular, a transfer transistor $TR_{trs}$ depicted only in FIG. 10A includes a gate portion connected to a transfer gate line TG, a channel formation region, one of source/drain regions connected to a high concentration impurity region (or having a region shared by the high concentration impurity region) and the other of source/drain regions configuring a floating diffusion layer.

A reset transistor $TR_{rst}$ depicted only in FIG. 10A includes a gate portion, a channel formation region, and source/drain regions. The gate portion of the reset transistor $TR_{rst}$ is connected to a reset line RST and one of the source/drain regions of the reset transistor $TR_{rst}$ is connected to a power supply $V_{DD}$ while the other of the source/drain regions serves also as a floating diffusion layer FD.

An amplification transistor $TR_{amp}$ depicted only in FIG. 10A includes a gate portion, a channel formation region and source/drain regions. The gate portion is connected to the other one (floating diffusion layer FD) of the source/drain regions of the reset transistor $TR_{rst}$ via a wiring layer. Meanwhile, the one of source/drain regions is connected to the power supply $V_{DD}$.

A selection transistor $TR_{sel}$ depicted only in FIG. 10A includes a gate portion, a channel formation region and source/drain regions. The gate portion is connected to a selection line SEL. One of the source/drain regions has a region shared with the other of the source/drain regions configuring to amplification transistor $TR_{amp}$, and the other of the source/drain regions is connected to a signal line (data output line) VSL (117).

A series of operations such as charge accumulation, reset operation and charge transfer of an imaging element are similar to a series of operations of a conventional imaging element such as charge accumulation, reset operation and charge transfer, and therefore, detailed description of them is omitted.

The photoelectric conversion portions 10, the transfer transistor $TR_{trs}$, the reset transistor $TR_{rst}$, the amplification transistor $TR_{amp}$, and the selection transistor $TR_{sel}$ include the first interlayer insulating layer-lower layer 83A.

Figure 11:
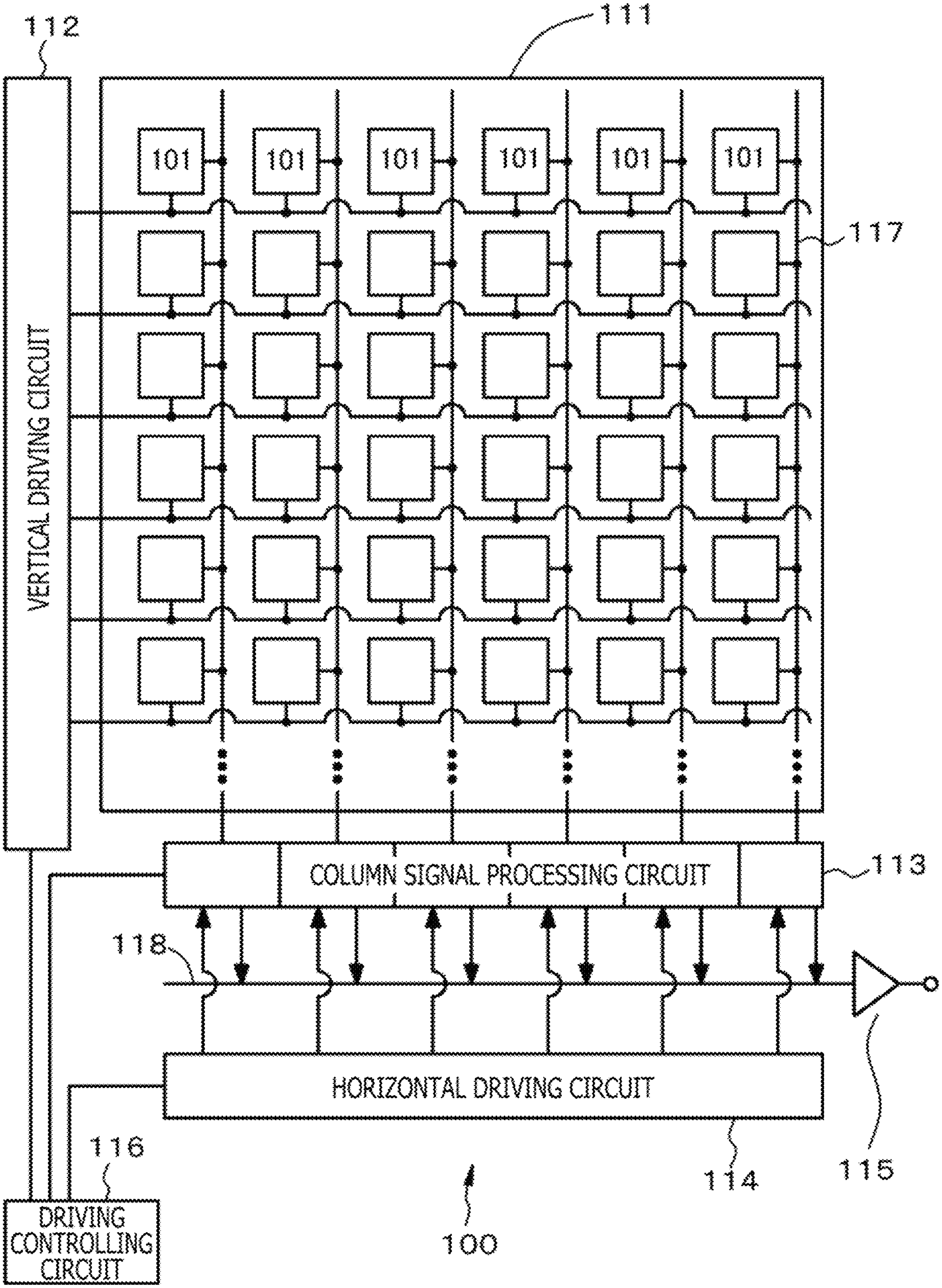
FIG. 11 is a conceptual diagram of the solid-state imaging device of the working example 1.

FIG. 11 depicts a conceptual diagram of the solid-state imaging device of the working example 1. The solid-state imaging device 100 of the working example 1 includes an imaging region 111 in which imaging elements 101 are arrayed in a two-dimensional array, and a vertical driving circuit 112 as a driving circuit (peripheral circuit) for the imaging elements 101, a column signal processing circuit 113, a horizontal driving circuit 114, an outputting circuit 115, a driving controlling circuit 116 and so forth. It is a matter of course that the circuits mentioned can include well-known circuits and can be configured using some other circuit configuration (for example, various circuits used in a conventional CCD imaging device or CMOS imaging device). In FIG. 11, an indication of reference sign "101" for the imaging elements 101 is given only for one row.

The driving controlling circuit 116 generates a clock signal to be used as a reference for operation of the vertical driving circuit 112, column signal processing circuit 113 and horizontal driving circuit 114 and control signals on the basis of a vertical synchronizing signal, a horizontal synchronizing signal and a master clock. Then, the generated clock signal and control signals are inputted to the vertical driving circuit 112, the column signal processing circuit 113, and the horizontal driving circuit 114.

The vertical driving circuit 112 is configured, for example, from a shift register and performs sequential selection scanning in the vertical direction of the imaging elements 101 in the imaging region 111 in a unit of a row. Then, a pixel signal (image signal) based on current (signal) generated in accordance with a reception light amount at each imaging element 101 is sent to the column signal processing circuit 113 through a signal line (data output line) 117, VSL.

The column signal processing circuit 113 is disposed, for example, for each column of the imaging elements 101 and performs signal processing such as noise removal and signal amplification of image signals outputted from the imaging elements 101 for one row with a signal from a black reference pixel (not depicted, formed around the effective pixel region) for each imaging element. At the output stage of the column signal processing circuit 113, a horizontal selection switch (not depicted) is provided and connected between the column signal processing circuit 113 and a horizontal signal line 118.

The horizontal driving circuit 114 includes, for example, a shift register and sequentially selects each of the column signal processing circuits 113 by sequentially outputting a horizontal scanning pulse and outputs a signal from each of the column signal processing circuits 113 to the horizontal signal line 118.

The outputting circuit 115 performs signal processing for and outputs a signal sequentially supplied thereto from each of the column signal processing circuits 113 through the horizontal signal line 118.

In the following, a disposition relation between the wire grid polarizer 91 and the photoelectric conversion portion 10 is described. It is to be noted that, in a plan layout diagram of the imaging element unit depicted in FIGS. 12 to 24, "R" denotes a red light imaging element (photoelectric conversion element) including a red color filter layer; "G" denotes a green light imaging element (photoelectric conversion element) including a green color filter layer; "B" denotes a blue light imaging element (photoelectric conversion element) including a blue color filter layer; and "W" denotes a white light imaging element (photoelectric conversion element) that does not include a color filter layer (or includes a transparent resin layer). Although each wire grid polarizer is indicated by hatching lines, the direction orthogonal to the direction in which the hatching lines extend indicates a polarization direction of light to be transmitted by the wire grid polarizer (or a polarizer segment). This similarly applies also in the following description.

Figure 12:
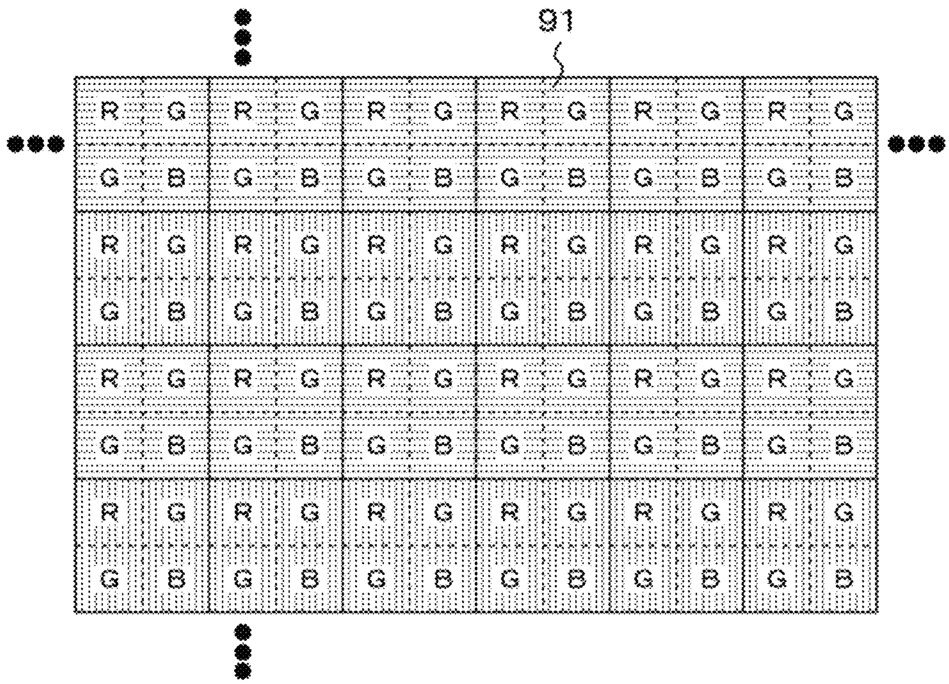
FIG. 12 is a plan layout diagram of imaging elements in the present disclosure having a Bayer array.
Figure 13:
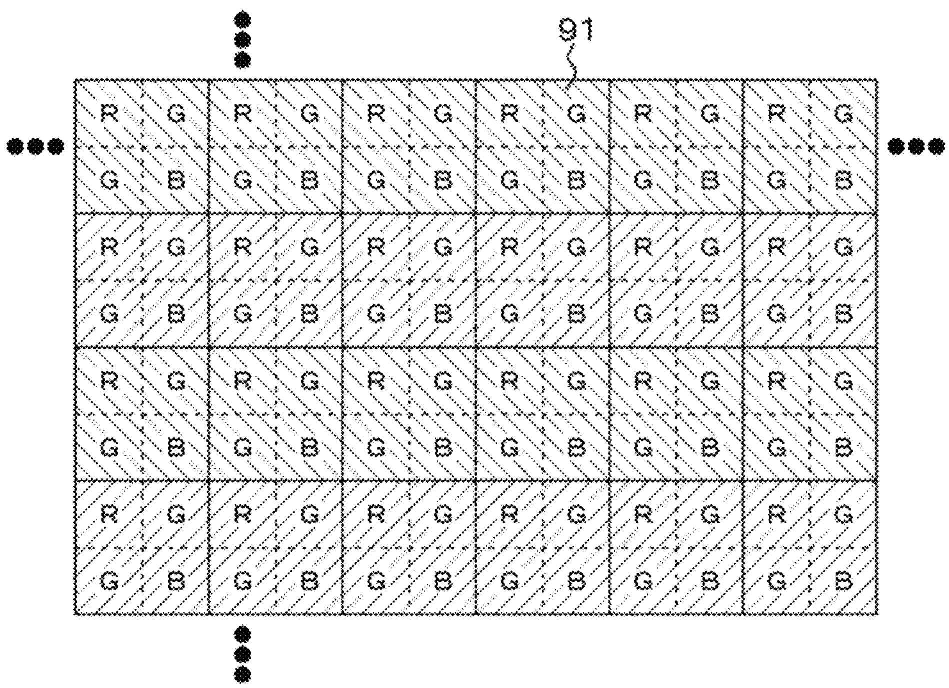
FIG. 13 is a plan layout diagram of a modification of the imaging elements in the present disclosure having a Bayer array.

As depicted in FIG. 12, it is possible to apply a combination of an imaging element in which the angle defined by the array direction of a plurality of imaging elements and the first direction is, for example, 0 degrees and another imaging element in which the angle is 90 degrees. Further, as depicted in FIG. 13, it is possible to apply a combination of an imaging element in which the angle defined by the array direction of the plurality of imaging elements and the first direction is, for example, 45 degrees and another imaging element in which the angle is 135 degrees.

Figure 14:
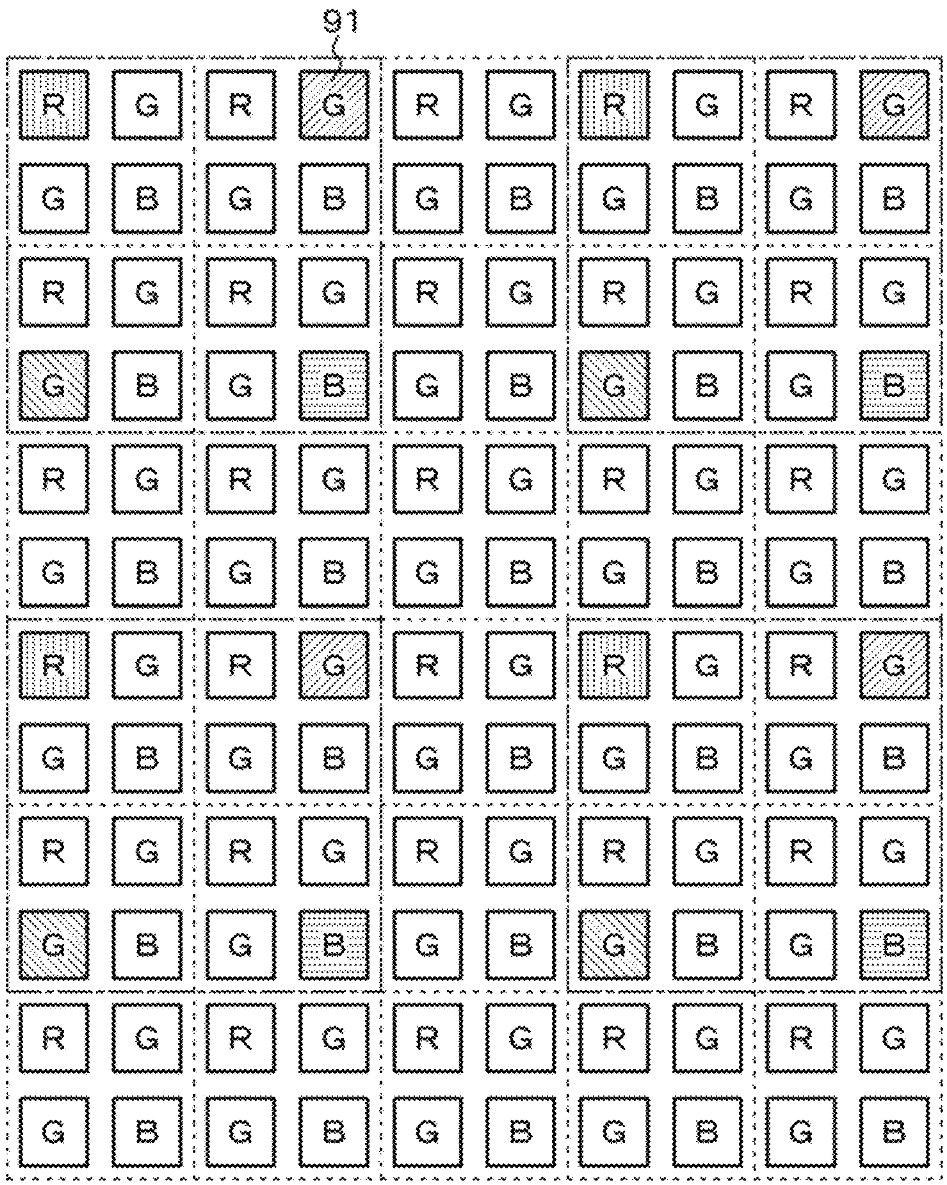
FIG. 14 is a plan layout diagram of another modification of the imaging elements in the present disclosure having a Bayer array.
Figure 34A:
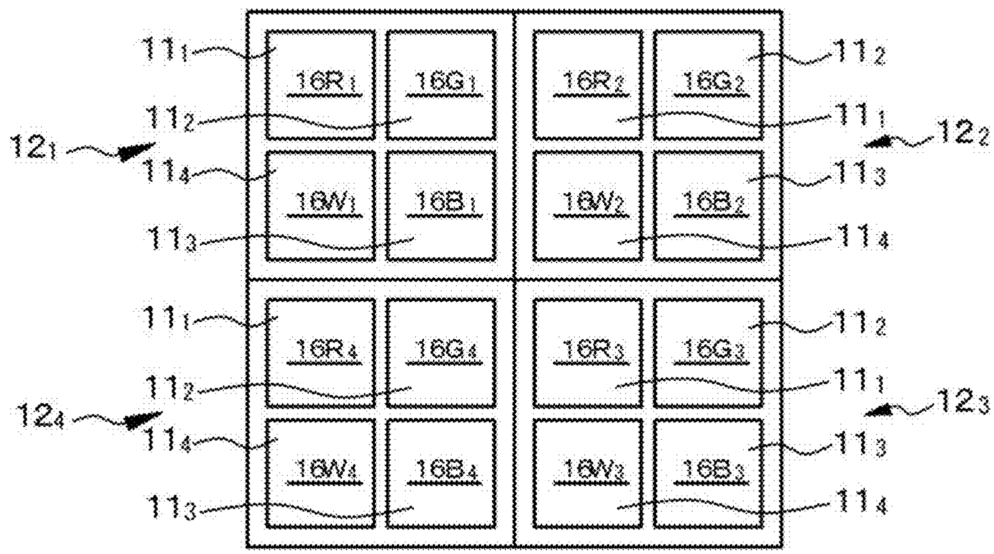
FIGS. 34A and 34B are a schematic layout diagram of a color filter layer configuring a red light stacked-type imaging element, a green light stacked-type imaging element, a blue light stacked-type imaging element, and a white light stacked-type imaging element and so forth and a schematic layout diagram of wire grid polarizers in a working example 6, respectively.
Figure 34B:
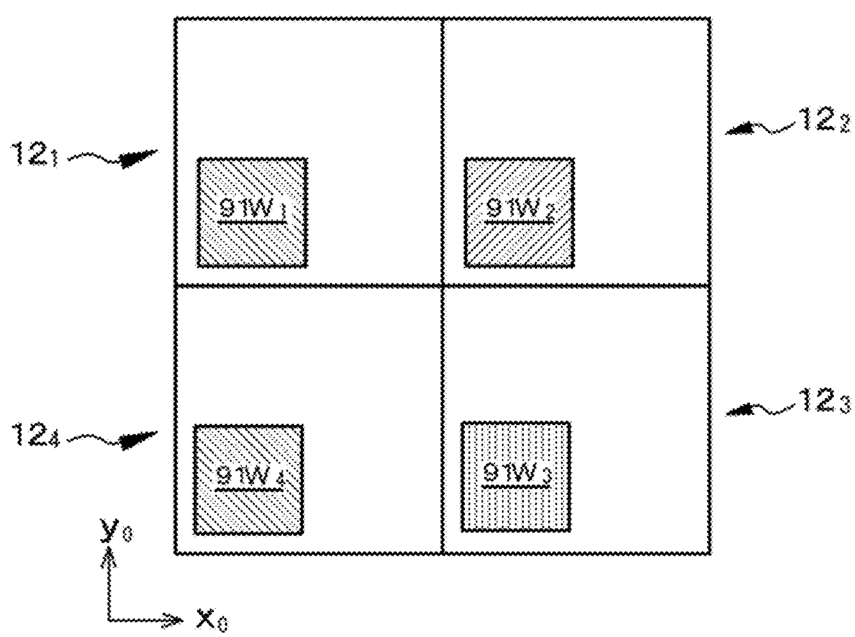

As depicted in FIG. 34B, white light imaging elements W having a wire grid polarizer 91 may be disposed skipping one imaging element in the $x_0$ direction and the $y_0$ direction. It is to be noted that, in regard to FIG. 34, detailed description is hereinafter given. Alternatively, the white light imaging elements W may be disposed skipping two imaging elements or three imaging elements, or imaging elements having the wire grid polarizer 91 may be disposed in a houndstooth pattern. The plan layout diagram depicted in FIG. 14 is a modification of the example depicted in FIG. 34B.

Figure 15:
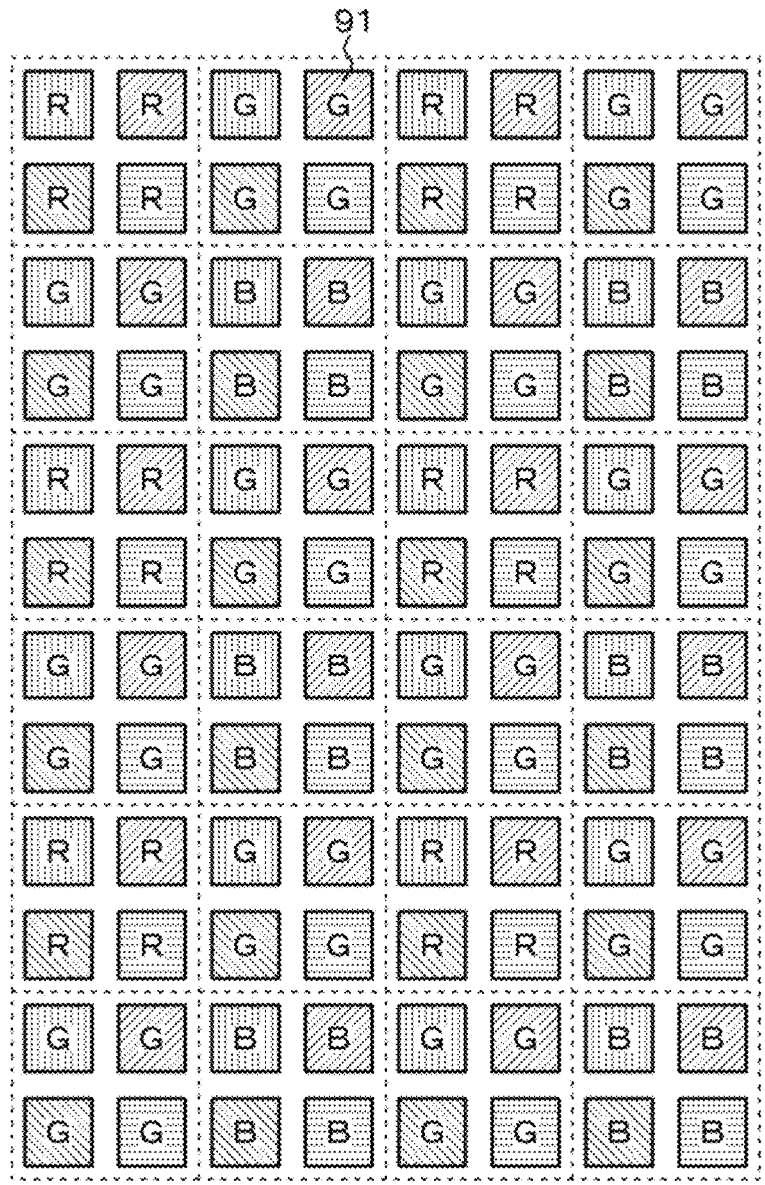
FIG. 15 is a plan layout diagram of a further modification of the imaging elements in the present disclosure having a Bayer array.
Figure 16:
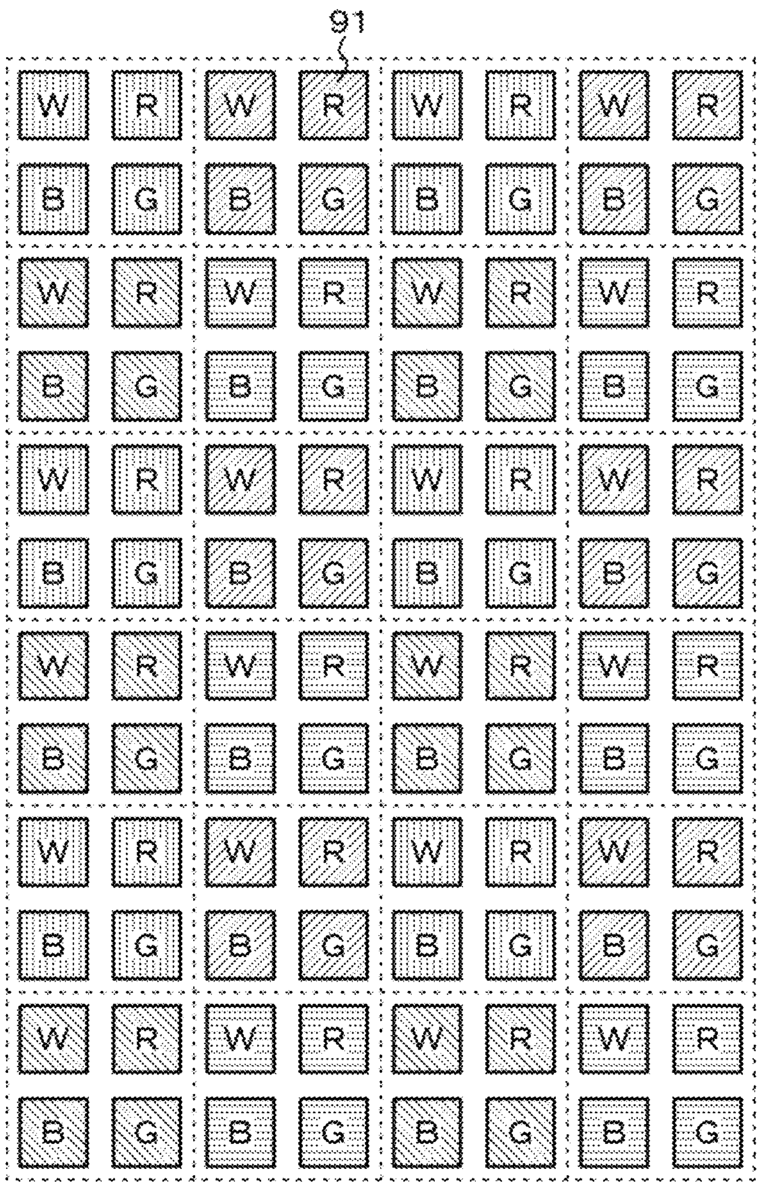
FIG. 16 is a plan layout diagram of a still further modification of the imaging elements in the present disclosure having a Bayer array.
Figure 17:
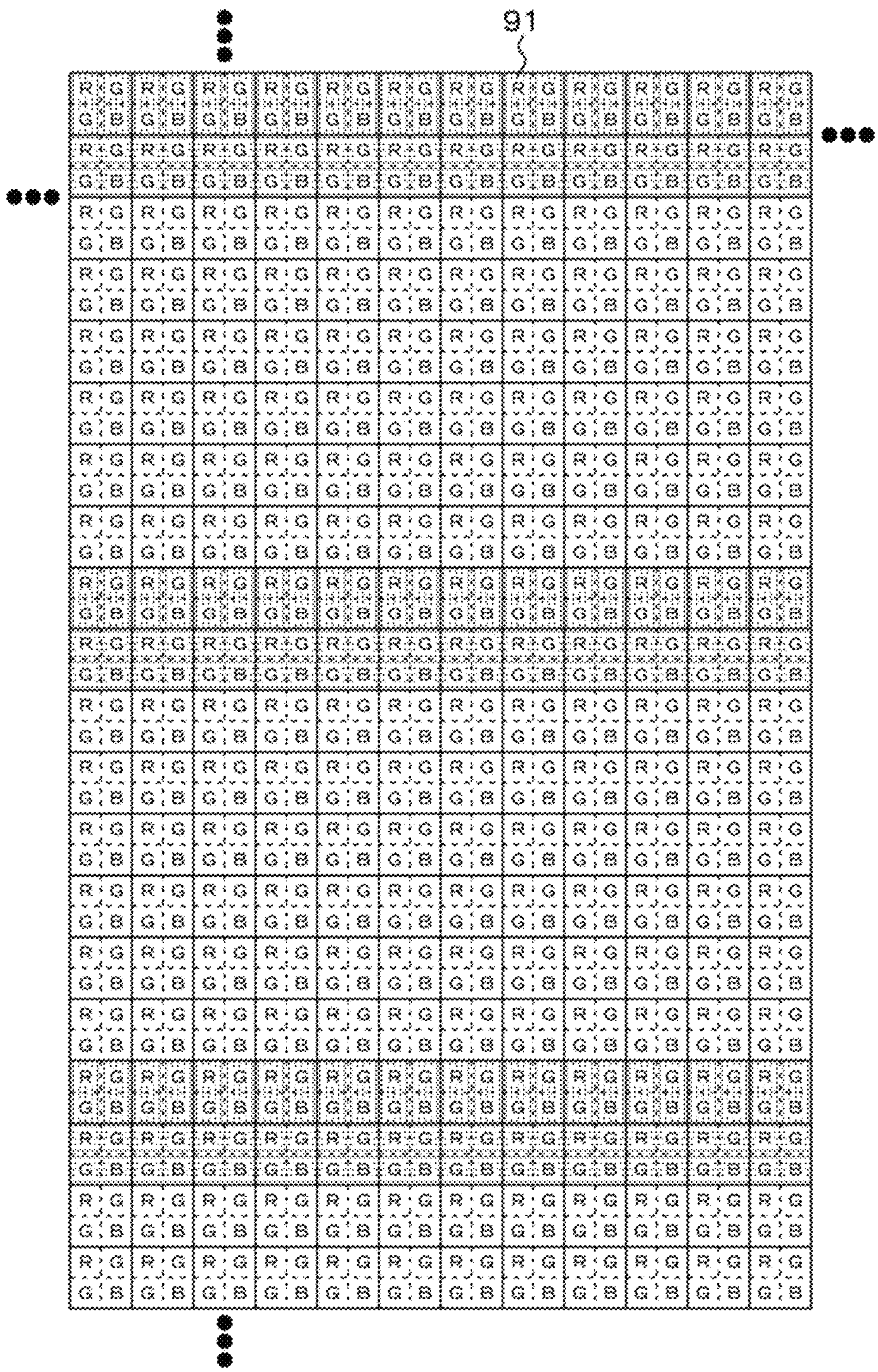
FIG. 17 is a plan layout diagram of a yet further modification of the imaging elements in the present disclosure having a Bayer array.
Figure 18:
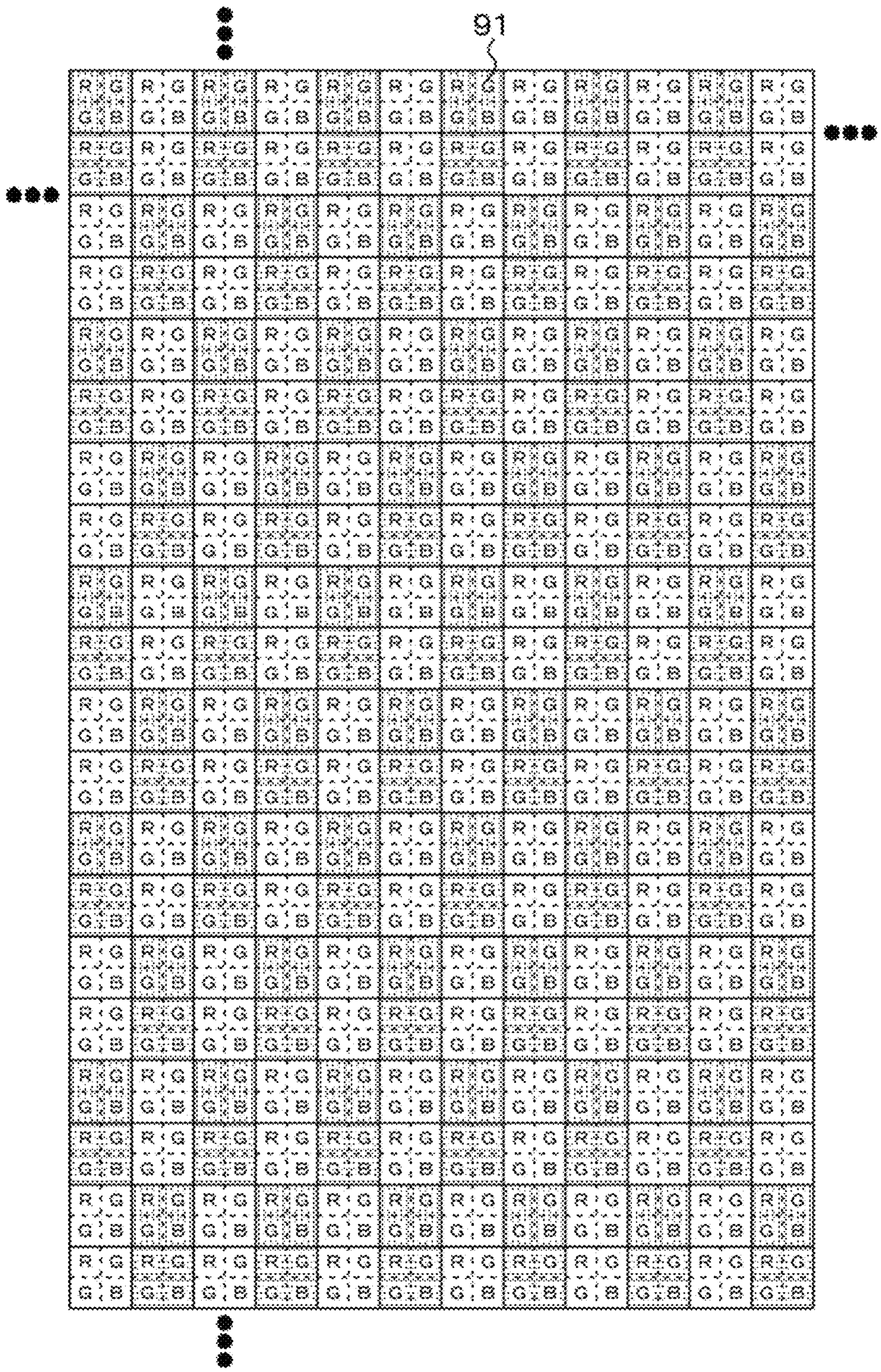
FIG. 18 is a plan layout diagram of a yet further modification of the imaging elements in the present disclosure having a Bayer array.
Figure 19:
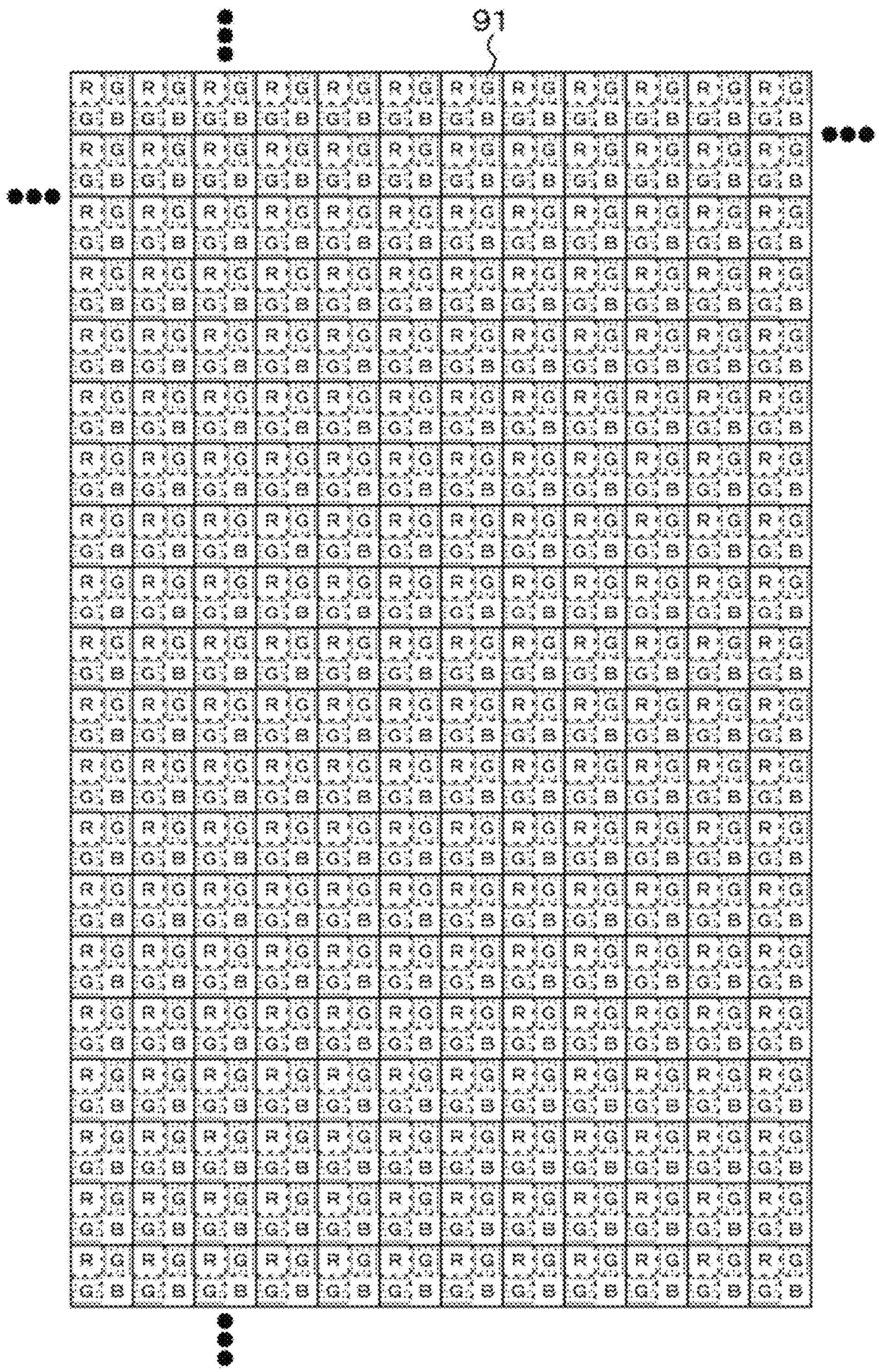
FIG. 19 is a plan layout diagram of a yet further modification of the imaging elements in the present disclosure having a Bayer array.
Figure 20:
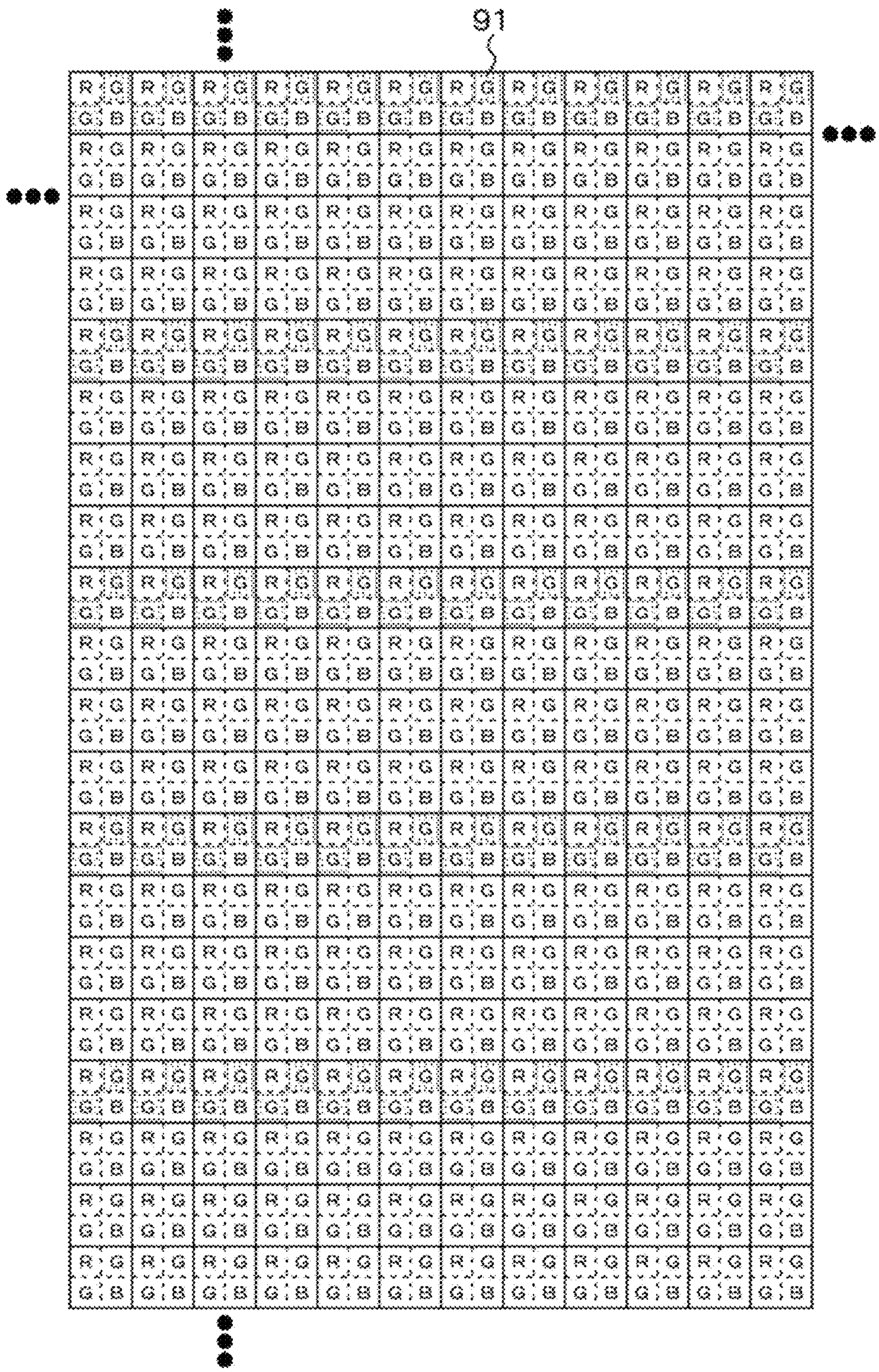
FIG. 20 is a plan layout diagram of a yet further modification of the imaging elements in the present disclosure having a Bayer array.
Figure 21:
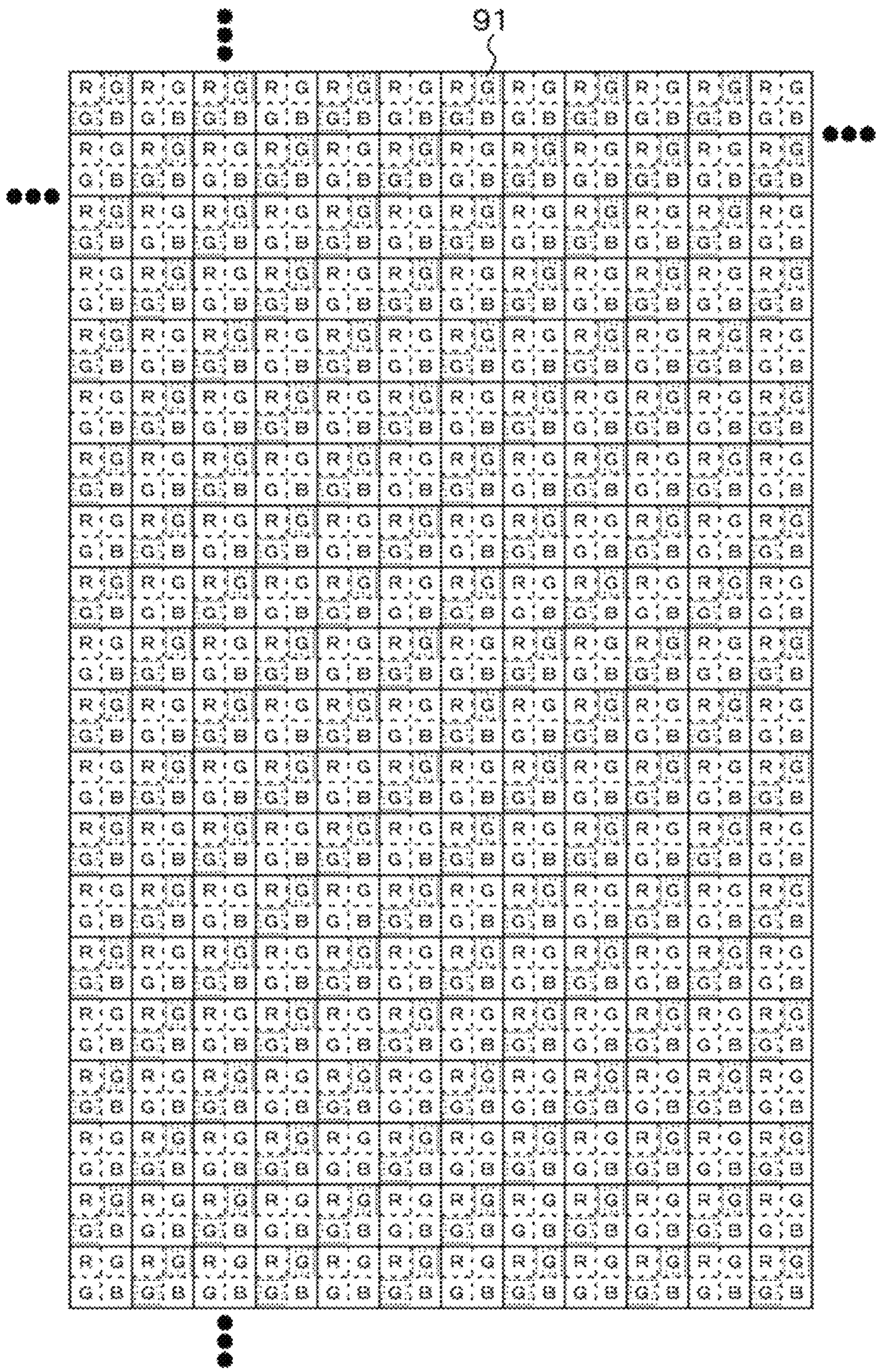
FIG. 21 is a plan layout diagram of a yet further modification of the imaging elements in the present disclosure having a Bayer array.
Figure 22:
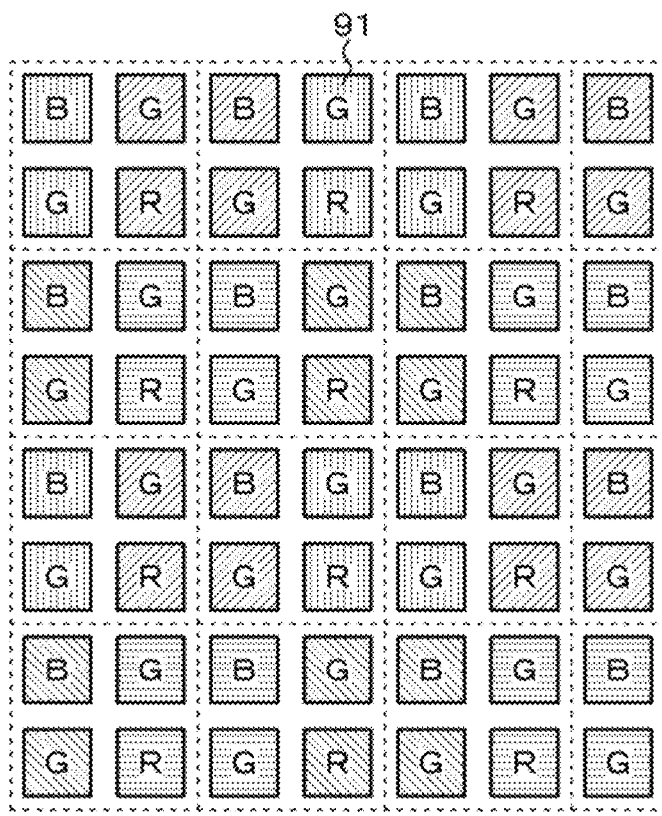
FIG. 22 is a plan layout diagram of a yet further modification of the imaging elements in the present disclosure having a Bayer array.
Figure 23:
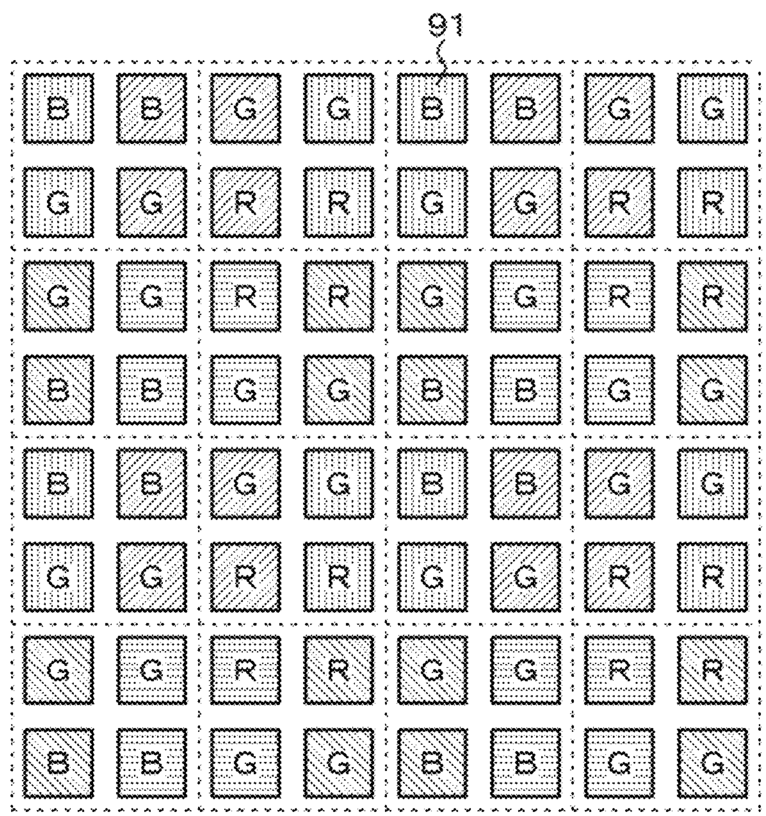
FIG. 23 is a plan layout diagram of a yet further modification of the imaging elements in the present disclosure having a Bayer array.
Figure 24:
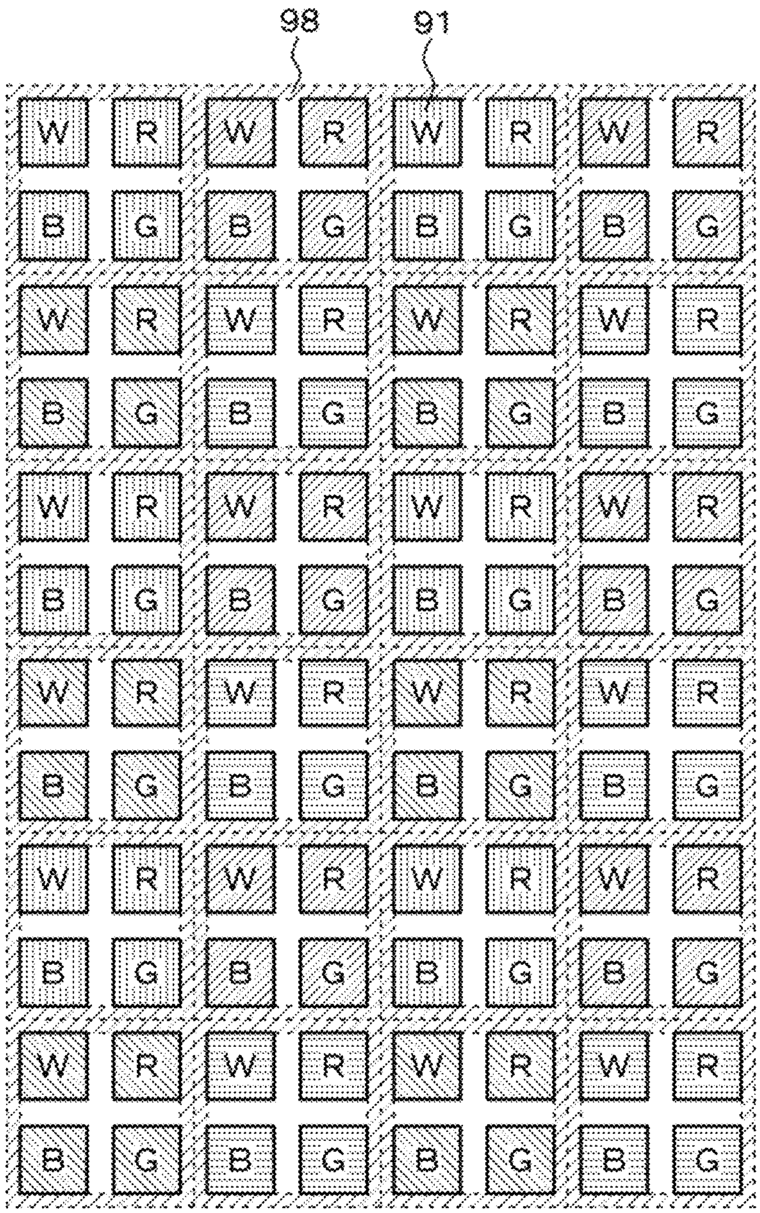
FIG. 24 is a plan layout diagram of a yet further modification of the imaging elements in the present disclosure having a Bayer array.

Also it is possible to apply a configuration of a planar layout depicted in FIG. 15 or 16. Here, in the case of a CMOS image sensor having the planar layout depicted in FIG. 15, a 2×2 pixel sharing method of sharing a selection transistor, a reset transistor and an amplification transistor in 2×2 imaging elements can be adopted. Thus, in an imaging mode in which pixel addition is not performed, imaging including polarization information is performed, but in a mode in which accumulated charge in the 2×2 subpixel region is FD added, an ordinary captured image in which all polarization components are integrated can be provided. Further, in the case of the planar layout depicted in FIG. 16, since it is a layout in which wire grid polarizers 91 for one direction are disposed for 2×2 imaging elements, discontinuity of a stack structure is less likely to occur between imaging element units, and polarization imaging of high quality can be implemented.

Furthermore, also it is possible to apply such configurations whose planar layouts are depicted in FIGS. 17, 18, 19, 20, 21, 22, 23, and 24.

In the solid-state imaging device of the working example 1, by defining materials for configuring the first interlayer insulating layer, second interlayer insulating layer and on-chip microlenses, especially by defining a material for configuring the on-chip microlenses, it is possible to cause the on-chip microlenses to function as a passivation film. Alternatively, in the solid-state imaging device of the working example 1, a refractive index difference of materials configuring the first interlayer insulating layer, the second interlayer insulating layer, and the on-chip microlens is defined. Therefore, occurrence of such a problem that, as a result of occurrence of abnormal precipitation of a metal material or the like configuring the wire grid polarizer or shape change of the wire grid polarizer, the performance of the wire grid polarizer or the imaging element, which is expected originally, is impaired can be avoided with certainty. Besides, since formation of a conventional passivation film can be omitted, the thickness of a portion of the imaging element positioned above the photoelectric conversion portion can be reduced further. In particular, for example, in comparison with a conventional imaging element, the thickness of a portion of the imaging element positioned above the photoelectric conversion portion can be reduced by approximately 10%. Further, as a result of being able to further reduce the thickness of a portion of the imaging element positioned above the photoelectric conversion portion, reduction of optical crosstalk and mixture of polarized light (polarization crosstalk) can be minimized and prevention of extinction ratio deterioration and ripple generation can be achieved effectively. Further, if a large number of layers of different refractive indices are stacked, then generally the sensitivity is deteriorated. However, in the solid-state imaging device of the working example 1, since the stack number of layers of different refractive indices can be reduced, suppression of sensitivity deterioration can be achieved effectively. Besides, since the wire grid polarizer is an absorption type wire grid polarizer having a light absorption layer, the light reflectance is low and the influence of stray light, flare and so forth upon a video can be reduced.

Further, since the solid-state imaging device of the working example 1 includes the wire grid polarizer, it can be made a solid-state imaging device that can acquire polarization information simultaneously in addition to ordinary imaging. In other words, a polarization separation function for spatially polarizing and separating polarization information of incident light can be given to the solid-state imaging device. In particular, since each imaging element can acquire a light intensity, a polarization component intensity and a polarization direction, it is possible to process image data on the basis of the polarization information, for example, after imaging. For example, by applying a desired process to a portion of a captured image of the sky or a glass window, a portion of a captured image of the water surface or the like, it is possible to emphasize or reduce a polarized light component or separate a polarized light component and a non-polarized light component from each other thereby to perform improvement of the contrast of the image or deletion of unnecessary information. It is to be noted that such processing can be performed, for example, by defining an imaging mode when imaging is to be performed using the solid-state imaging device. Furthermore, by the solid-state imaging device, removal of reflection on the glass window can be performed, and by adding polarization information to image information, sharpening of the boundary (contour) between a plurality of bodies can be achieved. Further, also it is possible to perform detection of a state of the road surface or detection of an obstacle on the road surface. Furthermore, it is possible to apply the solid-state imaging device to meteorological observation and various fields such as imaging of a design pattern reflecting birefringence of a body, measurement of a retardation distribution, acquisition of a polarizing microscope image, acquisition of a surface shape of a body or measurement of a surface shape of a body, detection of a mobile body (vehicle or the like) or measurement of a distribution of clouds or the like. Further, the solid-state imaging device can be made a solid-state imaging device that images a 3D image.

Figure 8B:
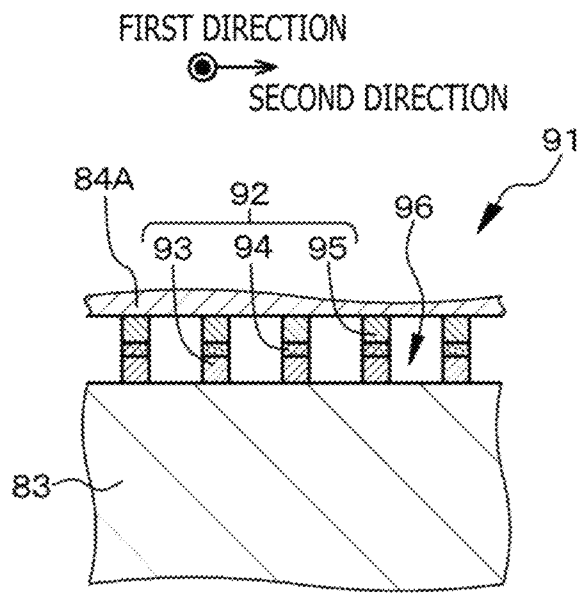

As a modification of the wire grid polarizer 91, as depicted in a schematic partial end view of FIG. 8B, a configuration in which the space portion 96 of the wire grid polarizer 91 is a gap can be exemplified. In other words, the space portion 96 is partly or entirely filled with air. In the example depicted, specifically, the space portion 96 is entirely filled with air. In such a structure as just described, after a wire grid polarizer 91 having a line-and-space structure is obtained, a second interlayer insulating layer-lower layer 84A including $SiO_2$ is formed over an overall area on the basis of a CVD method of appropriate deposition (formation) conditions. The top of the space portion 96 positioned between a line portion 92 and another line portion 92 is closed up with the second interlayer insulating layer-lower layer 84A. By forming the space portion 96 of the wire grid polarizer 91 as a gap in this manner (particularly since the space portion 96 is filled with air), the value of the average refractive index $n_{ave}$ can be made low, and as a result, improvement of the transmittance and improvement of the extinction ratio in the wire grid polarizer 91 can be achieved. Further, since the value of the formation pitch $P_0$ can be made high, improvement of the production yield of the wire grid polarizer 91 can be achieved.

Figure 9:
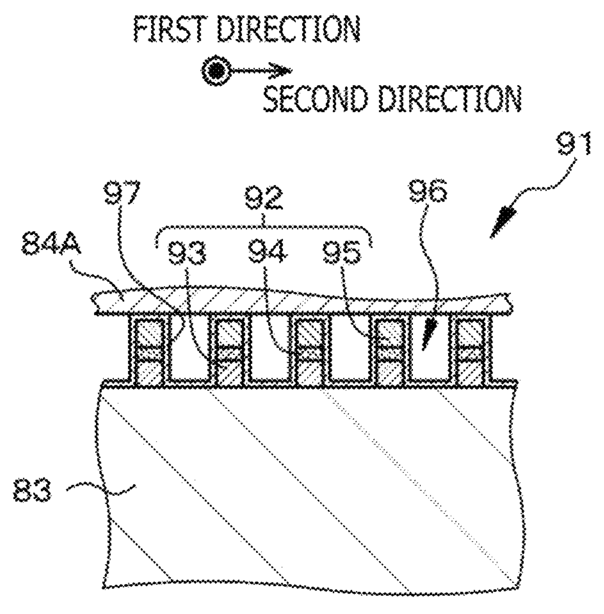
FIG. 9 is a schematic partial end view of the modification of the wire grid polarizer that configures the imaging element in the present disclosure.

As a modification of FIG. 8B, in some cases, a protective film 97 including, for example, $SiO_2$ may be formed on a side face of a line portion 92 facing a space portion 96 as depicted in a schematic partial end view of the wire grid polarizer 91 of FIG. 9. In particular, the space portion 96 is filled with air, and in addition, the protective film 97 exists at the space portion. The protective film 97 is deposited (formed), for example, on the basis of an HDP-CVD method, and this makes it possible to form a thinner protective film 97 conformally on a side face of the line portion 92.

The wire grid polarizer can be structured such that the insulating film is omitted, namely, can be configured such that a light reflection layer (for example, including aluminum) and a light absorption layer (for example, including tungsten) are stacked from the opposite side to the light incident side. Alternatively, also it is possible to configure the wire grid polarizer from a conductive light shielding material layer of one layer. As the material for configuring the conductive light shielding material layer, conductive materials having a complex refractive index in a wavelength band to which the imaging element has sensitivity such as aluminum (Al), copper (Cu), gold (Au), silver (Ag), platinum (Pt), tungsten (W), or alloys containing such metals can be exemplified.

Figure 7:
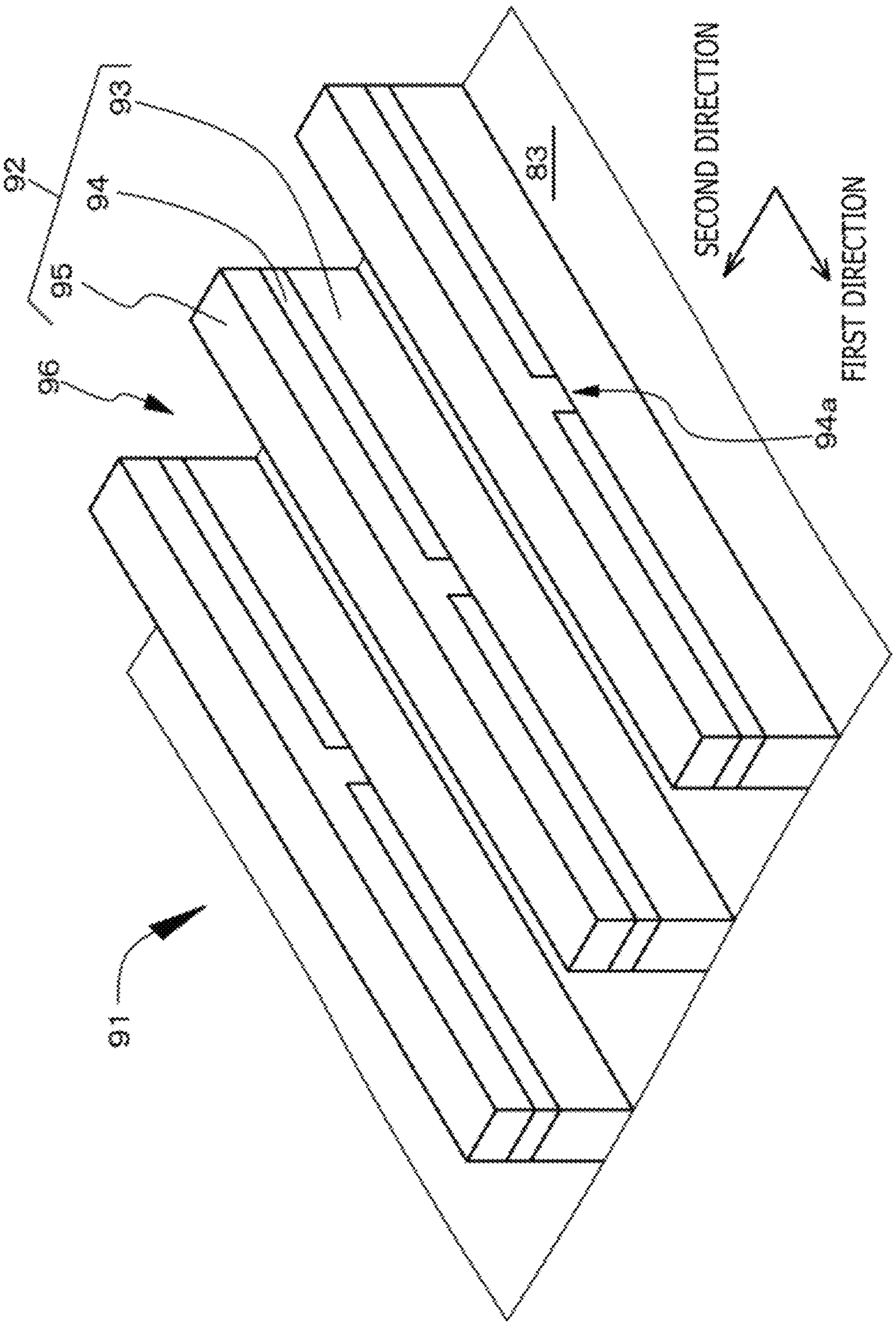
FIG. 7 is a schematic partial perspective view of a modification of the wire grid polarizer that configures the imaging element in the present disclosure.

While the example of the wire grid polarizer 91 depicted in FIG. 6 is configured such that the light reflection layer 93 and the light absorption layer 95 in the stack structure are isolated from each other by the insulating film 94 (namely, structured such that the insulating film 94 is formed over the overall area of the top face of the light reflection layer 93 and the light absorption layer 95 is formed over the overall area of the top face of the insulating film 94), the wire grid polarizer 91 may alternatively be configured such that part of the insulating film is cut away and the light reflection layer and the light absorption layer contact with each other at the cutaway portion of the insulating film. In other words, the wire grid polarizer 91 may be configured such that, as depicted in FIG. 7 that is a schematic partial perspective view, part of the insulating film 94 is cut away and the light reflection layer 93 and the light absorption layer 95 contact with each other at the cutaway portion 94*a* of the insulating film 94.

Working Example 2

The working example 2 is a modification of the working example 1. As depicted in a schematic partial sectional view of FIG. 2, in the solid-state imaging device of the working example 2, a first interlayer insulating layer 83 is structured such that a first interlayer insulating layer-lower layer 83A', a first interlayer insulating layer-intermediate layer 83B' and a first interlayer insulating layer-upper layer 83C' are stacked, light shielding portions 17A and 17B are provided at a location between the first interlayer insulating layer-lower layer 83A' and the first interlayer insulating layer-intermediate layer 83B' positioned above a region between adjacent ones of the imaging elements, and color filter layers 16R and 16G are provided at a location between the first interlayer insulating layer-intermediate layer 83B' and the first interlayer insulating layer-upper layer 83C' positioned above each photoelectric conversion portion 10. It is to be noted that reference sign 83D' denotes a color filter layer-lower underlayer.

Except the foregoing matters, the configuration and structure of the solid-state imaging device of the working example 2 can be made similar to the configuration and structure of the solid-state imaging device of the working example 1, and therefore, detailed description of them is omitted.

Working Example 3

Also the working example 3 is a modification of the working example 1. As depicted in a schematic partial sectional view of FIG. 3, in the solid-state imaging device of the working example 3, a light shielding portion (particularly, the frame portions 98) extending from the wire grid polarizer 91 is provided at a location between a wire grid polarizer 91 and another wire grid polarizer 91 positioned above a region between adjacent ones of the imaging elements, the second interlayer insulating layer 84 is structured such that a second interlayer insulating layer-lower layer 84A and a second interlayer insulating layer-upper layer 84B are stacked, and color filter layers 16R and 16G are provided at a location between the second interlayer insulating layer-lower layer 84A and the second interlayer insulating layer-upper layer 84B positioned above each photoelectric conversion portion 10.

Except the foregoing matters, the configuration and structure of the solid-state imaging device of the working example 3 can be made similar to the configuration and structure of the solid-state imaging device of the working example 1, and therefore, detailed description of them is omitted.

Working Example 4

Also the working example 4 is a modification of the working example 1. As depicted in a schematic partial sectional view of FIG. 4, in the solid-state imaging device of the working example 4, the first interlayer insulating layer 83 is structured such that a first interlayer insulating layer-lower layer 83A" and a first interlayer insulating layer-upper layer 83B" are stacked, color filter layers 16R and 16G are provided at a location between the first interlayer insulating layer-lower layer 83A" and the first interlayer insulating layer-upper layer 83B" positioned above each photoelectric conversion portion 10, and a light shielding portion (particularly, a frame portion 98) extending from the wire grid polarizer 91 is provided at a location between a wire grid polarizer 91 and another wire grid polarizer 91 positioned above a region between adjacent ones of the imaging elements. It is to be noted that reference sign 83C" denotes a color filter layer-underlayer.

Except the foregoing matters, the configuration and structure of the solid-state imaging device of the working example 4 can be made similar to the configuration and structure of the solid-state imaging device of the working example 1, and therefore, detailed description of them is omitted.

Working Example 5

Figure 10B:
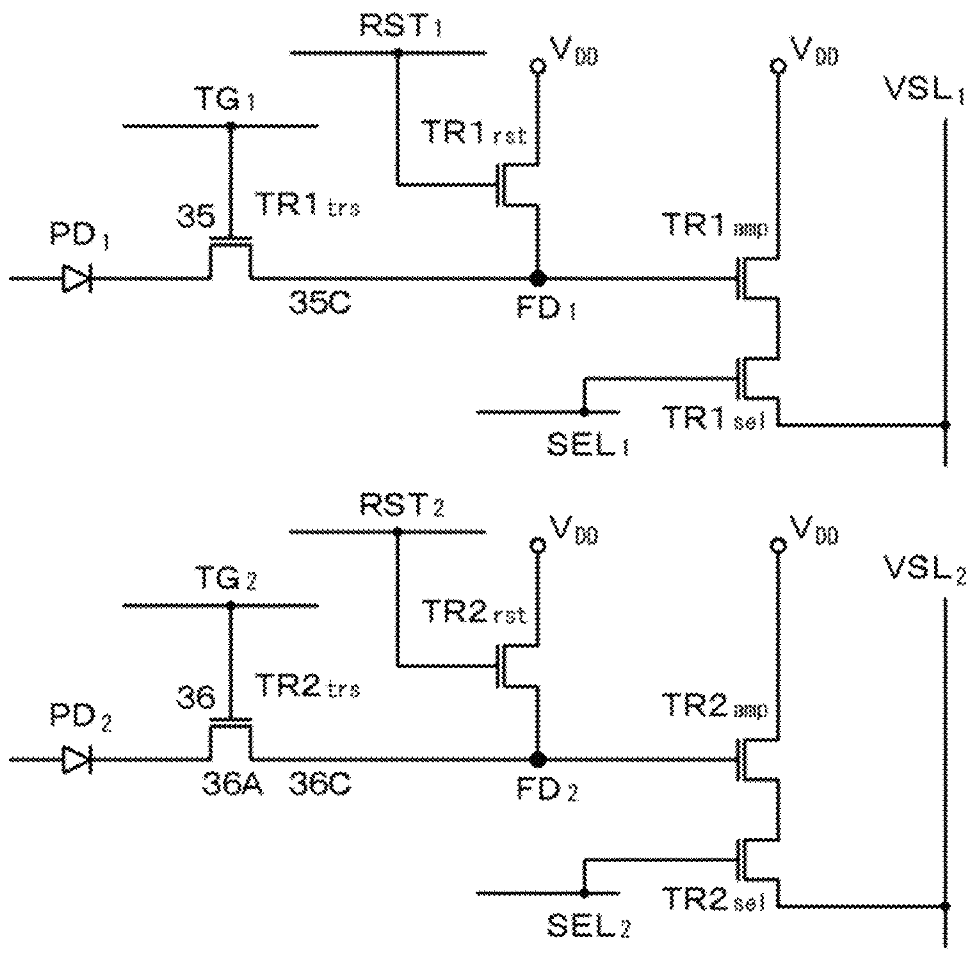
Figure 25:
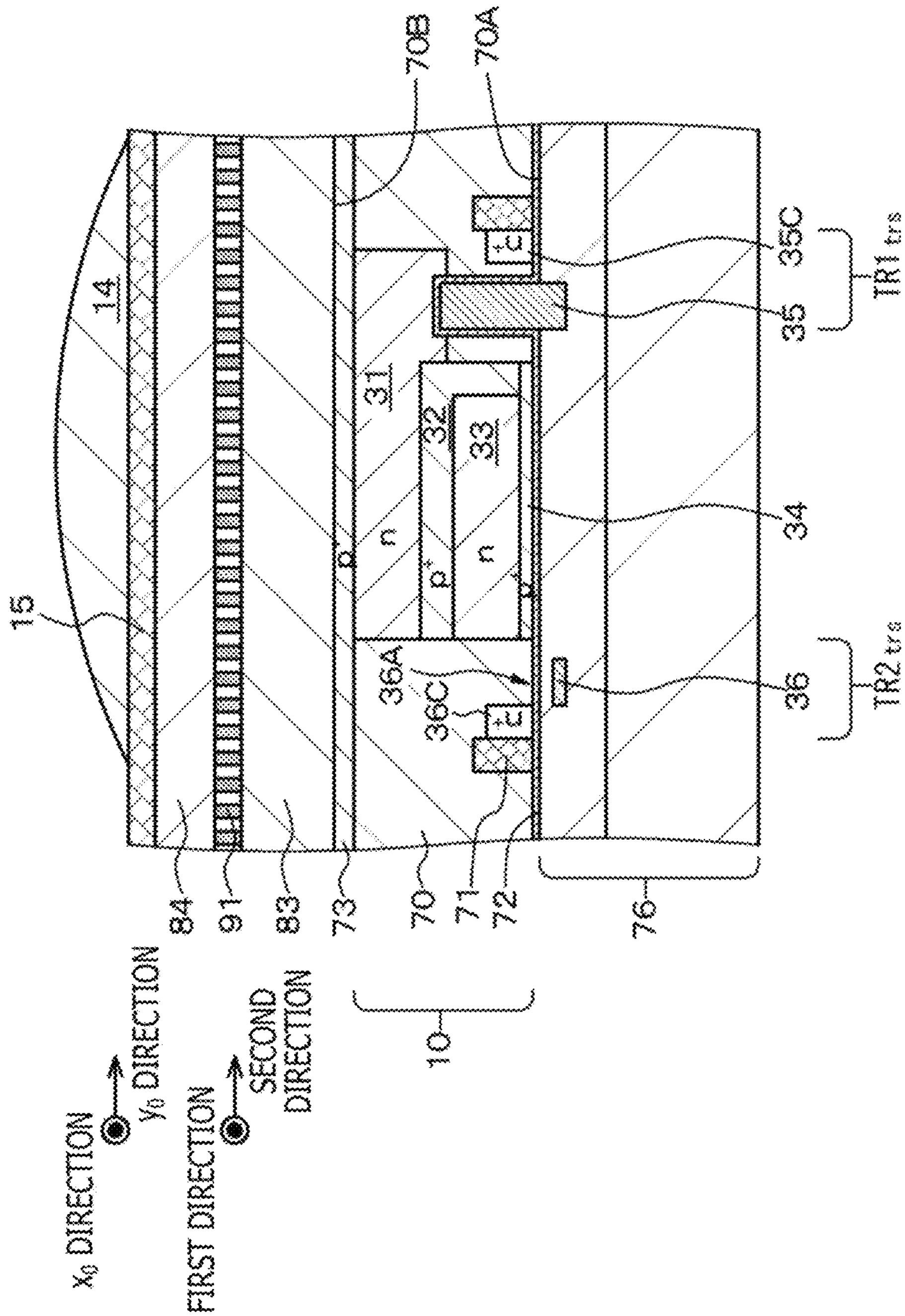
FIG. 25 is a schematic partial sectional view of a stacked-type imaging element of the working example 5.
Figure 27A:
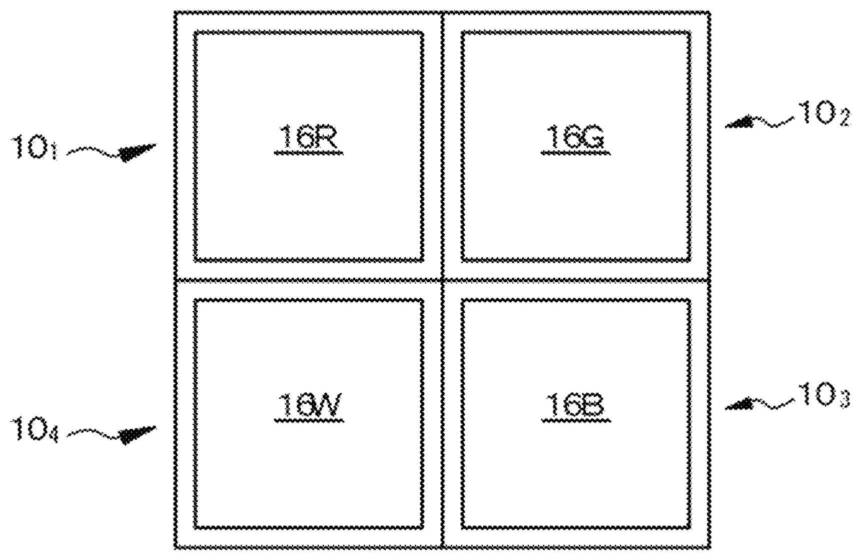
FIGS. 27A and 27B are a schematic layout diagram of a color filter layer configuring a red light stacked-type imaging element, a green light stacked-type imaging element, a blue light stacked-type imaging element, and a white light stacked-type imaging element and so forth and a schematic layout diagram of wire grid polarizers in the working example 5, respectively.
Figure 27B:
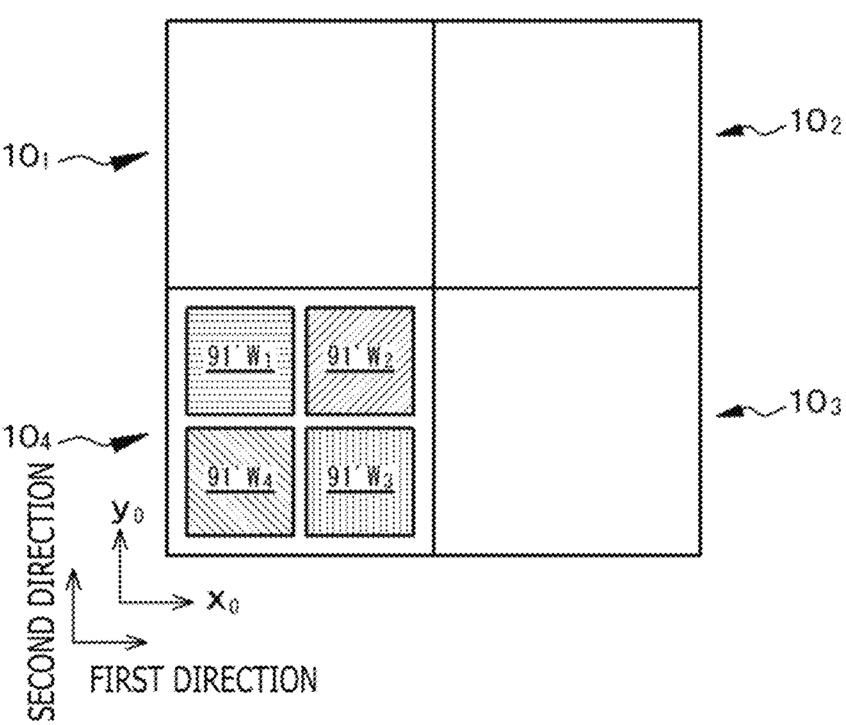
Figure 28A:
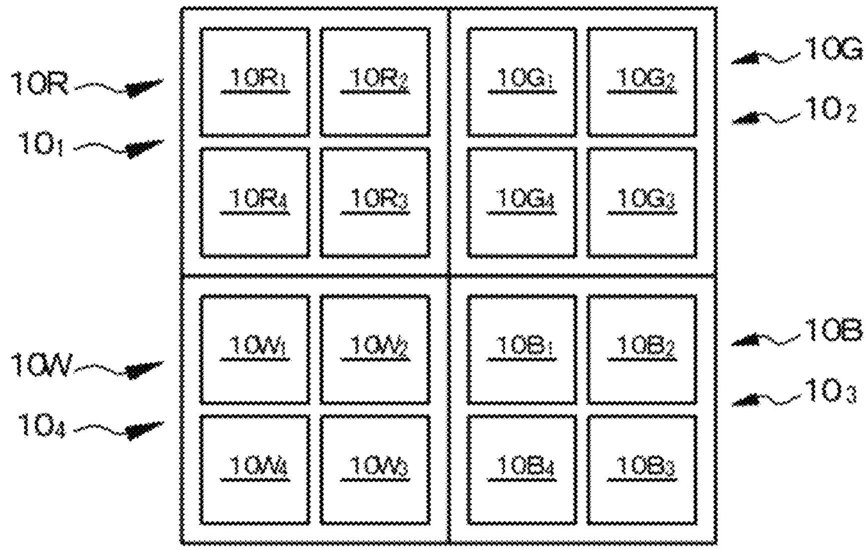
FIGS. 28A and 28B are a schematic layout diagram of upper layer photoelectric conversion portions configuring a red light stacked-type imaging element, a green light stacked-type imaging element, a blue light stacked-type imaging element, and a white light stacked-type imaging element and so forth and a schematic layout diagram of lower layer photoelectric conversion portions in the working example 5, respectively.
Figure 28B:
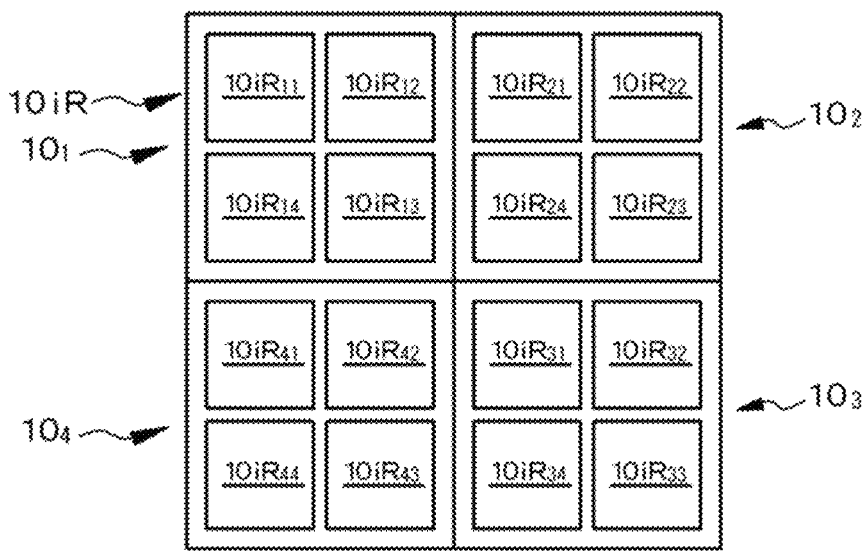

The working example 5 is a modification of the working examples 1 to 4, and the imaging element includes a stacked-type imaging element. A schematic partial sectional view of the stack photoelectric conversion portion in the working example 5 is depicted in FIG. 25; a schematic layout diagram of color filter layers and so forth configuring a red light stacked-type imaging element, a green light stacked-type imaging element, a blue light stacked-type imaging element and, a white light stacked-type imaging element is depicted in FIG. 27A; a schematic layout diagram of wire grid polarizers is depicted in FIG. 27B; a schematic layout diagram of upper layer photoelectric conversion portions is depicted in FIG. 28A; and a schematic layout diagram of lower layer photoelectric conversion portions is depicted in FIG. 28B. It is to be noted that only some of transistors are depicted in FIG. 25. Further, an equivalent circuit diagram of the stack photoelectric conversion portion in the working example 5 is depicted in FIG. 10B.

The stacked-type imaging element of the working example 5 includes a wire grid polarizer 91 and a plurality of stacked photoelectric conversion portions 10, and the wire grid polarizer 91 and the plurality of photoelectric conversion portions 10 are stacked in a state in which the wire grid polarizer 91 is disposed on the light incident side with respect to the plurality of photoelectric conversion portions 10.

Further, in the solid-state imaging device of the working example 5, the stacked-type imaging elements are arrayed in a two-dimensional matrix in the $x_0$ direction and the $y_0$ direction, each stacked-type imaging element includes a wire grid polarizer 91 and a plurality of stacked photoelectric conversion portions 10, and the wire grid polarizer 91 and the plurality of photoelectric conversion portions 10 configuring each stacked-type imaging element are stacked in a state in which the wire grid polarizer 91 is disposed on the light incident side with respect to the plurality of photoelectric conversion portions 10.

Alternatively, in the solid-state imaging device of the working example 5, imaging element units each including four stacked-type imaging elements including a first stacked-type imaging element $\mathbf{10}_1$, a second stacked-type imaging element $10_2$, a third stacked-type imaging element $10_3$, and a fourth stacked-type imaging element $10_4$ arrayed in 2×2 are arrayed in a two-dimensional matrix, and each imaging element unit further includes a wire grid polarizer 91W at least on the light incident side of the fourth stacked-type imaging element $10_4$.

Further, in the working example 5, the plurality of photoelectric conversion portions includes a photoelectric conversion portion 10W having sensitivity to white light and a photoelectric conversion portion 10*i*R having sensitivity to near infrared light. Here, the photoelectric conversion portion 10W configures an upper layer photoelectric conversion portion, and the photoelectric conversion portion 10*i*R configures a lower layer photoelectric conversion portion. A photoelectric conversion portion 10R having sensitivity to red light, a photoelectric conversion portion 10G having sensitivity to green light, and a photoelectric conversion portion 10B having sensitivity to blue light are formed on the same level as that of the photoelectric conversion portion 10W having sensitivity to white light. Further, while, above the photoelectric conversion portion 10R having sensitivity to red light, the photoelectric conversion portion 10G having sensitivity to green light, and the photoelectric conversion portion 10B having sensitivity to blue light, no wire grid polarizer is provided, below them, the photoelectric conversion portion 10*i*R having sensitivity to near infrared light is provided.

Since the color filter layers 16R, 16G, and 16B are provided, it is possible to form the photoelectric conversion portion 10R, the photoelectric conversion portion 10G, the photoelectric conversion portion 10B, and the photoelectric conversion portion 10W in a same configuration and structure, and they preferably include a photoelectric conversion portion that can photoelectrically convert wavelengths in the overall regions of visible rays. Also the configuration and the structure of the photoelectric conversion portion 10*i*R are same. Near infrared light passes through the color filter layers 16R, 16G, and 16B. Although not restrictive, it is sufficient if the photoelectric conversion portions 10R, 10G, 10B, and 10W include an organic photoelectric conversion material or a silicon layer of, for example, approximately 3 μm thick and the photoelectric conversion portion 10*i*R includes an organic photoelectric conversion material or a silicon layer of, for example, approximately 4 μm thick. This can be applied similarly to a modification of the working example 5, a working example 6 and a modification of the working example 6 described below.

Further, in the stacked-type imaging element of the working example 5, the wire grid polarizer 91W includes four polarizer segments arrayed in 2×2 and including a first polarizer segment 91'$W_1$, a second polarizer segment 91'$W_2$, a third polarizer segment 91'$W_3$, and a fourth polarizer segment 91'$W_4$. In particular, from among the four polarizer segments, two polarizer segments are arrayed in the $x_0$ direction and two polarizer segments are arrayed in the $y_0$ direction. Further, the polarization direction of light to be transmitted by the first polarizer segment 91'$W_1$ is α degrees; the polarization direction of light to be transmitted by the second polarizer segment 91'$W_2$ is (α+45) degrees; the polarization direction of light to be transmitted by the third polarizer segment 91'$W_3$ is (α+90) degrees; and the polarization direction of light to be transmitted by the fourth polarizer segment 91'$W_4$ is (α+135) degrees. As the value of a, the angle with respect to the $y_0$ direction is determined as "0 degrees."

Here, the stacked-type imaging element of the working example 5 depicted in FIG. 25 is a stacked-type imaging element of the back-illuminated type. In particular, in the examples depicted in FIGS. 27A, 27B, 28A, and 28B, the first stacked-type imaging element 101 includes a red color filter layer 16R [refer to FIG. 27A], four upper layer photoelectric conversion portions (red light imaging elements 10$R_1$, 10$R_2$, 10$R_3$, and 10$R_4$) [refer to FIG. 28A] disposed below the red color filter layer 16R, and lower layer photoelectric conversion portions (near infrared light photoelectric conversion portions 10*i*$R_{11}$, 10*i*$R_{12}$, 10*i*$R_{13}$, and 10*i*$R_{14}$) [refer to FIG. 28B] disposed below the respective upper layer photoelectric conversion portions.

Meanwhile, the second stacked-type imaging element $10_2$ includes a green color filter layer 16G (refer to FIG. 27A), four upper layer photoelectric conversion portions (green light imaging elements 10$G_1$, 10$G_2$, 10$G_3$, and 10$G_4$) disposed below the green color filter layer 16G, and lower layer photoelectric conversion portions (near infrared light photoelectric conversion portions 10*i*$R_{21}$, 10*i*$R_{22}$, 10*i*$R_{23}$, and 10*i*$R_{24}$) disposed below the respective upper layer photoelectric conversion portions.

Further, the third stacked-type imaging element $10_3$ includes a blue color filter layer 16B (refer to FIG. 27A), four upper layer photoelectric conversion portions (blue light imaging elements 10$B_1$, 10$B_2$, 10$B_3$, and 10$B_4$) disposed below the blue color filter layer 16B, and lower layer photoelectric conversion portions (near infrared light photoelectric conversion portions 10*i*$R_{31}$, 10*i*$R_{32}$, 10*i*$R_{33}$, and 10*i*$R_{34}$) disposed below the respective upper layer photoelectric conversion portions.

Furthermore, the fourth stacked-type imaging element $10_4$ includes a transparent resin layer 90W (refer to FIG. 27A), four polarizer segments 91'$W_1$, 91'$W_2$, 91'$W_3$, and 91'$W_4$ disposed below the transparent resin layer 90W, four upper layer photoelectric conversion portions (white light imaging elements 10$W_1$, 10$W_2$, 10$W_3$, and 10$W_4$) disposed below the four respective wire grid polarizers, and lower layer photoelectric conversion portions (near infrared light photoelectric conversion portions 10*i*$R_{41}$, 10*i*$R_{44}$, 10*i*$R_{43}$, and 10*i*$R_{44}$) disposed below the respective upper layer photoelectric conversion portions.

Alternatively, in other words, the first stacked-type imaging element $10_1$ includes a photoelectric conversion portion having sensitivity to red light and another photoelectric conversion portion having sensitivity to near infrared light, the second stacked-type imaging element $10_2$ includes a photoelectric conversion portion having sensitivity to green light and another photoelectric conversion portion having sensitivity to near infrared light, the third stacked-type imaging element $10_3$ includes a photoelectric conversion portion having sensitivity to blue light and another photoelectric conversion portion having sensitivity to near infrared light, the fourth stacked-type imaging element $10_4$ includes a photoelectric conversion portion having sensitivity to white light and another photoelectric conversion portion having sensitivity to near infrared light, the wire grid polarizer provided on the light incident side of the fourth stacked-type imaging element $10_4$ includes four polarizer segments arrayed in 2×2 (namely, two polarizer segments are arrayed in the $x_0$ direction and two polarizer segments are arrayed in the $y_0$ direction) and including a fourth-first wire grid polarizer element (polarizer segment) 91'$W_1$, a fourth-second wire grid polarizer element (polarizer segment) 91'$W_1$, a fourth-third wire grid polarizer element (polarizer segment) 91'$W_3$, and a fourth-fourth wire grid polarizer element (polarizer segment) 91'$W_4$, the polarization direction of light to be transmitted by the fourth-first wire grid polarizer element (polarizer segment) 91'$W_1$ is α degrees, the polarization direction of light to be transmitted by the fourth-second wire grid polarizer element (polarizer segment) 91'$W_2$ is (α+45) degrees, the polarization direction of light to be transmitted by the fourth-third wire grid polarizer element (polarizer segment) 91'$W_3$ is (α+90) degrees, and the polarization direction of light to be transmitted by the fourth-fourth wire grid polarizer element (polarizer segment) 91'$W_4$ is (α+135) degrees.

The upper layer photoelectric conversion portion includes an n-type semiconductor region 31 provided on the semiconductor substrate 70 as a photoelectric conversion layer. A gate portion 35 of a transfer transistor TR1$_{trs}$ including a vertical transistor extends to the n-type semiconductor region 31 and besides is connected to a transfer gate line $TG_1$. Further, a first floating diffusion layer $FD_1$ is provided in a region 35C of the semiconductor substrate 70 in the proximity of the gate portion 35 of the transfer transistor TR1$_{trs}$. Charge accumulated in the n-type semiconductor region 31 is read out to the first floating diffusion layer $FD_1$ through a transfer channel formed along the gate portion 35.

In the upper layer photoelectric conversion portion, a reset transistor TR1$_{rst}$, an amplification transistor TR1$_{amp}$ and a selection transistor TR1$_{sel}$ that configure a control portion of the upper layer photoelectric conversion portion are further provided on a first face side of the semiconductor substrate 70 (refer also to FIG. 10B).

The reset transistor TR1$_{rst}$ includes a gate portion, a channel formation region and source/drain regions. The gate portion of the reset transistor TR1$_{rst}$ is connected to a reset line $RST_1$, and one of the source/drain regions of the reset transistor TR1$_{rst}$ is connected to the power supply $V_{DD}$ while the other of the source/drain regions serves also as the first floating diffusion layer $FD_1$.

The amplification transistor TR1$_{amp}$ includes a gate portion, a channel formation region and source/drain regions. The gate portion is connected to the other of the source/drain regions (first floating diffusion layer $FD_1$) of the reset transistor TR1$_{rst}$. One of the source/drain regions is connected to the power supply $V_{DD}$.

The selection transistor TR1$_{sel}$ includes a gate portion, a channel formation region, and source/drain regions. The gate portion is connected to a selection line $SEL_1$. One of the source/drain regions shares a region with the other of the source/drain regions configuring the amplification transistor TR1$_{amp}$, and the other of the source/drain regions is connected to a signal line (data output line) $VSL_1$.

The lower layer photoelectric conversion portion includes an n-type semiconductor region 33 provided on the semiconductor substrate 70 as a photoelectric conversion layer. A gate portion 36 of the transfer transistor TR2$_{trs}$ is connected to a transfer gate line $TG_2$. Meanwhile, a second floating diffusion layer $FD_2$ is provided in a region 36C of the semiconductor substrate 70 in the proximity of the gate portion 36 of the transfer transistor TR2$_{trs}$. Charge accumulated in the n-type semiconductor region 33 is read out to the second floating diffusion layer $FD_2$ through a transfer channel 36A formed along the gate portion 36.

In the lower layer photoelectric conversion portion, a reset transistor TR2$_{rst}$, an amplification transistor TR2$_{amp}$ and a selection transistor TR2$_{sel}$ that configure a control portion of the lower layer photoelectric conversion portion are further provided on the first face side of the semiconductor substrate 70.

The reset transistor TR2$_{rst}$ includes a gate portion, a channel formation region, and source/drain regions. The gate portion of the reset transistor TR2$_{rst}$ is connected to a reset line $RST_2$, and one of the source/drain regions of the reset transistor TR2$_{rst}$ is connected to the power supply $V_{DD}$ while the other of the source/drain regions serves also as the second floating diffusion layer $FD_2$.

The amplification transistor TR2$_{amp}$ includes a gate portion, a channel formation region and source/drain regions. The gate portion is connected to the other of the source/drain regions (second floating diffusion layer $FD_2$) of the reset transistor TR2$_{rst}$. One of the source/drain regions is connected to the power supply $V_{DD}$.

The selection transistor TR2$_{sel}$ includes a gate portion, a channel formation region, and source/drain regions. The gate portion is connected to a selection line $SEL_2$. One of the source/drain regions shares a region with the other of the source/drain regions configuring the amplification transistor TR2$_{amp}$, and the other of the source/drain regions is connected to a signal line (data output line) $VSL_2$.

The reset lines $RST_1$ and $RST_2$, selection lines $SEL_1$ and $SEL_2$ and transfer gate lines $TG_1$ and $TG_2$ are connected to the vertical driving circuit 112 that configures the driving circuit, and the signal lines (data output lines) $VSL_1$ and $VSL_2$ are connected to the column signal processing circuit 113 that configures the driving circuit.

A series of operations such as charge accumulation, reset operation and charge transfer of the upper layer photoelectric conversion portion and the lower layer photoelectric conversion portion are similar to a conventional series of operations such as charge accumulation, reset operation, and charge transfer, and therefore, detailed description of the same is omitted.

A $p^+$ layer 34 is provided between the n-type semiconductor region 33 and the surface 70A of the semiconductor substrate 70 and suppresses generation of dark current. A $p^+$ layer 32 is formed between the n-type semiconductor region 31 and the n-type semiconductor region 33, and further, part of a side face of the n-type semiconductor region 33 is surrounded by the $p^+$ layer 32. A $p^+$ layer 73 is formed on the rear face 70B side of the semiconductor substrate 70.

On the $p^+$ layer 73, the first interlayer insulating layer 83, the wire grid polarizer 91, the second interlayer insulating layer 84, the on-chip microlens underlayer 14, and the on-chip microlens 15 are formed. Further, for example, on the second interlayer insulating layer 84, a color filter layer 16 (not depicted in FIG. 25 or in FIG. 26 that is hereinafter described) is formed.

The imaging element and the stacked-type imaging element of the working example 5 can be produced, for example, by the following method. First, an SOI substrate is prepared. Then, a first silicon layer is formed on the surface of the SOI substrate on the basis of an epitaxial growth method. Then, on the first silicon layer, a $p^+$ layer 73 and an n-type semiconductor region 31 are formed. Then, a second silicon layer is formed on the first silicon layer on the basis of an epitaxial growth method, and an element isolation region 71, an oxide film 72, a $p^+$ layer 32, an n-type semiconductor region 33 and a $p^+$ layer 34 are formed on the second silicon layer. Further, on the second silicon layer, various transistors and so forth for configuring a control portion of an imaging element are formed, and further on them, a wiring layer (not depicted), an interlayer insulating layer 76 and various wirings are formed. Further, the interlayer insulating layer 76 and a supporting substrate (not depicted) therefor are pasted. Thereafter, the SOI substrate is removed to expose the first silicon layer. The surface of the second silicon layer corresponds to the surface 70A of the semiconductor substrate 70 while the surface of the first silicon layer corresponds to the rear face 70B of the semiconductor substrate 70. Further, the first silicon layer and the second silicon layer are collectively represented as semiconductor substrate 70. Then, the second interlayer insulating layer 84 including the first interlayer insulating layer 83, the wire grid polarizer 91 and the color filter layer 16, an on-chip microlens underlayer 14 and on-chip microlenses 15 are formed on the $p^+$ layer 73. By the procedure described above, the stacked-type imaging element of the working example 5 can be obtained.

Although, in the working example 5, the wire grid polarizer 91 has a size equal to that the photoelectric conversion portion 10W having sensitivity to white light and the photoelectric conversion portion 10*i*R having sensitivity to near infrared light, this is not restrictive, and the wire grid polarizer 91 may be greater than the photoelectric conversion portion 10W and the photoelectric conversion portion 10*i*R.

Since, in the stacked-type imaging element of the working example 5, the wire grid polarizer is stacked in a state in which it is disposed on the light incident side with respect to the plurality of photoelectric conversion portions, while polarization information of all wavelength regions is acquired, the wavelength band of light can be expanded and utilized for improvement of luminance, improvement in sensitivity and spectral improvement can be achieved. As a result, both high accuracy polarization information acquisition and a good imaging characteristic can be achieved.

Besides, since the wire grid polarizer is formed integrally on-chip above the upper layer photoelectric conversion portion, the thickness of the stacked-type imaging element can be reduced. As a result, mixture of polarized light into an adjacent stacked-type imaging element (polarized light crosstalk) can be minimized. Further, since the wire grid polarizer is an absorption type wire grid polarizer having a light absorption layer, it is low in reflectivity, and the influence of stray light, flare and so forth upon a video can be reduced.

In the stacked-type imaging element of the working example 5, although a near infrared light photoelectric conversion portion is disposed below a red light imaging element, a green light imaging element and a blue light imaging element, a wire grid polarizer is not disposed above the red light imaging element, green light imaging element and blue light imaging element, but a color filter layer (wavelength selection means) is formed. On the other hand, below the white light imaging element, a near infrared light photoelectric conversion portion is disposed, and besides, above the white light imaging element, a wire grid polarizer is disposed while a color filter layer (wavelength selection means) is not formed. By adopting such a structure as just described, such a situation that a luminance output is deteriorated arising from wavelength separation of red light, green light, and blue light can be prevented, and polarization information in the wavelength bands of red light, green light, and blue light can be acquired without a miss and color, luminance and polarization information can be utilized to the utmost. Further, since there is no loss of light by a color filter layer, such an advantage that the output having polarization information is improved can be obtained.

Figure 26:
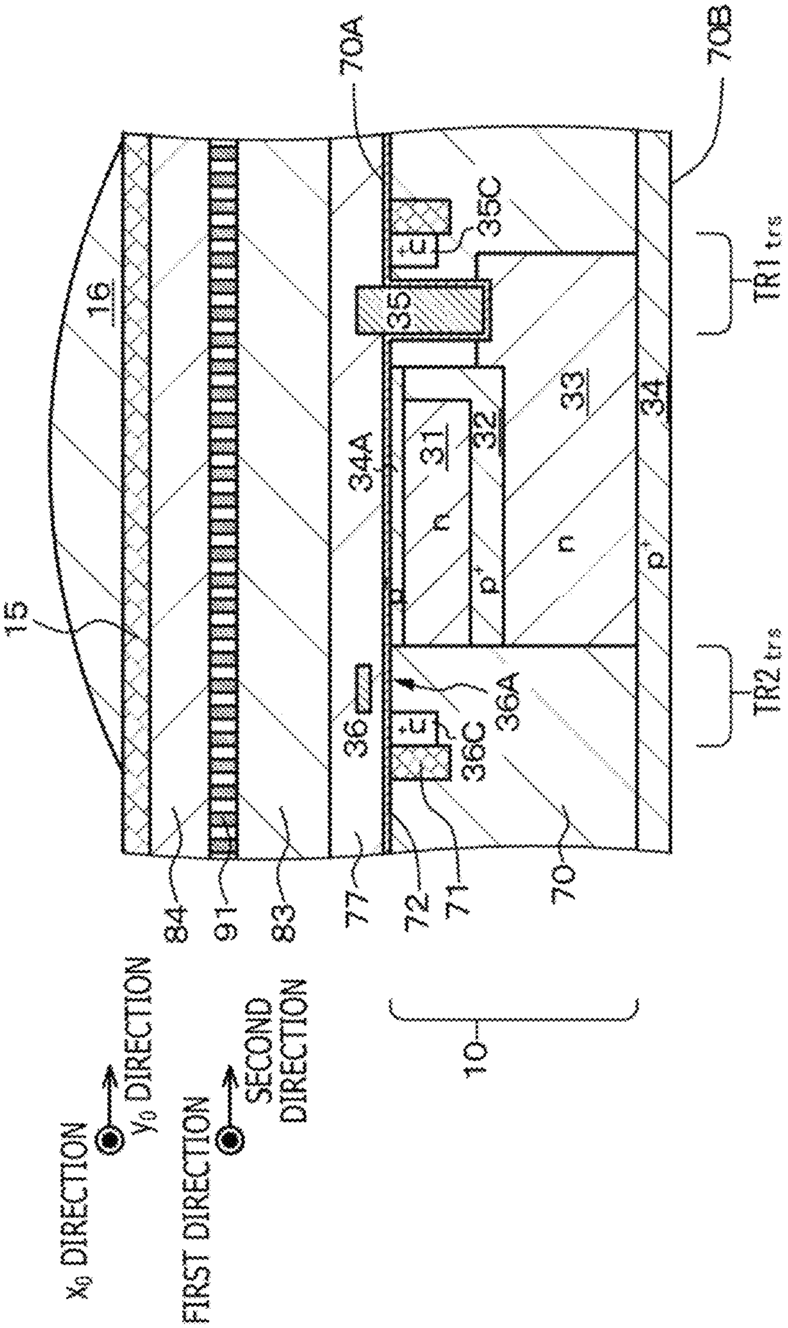
FIG. 26 is a schematic partial sectional view of a modification of the stacked-type imaging element of the working example 5.

The modification of the stacked-type imaging element of the working example 5 depicted in FIG. 26 is a stacked-type imaging element of the front-illuminated type. In particular, various transistors configuring a control portion are provided on the surface 70A side of the semiconductor substrate 70. The transistors can be configured and structured similarly to the transistors described hereinabove. Further, although an upper layer photoelectric conversion portion and a lower layer photoelectric conversion portion are provided on the semiconductor substrate 70, also the photoelectric conversion portions can be configured and structured substantially similarly to those described hereinabove. An interlayer insulating layer 77 is formed on the surface 70A of the semiconductor substrate 70, and a second interlayer insulating layer 84 including a first interlayer insulating layer 83, a wire grid polarizer 91 and a color filter layer 16, an on-chip microlens underlayer 14 and an on-chip microlenses 15 are formed on an interlayer insulating layer 77. Since the configuration and the structure of the modification of the stacked type imaging element of the working example 5 can be made similar to the configuration and structure of the imaging element and the stacked-type imaging element of the working example 5 described above in this manner except that the stacked-type imaging element of the working example 5 is of the front-illuminated type, detailed description of them is omitted.

<First Modification of Stacked-Type Imaging Element of Working Example 5>

Figure 29A:
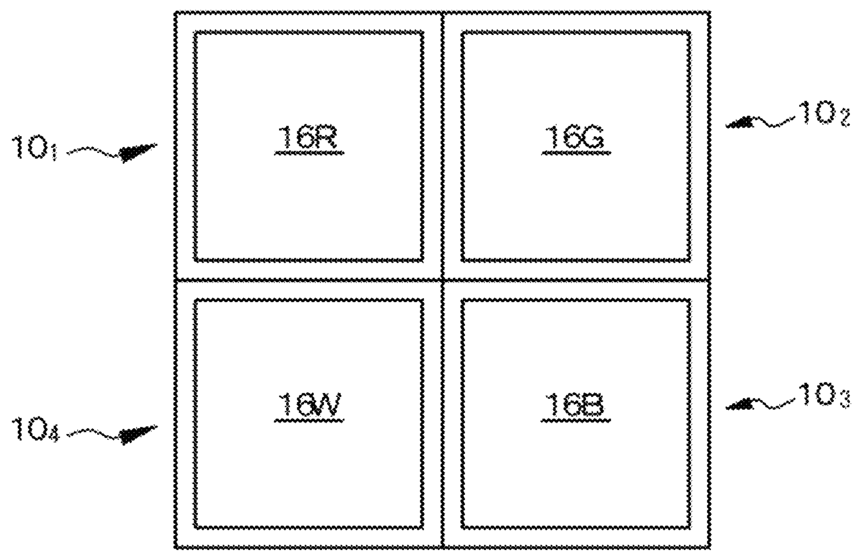
FIGS. 29A and 29B are a schematic layout diagram of a color filter layer configuring a red light stacked-type imaging element, a green light stacked-type imaging element, a blue light stacked-type imaging element, and a white light stacked-type imaging element and so forth and a schematic layout diagram of wire grid polarizers in a first modification of the working example 5, respectively.
Figure 29B:
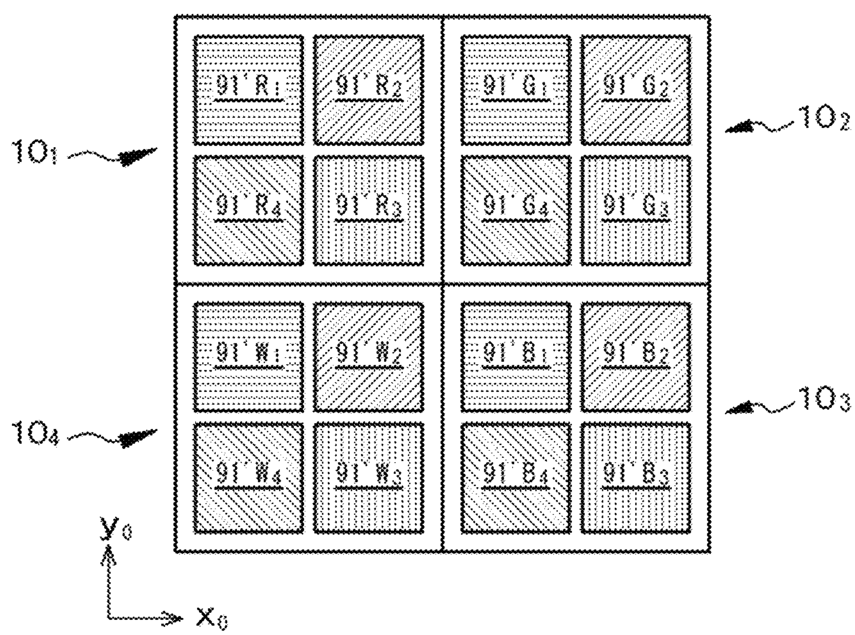

As the first modification of the stacked-type imaging element of the working example 5, a schematic layout diagram of a color filter layer and so forth configuring a red light stacked-type imaging element, a green light stacked-type imaging element, a blue light stacked-type imaging element and a white light stacked-type imaging element is depicted in FIG. 29A, and as depicted in FIG. 29B that is a schematic layout diagram of a wire grid polarizer, a plurality of photoelectric conversion portions can include a photoelectric conversion portion having sensitivity to red light, green light, or blue light and another photoelectric conversion portion having sensitivity to near infrared light.

In particular, the first stacked-type imaging element 101 includes a red color filter layer 16R [refer to FIG. 29A], four polarizer segments 91' $R_1$, 91'$R_2$, 91'$R_3$, and 91'$R_4$ [refer to FIG. 29B] disposed below the red color filter layer 16R, upper layer photoelectric conversion portions (red light imaging elements 10$R_1$, 10$R_2$, 10$R_3$, and 10$R_4$) [refer to FIG. 28A] individually disposed below the four polarizer segments, and lower layer photoelectric conversion portions (near infrared light photoelectric conversion portions 10*i*$R_{11}$, 10*i*$R_{12}$, 10*i*$R_{13}$, and 10*i*$R_{14}$) [refer to FIG. 28B] individually disposed below the upper layer photoelectric conversion portions.

Meanwhile, the second stacked-type imaging element $\mathbf{10}_2$ includes a green color filter layer 16G [refer to FIG. 29A], four polarizer segments 91'$G_1$, 91'$G_2$, 91'$G_3$, and 91'$G_4$ [refer to FIG. 29B] disposed below the green color filter layer 16G, upper layer photoelectric conversion portions (green light imaging elements 10$G_1$, 10$G_2$, 10$G_3$, and 10$G_4$) [refer to FIG. 28A] individually disposed below the four polarizer segments, and lower layer photoelectric conversion portions (near infrared light photoelectric conversion portions 10*i*$R_{21}$, 10*i*$R_{22}$, 10*i*$R_{23}$, and 10*i*$R_{24}$) [refer to FIG. 28B] individually disposed below the upper layer photoelectric conversion portions.

Further, the third stacked-type imaging element $\mathbf{10}_3$ includes a blue color filter layer 16B [refer to FIG. 29A], four polarizer segments 91'$B_1$, 91'$B_2$, 91'$B_3$, and 91'$B_4$ [refer to FIG. 29B] disposed below the blue color filter layer 16B, upper layer photoelectric conversion portions (blue light imaging elements 10$B_1$, 10$B_2$, 10$B_3$, and 10$B_4$) [refer to FIG. 28A] individually disposed below the four polarizer segments, and lower layer photoelectric conversion portions (near infrared light photoelectric conversion portions $10iR_{31}$, $10iR_{32}$, $10iR_{33}$, and $10iR_{34}$) [refer to FIG. 28B] individually disposed below the upper layer photoelectric conversion portions.

Furthermore, the fourth stacked-type imaging element $10_4$ includes a transparent resin layer 90W [refer to FIG. 29A], four polarizer segments 91'$W_1$, 91'$W_2$, 91'$W_3$, and 91'$W_4$ [refer to FIG. 29B] disposed below the transparent resin layer 90W, upper layer photoelectric conversion portions (white light imaging elements $10W_1$, $10W_2$, $10W_3$, and $10W_4$) [refer to FIG. 28A] individually disposed below the four polarizer segments, and lower layer photoelectric conversion portions (near infrared light photoelectric conversion portions $10iR_{41}$, $10iR_{44}$, $10iR_{43}$, and $10iR_{44}$) [refer to FIG. 28B] individually disposed below the upper layer photoelectric conversion portions.

In other words, the first modification of the stacked-type imaging element of the working example 5 further includes a wire grid polarizer provided on the light incident side of each of the first stacked-type imaging element $10_1$, the second stacked-type imaging element $10_2$, and the third stacked-type imaging element $10_3$, the wire grid polarizer provided on the light incident side of the first stacked-type imaging element $10_1$ includes four polarizer segments arrayed in 2×2 (namely, two polarizer segments are arrayed in the $x_0$ direction and two polarizer segments are arrayed in the $y_0$ direction) and including a first-first wire grid polarizer (polarizer segment) 91'$R_1$, a first-second wire grid polarizer (polarizer segment) 91'$R_2$, a first-third wire grid polarizer (polarizer segment) 91'$R_3$, and a first-fourth wire grid polarizer (polarizer segment) 91'$R_4$, the polarization direction of light to be transmitted by the first-first wire grid polarizer (polarizer segment) 91'$R_1$ is β degrees, the polarization direction of light to be transmitted by the first-second wire grid polarizer (polarizer segment) 91'$R_2$ is (β+45) degrees, the polarization direction of light to be transmitted by the first-third wire grid polarizer (polarizer segment) 91'$R_3$ is (β+90) degrees, and the polarization direction of light to be transmitted by the first-fourth wire grid polarizer (polarizer segment) 91'$R_4$ is (β+135) degrees.

Meanwhile, the wire grid polarizer provided on the light incident side of the second stacked-type imaging element $10_2$ includes four polarizer segments arrayed in 2×2 (namely, two polarizer segments are arrayed in the $x_0$ direction and two polarizer segments are arrayed in the $y_0$ direction) and including a second-first wire grid polarizer (polarizer segment) 91'$G_1$, a second-second wire grid polarizer (polarizer segment) 91'$G_2$, a second-third wire grid polarizer (polarizer segment) 91'$G_3$, and a second-fourth wire grid polarizer (polarizer segment) 91'$G_4$, the polarization direction of light to be transmitted by the second-first wire grid polarizer (polarizer segment) 91'$G_1$ is γ degrees, the polarization direction of light to be transmitted by the second-second wire grid polarizer (polarizer segment) 91'$G_2$ is (γ+45) degrees, the polarization direction of light to be transmitted by the second-third wire grid polarizer (polarizer segment) 91'$G_3$ is (γ+90) degrees, and the polarization direction of light to be transmitted by the second-fourth wire grid polarizer (polarizer segment) 91'$G_4$ is (γ+135) degrees.

Further, the wire grid polarizer provided on the light incident side of the third stacked-type imaging element $10_3$ includes four polarizer segments arrayed in 2×2 (namely, two polarizer segments are arrayed in the $x_0$ direction and two polarizer segments are arrayed in the $y_0$ direction) and including a third-first wire grid polarizer (polarizer segment) 91'$B_1$, a third-second wire grid polarizer (polarizer segment) 91'$B_2$, a third-third wire grid polarizer (polarizer segment) 91'$B_3$, and a third-fourth wire grid polarizer (polarizer segment) 91'$B_4$, the polarization direction of light to be transmitted by the third-first wire grid polarizer (polarizer segment) 91'$B_1$ is δ degrees, the polarization direction of light to be transmitted by the third-second wire grid polarizer (polarizer segment) 91'$B_2$ is (δ+45) degrees, the polarization direction of light to be transmitted by the third-third wire grid polarizer (polarizer segment) 91'$B_3$ is (δ+90) degrees, and the polarization direction of light to be transmitted by the third-fourth wire grid polarizer (polarizer segment) 91'$B_4$ is (δ+135) degrees.

Here, β, γ, and δ are set to β=γ=δ, and as the value of β, γ, and δ, the angle defined with respect to the $y_0$ direction is set to "0 degrees."

<Second Modification of Stacked-Type Imaging Element of Working Example 5>

Figure 30A:
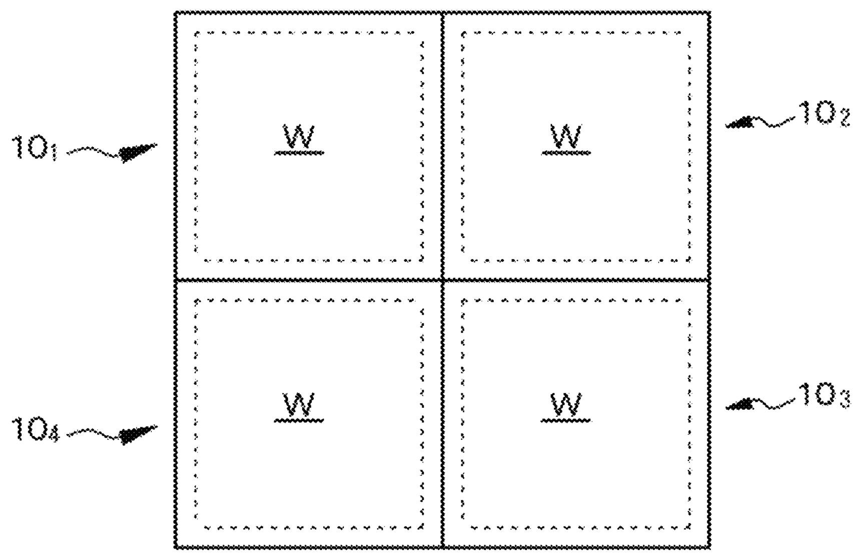
FIGS. 30A and 30B are a schematic layout diagram of a region for configuring the white light stacked-type imaging element and so forth and a schematic layout diagram of the wire grid polarizers in a second modification of the working example 5, respectively.
Figure 30B:
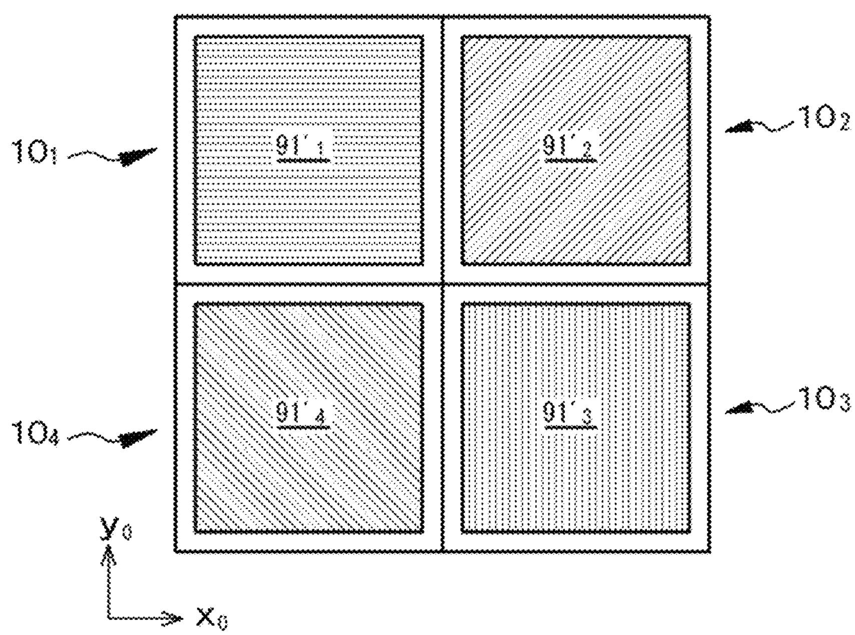
Figure 31A:
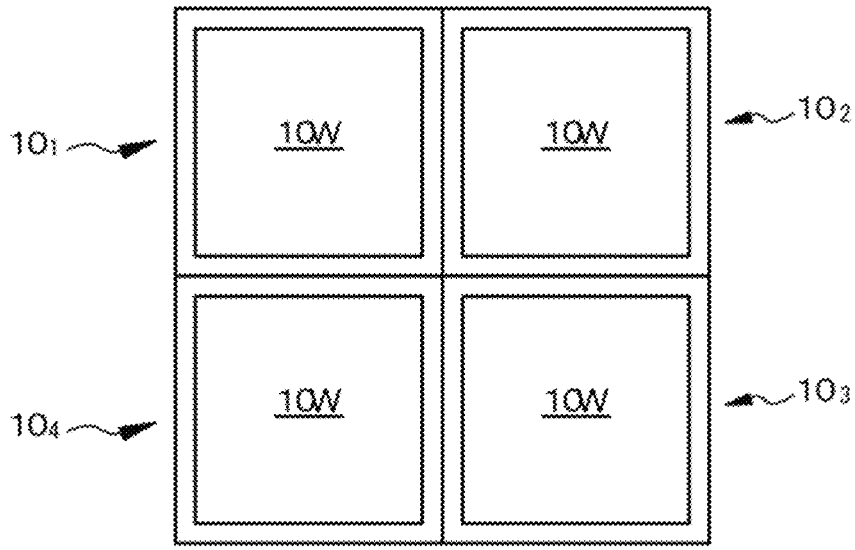
FIGS. 31A and 31B are a schematic layout diagram of upper layer photoelectric conversion portions configuring the white light stacked-type imaging element and so forth and a schematic layout diagram of lower layer photoelectric conversion portions in the second modification of the working example 5, respectively.
Figure 31B:
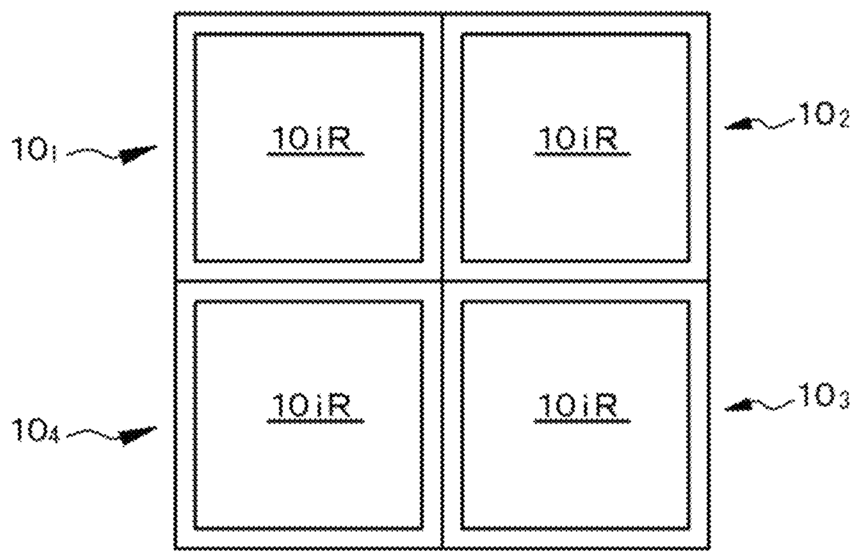
Figure 33A:
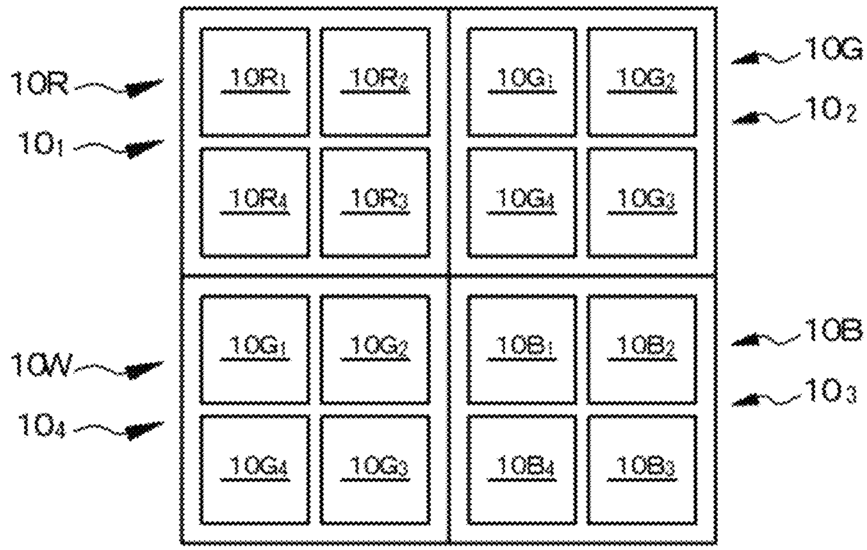
FIGS. 33A and 33B are a schematic layout diagram of upper layer photoelectric conversion portions configuring the white light stacked-type imaging element and so forth and a schematic layout diagram of a lower layer photoelectric conversion portion in the third modification of the working example 5, respectively.
Figure 33B:
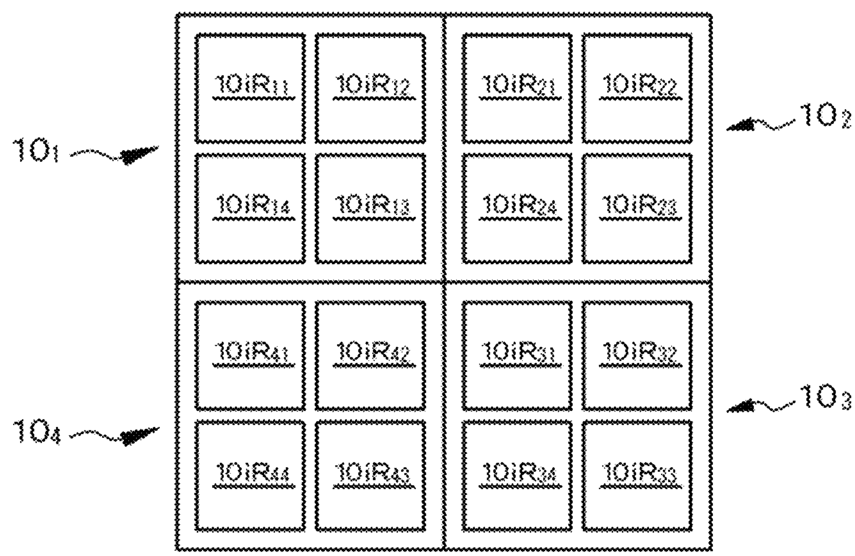

As the second modification of the stacked-type imaging element of the working example 5, a stacked-type imaging element that configures a single color solid-state imaging device can be exemplified. In particular, a schematic layout diagram of regions W in which 2×2 white light stacked-type imaging elements are configured is depicted in FIG. 30A; a schematic layout diagram of wire grid polarizers $91_1$, $91_2$, $91_3$, and $91_4$ is depicted in FIG. 30B; a schematic layout diagram of upper layer photoelectric conversion portions 10W configuring a white light stacked-type imaging element is depicted in FIG. 31A; and a schematic layout diagram of lower layer photoelectric conversion portions 10*i*R is depicted in FIG. 33B. In particular, the stacked-type imaging element includes regions W (in each of which a transparent resin layer 90W may be formed) that configure a white light stacked-type imaging element [refer to FIG. 30A], four polarizer segments 91'$W_1$, 91'$W_2$, 91'$W_3$, and 91'$W_4$ individually disposed below the regions W [refer to FIG. 30B], upper layer photoelectric conversion portions (white light imaging elements 10W) individually disposed below the four polarizer segments [refer to FIG. 31A], and lower layer photoelectric conversion portions (near infrared light photoelectric conversion portions 10*i*R) individually disposed below the upper layer photoelectric conversion portions [refer to FIG. 31B].

<Third Modification of Stacked-Type Imaging Element of Working Example 5>

Figure 32A:
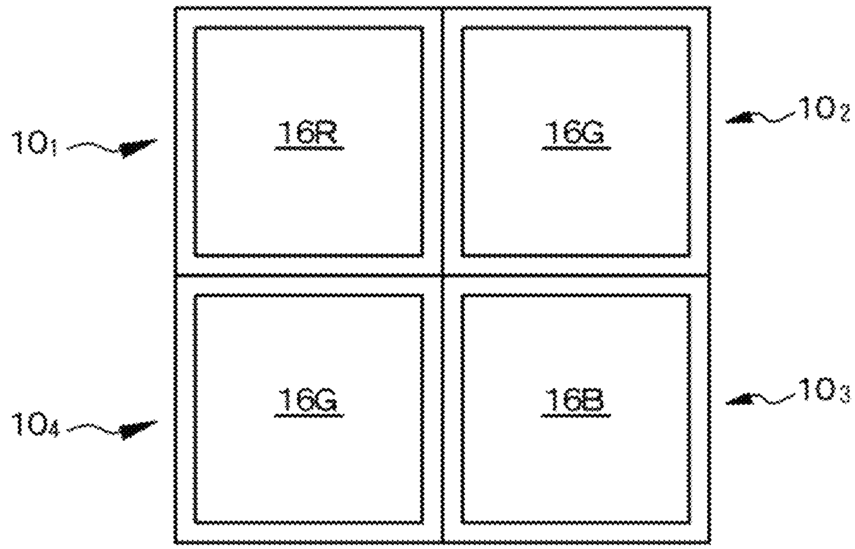
FIGS. 32A and 32B are a schematic layout diagram of a region for configuring the white light stacked-type imaging element and so forth and a schematic layout diagram of wire grid polarizers in a third modification of the working example 5, respectively.
Figure 32B:
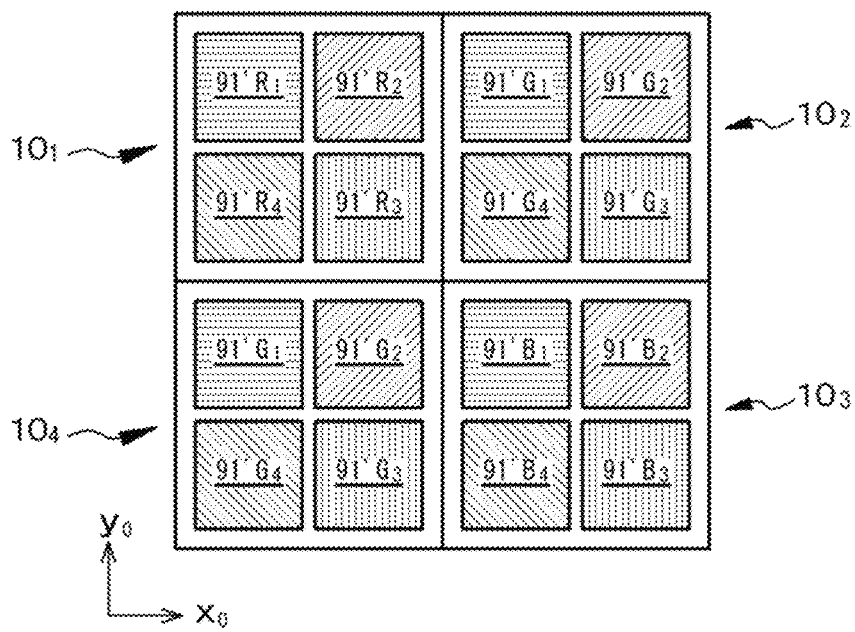

As the third modification of the stacked-type imaging element of the working example 5, a stacked-type imaging element configuring a solid-state imaging device having a Bayer array can be exemplified. In particular, a schematic layout diagram of color filter layers and so forth configuring a red light stacked-type imaging element, a green light stacked-type imaging element and a blue light stacked-type imaging element is depicted in FIG. 32A; a schematic layout diagram of wire grid polarizers is depicted in FIG. 32B; a schematic layout diagram of upper layer photoelectric conversion portions configuring a red light stacked-type imaging element, a green light stacked-type imaging element and a blue light stacked-type imaging element is depicted in FIG. 33A; and a schematic layout diagram of lower layer photoelectric conversion portions is depicted in FIG. 33B. As depicted in those figures, a plurality of photoelectric conversion portions can include a photoelectric conversion portion having sensitivity to red light, green light, or blue light and a photoelectric conversion portion having sensitivity to near infrared light.

In particular, the first stacked-type imaging element 101 includes a red color filter layer 16R [refer to FIG. 32A], four polarizer segments 91' $R_1$, 91'$R_2$, 91'$R_3$, and 91'$R_4$ disposed below the red color filter layer 16R [refer to FIG. 32B], upper layer photoelectric conversion portions (red light imaging elements 10$R_1$, 10$R_2$, 10$R_3$, and 10$R_4$) individually disposed below the four polarizer segments [refer to FIG. 33A], and lower layer photoelectric conversion portions (near infrared light photoelectric conversion portions 10$iR_{11}$, 10$iR_{12}$, 10$iR_{13}$, and 10$iR_{14}$) individually disposed below the upper layer photoelectric conversion portions [refer to FIG. 33B].

Meanwhile, the second stacked-type imaging element 10$_2$ and the fourth stacked-type imaging element 10$_4$ each include a green color filter layer 16G [refer to FIG. 32A], four polarizer segments 91'$G_1$, 91'$G_2$, 91'$G_3$, and 91'$G_4$ individually disposed below the green color filter layer 16G [refer to FIG. 32B], upper layer photoelectric conversion portions (green light imaging elements 10$G_1$, 10$G_2$, 10$G_3$, and 10$G_4$) individually disposed below the four polarizer segments [refer to FIG. 33A], and lower layer photoelectric conversion portions (near infrared light photoelectric conversion portions 10$iR_{21}$, 10$iR_{22}$, 10$iR_{23}$, 10$iR_{24}$, 10$iR_{41}$, 10$iR_{42}$, 10$iR_{43}$, and 10$iR_{44}$) individually disposed below the upper layer photoelectric conversion portions [refer to FIG. 33B].

Further, the third stacked-type imaging element 10$_3$ includes a blue color filter layer 16B [refer to FIG. 32A], four polarizer segments 91'$B_1$, 91'$B_2$, 91'$B_3$, and 91'$B_4$ disposed below the blue color filter layer 16B [refer to FIG. 32B], upper layer photoelectric conversion portions (blue light imaging elements 10$B_1$, 10$B_2$, 10$B_3$, and 10$B_4$) individually disposed below the four polarizer segments [refer to FIG. 33A], and lower layer photoelectric conversion portions (near infrared light photoelectric conversion portions 10$iR_{31}$, 10$iR_{32}$, 10$iR_{33}$, and 10$iR_{34}$) individually disposed below the upper layer photoelectric conversion portions [refer to FIG. 33B].

In the stacked-type imaging element of the working example 5 or the modifications of the same described above, the upper layer photoelectric conversion portion includes photoelectric conversion portions having a sensitivity to red light, green light, blue light, and white light and the lower layer photoelectric conversion portion includes a photoelectric conversion portion having sensitivity to near infrared light. However, alternatively the upper layer photoelectric conversion portion may include a photoelectric conversion portion having sensitivity to near infrared light while the lower layer photoelectric conversion portion includes photoelectric conversion portions having sensitivity to red light, green light, blue light, and white light. Also it is possible to configure the photoelectric conversion portion having sensitivity to red light, green light or blue light such that at least two photoelectric conversion portions selected from a group including a red light photoelectric conversion portion having sensitivity to red light, a green light photoelectric conversion portion having sensitivity to green light, and a blue light photoelectric conversion portion having sensitivity to blue light are stacked.

Working Example 6

Figure 35A:
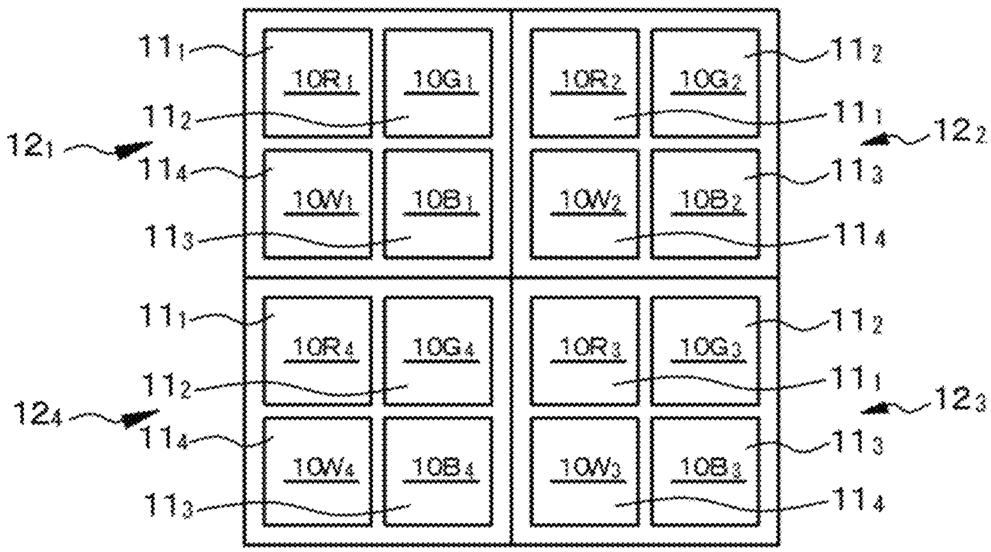
FIGS. 35A and 35B are a schematic layout diagram of an upper layer photoelectric conversion portion configuring a red light stacked-type imaging element, a green light stacked-type imaging element, a blue light stacked-type imaging element, and a white light stacked-type imaging element and so forth and a schematic layout diagram of a lower layer photoelectric conversion portion in the working example 6, respectively.
Figure 35B:
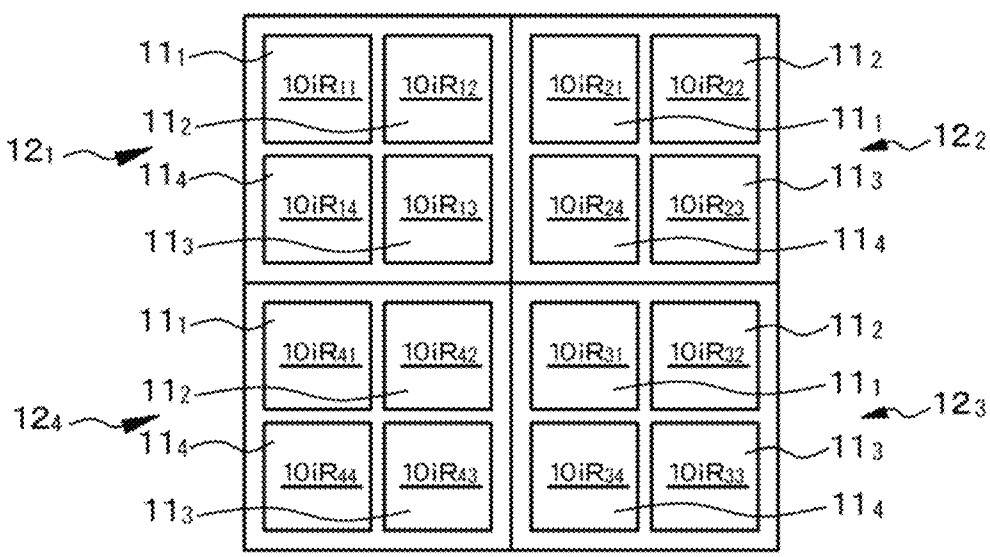

The working example 6 is a modification of the working example 5. A schematic layout diagram of a color filter layer and so forth configuring a red light stacked-type imaging element, a green light stacked-type imaging element, a blue light stacked-type imaging element, and a white light stacked-type imaging element in the working example 6 is depicted in FIG. 34A, and a schematic layout diagram of wire grid polarizers is depicted in FIG. 34B. Further, a schematic layout diagram of upper layer photoelectric conversion portions configuring a red light stacked-type imaging element, a green light stacked-type imaging element, a blue light stacked-type imaging element, and a white light stacked-type imaging element in the working example 6 is depicted in FIG. 35A, and a schematic layout diagram of lower layer photoelectric conversion portions is depicted in FIG. 35B.

In the solid-state imaging device of the working example 6, in a first imaging element unit 12$_1$, a first stacked-type imaging element 11$_1$ includes a photoelectric conversion portion 10$R_1$ having sensitivity to red light and a photoelectric conversion portion 10$iR_{11}$ having sensitivity to near infrared light, a second stacked-type imaging element 11$_2$ includes a photoelectric conversion portion 10$G_1$ having sensitivity to green light and a photoelectric conversion portion 10$iR_{12}$ having sensitivity to near infrared light, a third stacked-type imaging element 11$_3$ includes a photoelectric conversion portion 10$B_1$ having sensitivity to blue light and a photoelectric conversion portion 10$iR_{13}$ having sensitivity to near infrared light, and a fourth stacked-type imaging element 11$_4$ includes a photoelectric conversion portion 10$W_1$ having sensitivity to white light and a photoelectric conversion portion 10$iR_{14}$ having sensitivity to near infrared light.

Meanwhile, in a second imaging element unit 12$_2$, the first stacked-type imaging element 11$_1$ includes a photoelectric conversion portion 10$R_2$ having sensitivity to red light and a photoelectric conversion portion 10$iR_{21}$ having sensitivity to near infrared light, the second stacked-type imaging element 11$_2$ includes a photoelectric conversion portion 10$G_2$ having sensitivity to green light and a photoelectric conversion portion 10$iR_{22}$ having sensitivity to near infrared light, the third stacked-type imaging element 11$_3$ includes a photoelectric conversion portion 10$B_2$ having sensitivity to blue light and a photoelectric conversion portion 10$iR_{23}$ having sensitivity to near infrared light, and the fourth stacked-type imaging element 11$_4$ includes a photoelectric conversion portion 10$W_2$ having sensitivity to white light and a photoelectric conversion portion 10$iR_{24}$ having sensitivity to near infrared light.

Further, in a third imaging element unit 12$_3$, the first stacked-type imaging element 11$_1$ includes a photoelectric conversion portion 10$R_3$ having sensitivity to red light and a photoelectric conversion portion 10$iR_{31}$ having sensitivity to near infrared light, the second stacked-type imaging element 11$_2$ includes a photoelectric conversion portion 10$G_3$ having sensitivity to green light and a photoelectric conversion portion 10$iR_{32}$ having sensitivity to near infrared light, the third stacked-type imaging element 11$_3$ includes a photoelectric conversion portion 10$B_3$ having sensitivity to blue light and a photoelectric conversion portion 10$iR_{33}$ having sensitivity to near infrared light, and the fourth stacked-type imaging element 11$_4$ includes a photoelectric conversion portion 10$W_3$ having sensitivity to white light and a photoelectric conversion portion 10$iR_{34}$ having sensitivity to near infrared light.

Further, in a fourth imaging element unit $12_4$, the first stacked-type imaging element $11_1$ includes a photoelectric conversion portion $10R_4$ having sensitivity to red light and a photoelectric conversion portion $10iR_{41}$ having sensitivity to near infrared light, the second stacked-type imaging element $11_2$ includes a photoelectric conversion portion $10G_4$ having sensitivity to green light and a photoelectric conversion portion $10iR_{42}$ having sensitivity to near infrared light, the third stacked-type imaging element $11_3$ includes a photoelectric conversion portion $10B_4$ having sensitivity to blue light and a photoelectric conversion portion $10iR_{43}$ having sensitivity to near infrared light, and the fourth stacked-type imaging element $11_4$ includes a photoelectric conversion portion $10W_4$ having sensitivity to white light and a photoelectric conversion portion $10iR_{44}$ having sensitivity to near infrared light.

The first stacked-type imaging element $11_1$, the second stacked-type imaging element $11_2$, and the third stacked-type imaging element $11_3$ do not include a wire grid polarizer, and the fourth stacked-type imaging element $11_4$ includes wire grid polarizers $91W_1$, $91W_2$, $91W_3$, and $91W_4$.

Except the foregoing matters, the configuration and structure of the stacked-type imaging element and the configuration and the structure of the solid-state imaging device of the working example 6 can be made similar to the configuration and structure of the stacked-type imaging element and the solid-state imaging device described hereinabove in connection with the working example 5, and therefore, detailed description of them is omitted.

In the working example 6, since the first stacked-type imaging element $11_1$, the second stacked-type imaging element 112, and the third stacked-type imaging element $11_3$ do not include a wire grid polarizer and the fourth stacked-type imaging element $11_4$ includes the wire grid polarizers $91W_3$, $91W_2$, $91W_3$, and $91W_4$, such a situation that a luminance output is deteriorated arising from wavelength separation of red light, green light, and blue light can be prevented, and polarization information in the wavelength bands of red light, green light, and blue light can be acquired without a miss of polarization information. Consequently, the color, luminance and polarization information can be utilized to the utmost. Further, since there is no loss of light by a color filter layer, such an advantage that the output having polarization information is improved can be obtained.

<First Modification of Solid-State Imaging Device of Working Example 6>

Figure 36A:
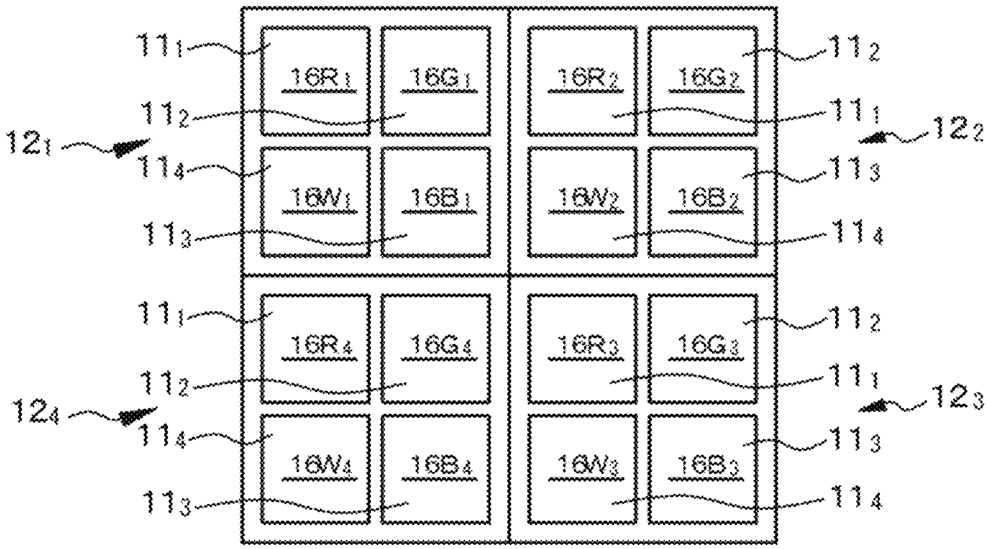
FIGS. 36A and 36B are a schematic layout diagram of a color filter layer configuring a red light stacked-type imaging element, a green light stacked-type imaging element, a blue light stacked-type imaging element, and a white light stacked-type imaging element and so forth and a schematic layout diagram of wire grid polarizers in a first modification of the working example 6, respectively.
Figure 36B:
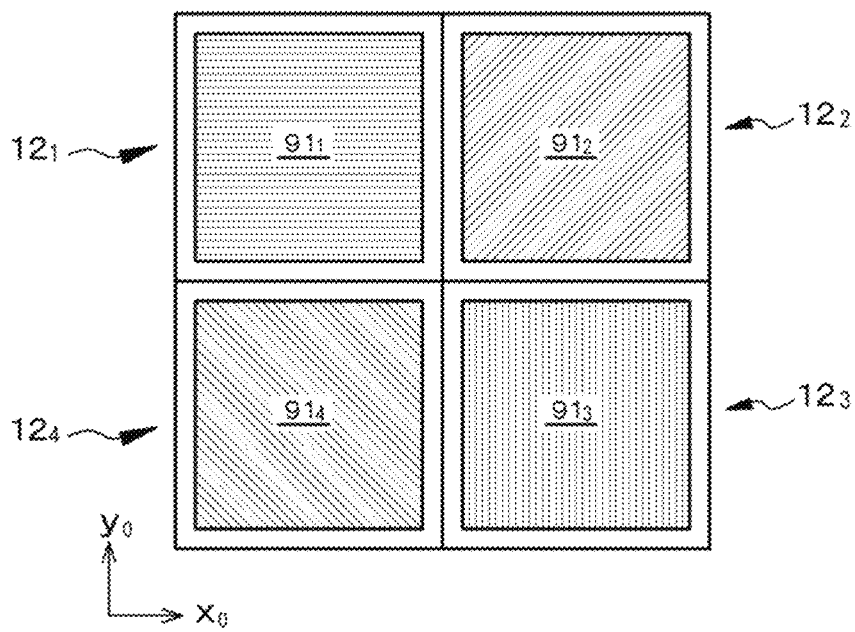
Figure 37A:
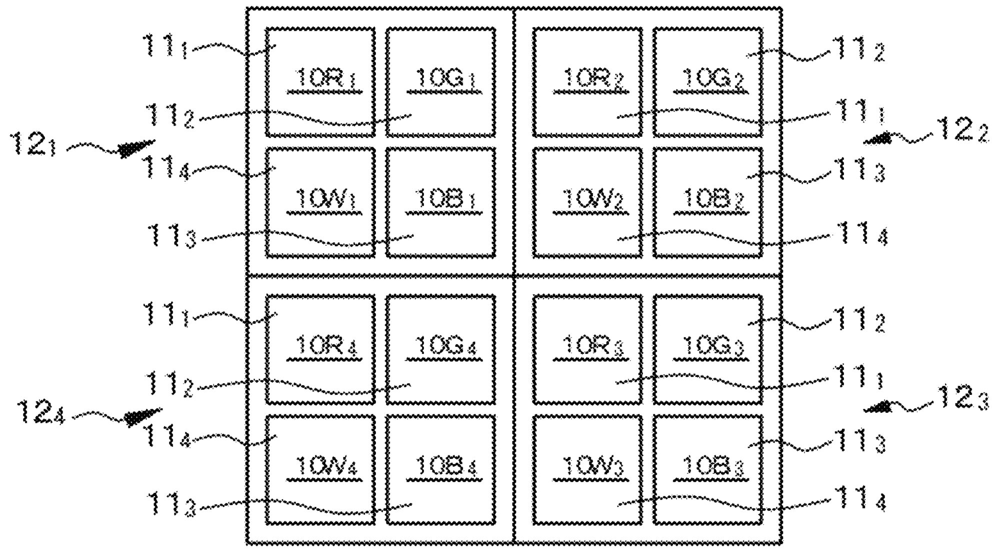
FIGS. 37A and 37B are a schematic layout diagram of an upper layer photoelectric conversion portion configuring a red light stacked-type imaging element, a green light stacked-type imaging element, a blue light stacked-type imaging element, and a white light stacked-type imaging element and so forth and a schematic layout diagram of a lower layer photoelectric conversion portion in the first modification of the working example 6, respectively.
Figure 37B:
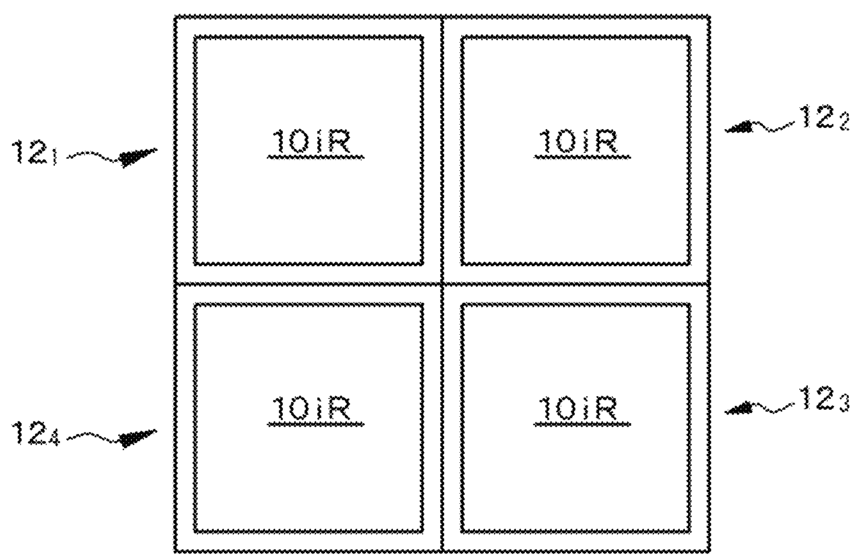

A schematic layout diagram of a color filter layer and so forth configuring a red light stacked-type imaging element, a green light stacked-type imaging element, a blue light stacked-type imaging element, and a white light stacked-type imaging element and so forth in the first modification of the working example 6 is depicted in FIG. 36A, and a schematic layout diagram of wire grid polarizers is depicted in FIG. 36B. Further, a schematic layout diagram of an upper layer photoelectric conversion portion configuring the red light stacked-type imaging element, green light stacked-type imaging element, blue light stacked-type imaging element, and white light stacked-type imaging element in the first modification of the working example 6 is depicted in FIG. 37A, and a schematic layout diagram of a lower layer photoelectric conversion portion is depicted in FIG. 37B.

In the first modification of the working example 6, each of the imaging element units $12_1$, $12_2$, $12_3$, and $12_4$ further includes wire grid polarizers $91_1$, $91_2$, and $91_3$ provided on the light incident side of the first stacked-type imaging element $11_1$, the second stacked-type imaging element $11_2$, and the third stacked-type imaging element $11_3$, and the wire grid polarizers $91_1$, $91_2$, $91_3$, and $91_4$ provided in the first stacked-type imaging element $11_1$, the second stacked-type imaging element $11_2$, the third stacked-type imaging element, and the fourth stacked-type imaging element $11_4$ have a same polarization direction in one wire grid polarizer.

In particular, in the first imaging element unit $12_1$, one wire grid polarizer $91_1$ is disposed and one lower layer photoelectric conversion portion $10iR$ is disposed for the photoelectric conversion portion 10R1 configuring the first stacked-type imaging element $11_1$, the photoelectric conversion portion $10G_1$ configuring the second stacked-type imaging element $11_1$, the photoelectric conversion portion $10B_1$ configuring the third stacked-type imaging element $11_1$, and the photoelectric conversion portion $10W_1$ configuring the fourth stacked-type imaging element $11_1$.

Meanwhile, in the second imaging element unit $12_2$, one wire grid polarizer $91_2$ is disposed and one lower layer photoelectric conversion portion $10iR$ is disposed for the photoelectric conversion portion $10R_2$ configuring the first stacked-type imaging element $11_2$, the photoelectric conversion portion $10G_2$ configuring the second stacked-type imaging element $11_2$, the photoelectric conversion portion $10B_2$ configuring the third stacked-type imaging element $11_2$, and the photoelectric conversion portion $10W_2$ configuring the fourth stacked-type imaging element $11_2$.

Further, in the third imaging element unit $12_3$, one wire grid polarizer $91_3$ is disposed and one lower layer photoelectric conversion portion $10iR$ is disposed for the photoelectric conversion portion $10R_3$ configuring the first stacked-type imaging element $11_3$, the photoelectric conversion portion $10G_3$ configuring the second stacked-type imaging element $11_3$, the photoelectric conversion portion $10B_3$ configuring the third stacked-type imaging element $11_3$, and the photoelectric conversion portion $10W_3$ configuring the fourth stacked-type imaging element $11_3$.

Furthermore, in the fourth imaging element unit $12_4$, one wire grid polarizer $91_4$ is disposed and one lower layer photoelectric conversion portion $10iR$ is disposed for the photoelectric conversion portion $10R_4$ configuring the first stacked-type imaging element $11_4$, the photoelectric conversion portion $10G_4$ configuring the second stacked-type imaging element $11_4$, the photoelectric conversion portion $10B_4$ configuring the third stacked-type imaging element $11_4$, and the photoelectric conversion portion $10W_4$ configuring the fourth stacked-type imaging element $11_4$.

Figure 38:
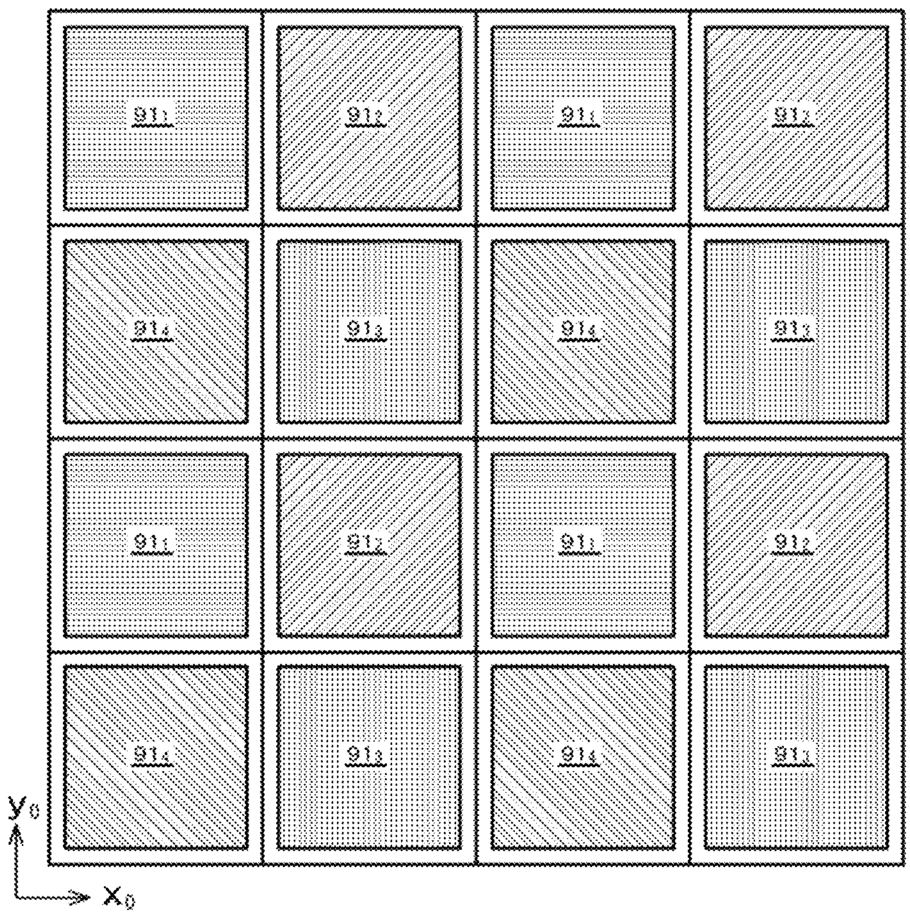
FIG. 38 is a schematic layout diagram of a wire grid polarizer configuring a red light stacked-type imaging element, a green light stacked-type imaging element, a blue light stacked-type imaging element, and a white light stacked-type imaging element in a second modification of the working example 6 and is a view illustrating a relation between wire grid polarizers in adjacent stacked-type imaging elements.

Furthermore, between adjacent ones of the imaging element units, the polarization direction of the wire grid polarizer is different (refer to a schematic layout diagram of wire grid polarizers of FIG. 38).

<Second Modification of Solid-State Imaging Device of Working Example 6>

Figure 39A:
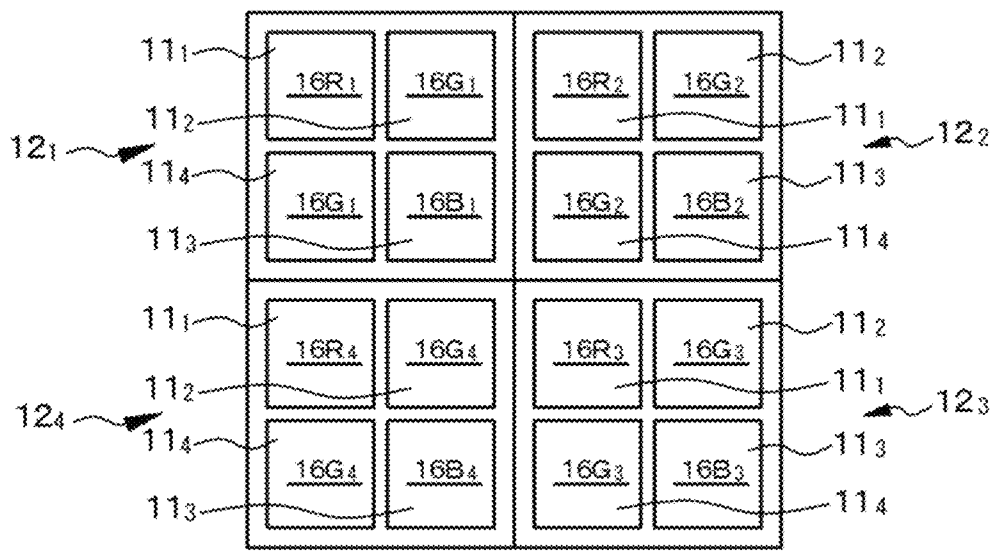
FIGS. 39A and 39B are a schematic layout diagram of a color filter layer configuring a red light stacked-type imaging element, a green light stacked-type imaging element, and a blue light stacked-type imaging element and so forth and a schematic layout diagram of wire grid polarizers in a third modification of the working example 6, respectively.
Figure 39B:
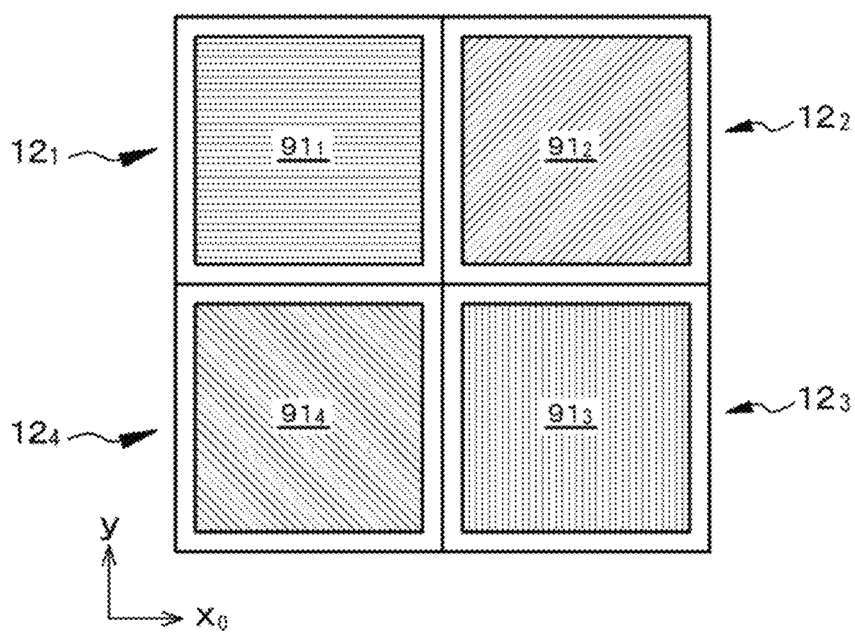
Figure 40A:
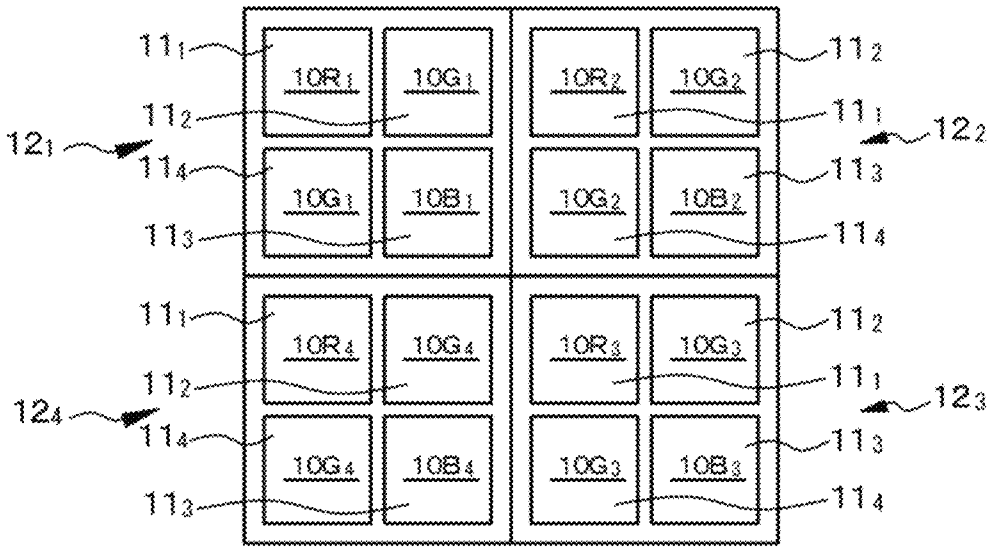
FIGS. 40A and 40B are a schematic layout diagram of an upper layer photoelectric conversion portion configuring a red light stacked-type imaging element, a green light stacked-type imaging element, and a blue light stacked-type imaging element and a schematic layout diagram of a lower layer photoelectric conversion portion in the third modification of the working example 6, respectively.
Figure 40B:
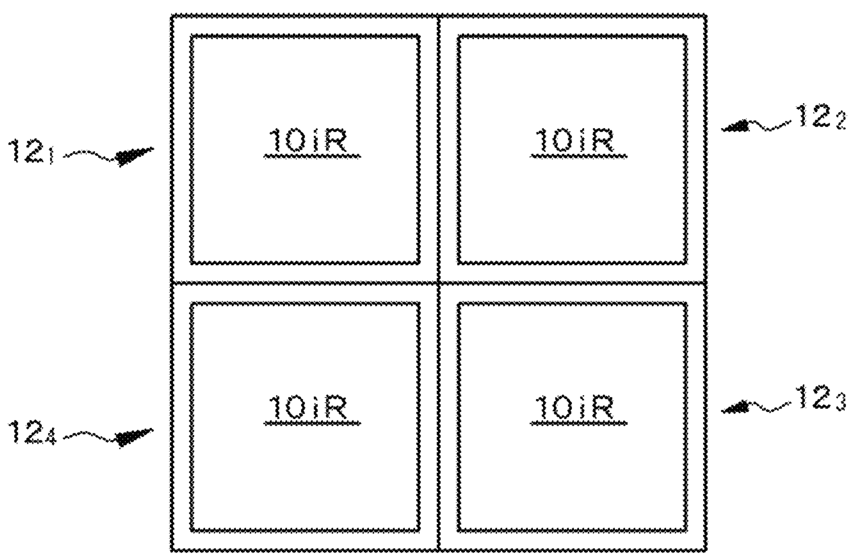

As the second modification of the stacked-type imaging element of the working example 6, a stacked-type imaging element configuring a solid-state imaging device having a Bayer array can be exemplified. A schematic layout diagram of a color filter layer and so forth configuring a red light stacked-type imaging element, a green light stacked-type imaging element, and a blue light stacked-type imaging element in the second modification of the working example 6 is depicted in FIG. 39A, and a schematic layout diagram of wire grid polarizers is depicted in FIG. 39B. Further, a schematic layout diagram of an upper layer photoelectric conversion portion configuring a red light stacked-type imaging element, a green light stacked-type imaging element, and a blue light stacked-type imaging element in the second modification of the working example 6 is depicted in FIG. 40A, and a schematic layout diagram of a lower layer photoelectric conversion portion is depicted in FIG. 40B.

In the second modification of the stacked-type imaging element of the working example 6, a plurality of photoelectric conversion portions can include a photoelectric conversion portion having sensitivity to red light, green light, or blue light and a photoelectric conversion portion having sensitivity to near infrared light.

In particular, the first stacked-type imaging element $\mathbf{11}_1$ configuring the first imaging element unit $\mathbf{12}_1$ includes a red color filter layer $\mathbf{16}R_1$, two green color filter layers $\mathbf{16}G_1$, a blue color filter layer $\mathbf{16}B_1$ [refer to FIG. 39A], one wire grid polarizer $\mathbf{91}_1$ disposed below the color filter layers $\mathbf{16}R_1$, $\mathbf{90}G_1$, and $\mathbf{90}B_1$ [refer to FIG. 39B], four upper layer photoelectric conversion portions (a red light imaging element $\mathbf{10}R_1$, a green light imaging element $\mathbf{10}G_1$, a blue light imaging element $\mathbf{10}B_1$, and another green light imaging element $\mathbf{10}G_1$) disposed below the one wire grid polarizer $\mathbf{91}_1$ [refer to FIG. 40A], and one lower layer photoelectric conversion portion (near infrared photoelectric conversion portion 10*i*R) disposed below the upper layer photoelectric conversion portions [refer to FIG. 40B].

Meanwhile, the first stacked-type imaging element 112 configuring the second imaging element unit $\mathbf{12}_2$ includes a red color filter layer $\mathbf{16}R_2$, two green color filter layers $\mathbf{16}G_2$, a blue color filter layer $\mathbf{16}B_2$ [refer to FIG. 39A], one wire grid polarizer $\mathbf{91}_2$ disposed below the color filter layers $\mathbf{16}R_2$, $\mathbf{90}G_2$, and $\mathbf{90}B_2$ [refer to FIG. 39B], four upper layer photoelectric conversion portions (a red light imaging element $\mathbf{10}R_2$, a green light imaging element $\mathbf{10}G_2$, a blue light imaging element $\mathbf{10}B_2$, and another green light imaging element $\mathbf{10}G_2$) disposed below the one wire grid polarizer $\mathbf{91}_2$ [refer to FIG. 40A], and one lower layer photoelectric conversion portion (near infrared photoelectric conversion portion 10*i*R) disposed below the upper layer photoelectric conversion portions [refer to FIG. 40B].

Further, the first stacked-type imaging element $\mathbf{11}_3$ configuring the third imaging element unit $\mathbf{12}_3$ includes a red color filter layer $\mathbf{16}R_3$, two green color filter layers $\mathbf{16}G_3$, a blue color filter layer $\mathbf{16}B_3$ [refer to FIG. 39A], one wire grid polarizer $\mathbf{91}_3$ disposed below the color filter layers $\mathbf{16}R_3$, $\mathbf{90}G_3$, and $\mathbf{90}B_3$ [refer to FIG. 39B], four upper layer photoelectric conversion portions (a red light imaging element $\mathbf{10}R_3$, a green light imaging element $\mathbf{10}G_3$, a blue light imaging element $\mathbf{10}B_3$, and another green light imaging element $\mathbf{10}G_3$) disposed below the one wire grid polarizer $\mathbf{91}_3$ [refer to FIG. 40A], and one lower layer photoelectric conversion portion (near infrared photoelectric conversion portion 10*i*R) disposed below the upper layer photoelectric conversion portions [refer to FIG. 40B].

Furthermore, the first stacked-type imaging element $\mathbf{11}_4$ configuring the fourth imaging element unit $\mathbf{12}_4$ includes a red color filter layer $\mathbf{16}R_4$, two green color filter layers $\mathbf{16}G_4$, a blue color filter layer $\mathbf{16}B_4$ [refer to FIG. 39A], one wire grid polarizer $\mathbf{91}_1$ disposed below the color filter layers $\mathbf{16}R_4$, $\mathbf{90}G_4$, and $\mathbf{90}B_4$ [refer to FIG. 39B], four upper layer photoelectric conversion portions (a red light imaging element $\mathbf{10}R_4$, a green light imaging element $\mathbf{10}G_4$, a blue light imaging element $\mathbf{10}B_4$, and another green light imaging element $\mathbf{10}G_4$) disposed below the one wire grid polarizer $\mathbf{91}_4$ [refer to FIG. 40A], and one lower layer photoelectric conversion portion (near infrared photoelectric conversion portion 10*i*R) disposed below the upper layer photoelectric conversion portions [refer to FIG. 40B].

In other words, in the first modification and the second modification of the working example 6, as depicted in FIGS. 36A, 36B, 37A, 37B, 39A, 39B, 40A, and 40B, the first stacked-type imaging element $\mathbf{11}_1$ includes a photoelectric conversion portion having sensitivity to red light and another photoelectric conversion portion having sensitivity to near infrared light, the second stacked-type imaging element $\mathbf{11}_2$ includes a photoelectric conversion portion having sensitivity to green light and another photoelectric conversion portion having sensitivity to near infrared light, the third stacked-type imaging element $\mathbf{11}_3$ includes a photoelectric conversion portion having sensitivity to blue light and another photoelectric conversion portion having sensitivity to near infrared light, an imaging element unit group includes four imaging element units arrayed in 2×2 and including a first imaging element unit $\mathbf{12}_1$, a second imaging element unit $\mathbf{12}_2$, a third imaging element unit $\mathbf{12}_3$, and a fourth imaging element unit $\mathbf{12}_4$ (namely, two imaging element units arrayed in the $x_0$ direction and two imaging element units arrayed in the $y_0$ direction), the polarization direction of light to be transmitted by the first wire grid polarizer $\mathbf{91}_1$ provided in the first imaging element unit $\mathbf{12}_1$ is α degrees, the polarization direction of light to be transmitted by the second wire grid polarizer $\mathbf{91}_2$ provided in the second imaging element unit $\mathbf{12}_2$ is (α+45) degrees, the polarization direction of light to be transmitted by the third wire grid polarizer $\mathbf{91}_3$ provided in the third imaging element unit $\mathbf{12}_3$ is (α+90) degrees, and the polarization direction of light to be transmitted by the fourth wire grid polarizer $\mathbf{91}_4$ provided in the fourth imaging element unit $\mathbf{12}_4$ is (α+135) degrees.

Working Example 7

The working example 7 is a modification of the working examples 5 to 6 and relates to a stacked-type imaging element including a charge accumulation electrode.

Figure 41:
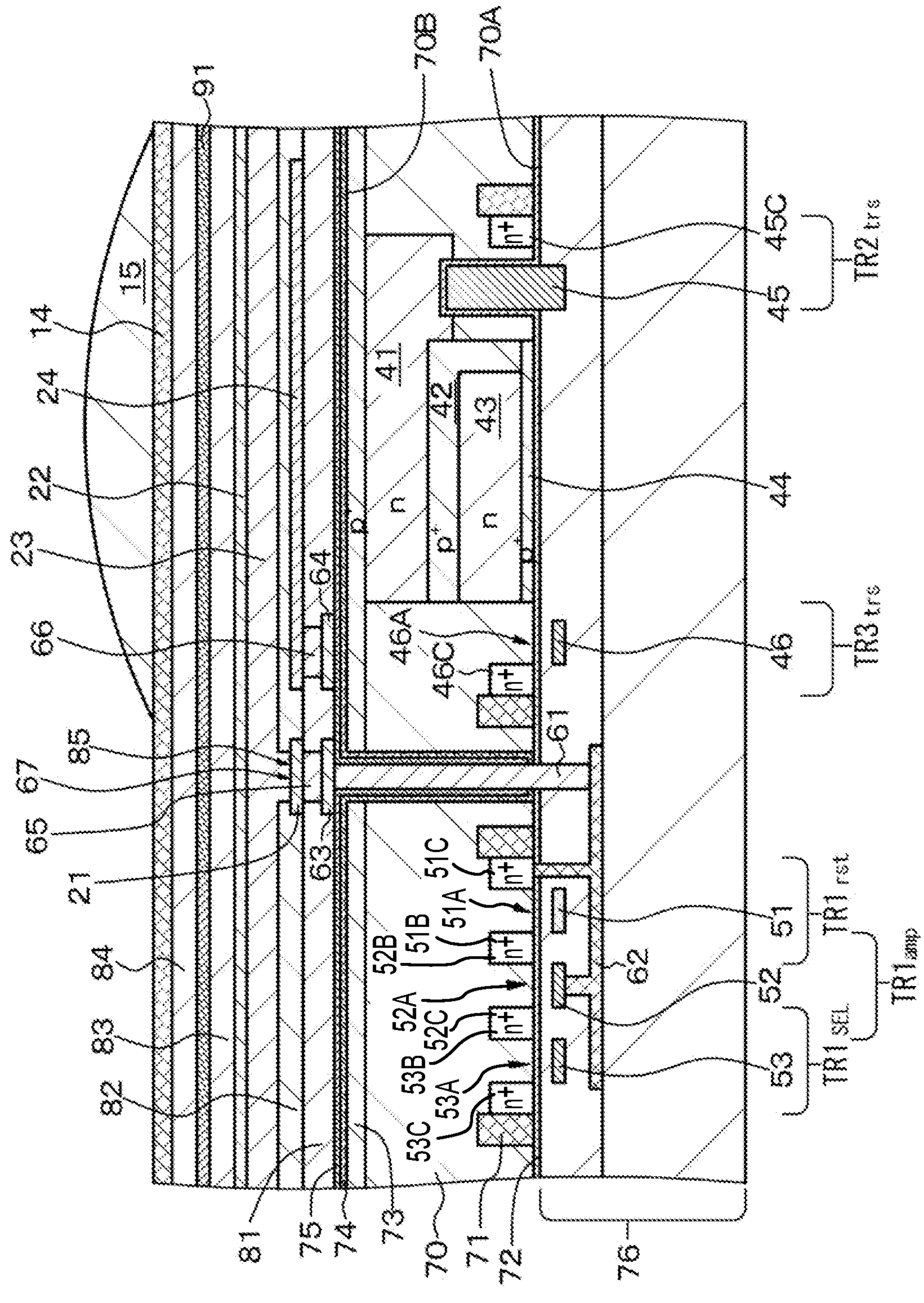
FIG. 41 is a schematic partial sectional view of a stacked-type imaging element of a working example 7.
Figure 42:
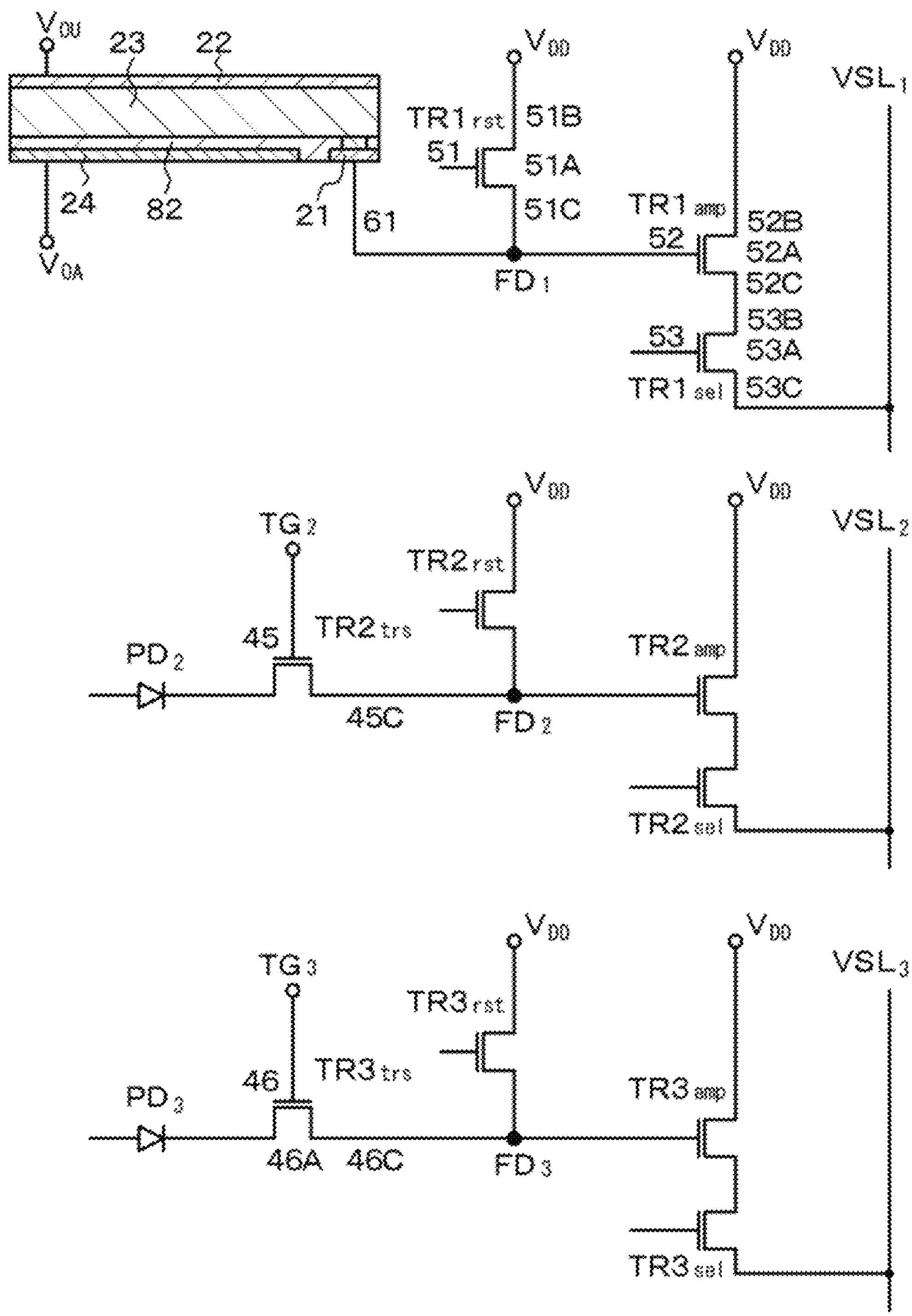
FIG. 42 is an equivalent circuit diagram of the stacked-type imaging element of the working example 7.
Figure 43:
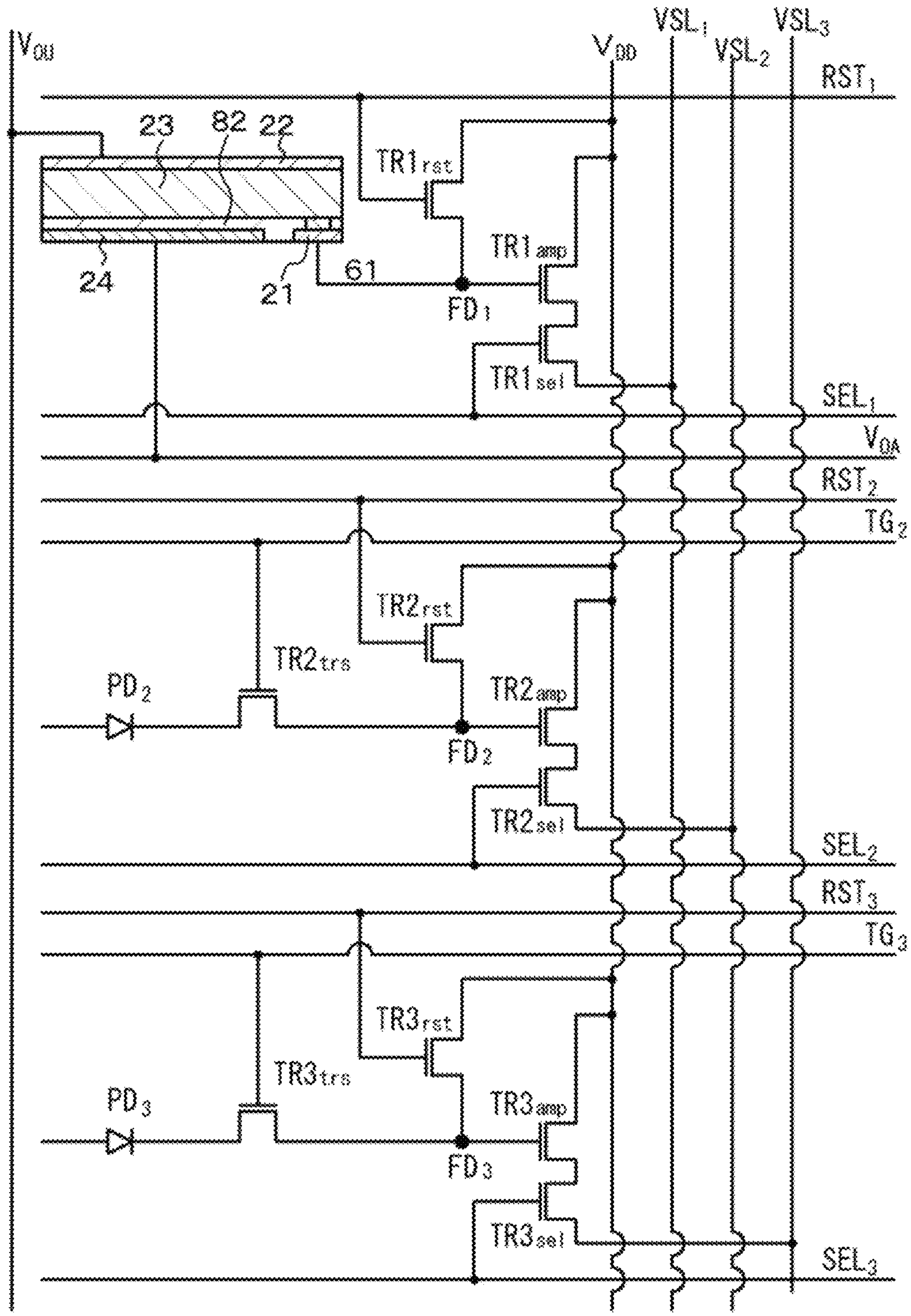
FIG. 43 is an equivalent circuit diagram of the stacked-type imaging element of the working example 7.
Figure 44:
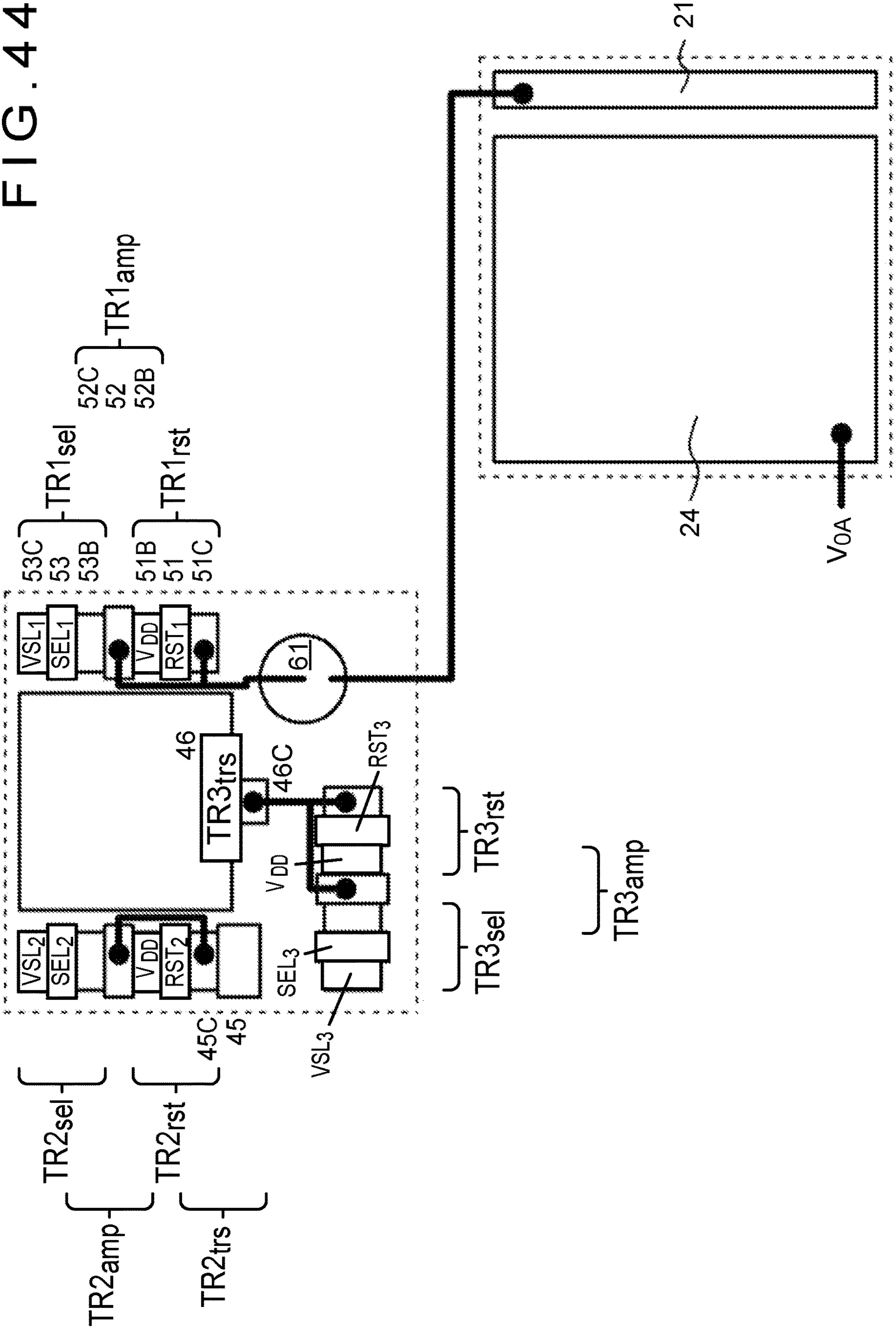
FIG. 44 is a schematic layout diagram of a first electrode and a charge accumulation electrode as well as transistors configuring a control portion, which configure the stacked-type imaging element of the working example 7.
Figure 45:
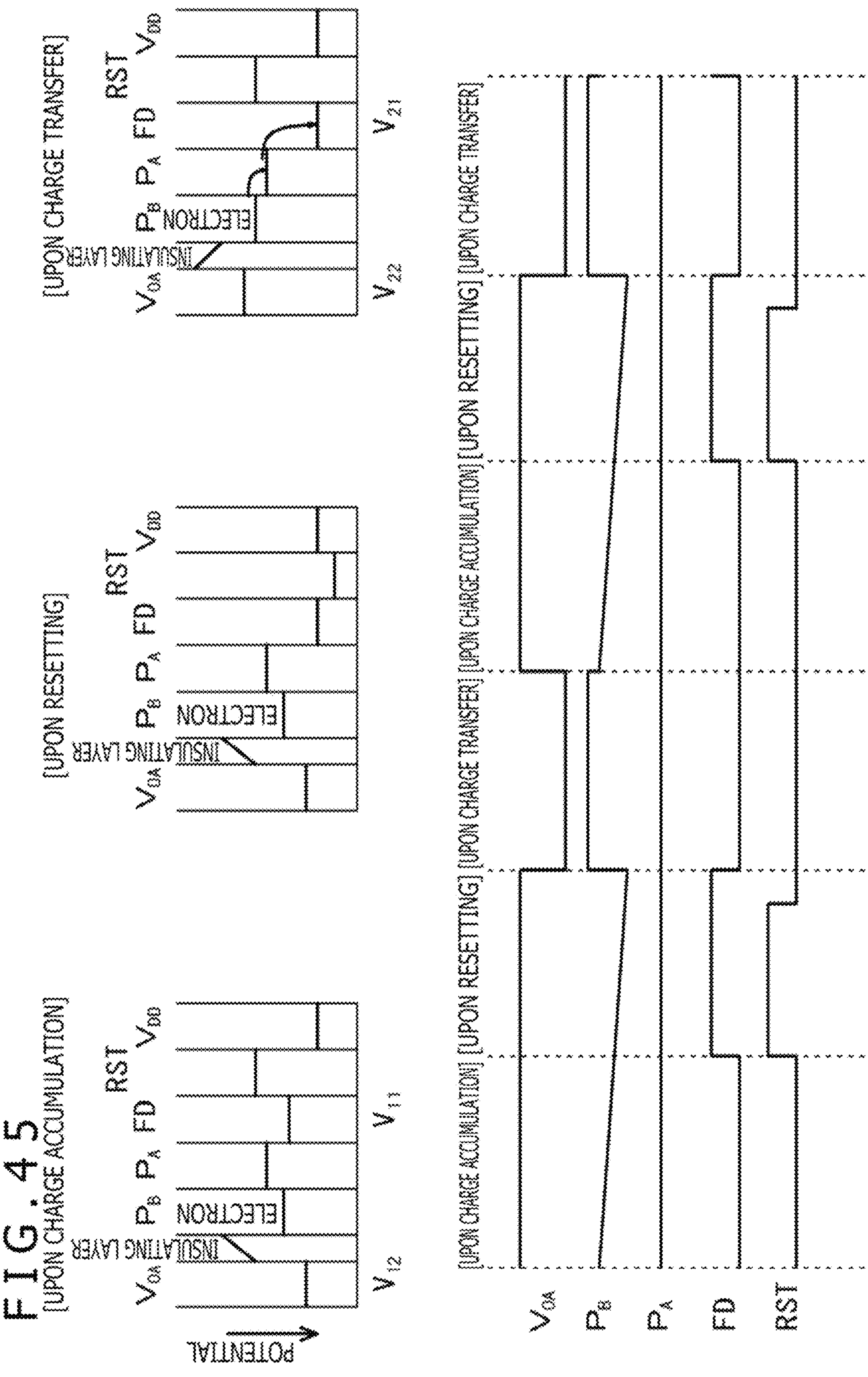
FIG. 45 is a view schematically depicting a state of potentials at respective portions upon operation of the stacked-type imaging element of the working example 7.
Figure 46A:
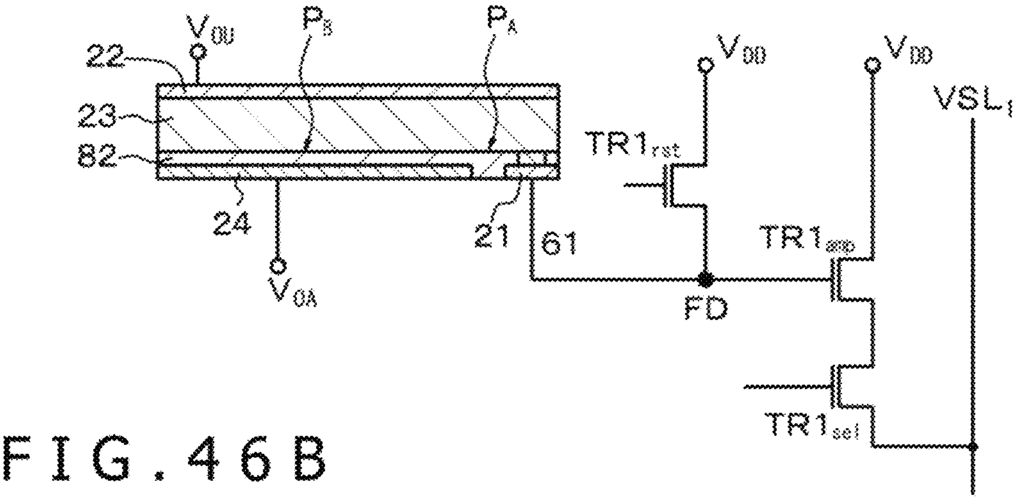
FIGS. 46A, 46B and 46C are equivalent circuit diagrams of the stacked-type imaging elements of the working examples 7, 10, and 12 illustrating respective portions of FIG. 45 (working example 7), FIGS. 60 and 61 (working example 10), and FIGS. 72 and 73 (working example 12).
Figure 47:
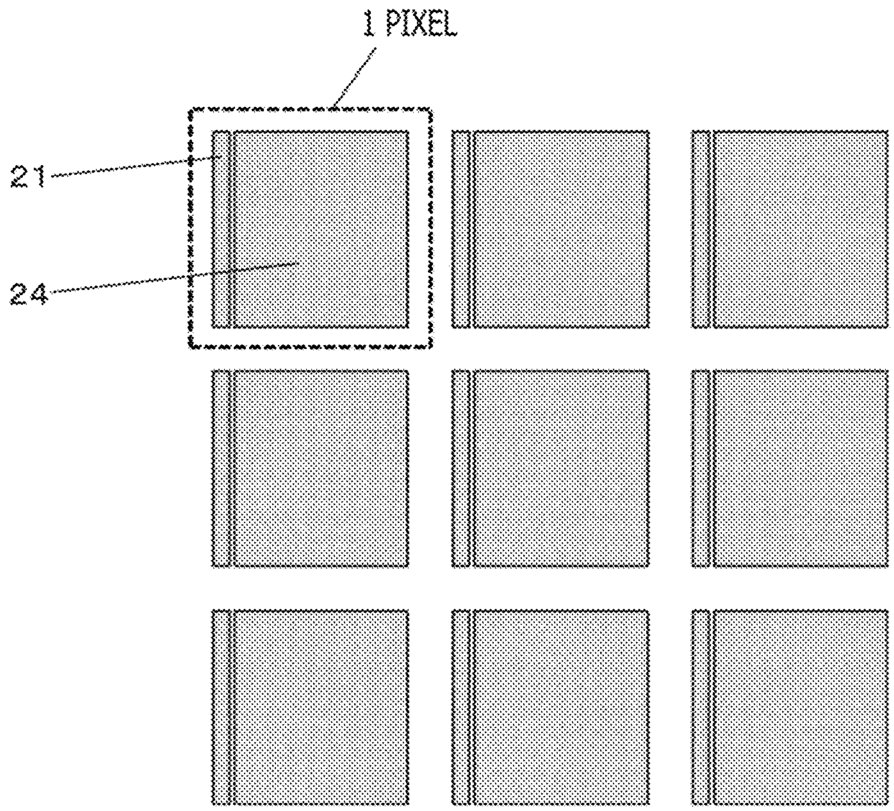
FIG. 47 is a schematic layout diagram of the first electrode and the charge accumulation electrode configuring the stacked-type imaging element of the working example 7.
Figure 48:
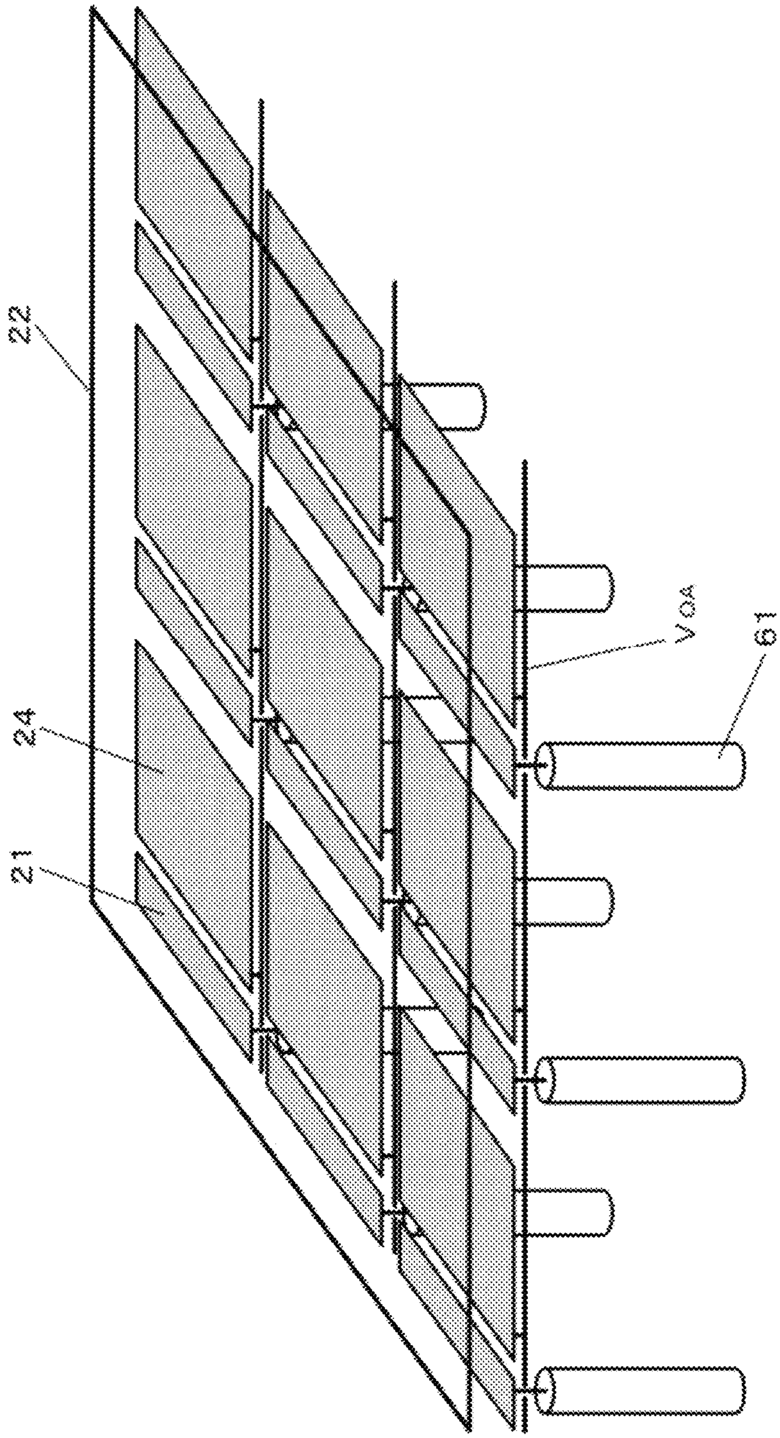
FIG. 48 is a schematic perspective view of the first electrode, the charge accumulation electrode, a second electrode, and a contact hole portion configuring the stacked-type imaging element of the working example 7.

A schematic partial sectional view of the stacked-type imaging element of the working example 7 (stacked-type imaging element including a charge accumulation electrode) is depicted in FIG. 41; equivalent circuit diagrams of the stacked-type imaging element of the working example 7 are depicted in FIGS. 42 and 43; a schematic layout diagram of a first electrode and a charge accumulation electrode as well as transistors configuring a control portion, which configure a photoelectric conversion portion including a charge accumulation electrode of the stacked-type imaging element of the working example 7 is depicted in FIG. 44; a schematic state of the potential at respective portions upon operation of the stacked-type imaging element of the working example 7 is depicted in FIG. 45; and an equivalent circuit diagram illustrating respective portions of the stacked-type imaging element of the working example 7 is depicted in FIG. 46A. Further, a schematic layout diagram of a first electrode and a charge accumulation electrode configuring a photoelectric conversion portion that includes a charge accumulation electrode of the stacked-type imaging element of the working example 7 is depicted in FIG. 47, and a schematic perspective view of the first electrode, the charge accumulation electrode, a second electrode, and a contact hole portion is depicted in FIG. 48.

In the stacked-type imaging element of the working example 7 (for example, a green light imaging element hereinafter described), at least one photoelectric conversion portion (in particular, this is a photoelectric conversion portion including one charge accumulation electrode and is an upper layer photoelectric conversion portion) from among a plurality of stacked photoelectric conversion portions includes a first electrode 21, a photoelectric conversion layer 23 and a second electrode 22 stacked on each other and further includes a charge accumulation electrode 24 disposed in a spaced relation from the first electrode 21 and disposed in an opposing relation to the photoelectric conversion layer 23 with an insulating layer 82 interposed therebetween. Note that, the wire grid polarizer 91 is simplified in the figure.

The stacked-type imaging element further includes a semiconductor substrate (more particularly, a silicon semiconductor layer) 70, and the photoelectric conversion portion (photoelectric conversion portion including the charge accumulation electrode) is disposed above the semiconductor substrate 70. The stacked-type imaging element further includes a control portion provided on the semiconductor substrate 70 and including a driving circuit to which the first electrode 21 and the second electrode 22 are connected. Here, it is assumed that a light incident face of the semiconductor substrate 70 indicates an upper direction and the opposite side of the semiconductor substrate 70 indicates a downward direction. A wiring layer 62 including a plurality of wirings is provided below the semiconductor substrate 70.

On the semiconductor substrate 70, at least a floating diffusion layer EDI and an amplification transistor $TR1_{amp}$ that configure the control portion are provided, and the first electrode 21 is connected to the first floating diffusion layer EDI and the gate portion of the amplification transistor $TR1_{amp}$. On the semiconductor substrate 70, a reset transistor $TR1_{rst}$ and a selection transistor $TR1_{sel}$ that configure the control portion are provided further. The floating diffusion layer EDI is connected to one of the source/drain regions of the reset transistor $TR1_{rst}$, and one of the source/drain regions of the amplification transistor $TR1_{amp}$ is connected to one of the source/drain regions of the selection transistor $TR1_{sel}$ while the other of the source/drain regions of the selection transistor $TR1_{sel}$ is connected to a signal line $VSL_1$. The amplification transistor $TR1_{amp}$, reset transistor $TR1_{rst}$ and selection transistor $TR1_{sel}$ configure the driving circuit.

In particular, the stacked-type imaging element of the working example 7 is an imaging element of the back-illuminated type and is structured such that three imaging elements including a green light imaging element of the working example 7 of a first type (hereinafter referred to as “first imaging element”) including a green light photoelectric conversion layer of a first type for absorbing green light and having sensitivity to green light, a conventional blue light imaging element of a second type (hereinafter referred to as “second imaging element”) including a blue light photoelectric conversion layer of a second type for absorbing blue light and having sensitivity to blue light, and a conventional red light imaging element of the second type (hereinafter referred to as “third imaging element”) including a red light photoelectric conversion layer of the second type for absorbing red light and having sensitivity to red light. Here, the red light imaging element (third imaging element) and the blue light imaging element (second imaging element) are provided in the semiconductor substrate 70, and the second imaging element is positioned on the light incident side with respect to the third imaging element. Further, the green light imaging element (first imaging element) is provided above the blue light imaging element (second imaging element). One pixel includes the first imaging element, the second imaging element, and the third imaging element. No color filter layer is provided.

In the first imaging element, the first electrode 21 and the charge accumulation electrode 24 are formed in a spaced relation from each other on an interlayer insulating layer 81. The interlayer insulating layer 81 and the charge accumulation electrode 24 are covered with an insulating layer 82. The photoelectric conversion layer 23 is formed on the insulating layer 82, and the second electrode 22 is formed on the photoelectric conversion layer 23. In an overall area including the second electrode 22, a first interlayer insulating layer 83 is formed, and a wire grid polarizer 91, a second interlayer insulating layer 84, an on-chip microlens underlayer 14 and an on-chip microlens 15 are provided on the first interlayer insulating layer 83. No color filter layer is provided. The first electrode 21, the charge accumulation electrode 24, and the second electrode 22 include a transparent electrode including, for example, ITO (work function: approximately 4.4 eV). The photoelectric conversion layer 23 includes a layer including a well-known organic photoelectric conversion material having sensitivity at least to green light (organic material such as, for example, a rhodamine dye, a melocyanin dye, or a quinacridone pigment). Further, the photoelectric conversion layer 23 may be configured further including a material layer suitable for charge accumulation. In other words, a material layer suitable for charge accumulation may further be formed between the photoelectric conversion layer 23 and the first electrode 21 (for example, in a connection portion 67). The interlayer insulating layer 81, the insulating layer 82, the first interlayer insulating layer 83, and the second interlayer insulating layer 84 include well-known insulating materials (for example, $SiO_2$ or SiN). The photoelectric conversion layer 23 and the first electrode 21 are connected to each other by the connection portion 67 provided on the insulating layer 82. In the connection portion 67, the photoelectric conversion layer 23 extends. In particular, the photoelectric conversion layer 23 extends in an opening 85 provided in the insulating layer 82 and is connected to the first electrode 21.

The charge accumulation electrode 24 is connected to a driving circuit. In particular, the charge accumulation electrode 24 is connected to the vertical driving circuit 112 confirming a driving circuit through a connection hole 66 provided in the interlayer insulating layer 81, a pad portion 64 and a wiring $V_{OA}$ provided in the interlayer insulating layer 81.

The size of the charge accumulation electrode 24 is greater than that of the first electrode 21. Where the area of the charge accumulation electrode 24 is represented by $S_1'$ and the area of the first electrode 21 is represented by $S_1$, though not restrictive, it is preferable that $$4 \leq S_1'/S_1$$

is satisfied, and in the working example 7, though not restrictive, for example, $$S_1'/S_1 = 8.$$

It is to be noted that the working examples 13 to 16 hereinafter described, the three photoelectric conversion portion segments $10'_1$, $10'_2$, and $10'_3$ have an equal size and have a same planar shape.

An element isolation region 71 is formed on the first face (front face) 70A side of the semiconductor substrate 70, and an oxide film 72 is formed on the first face 70A of the semiconductor substrate 70. Further, a reset transistor $TR1_{rst}$, an amplification transistor $TR1_{amp}$ and a selection transistor $TR1_{sel}$ that configure the control portion of the first imaging element are provided on the first face side of the semiconductor substrate 70, and a first floating diffusion layer $FD_1$ is provided further.

The reset transistor $TR\mathbf{1}_{rst}$ includes a gate portion 51, a channel formation region 51A and source/drain regions 51B and 51C. The gate portion 51 of the reset transistor $TR\mathbf{1}_{rst}$ is connected to a reset line $RST_1$, and one 51C of the source/drain regions of the reset transistor $TR\mathbf{1}_{rst}$ serves also as a first floating diffusion layer $FD_1$, and the other 51B of the source/drain regions is connected to a power supply $V_{DD}$.

The first electrode 21 is connected to the one 51C of the source/drain regions of the reset transistor $TR\mathbf{1}_{rst}$ (first floating diffusion layer $FD_1$) through a connection hole 65 and a pad portion 63 provided in the interlayer insulating layer 81, a contact hole portion 61 formed in the semiconductor substrate 70 and the interlayer insulating layer 76, and a wiring layer 62 formed in the interlayer insulating layer 76.

The amplification transistor $TR\mathbf{1}_{amp}$ includes a gate portion 52, a channel formation region 52A and source/drain regions 52B and 52C. The gate portion 52 is connected to the first electrode 21 and one 51C of the source/drain regions of the reset transistor $TR\mathbf{1}_{rst}$ (first floating diffusion layer $FD_1$) through the wiring layer 62. Further, one 52B of the source/drain regions is connected to the power supply $V_{DD}$.

The selection transistor $TR\mathbf{1}_{sel}$ includes a gate portion 53, a channel formation region 53A and source/drain regions 53B and 53C. The gate portion 53 is connected to the selection line $SEL_1$. Further, one 53B of the source/drain regions shares a region with the other 52C of the source/drain regions that configure the amplification transistor $TR\mathbf{1}_{amp}$, and the other 53C of the source/drain regions is connected to the signal line (data output line) $VSL_1$ (117).

The second imaging element includes an n-type semiconductor region 41 provided on the semiconductor substrate 70 as a photoelectric conversion layer. A gate portion 45 of the transfer transistor $TR\mathbf{2}_{trs}$ including a vertical transistor extends to the n-type semiconductor region 41 and is connected to a transfer gate line $TG_2$. Further, a second floating diffusion layer $FD_2$ is provided in a region 45C of the semiconductor substrate 70 in the proximity of the gate portion 45 of the transfer transistor $TR\mathbf{2}_{trs}$. Charge accumulated in the n-type semiconductor region 41 is read out to the second floating diffusion layer $FD_2$ through a transfer channel that is formed along the gate portion 45.

In the second imaging element, a reset transistor $TR\mathbf{2}_{rst}$, an amplification transistor $TR\mathbf{2}_{amp}$ and a selection transistor $TR\mathbf{2}_{sel}$ that configure a control portion of the second imaging element are provided on the first face side of the semiconductor substrate 70.

The reset transistor $TR\mathbf{2}_{rst}$ includes a gate portion, a channel formation region and source/drain regions. The gate portion of the reset transistor $TR\mathbf{2}_{rst}$ is connected to the reset line $RST_2$, and one of the source/drain regions of the reset transistor $TR\mathbf{2}_{rst}$ is connected to the power supply $V_{DD}$ while the other of the source/drain regions serves also as a second floating diffusion layer $FD_2$.

The amplification transistor $TR\mathbf{2}_{amp}$ includes a gate portion, a channel formation region and source/drain regions. The gate portion of the amplification transistor $TR\mathbf{2}_{amp}$ is connected to the other of the source/drain regions of the reset transistor $TR\mathbf{2}_{rst}$ (second floating diffusion layer $FD_2$). Meanwhile, one of the source/drain regions is connected to the power supply $V_{DD}$.

The selection transistor $TR\mathbf{2}_{sel}$ includes a gate portion, a channel formation region, and source/drain regions. The gate portion is connected to the selection line $SEL_2$. Meanwhile, one of the source/drain regions shares a region with the other of the source/drain regions that configures the amplification transistor $TR\mathbf{2}_{amp}$, and the other of the source/drain regions is connected to the signal line (data output line) $VSL_2$.

The third imaging element includes an n-type semiconductor region 43 provided on the semiconductor substrate 70 as a photoelectric conversion layer. A gate portion 46 of a transfer transistor $TR\mathbf{3}_{trs}$ is connected to a transfer gate line $TG_3$. Further, a third floating diffusion layer $FD_3$ is provided in a region 46C of the semiconductor substrate 70 in the proximity of the gate portion 46 of the transfer transistor $TR\mathbf{3}_{trs}$. Charge accumulated in the n-type semiconductor region 43 is read out to the third floating diffusion layer $FD_3$ through a transfer channel 46A that is formed along the gate portion 46.

In the third imaging element, a reset transistor $TR\mathbf{3}_{rst}$, a amplification transistor $TR\mathbf{3}_{amp}$ and a selection transistor $TR\mathbf{3}_{sel}$ that configure the control portion of the third imaging element are provided on the first face side of the semiconductor substrate 70.

The reset transistor $TR\mathbf{3}_{rst}$ includes a gate portion, a channel formation region and source/drain regions. The gate portion of the reset transistor $TR\mathbf{3}_{rst}$ is connected to a reset line $RST_3$, and one of the source/drain regions of the reset transistor $TR\mathbf{3}_{rst}$ is connected to the power supply $V_{DD}$ while the other of the source/drain regions serves also as the third floating diffusion layer $FD_3$.

The amplification transistor $TR\mathbf{3}_{amp}$ includes a gate portion, a channel formation region and source/drain regions. The gate portion of the amplification transistor $TR\mathbf{3}_{amp}$ is connected to the other of the source/drain regions (third floating diffusion layer $FD_3$) of the reset transistor $TR\mathbf{3}_{rst}$. Meanwhile, one of the source/drain regions is connected to the power supply $V_{DD}$.

The selection transistor $TR\mathbf{3}_{sel}$ includes a gate portion, a channel formation region, and source/drain regions. The gate portion is connected to a selection line $SEL_3$. Meanwhile, one of the source/drain regions shares a region with the other of the source/drain regions that configures the amplification transistor $TR\mathbf{3}_{amp}$, and the other of the source/drain regions is connected to a signal line (data output line) $VSL_3$.

The reset lines $RST_1$, $RST_2$, and $RST_3$, selection lines $SEL_1$, $SEL_2$, and $SEL_3$ and transfer gate lines $TG_2$ and $TG_3$ are connected to the vertical driving circuit 112 that configures the driving circuit, and the signal lines (data output lines) $VSL_1$, $VSL_2$, and $VSL_3$ are connected to the column signal processing circuit 113 that configures the driving circuit.

A $p^+$ layer 44 is provided between the n-type semiconductor region 43 and the surface 70A of the semiconductor substrate 70 and suppresses generation of dark current. Another $p^+$ layer 42 is formed between the n-type semiconductor region 41 and the n-type semiconductor region 43, and part of a side face of the n-type semiconductor region 43 is surrounded by the $p^+$ layer 42. A $p^+$ layer 73 is formed on the rear face 70B side of the semiconductor substrate 70, and a $HfO_2$ film 74 and an insulating material film 75 are formed at a portion at which a contact hole portion 61 is to be formed in the inside of the semiconductor substrate 70 from the $p^+$ layer 73. Although, in the interlayer insulating layer 76, wirings are formed over a plurality of layers, they are not depicted.

The $HfO_2$ film 74 is a film having negative fixed charge, and by providing such a film as just described, generation of dark current can be suppressed. It is to be noted that, in place of the $HfO_2$ film, also an aluminum oxide ($Al_2O_3$) film, a zirconium oxide ($ZrO_2$) film, a tantalum oxide ($Ta_2O_5$) film, a titanium oxide ($TiO_2$) film, a lanthanum oxide ($La_2O_3$) film, a praseodymium oxide ($Pr_2O_3$) film, a cerium oxide ($CeO_2$) film, a neodymium oxide ($Nd_2O_3$) film, a promethium oxide ($Pm_2O_3$) film, a samarium oxide ($Sm_2O_3$) film, a europium oxide ($Eu_2O_3$) film, a gadolinium oxide ($Gd_2O_3$) film, a terbium oxide ($Tb_2O_3$) film, a dysprosium oxide ($Dy_2O_3$) film, a holmium oxide ($HO_2O_3$) film, a thulium oxide ($Tm_2O_3$) film, an ytterbium oxide ($Yb_2O_3$) film, a lutetium oxide ($Lu_2O_3$) film, an yttrium oxide ($Y_2O_3$) film, a hafnium nitride film, an aluminum nitride film, a hafnium oxynitride film, and an aluminum oxynitride film can be used. As the film formation (formation) method of the films mentioned, for example, a CVD method, a PVD method, and an ALD method can be exemplified.

In the following, operation of a stacked-type imaging element including the charge accumulation electrode of the working example 7 (or the imaging element in the present disclosure, the first imaging element) is described with reference to FIGS. 45 and 46A. Here, the potential of the first electrode 21 is made higher than the potential of the second electrode 22. In particular, for example, the first electrode 21 is set to a positive potential and the second electrode 22 is set to a negative potential, and electrons generated by photoelectric conversion by the photoelectric conversion layer 23 are read out to a floating diffusion layer. This applies also to the other working examples. It is to be noted, in a form where the first electrode 21 has a negative potential while the second electrode 22 has a positive potential and holes generated by photoelectric conversion by the photoelectric conversion layer 23 are read out into the floating diffusion layer, it is sufficient if the potential levels given below are reversed.

Figure 60:
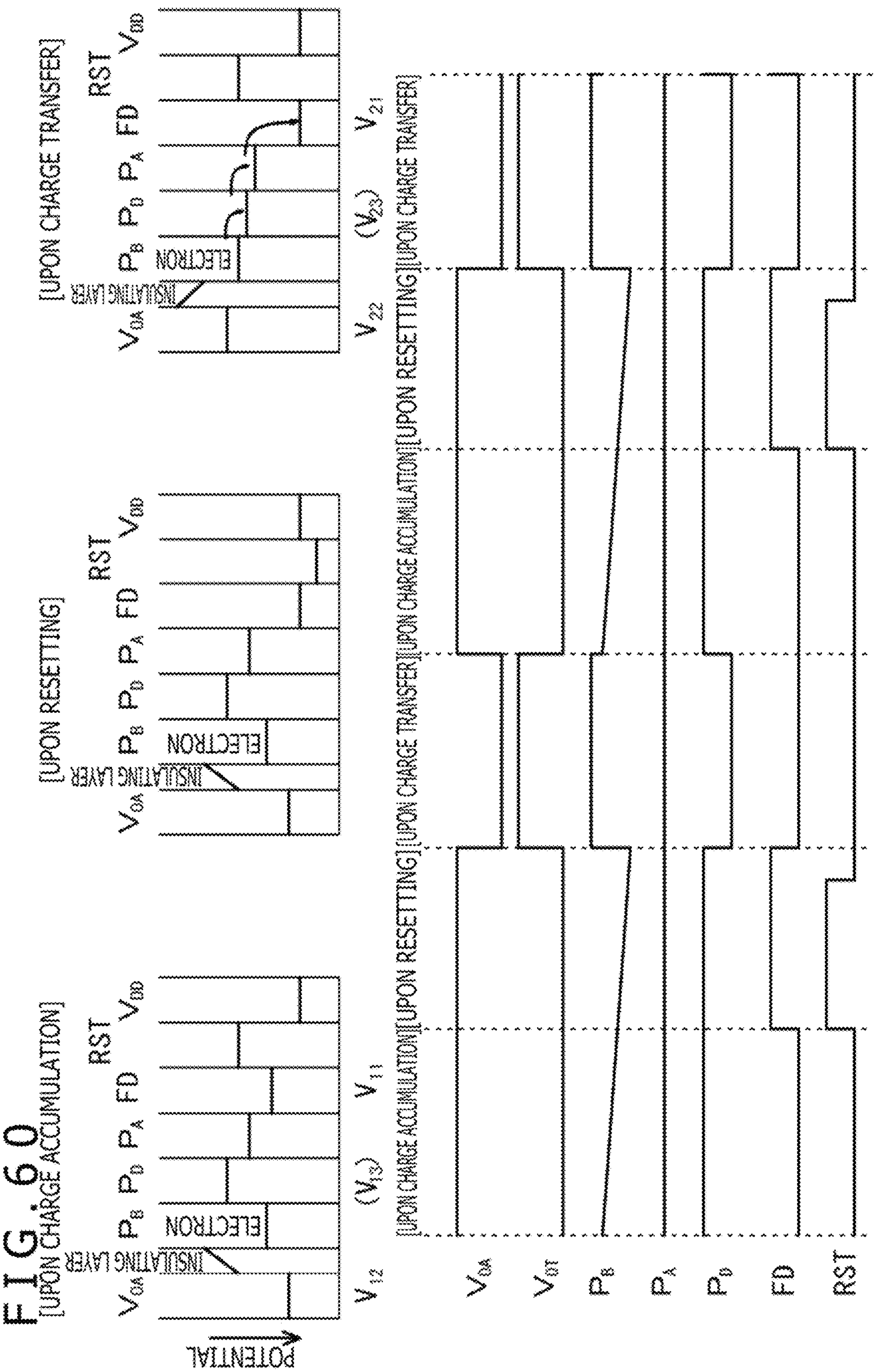
FIG. 60 is a view schematically depicting a state of potentials at respective portions upon operation of the stacked-type imaging element of the working example 10.
Figure 61:
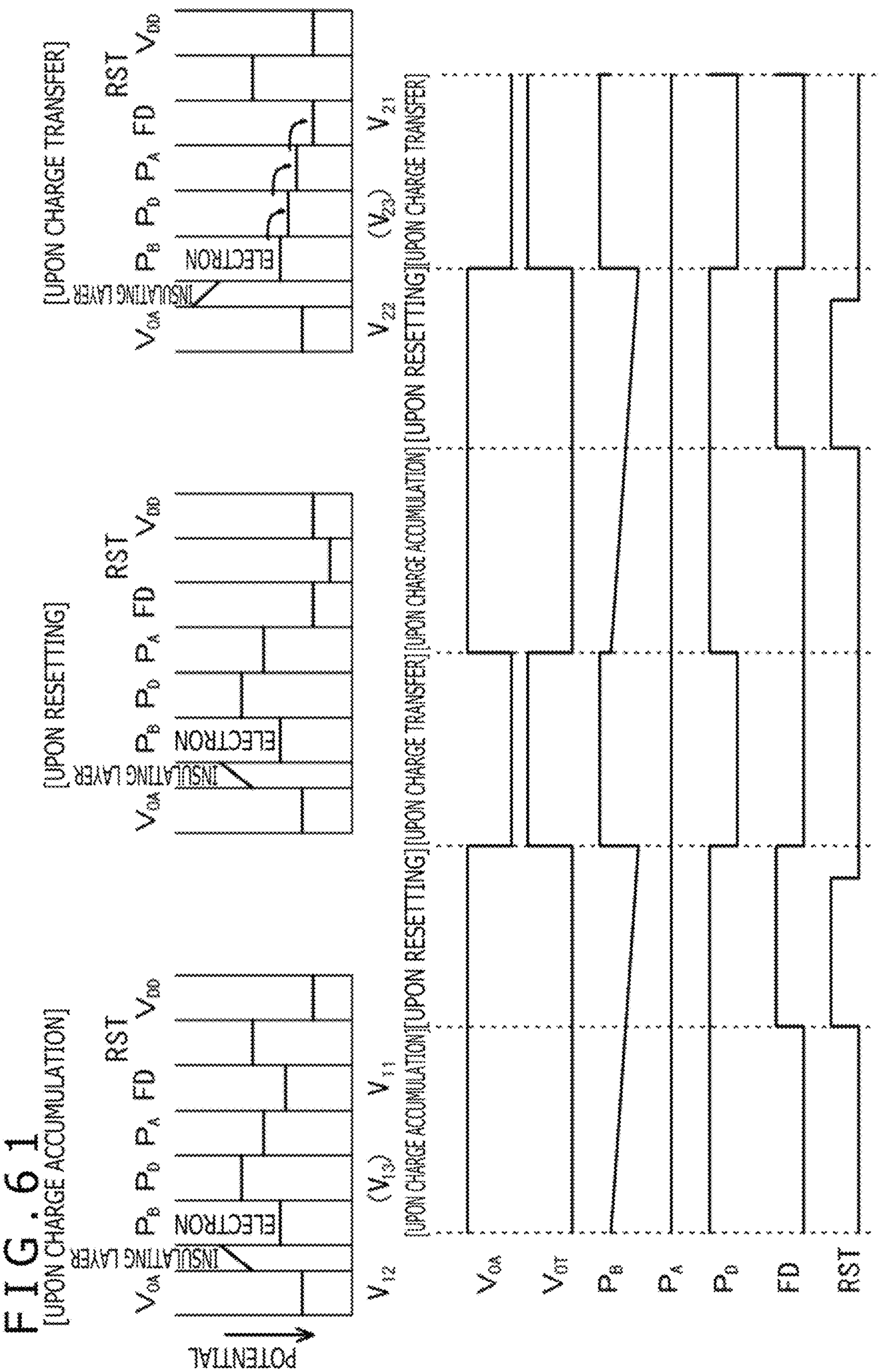
FIG. 61 is a view schematically depicting a state of potentials at respective portions upon different operation of the stacked-type imaging element of the working example 10.

Reference signs used in FIG. 45, FIGS. 60 and 61 in the case of the working example 10, and FIGS. 72 and 73 in the case of the working example 12 are such as given below.

$P_A$ . . . potential at a point $P_A$ in a region of the photoelectric conversion layer 23 opposing to a region positioned intermediately between the charge accumulation electrode 24 or a transfer controlling electrode (charge transfer electrode) 25 and the first electrode 21

$P_B$ . . . potential at a point $P_B$ in the region of the photoelectric conversion layer 23 opposing to the charge accumulation electrode 24

$P_{C1}$ . . . potential at a point $P_{C1}$ in the region of the photoelectric conversion layer 23 opposing to a charge accumulation electrode segment 24A $P_{C2}$ . . . potential at a point $P_{C2}$ in the region of the photoelectric conversion layer 23 opposing to a charge accumulation electrode segment 24B $P_{C3}$ . . . potential at a point $P_{C3}$ in the region of the photoelectric conversion layer 23 opposing to a charge accumulation electrode segment 24C $P_D$ . . . potential at a point $P_D$ in the region of the photoelectric conversion layer 23 opposing to the transfer controlling electrode (charge transfer electrode) 25

FD . . . potential at the first floating diffusion layer $FD_1$ $V_{OA}$ . . . potential at the charge accumulation electrode 24

$V_{OA\text{-}A}$ . . . potential at the charge accumulation electrode segment 24A $V_{OA\text{-}B}$ . . . potential at the charge accumulation electrode segment 24B $V_{OA\text{-}C}$ . . . potential at the charge accumulation electrode segment 24C $V_{OT}$ . . . potential at the transfer controlling electrode (charge transfer electrode) 25

RST . . . potential at the gate portion 51 of the reset transistor $TR1_{rst}$ $V_{DD}$ . . . potential of the power supply $VSL_1$ . . . signal line (data output line) $VSL_1$ $TR1_{rst}$ reset transistor $TR1_{rst}$ $TR1_{amp}$ . . . amplification transistor $TR1_{amp}$ $TR1_{sel}$ . . . selection transistor $TR1_{sel}$ During a charge accumulation period, from the driving circuit, a potential $V_{11}$ is applied to the first electrode 21 and a potential $V_{12}$ is applied to the charge accumulation electrode 24. Photoelectric conversion is caused by light incident to the photoelectric conversion layer 23 in the photoelectric conversion layer 23. Holes generated by the photoelectric conversion are sent out from the second electrode 22 to the driving circuit through a wiring $V_{OU}$. Meanwhile, since the potential of the first electrode 21 is made higher than the potential of the second electrode 22, namely, since, for example, a positive potential is applied to the first electrode 21 and a negative potential is applied to the second electrode 22, $V_{12} \geq V_{11}$, preferably, $V_{12} > V_{11}$. Consequently, electrons generated by the photoelectric conversion are attracted to the charge accumulation electrode 24 and stay in the region of the photoelectric conversion layer 23 opposing to the charge accumulation electrode 24. In other words, charge is accumulated into the photoelectric conversion layer 23. Since $V_{12} > V_{11}$, electrons generated in the inside of the photoelectric conversion layer 23 do not move toward the first electrode 21. As time of photoelectric conversion elapses, the potential in the region of the photoelectric conversion layer 23 opposing to the charge accumulation electrode 24 increases to the negative side.

In the later stage of the charge accumulation period, reset operation is performed. By this operation, the potential at the first floating diffusion layer $FD_1$ is reset, and the potential at the first floating diffusion layer $FD_1$ becomes the potential $V_{DD}$ of the power supply.

After completion of the reset operation, reading out of charge is performed. In particular, during a charge transfer period, a potential $V_{21}$ is applied to the first electrode 21 and a potential $V_{22}$ is applied to the charge accumulation electrode 24 from the driving circuit. Here, $V_{22} < V_{21}$. Consequently, electrons staying in the region of the photoelectric conversion layer 23 opposing to the charge accumulation electrode 24 are read out to the first electrode 21 and further into the first floating diffusion layer $FD_1$. In other words, charge accumulated in the photoelectric conversion layer 23 is read out to the control portion.

The series of operations of charge accumulation, a reset operation, and charge transfer are completed therewith.

Operation of the amplification transistor $TR1_{amp}$ and the selection transistor $TR1_{sel}$ after electrons are read out into the first floating diffusion layer $FD_1$ is same as conventional operation of such transistors. Further, such a series of operations as charge accumulation, reset operation and charge transfer of the second imaging element and the third imaging element are similar to such series of conventional operations as charge accumulation, reset operation and charge transfer. Further, reset noise of the first floating diffusion layer $FD_1$ can be removed by a correlated double sampling (CDS, Correlated Double Sampling) process similarly as before.

As described above, in the working example 7, since the charge accumulation electrode disposed in a spaced relation from the first electrode and in an opposing relation with the photoelectric conversion layer with an insulating layer interposed therebetween is provided, when light is irradiated upon the photoelectric conversion portion (photoelectric conversion portion including the charge accumulation electrode) and is photoelectrically converted by the photoelectric conversion portion, a kind of capacitor includes the photoelectric conversion layer, insulating layer and charge accumulation electrode and charge can be stored into the photoelectric conversion layer. Therefore, when exposure is started, the photoelectric conversion portion is depleted fully and charge can be erased. As a result, occurrence of a phenomenon that kTC noise becomes great and random noise gets worse, which gives rise to deterioration of the imaging quality, can be suppressed. Further, since all pixels can be reset all at once, a so-called global shutter function can be implemented.

Figure 49:
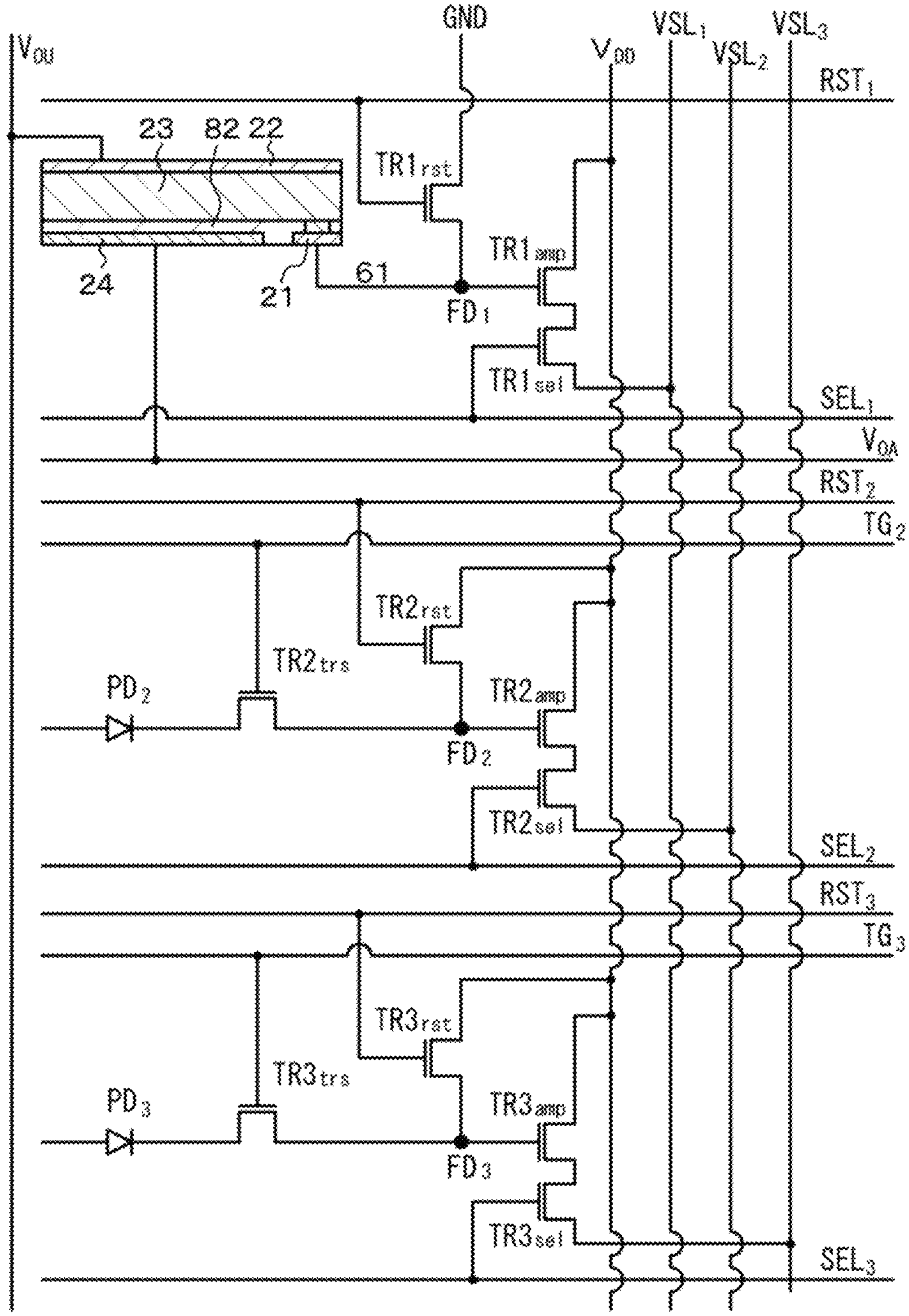
FIG. 49 is an equivalent circuit diagram of a modification of the stacked-type imaging element of the working example 7.
Figure 50:
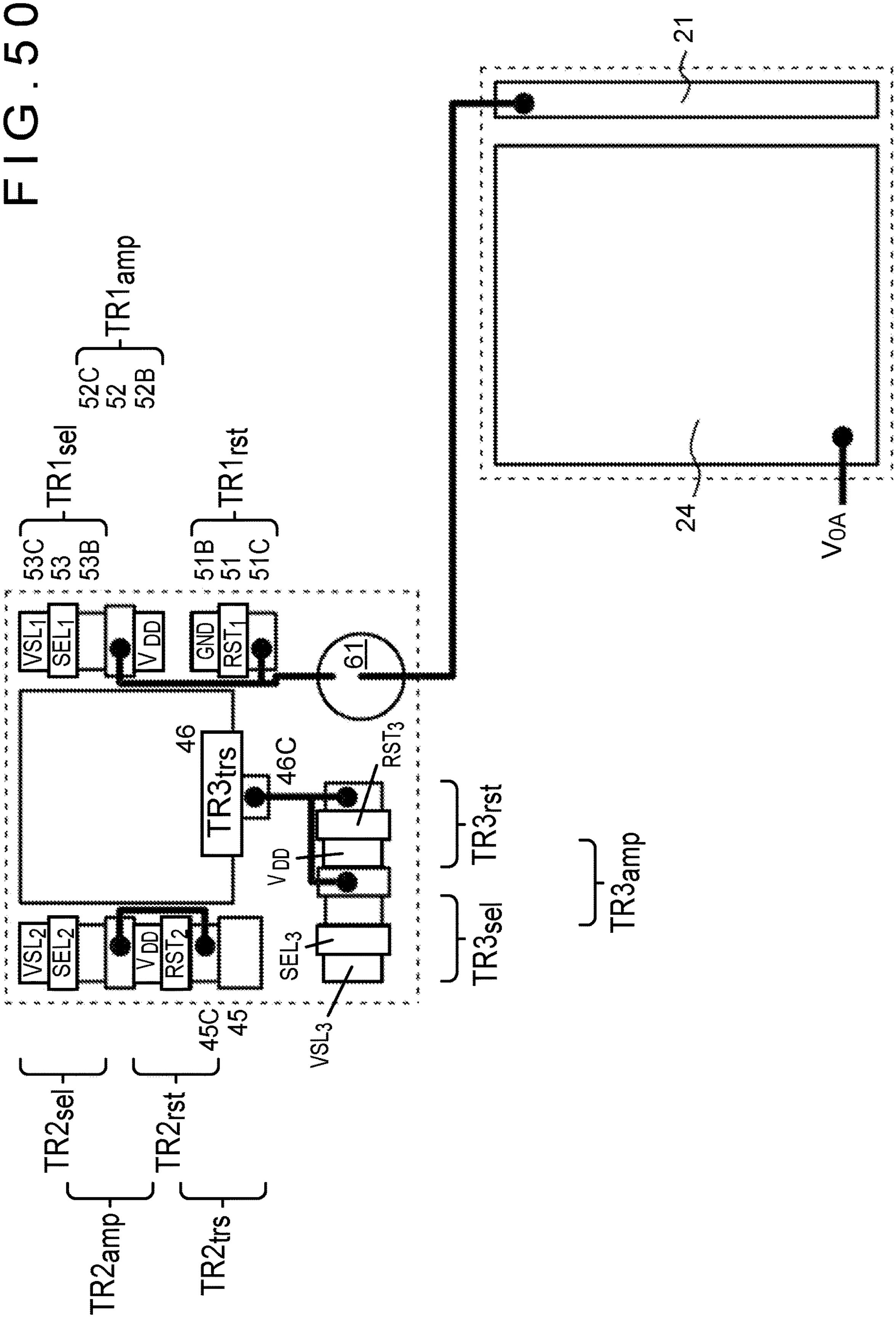
FIG. 50 is a schematic layout diagram of a first electrode and a charge accumulation electrode as well as transistors configuring a control portion, which configure a modification of the stacked-type imaging element of the working example 7 depicted in FIG. 49.

As depicted in FIG. 49 that is an equivalent circuit diagram of the modification of the stacked-type imaging element of the working example 7 and FIG. 50 that is a schematic layout diagram of the first electrode and the charge accumulation electrode as well as the transistors that configure the control portion, the other 51B of the source/drain regions of the reset transistor $TR1_{rst}$ may be grounded in place of being connected to the power supply $V_{DD}$.

The stacked-type imaging element of the working example 7 can be produced, for example, by the following method. In particular, a SOI substrate is prepared first. Then, a first silicon layer is formed on the surface of the SOI substrate on the basis of an epitaxial growth method, and a $p^+$ layer 73 and an n-type semiconductor region 41 are formed on the first silicon layer. Then, a second silicon layer is formed on the first silicon layer on the basis of an epitaxial growth method, and an element isolation region 71, an oxide film 72, a $p^+$ layer 42, an n-type semiconductor region 43 and a $p^+$ layer 44 are formed on the second silicon layer. Further, on the second silicon layer, various transistors and so forth for configuring a control portion of the stacked-type imaging element are formed, and a wiring layer 62, an interlayer insulating layer 76 and various wirings are formed on them, whereafter the interlayer insulating layer 76 and a support substrate (not depicted) are pasted to each other. Thereafter, the SOI substrate is removed to expose the first silicon layer. It is to be noted that the surface of the second silicon layer corresponds to the surface 70A of the semiconductor substrate 70, and the surface of the first silicon layer corresponds to the rear face 70B of the semiconductor substrate 70. Further, the first silicon layer and the second silicon layer are collectively represented as semiconductor substrate 70. Then, an opening for forming the contact hole portion 61 is formed on the rear face 70B side of the semiconductor substrate 70, and an $HfO_2$ film 74, an insulating material film 75 and a contact hole portion 61 are formed. Further, pad portions 63 and 64, an interlayer insulating layer 81, connection holes 65 and 66, a first electrode 21, a charge accumulation electrode 24 and an insulating layer 82 are formed. Then, the connection portion 67 is opened, and a photoelectric conversion layer 23, a second electrode 22, a first interlayer insulating layer 83, a wire grid polarizer 91, a second interlayer insulating layer 84, an on-chip microlens underlayer 14 and an on-chip microlens 15 are formed. By them, the stacked-type imaging element of the working example 7 can be obtained.

Working Example 8

Figure 51:
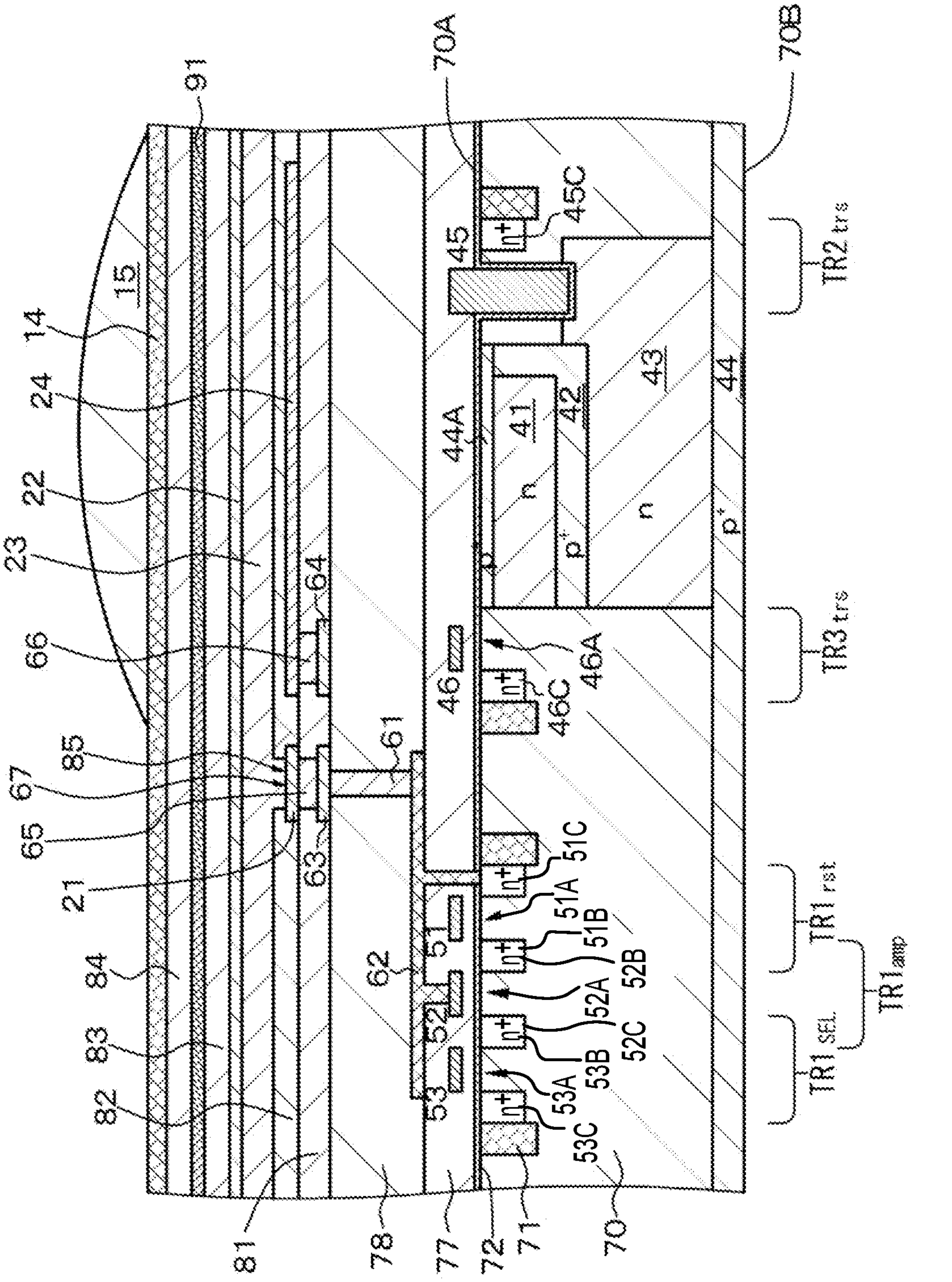
FIG. 51 is a schematic partial sectional view of a stacked-type imaging element of a working example 8.

The working example 8 is a modification of the working example 7. The stacked-type imaging element of the working example 8 whose schematic partial sectional view is depicted in FIG. 51 is an imaging element of the front-illuminated type and is structured such that three imaging elements including a green light imaging element of the working example 7 of the first type (first imaging element) including a green light photoelectric conversion layer of the first type that absorbs green light and having sensitivity to green light, a conventional blue light imaging element of the second type (second imaging element) including a blue light photoelectric conversion layer of the second type that absorbs blue light and having sensitivity to blue light, and a conventional red light imaging element of the second type (third imaging element) including a red light photoelectric conversion layer of the second type that absorbs red light and having sensitivity to red light are stacked on each other. Here, the red light imaging element (third imaging element) and the blue light imaging element (second imaging element) are provided in the semiconductor substrate 70, and the second imaging element is positioned on the light incident side with respect to the third imaging element. Further, the green light imaging element (first imaging element) is provided above the blue light imaging element (second imaging element).

Various transistors configuring the control portion similarly as in the working example 7 are provided on the surface 70A side of the semiconductor substrate 70. The transistors can be configured and structured substantially similarly to the transistors described hereinabove in connection with the working example 7. Further, although the second imaging element and the third imaging element are provided on the semiconductor substrate 70, also those imaging elements can be configured and structured substantially similarly to the second imaging element and the third imaging element described hereinabove in connection with the working example 7.

Interlayer insulating layers 77 and 78 are formed on the surface 70A of the semiconductor substrate 70, and a photoelectric conversion portion (first electrode 21, photoelectric conversion layer 23, and second electrode 22 as well as charge accumulation electrode 24 and so forth) including a charge accumulation electrode configuring the stacked-type imaging element of the working example 7 is provided on the interlayer insulating layer 78.

In this manner, since the configuration and the structure of the stacked-type imaging element of the working example 8 can made similar to the configuration and the structure of the stacked-type imaging element of the working example 7 except that the stacked-type imaging element of the working example 8 is of the front-illuminated type, detailed description of them is omitted.

Working Example 9

The working example 9 is a modification to the working examples 7 and 8.

Figure 52:
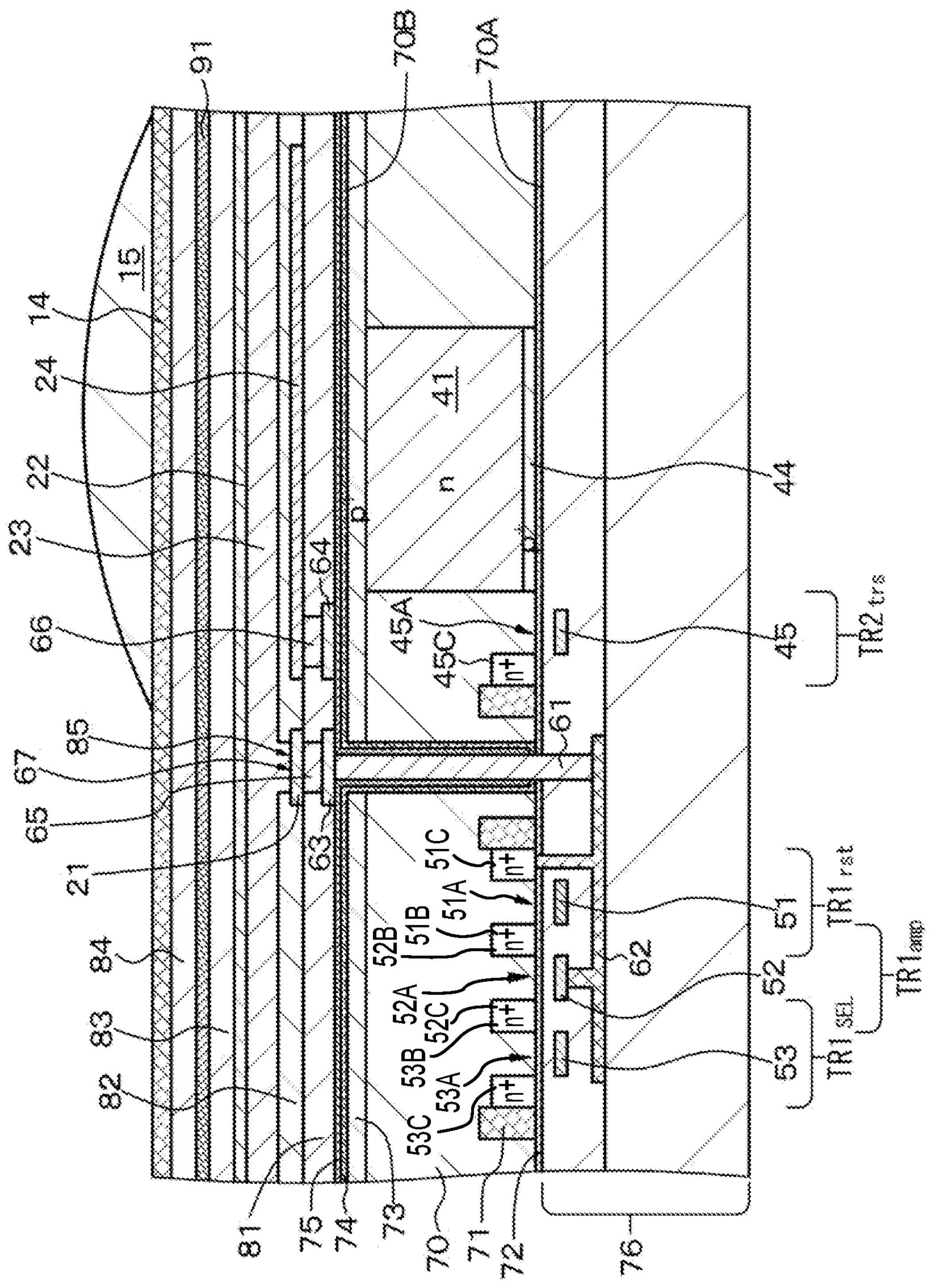
FIG. 52 is a schematic partial sectional view of a stacked-type imaging element of a working example 9.
Figure 53:
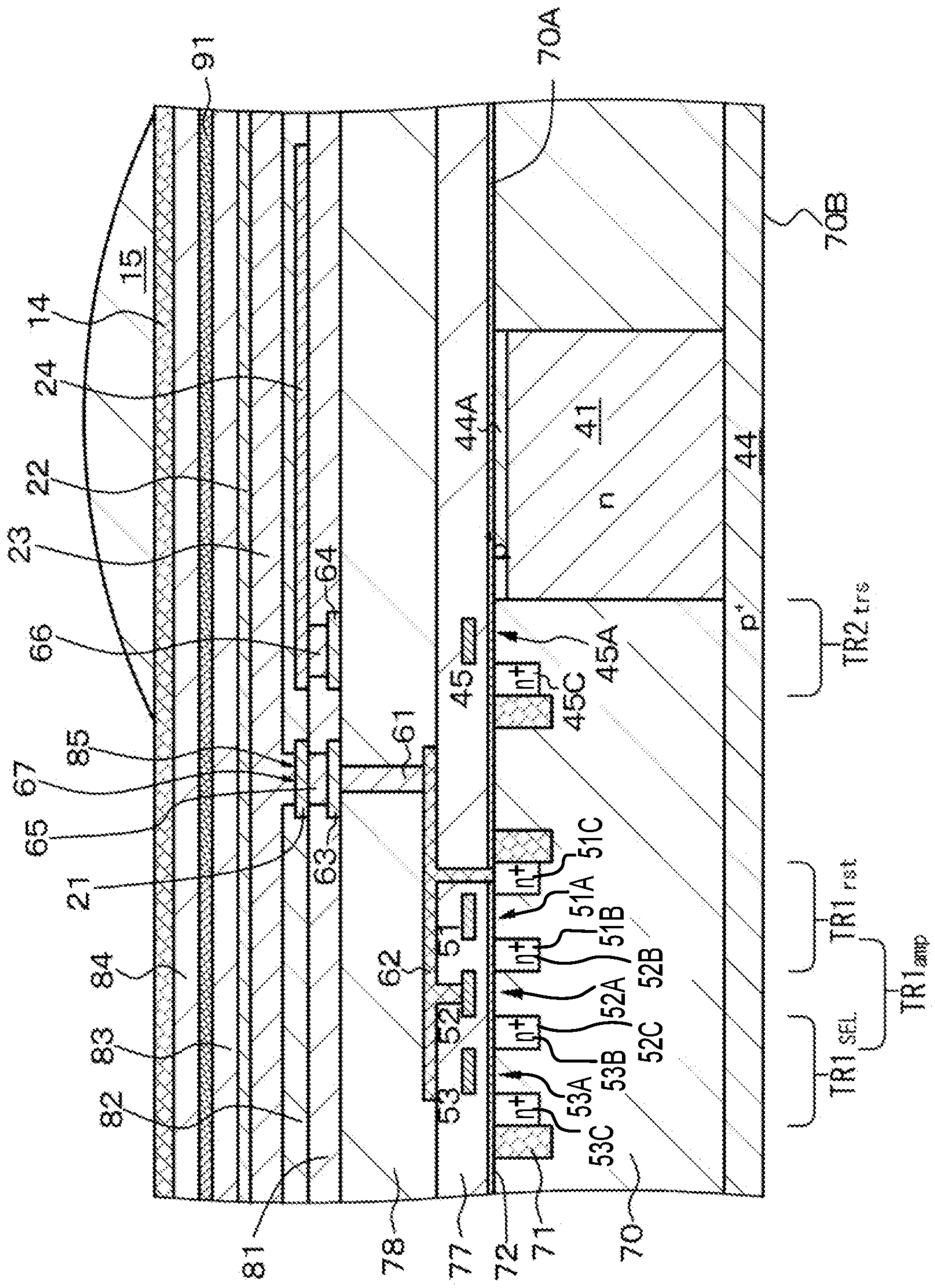
FIG. 53 is a schematic partial sectional view of a modification of the stacked-type imaging element of the working example 9.

The stacked-type imaging element of the working example 9 whose schematic partial sectional view is depicted in FIG. 52 is an imaging element of the back-illuminated type and is structured such that two imaging elements including the first imaging element of the working example 7 of the first type and the second imaging element of the second type are stacked on each other. Further, a modification of the stacked-type imaging element of the working example 9 whose schematic partial sectional view is depicted in FIG. 53 is an imaging element of the front-illuminated type and is structured such that two imaging elements including the first imaging element of the working example 7 of the first type and the second imaging element of the second type are stacked on each other. Here, the first imaging element absorbs light of an original color and the second imaging element absorbs light of a complementary color. Alternatively, the first imaging element absorbs white light, and the second imaging element absorbs infrared rays.

Figure 54:
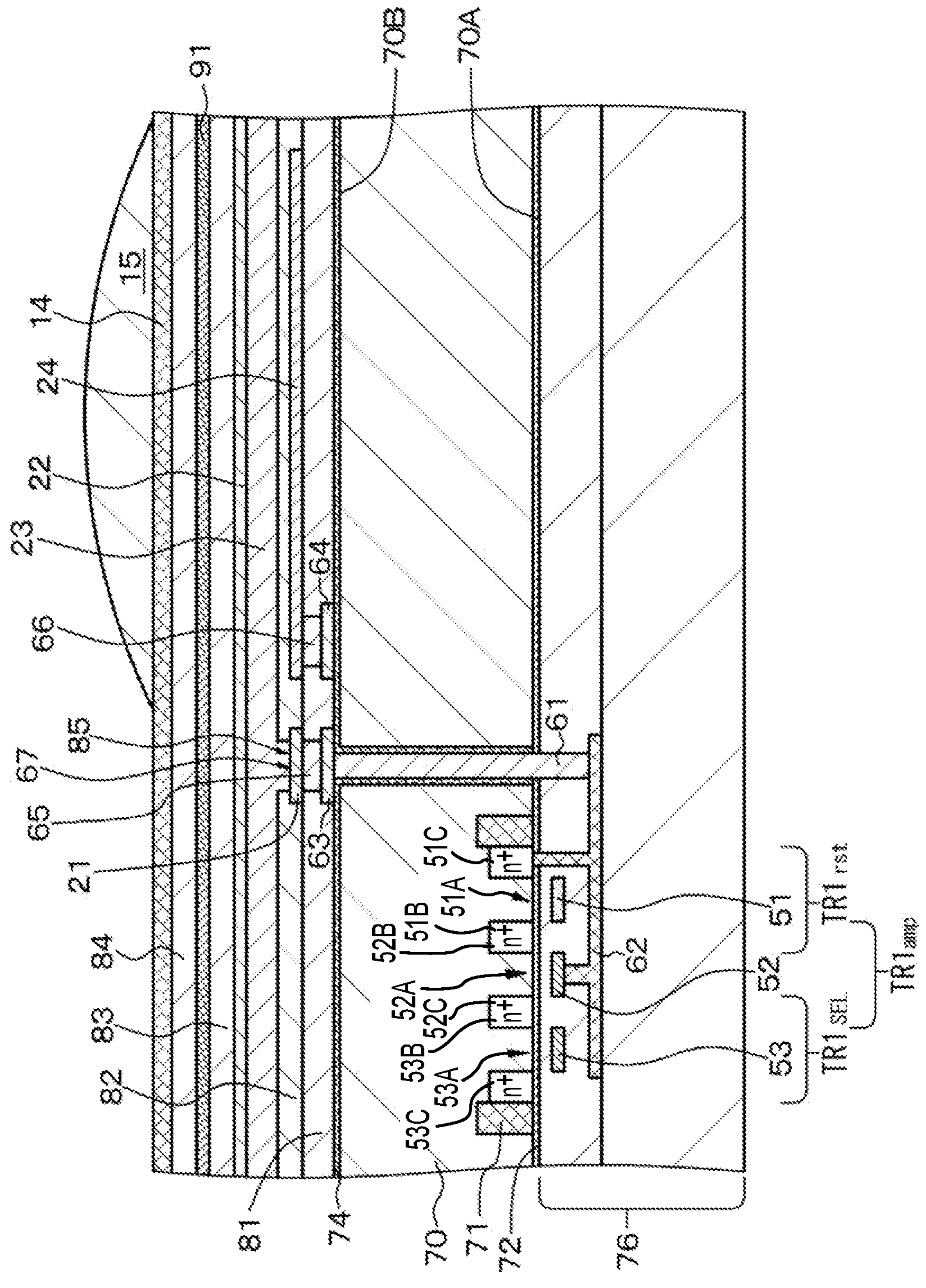
FIG. 54 is a schematic partial sectional view of another modification of the stacked-type imaging element of the working example 9.
Figure 55:
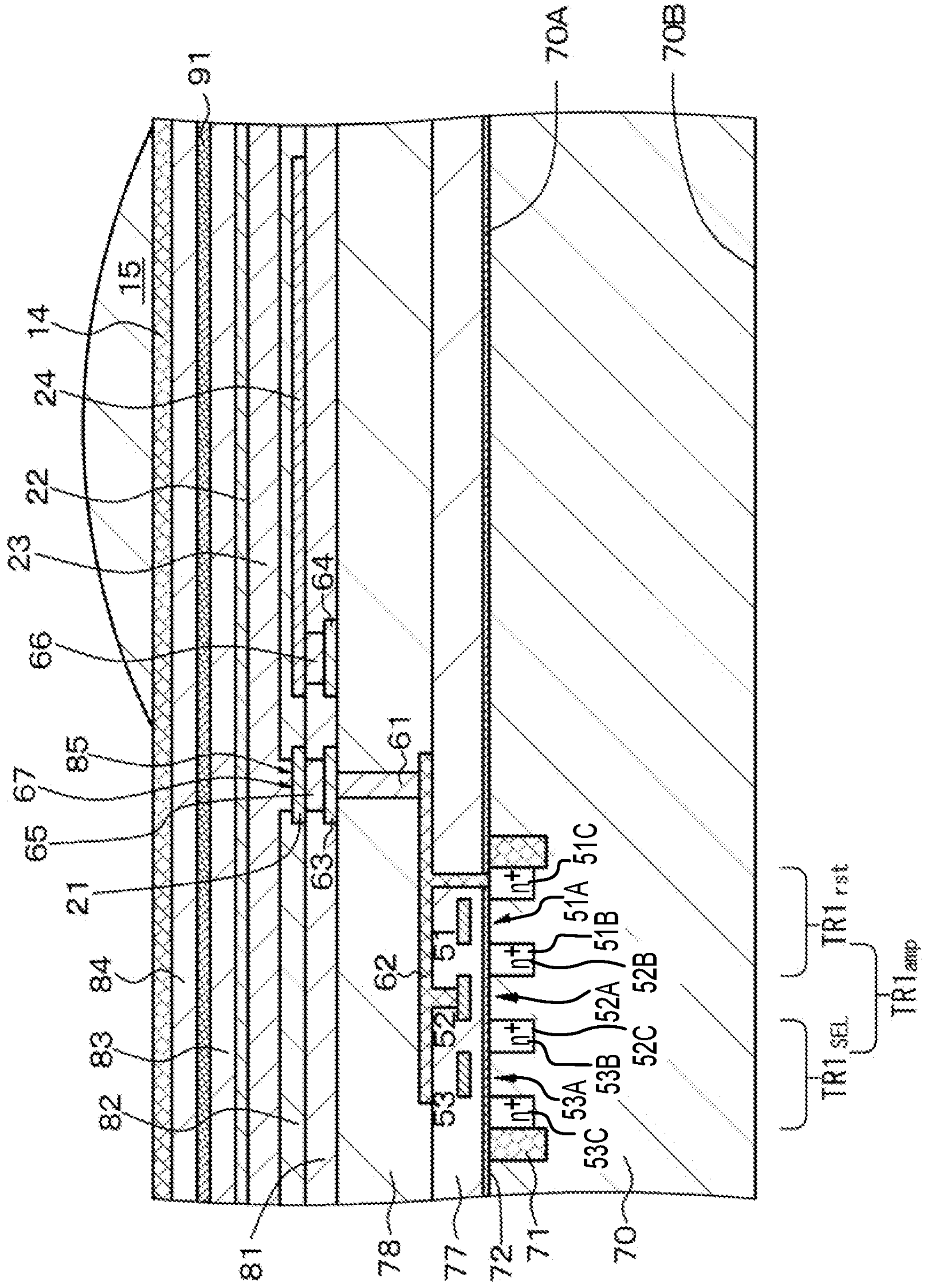
FIG. 55 is a schematic partial sectional view of a further modification of the stacked-type imaging element of the working example 9.

A modification of the imaging element of the working example 9 whose schematic partial sectional view is depicted in FIG. 54 is an imaging element of the back-illuminated type and includes the first imaging element of the working example 7 of the first type. Meanwhile, a modification of the imaging element of the working example 9 whose schematic partial sectional view is depicted in FIG. 55 is an imaging element of the front-illuminated type and includes the first imaging element of the working example 7 of the first type. Here, the first imaging element includes three kinds of imaging elements including an imaging element that absorbs red light, another imaging element that absorbs green light and a further imaging element that absorbs blue light. Furthermore, a solid-state imaging device according to the first aspect of the present disclosure includes a plurality of such imaging elements. As arrangement of such plurality of imaging elements, a Bayer array can be exemplified. On the light incident side of each imaging element, a color filter layer for performing spectroscopy of blue, green and red is disposed as occasion demands.

It is to be noted that also it is possible, in place of providing one photoelectric conversion portion including the charge accumulation electrode of the working example 7 of the first type, to use a form in which two such photoelectric conversion portions are stacked (namely, two photoelectric conversion portions each including the charge accumulation electrode are stacked and a control portion for the two photoelectric conversion portions is provided on the semiconductor substrate) or another form in which three such photoelectric conversion portions are stacked (in particular, three photoelectric conversion portions each including the charge accumulation electrode are stacked and a control portion for the three photoelectric conversion portions is provided on the semiconductor substrate). Examples of the stack structure of imaging elements of the first type and imaging elements of the second type are exemplified in the following table.

| | First Type | Second Type |
|---|---|---|
| Back-illuminated Type and Front-illuminated Type | 1<br>Green | 2<br>Blue + Red |
| | 1<br>Original Color | 1<br>Complementary Color |
| | 1<br>White | 1<br>Infrared Rays |
| | 1<br>Blue, Green, or Red | 0 |
| | 2<br>Green + Infrared Light | 2<br>Blue + Red |
| | 2<br>Green + Blue | 1<br>Red |
| | 2<br>White + Infrared Light | 0 |
| | 3<br>Green + Blue + Red | 2<br>Blue Green (Emerald Color) + Infrared Light |
| | 3<br>Green + Blue + Red | 1<br>Infrared Light |
| | 3<br>Blue + Green + Red | 0 |

Working Example 10

Figure 46B:
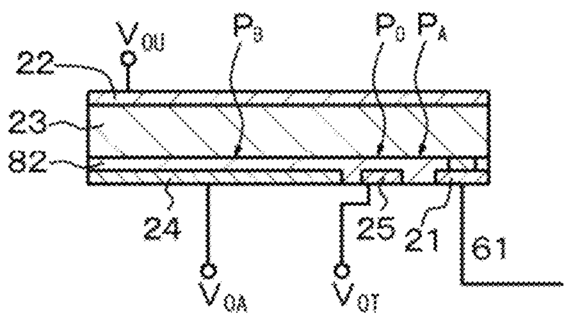
Figure 56:
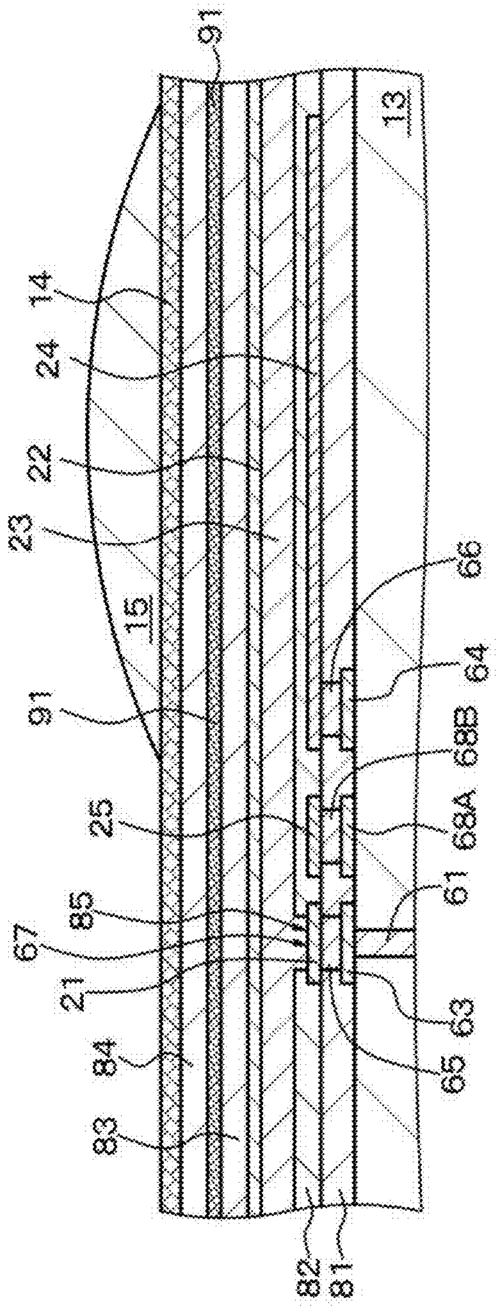
FIG. 56 is a schematic partial sectional view of part of a stacked-type imaging element of a working example 10.
Figure 57:
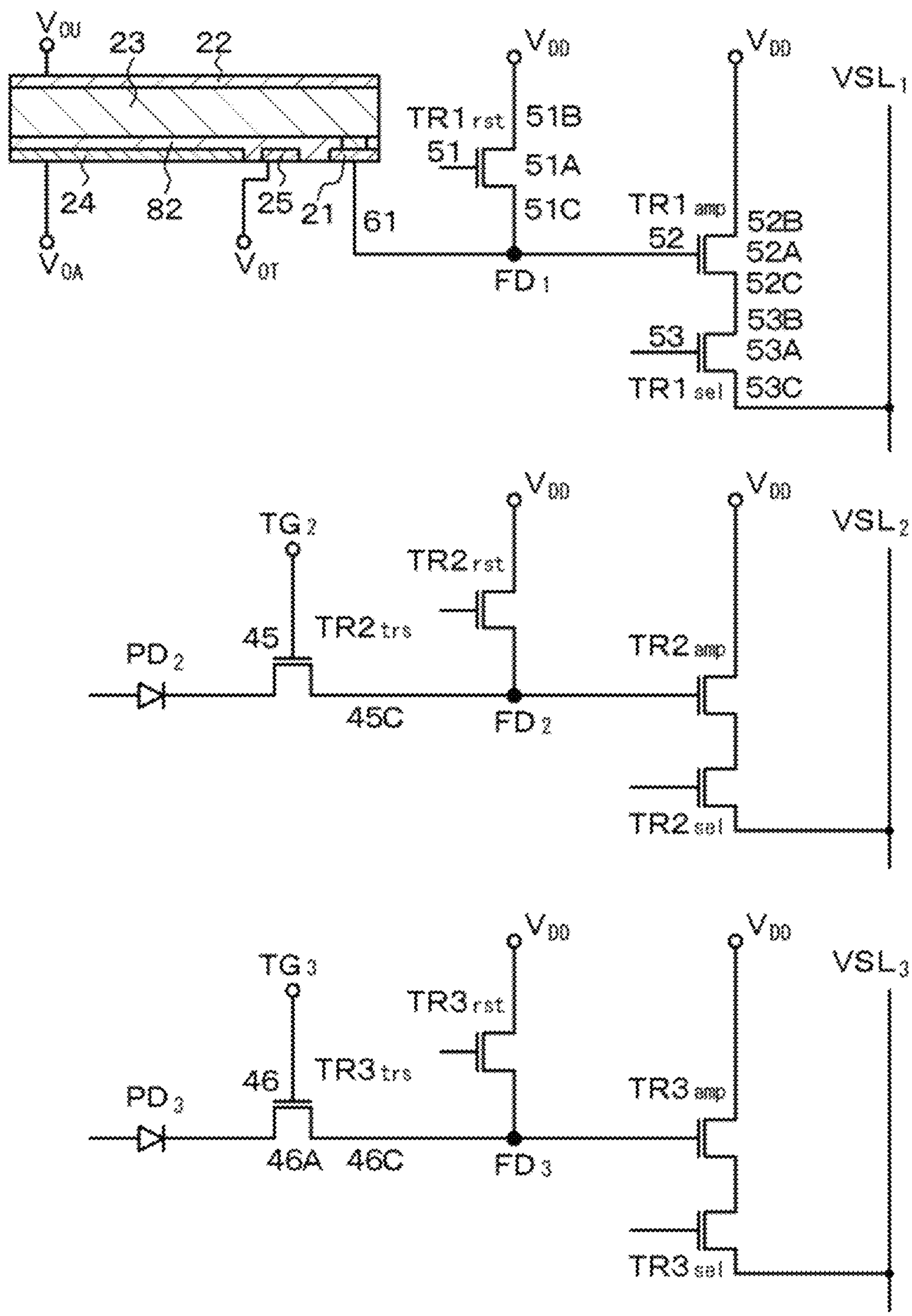
FIG. 57 is an equivalent circuit diagram of the stacked-type imaging element of the working example 10.
Figure 58:
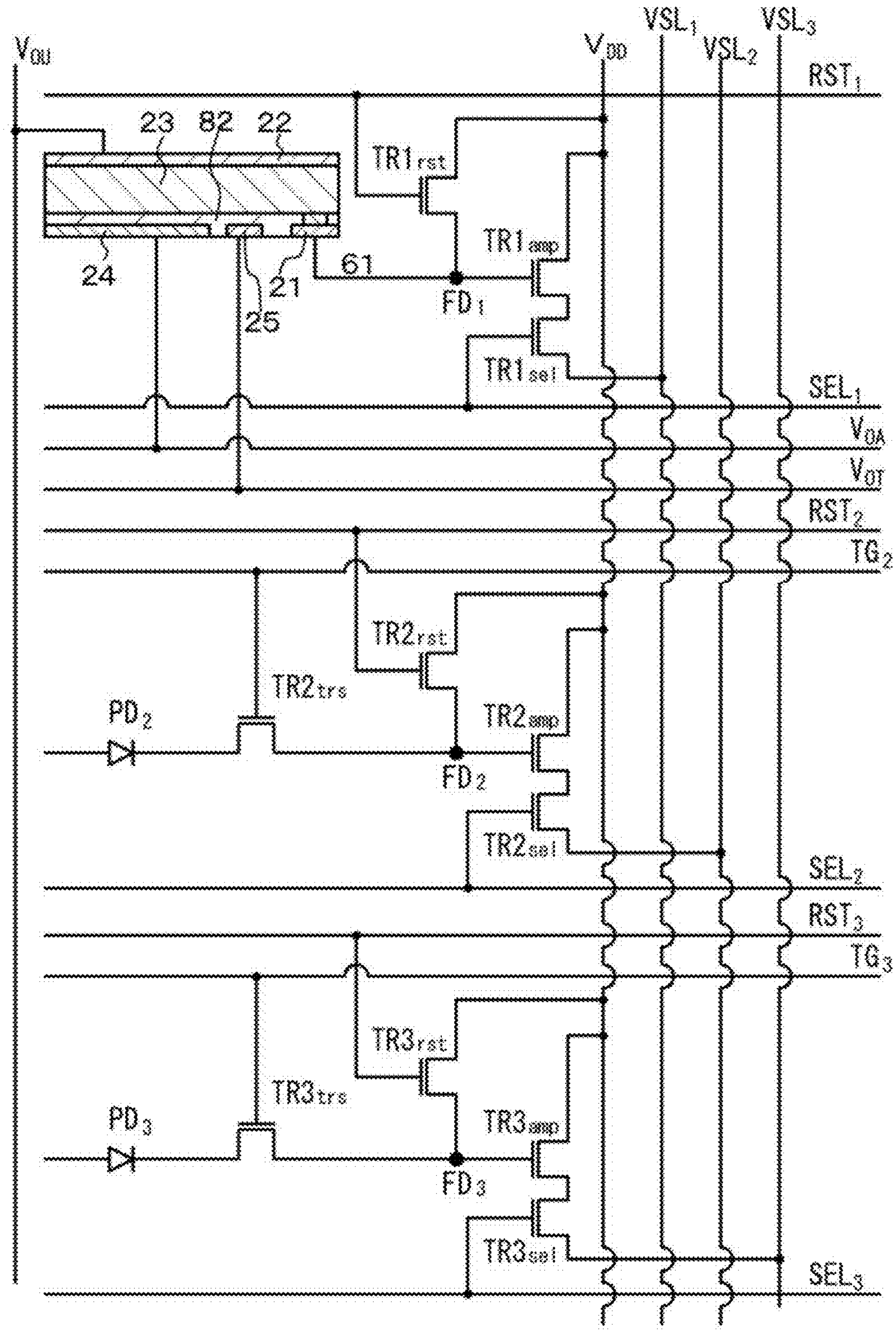
FIG. 58 is an equivalent circuit diagram of the stacked-type imaging element of the working example 10.
Figure 59:
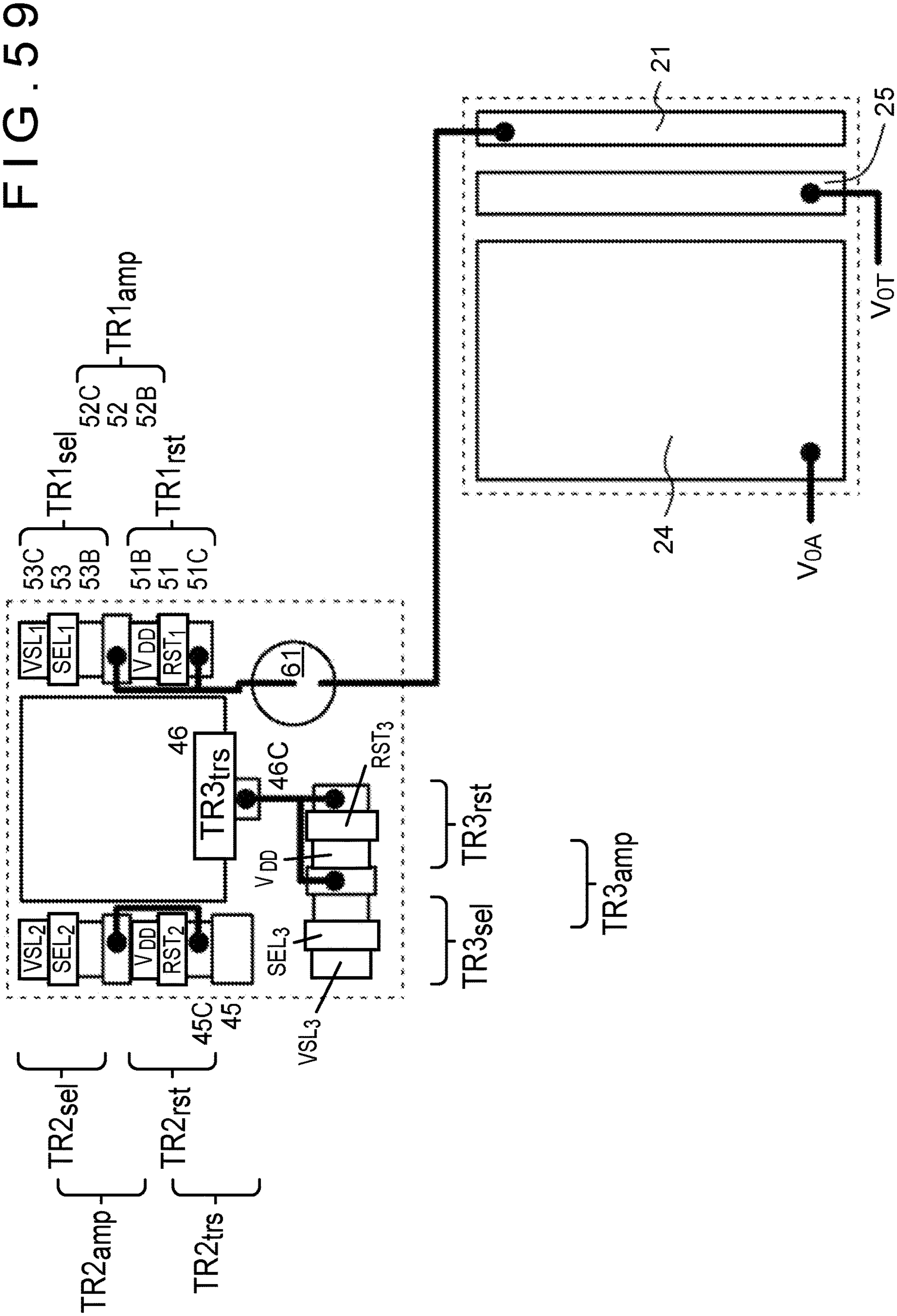
FIG. 59 is a schematic layout diagram of a first electrode, a transfer controlling electrode, and a charge accumulation electrode as well as transistors configuring a control portion, which configure the stacked-type imaging element of the working example 10.
Figure 62:
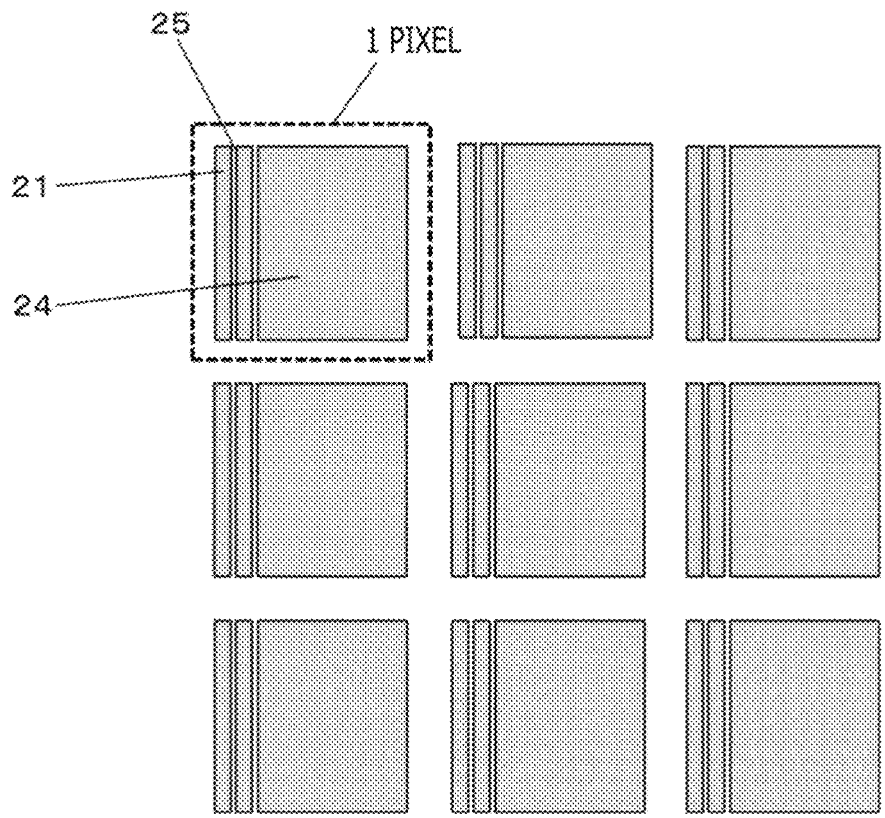
FIG. 62 is a schematic layout diagram of a first electrode, a transfer controlling electrode, and a charge accumulation electrode that configure the stacked-type imaging element of the working example 10.
Figure 63:
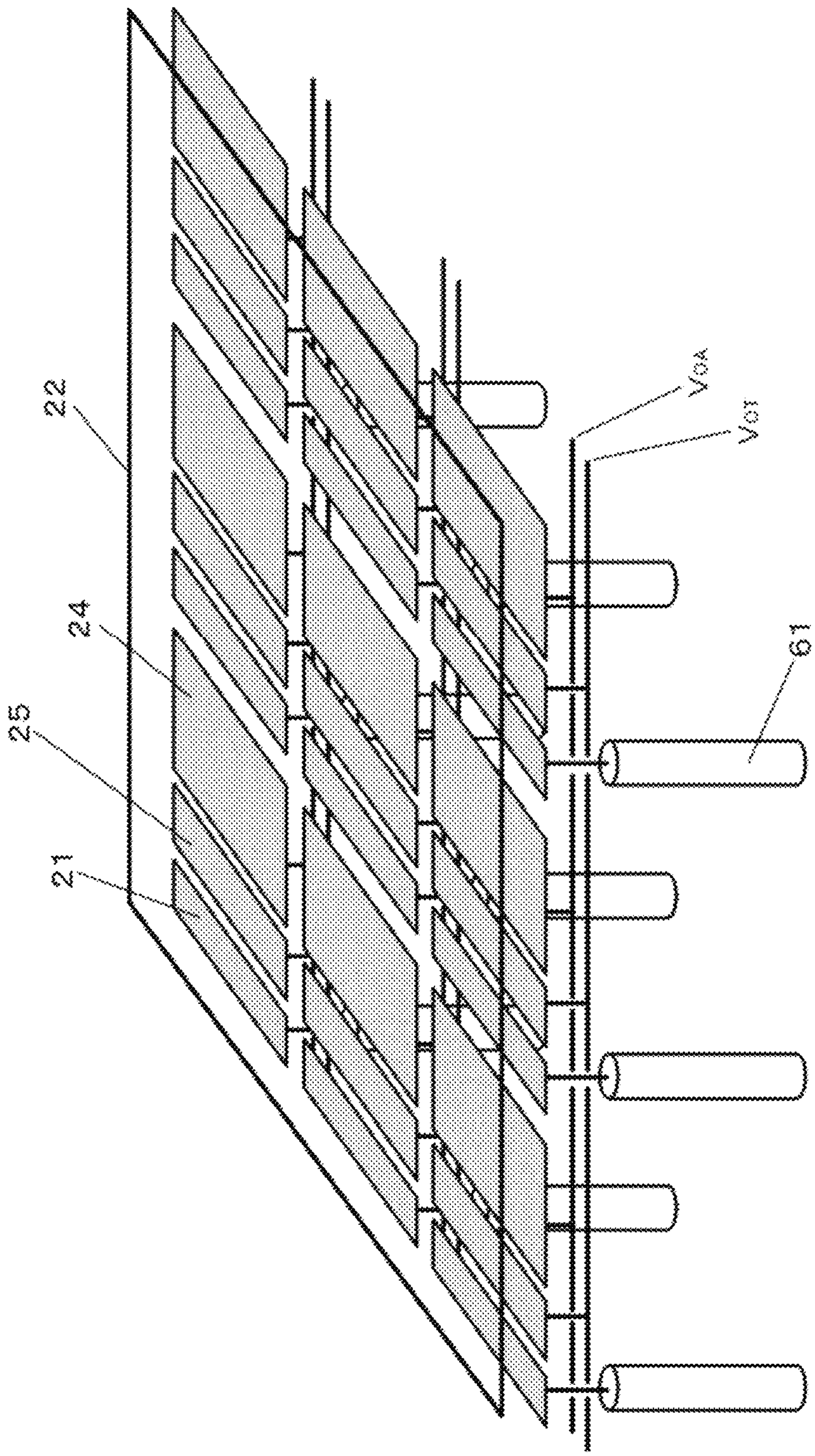
FIG. 63 is a schematic perspective view of the first electrode, the transfer controlling electrode, the charge accumulation electrode, a second electrode, and a contact hole portion configuring the stacked-type imaging element of the working example 10.

The working example 10 is a modification of the working examples 7 to 9 and relates to the imaging element according to the present disclosure including a transfer controlling electrode (charge transfer electrode). A schematic partial sectional view of a portion of the stacked-type imaging element of the working example 10 is depicted in FIG. 56; equivalent circuit diagrams of the stacked-type imaging element of the working example 10 are depicted in FIGS. 57 and 58; a schematic layout diagram of the first electrode, the transfer controlling electrode, and the charge accumulation electrode, which configure the photoelectric conversion portion including the charge accumulation electrode of the stacked-type imaging element of the working example 10, and transistors configuring the control portion is depicted in FIG. 59; states of the potential at respective portions upon operation of the stacked-type imaging element of the working example 10 are schematically depicted in FIGS. 60 and 61; and an equivalent circuit diagram illustrating respective portions of the stacked-type imaging element of the working example 10 is depicted in FIG. 46B. Further, a schematic layout diagram of the first electrode, the transfer controlling electrode, and the charge accumulation electrode configuring the photoelectric conversion portion including the charge accumulation electrode of the stacked-type imaging element of the working example 10 is depicted in FIG. 62, and a schematic perspective view of the first electrode, the transfer controlling electrode, the charge accumulation electrode, a second electrode and a contact hole portion is depicted in FIG. 63.

The stacked-type imaging element of the working example 10 further includes, between the first electrode 21 and the charge accumulation electrode 24, a transfer controlling electrode (charge transfer electrode) 25 disposed in a spaced relation from the first electrode 21 and the charge accumulation electrode 24 and besides is disposed in an opposing relation to the photoelectric conversion layer 23 with the insulating layer 82 interposed therebetween. The transfer controlling electrode 25 is connected to a pixel driving circuit that configures a driving circuit through a connection hole 68B, a pad portion 68A and a wiring $V_{OT}$ provided in the interlayer insulating layer 81. It is to be noted that, in order to simplify the drawings, various imaging element components positioned below the interlayer insulating layer 81 are collectively denoted by reference sign 13 for the convenience of illustration.

In the following, operation of the stacked-type imaging element (first imaging element) of the working example 10 is described with reference to FIGS. 60 and 61. It is to be noted that, between FIGS. 60 and 61, especially the potentials to be applied to the charge accumulation electrode 24 and the potential at the point $P_D$ are different in value.

During a charge accumulation period, from the driving circuit, a potential $V_{11}$ is applied to the first electrode 21; a potential $V_{12}$ is applied to the charge accumulation electrode 24; and a potential $V_{13}$ is applied to the transfer controlling electrode 25. Photoelectric conversion is caused in the photoelectric conversion layer 23 by light incident to the photoelectric conversion layer 23. Holes generated by the photoelectric conversion are sent out from the second electrode 22 to the driving circuit through the wiring $V_{OU}$. On the other hand, since the potential of the first electrode 21 is higher than the potential of the second electrode 22, for example, since a positive potential is applied to the first electrode 21 and a negative potential is applied to the second electrode 22, $V_{12}>V_{13}$ (for example, $V_{12}>V_{11}>V_{13}$, or $V_{11}>V_{12}>V_{13}$). Consequently, electrons generated by the photoelectric conversion are attracted to the charge accumulation electrode 24 and stay in the region of the photoelectric conversion layer 23 opposing to the charge accumulation electrode 24. In other words, charge is accumulated into the photoelectric conversion layer 23. Since $V_{12}>V_{13}$, electrons generated in the inside of the photoelectric conversion layer 23 can be prevented from moving toward the first electrode 21 with certainty. As time of the photoelectric conversion elapses, the potential in the region of the photoelectric conversion layer 23 opposing to the charge accumulation electrode 24 increases to the negative side.

In the later stage of the charge accumulation period, reset operation is performed. By the reset operation, the potential of the first floating diffusion layer $FD_1$ is reset and the potential at the first floating diffusion layer $FD_1$ becomes the potential $V_{DD}$ of the power supply.

After completion of the reset operation, reading out of charge is performed. In particular, during a charge transfer period, from the driving circuit, a potential $V_{21}$ is applied to the first electrode 21; a potential $V_{22}$ is applied to the charge accumulation electrode 24; and a potential $V_{23}$ is applied to the transfer controlling electrode 25. Here, $V_{22}\leq V_{23}\leq V_{21}$. As a result, electrons staying in the region of the photoelectric conversion layer 23 opposing to the charge accumulation electrode 24 are read out to the first electrode 21 and further to the first floating diffusion layer $FD_1$ with certainty. In other words, charge accumulated in the photoelectric conversion layer 23 is read out to the control portion.

The series of operations of charge accumulation, a reset operation, and charge transfer are completed therewith.

Operation of the amplification transistor $TR1_{amp}$ and the selection transistor $TR1_{sel}$ after electrons are read out into the first floating diffusion layer $FD_1$ is same as conventional operation of such transistors. Further, such a series of operations as charge accumulation, a reset operation and charge transfer, for example, of the second imaging element and the third imaging element are similar to such conventional series of operations as charge transfer, reset operation and charge transfer.

Figure 64:
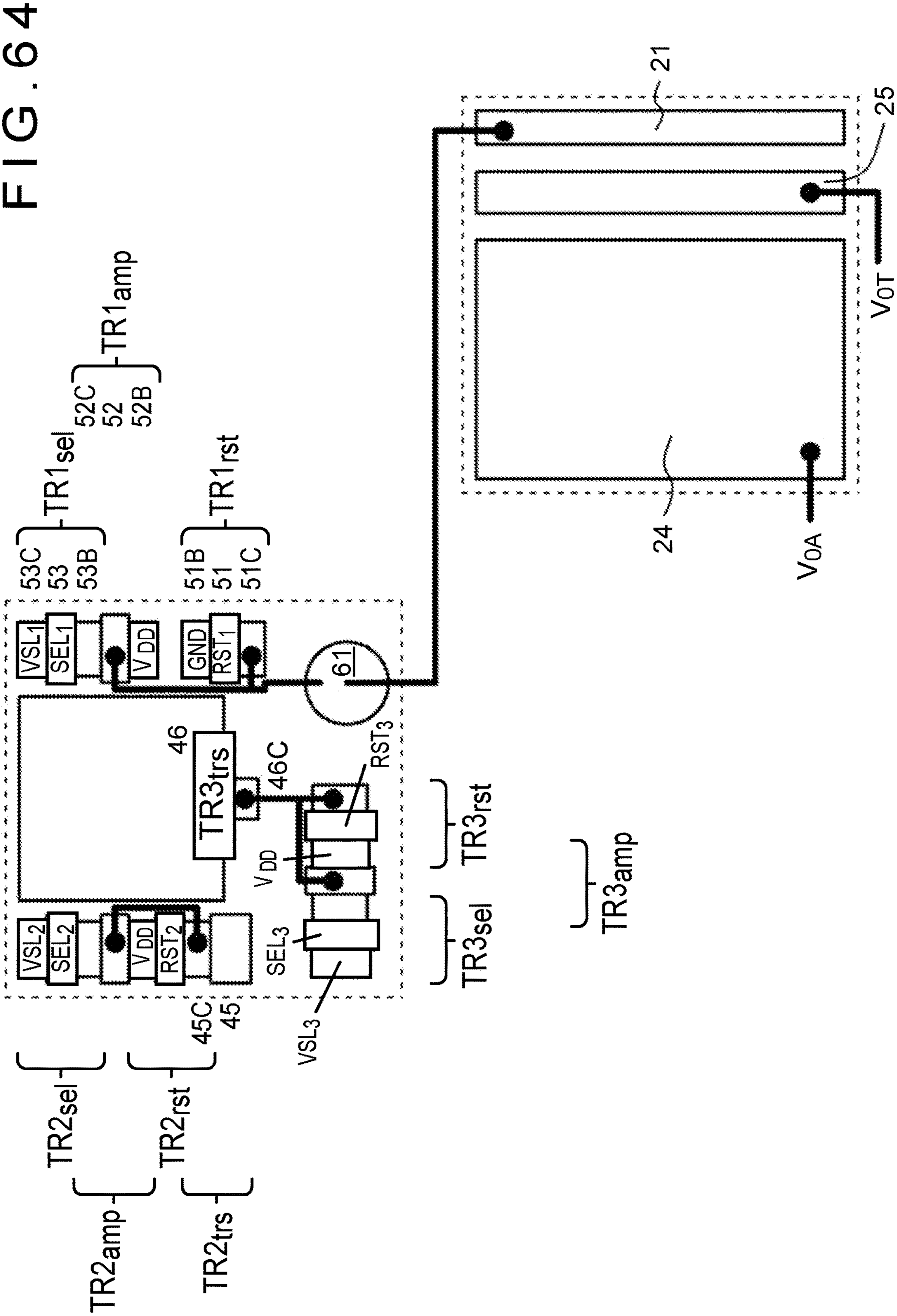
FIG. 64 is a schematic layout diagram of the first electrode, the transfer controlling electrode, and the charge accumulation electrode as well as transistors configuring a control portion, which configure a modification of the stacked-type imaging element of the working example 10.

As depicted in FIG. 64 that is a schematic layout diagram of a first electrode and a charge accumulation electrode as well as transistors configuring a control portion, which configure a modification of the stacked-type imaging element of the working example 10, the other 51B of the source/drain regions of the reset transistor $TR1_{rst}$ may be grounded in place of being connected to the power supply $V_{DD}$.

Working Example 11

Figure 65:
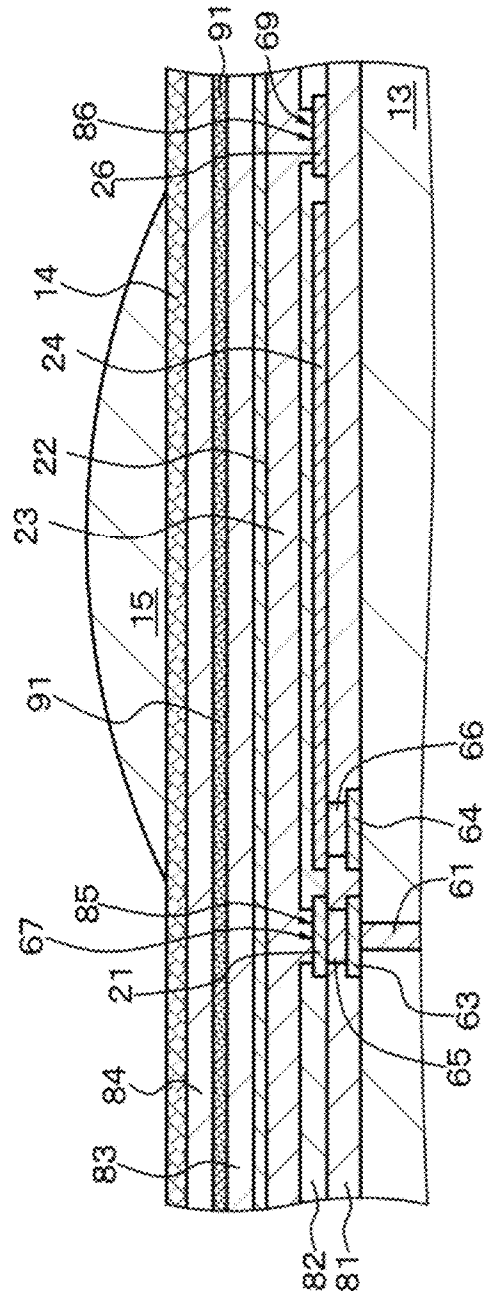
FIG. 65 is a schematic partial sectional view of part of a stacked-type imaging element of a working example 11.
Figure 66:
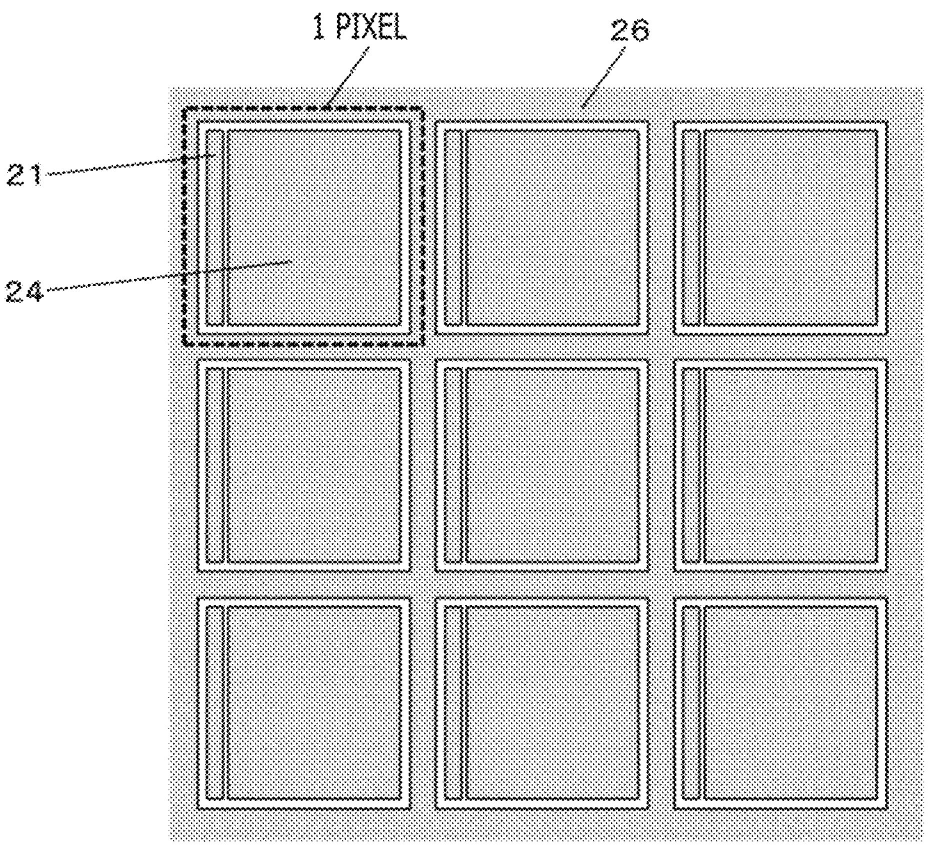
FIG. 66 is a schematic layout diagram of a first electrode, a charge accumulation electrode, and a discharging electrode that configure the stacked-type imaging element of the working example 11.
Figure 67:
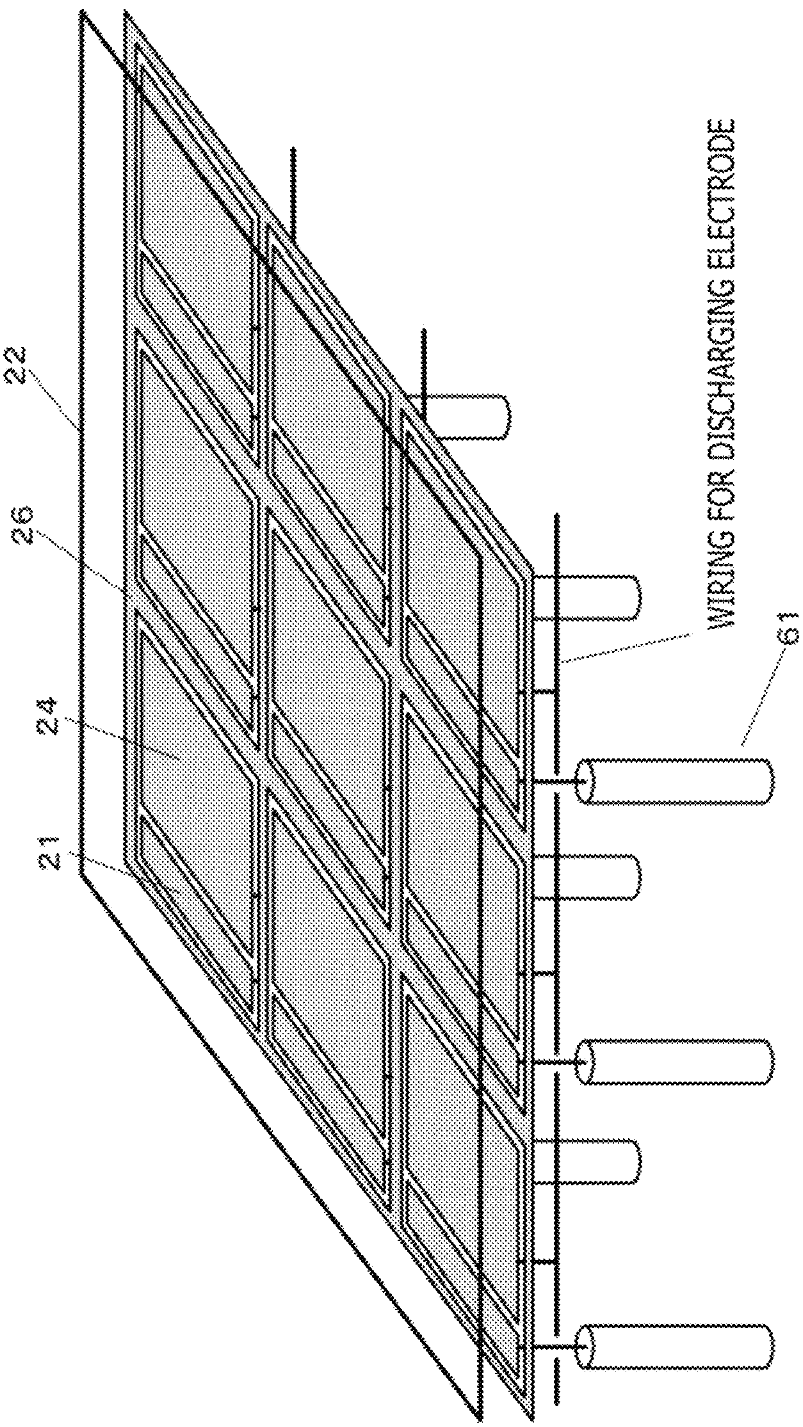
FIG. 67 is a schematic perspective view of the first electrode, the charge accumulation electrode, a discharging electrode, a second electrode, and a contact hole portion configuring the stacked-type imaging element of the working example 11.

The working example 11 is a modification of the working examples 7 to 10 and relates to an imaging element according to the present disclosure including a discharging electrode. A schematic partial sectional view of part of the stacked-type imaging element of the working example 11 is depicted in FIG. 65; a schematic layout diagram of a first electrode, a charge accumulation electrode, and a discharging electrode that configure a photoelectric conversion portion including a charge accumulation electrode of the stacked-type imaging element of the working example 11 is depicted in FIG. 66; and a schematic perspective view of the first electrode, the charge accumulation electrode, the discharging electrode, a second electrode, and a contact hole portion is depicted in FIG. 67.

The stacked-type imaging element of the working example 11 further includes a discharging electrode 26 connected to the photoelectric conversion layer 23 through a connection portion 69 and disposed in a spaced relation from the first electrode 21 and the charge accumulation electrode 24. Here, the discharging electrode 26 is disposed in such a manner as to surround the first electrode 21 and the charge accumulation electrode 24 (namely, in a frame shape). The discharging electrode 26 is connected to a pixel driving circuit that configures a driving circuit. The photoelectric conversion layer 23 extends into the connection portion 69. In particular, the photoelectric conversion layer 23 extends in a second opening 86 provided in the insulating layer 82 and is connected to the discharging electrode 26. The discharging electrode 26 is shared by (made common to) a plurality of stacked-type imaging elements.

In the working example 11, during a charge accumulation period, from the driving circuit, a potential $V_{11}$ is applied to the first electrode 21; a potential $V_{12}$ is applied to the charge accumulation electrode 24; and a potential $V_{14}$ is applied to the discharging electrode 26, and charge is accumulated into the photoelectric conversion layer 23. Photoelectric conversion is performed in the photoelectric conversion layer 23 by light incident to the photoelectric conversion layer 23. Holes generated by the photoelectric conversion are sent out from the second electrode 22 to the driving circuit through a wiring $V_{OU}$. On the other hand, since the potential of the first electrode 21 is set higher than the potential of the second electrode 22, namely, for example, since a positive potential is applied to the first electrode 21 and a negative potential is applied to the second electrode 22, $V_{14}>V_{11}$ (for example, $V_{12}>V_{14}>V_{11}$). Consequently, electrons generated by the photoelectric conversion are attracted to the charge accumulation electrode 24 and stay in the region of the photoelectric conversion layer 23 opposing to the charge accumulation electrode 24 and can be prevented from moving toward the first electrode 21 with certainty. However, if the attraction by the charge accumulation electrode 24 is not sufficient, or if some electrons fail to be accumulated into the photoelectric conversion layer 23 (so-called overflowing electrons), such electrons are sent out to the driving circuit through the discharging electrode 26.

In the later stage of the charge accumulation period, reset operation is performed. Consequently, the potential of the first floating diffusion layer $FD_1$ is reset, and the potential of the first floating diffusion layer $FD_1$ becomes the potential $V_{DD}$ of the power supply.

After completion of the reset operation, reading out of charge is performed. In particular, during a charge transfer period, from the driving circuit, a potential $V_{21}$ is applied to the first electrode 21; a potential $V_{22}$ is applied to the charge accumulation electrode 24; and a potential $V_{24}$ is applied to the discharging electrode 26. Here, $V_{24}<V_{21}$ (for example, $V_{24}<V_{22}<V_{21}$). Consequently, electrons staying in the region of the photoelectric conversion layer 23 opposing to the charge accumulation electrode 24 are read out to the first electrode 21 and further to the first floating diffusion layer $FD_1$ with certainty. In short, the charge accumulated in the photoelectric conversion layer 23 is read out to the control portion.

The series of operations of charge accumulation, a reset operation, and charge transfer are completed therewith.

Operation of the amplification transistor $TR1_{amp}$ and the selection transistor $TR1_{sel}$ after electrons are read out to the first floating diffusion layer $FD_1$ is same as conventional operation of such transistors. Further, such a series of operations as charge accumulation, a reset operation, and charge transfer, for example, of the second imaging element and the third imaging element are similar to such conventional series of operations as charge transfer, reset operation and charge transfer.

In the working example 11, since so-called overflowing electrons are sent out to the driving circuit through the discharging electrode 26, leaking of such electrons into the charge accumulation portion of an adjacent pixel can be suppressed, and occurrence of blooming can be suppressed. Then, this can improve the imaging performance of the stacked-type imaging element. [Working Example 12]

The working example 12 is a modification of the working examples 7 to 11 and relates to an imaging element of the present disclosure including a plurality of charge accumulation electrode segments.

Figure 46C:
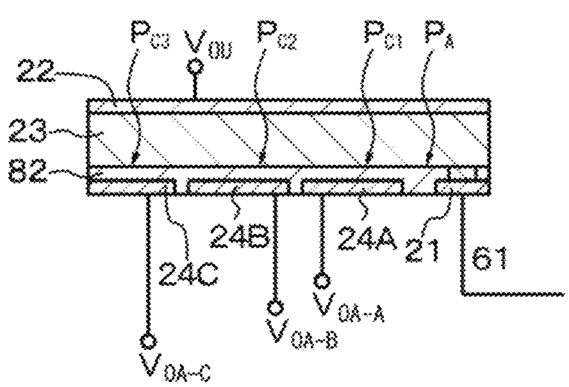
Figure 68:
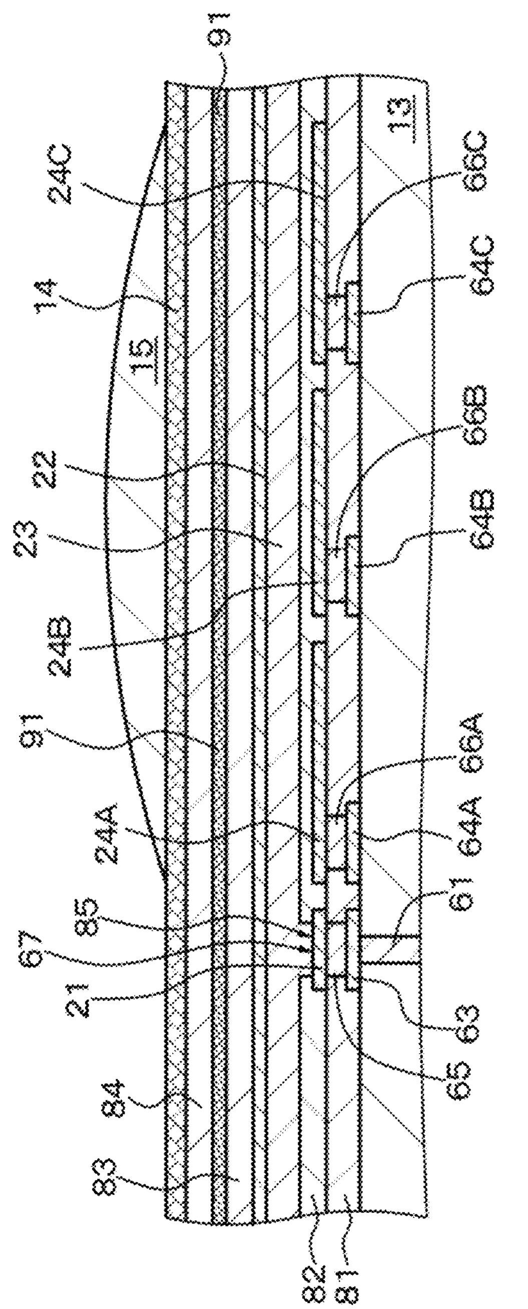
FIG. 68 is a schematic partial sectional view of part of a stacked-type imaging element of a working example 12.
Figure 69:
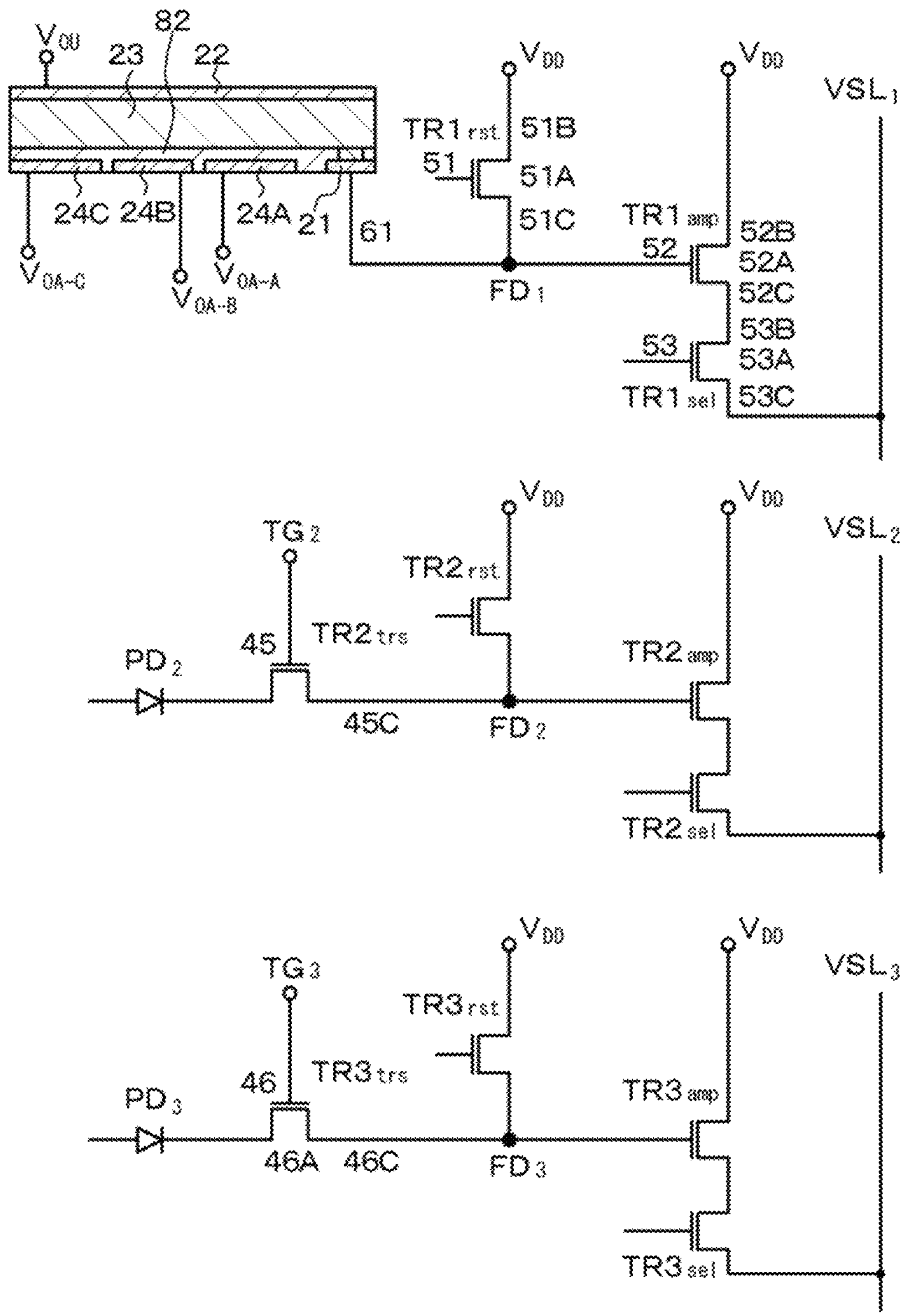
FIG. 69 is an equivalent circuit diagram of the stacked-type imaging element of the working example 12.
Figure 70:
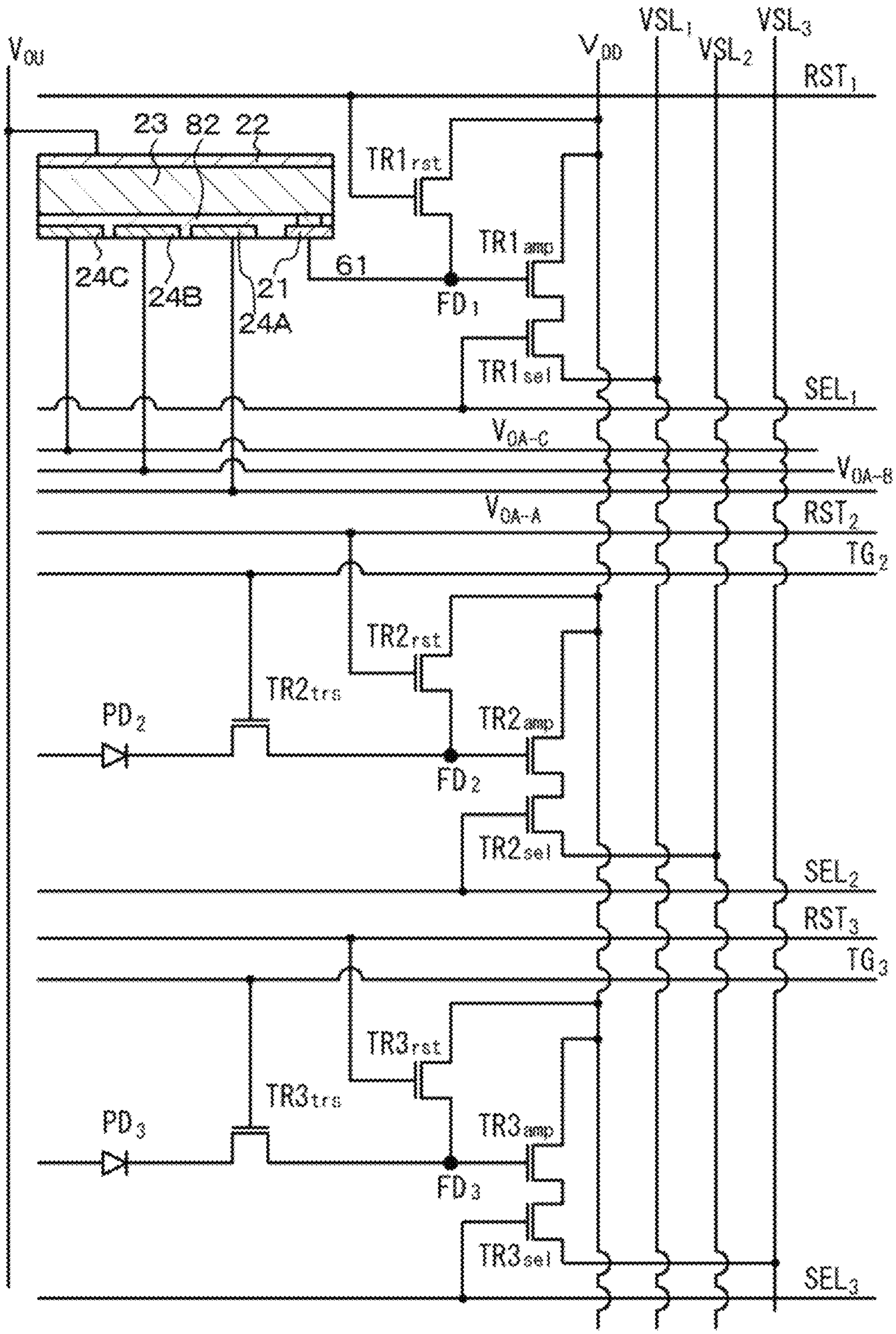
FIG. 70 is an equivalent circuit diagram of the stacked-type imaging element of the working example 12.
Figure 71:
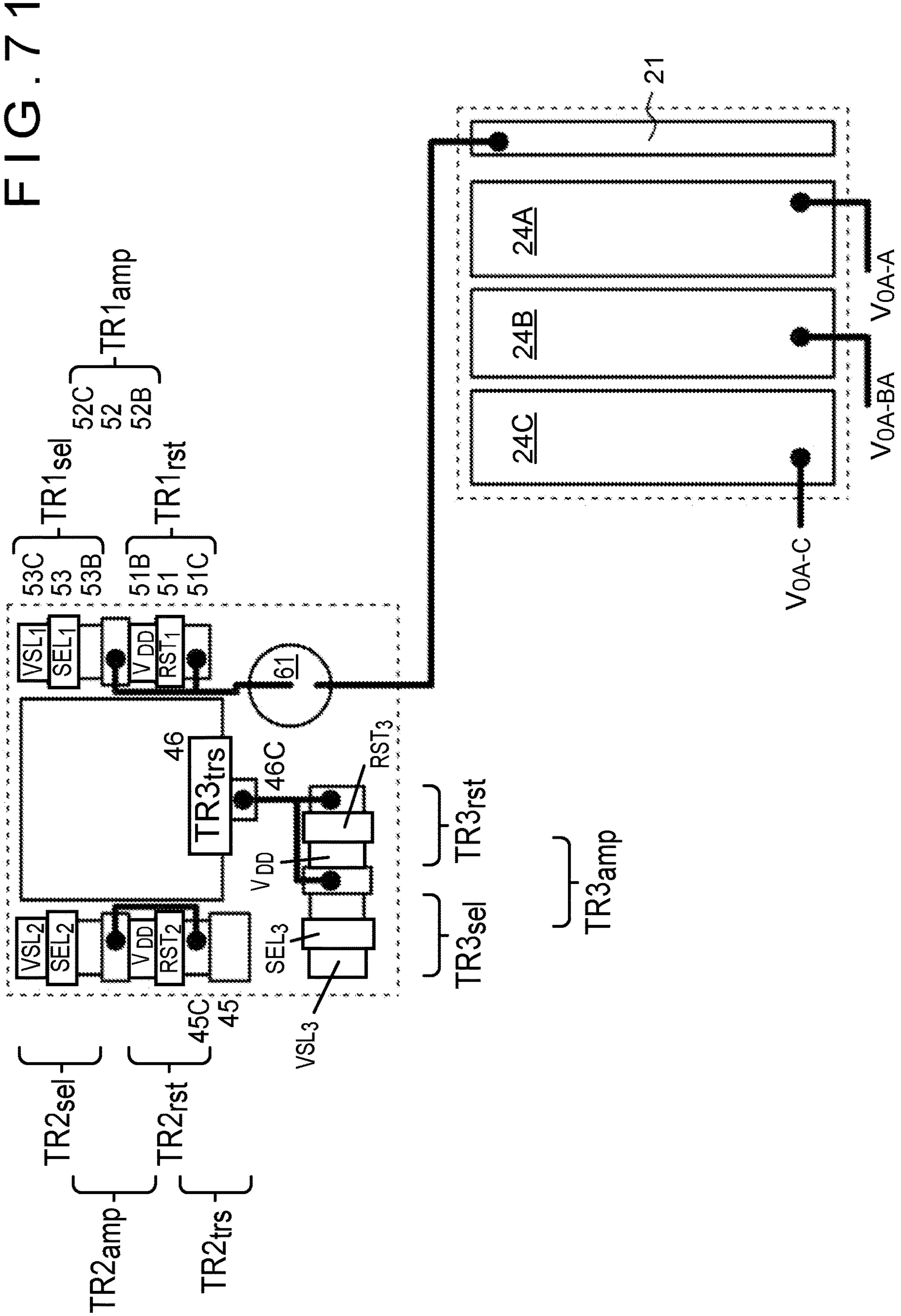
FIG. 71 is a schematic layout diagram of a first electrode and a charge accumulation electrode as well as transistors configuring a control portion, which configure the stacked-type imaging element of the working example 12.
Figure 72:
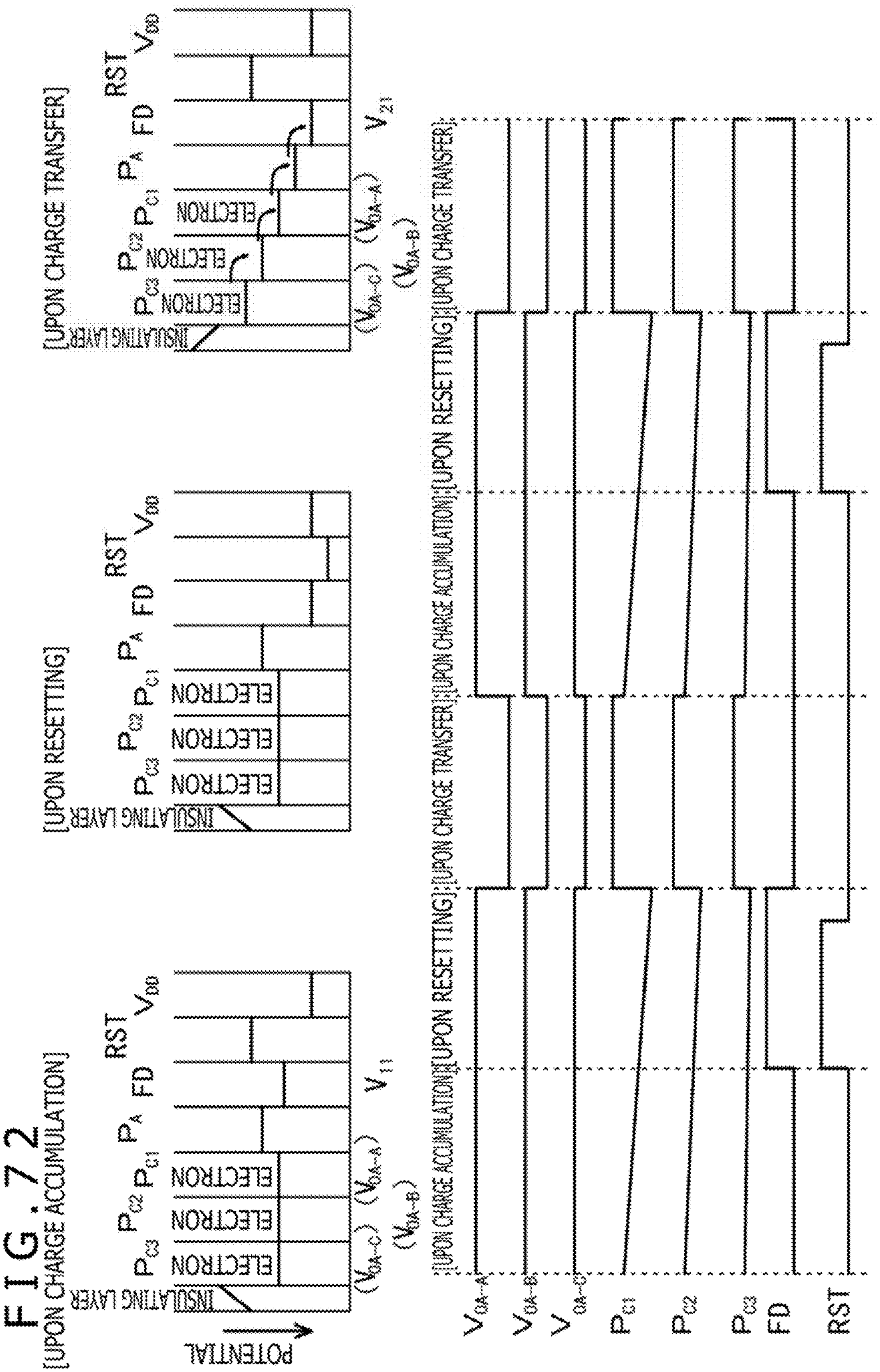
FIG. 72 is a view schematically depicting a state of potentials at respective portions upon operation of the stacked-type imaging element of the working example 12.
Figure 73:
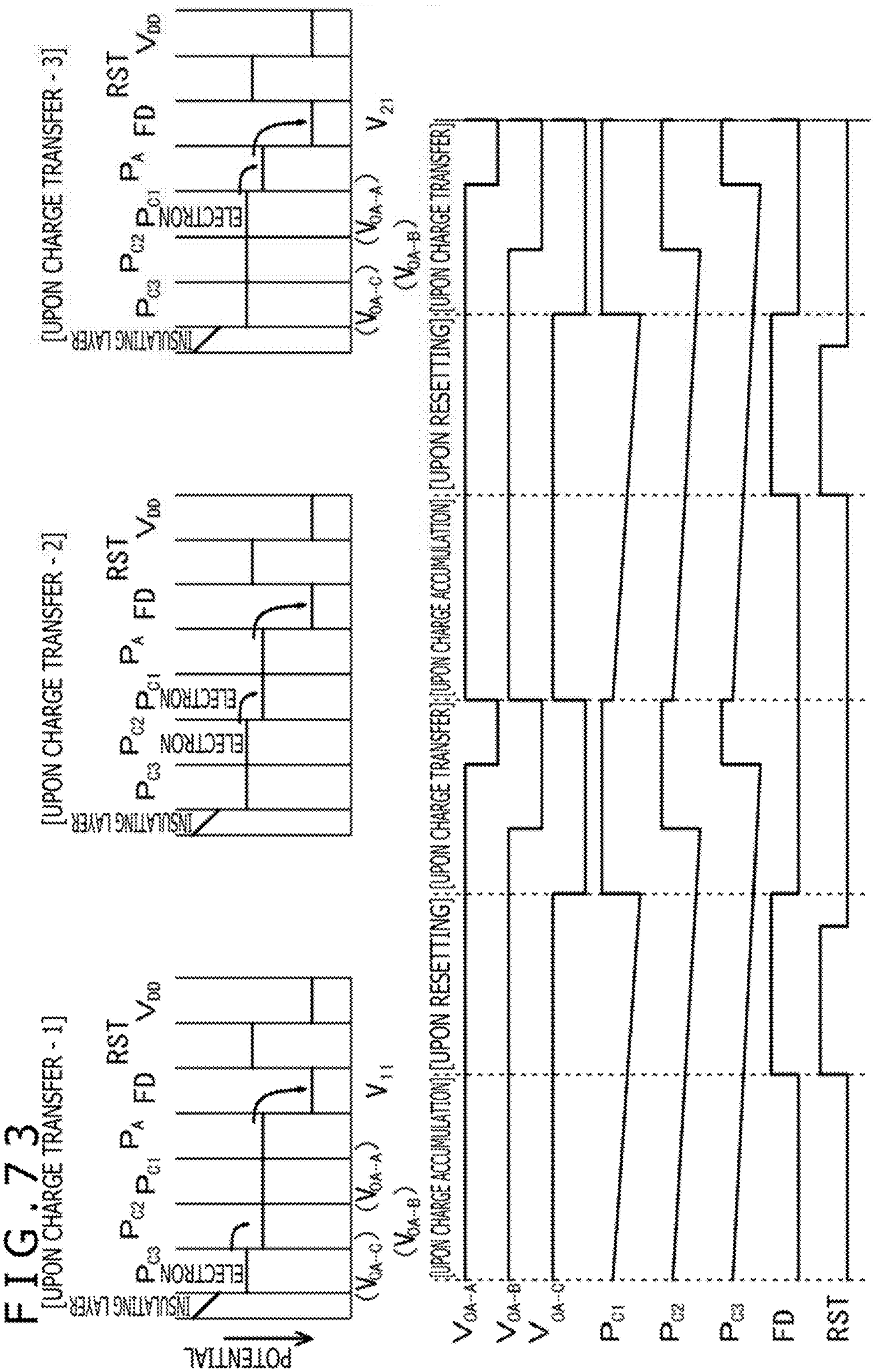
FIG. 73 is a view schematically depicting a state of potentials at respective portions upon different operation (upon transfer) of the stacked-type imaging element of the working example 12.
Figure 74:
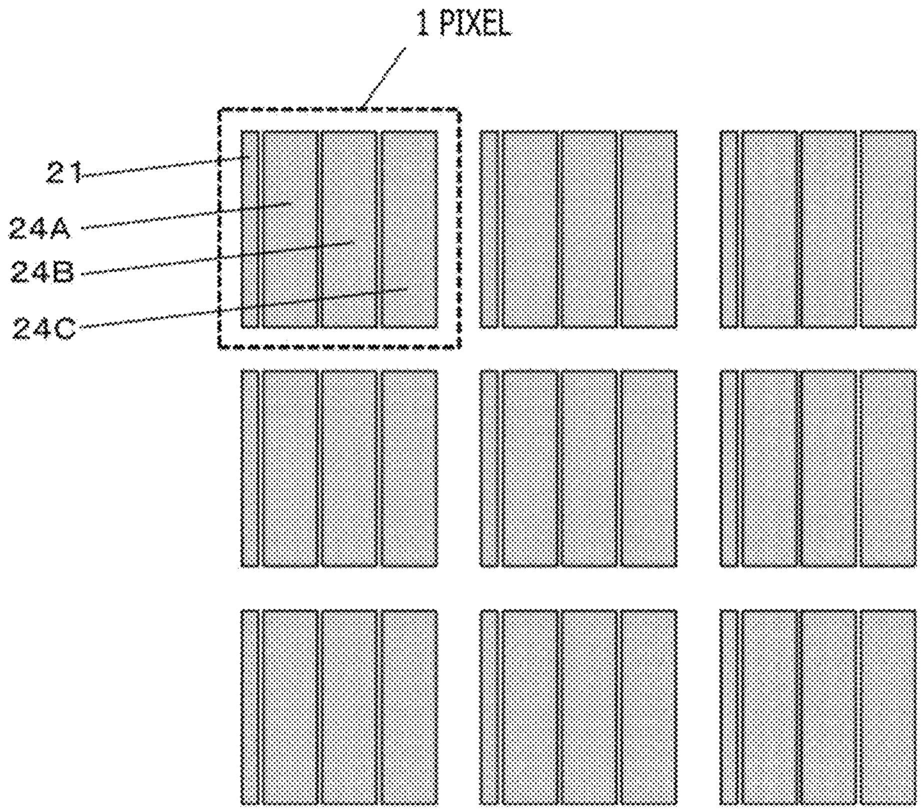
FIG. 74 is a schematic layout diagram of the first electrode and the charge accumulation electrode that configure the stacked-type imaging element of the working example 12.
Figure 75:
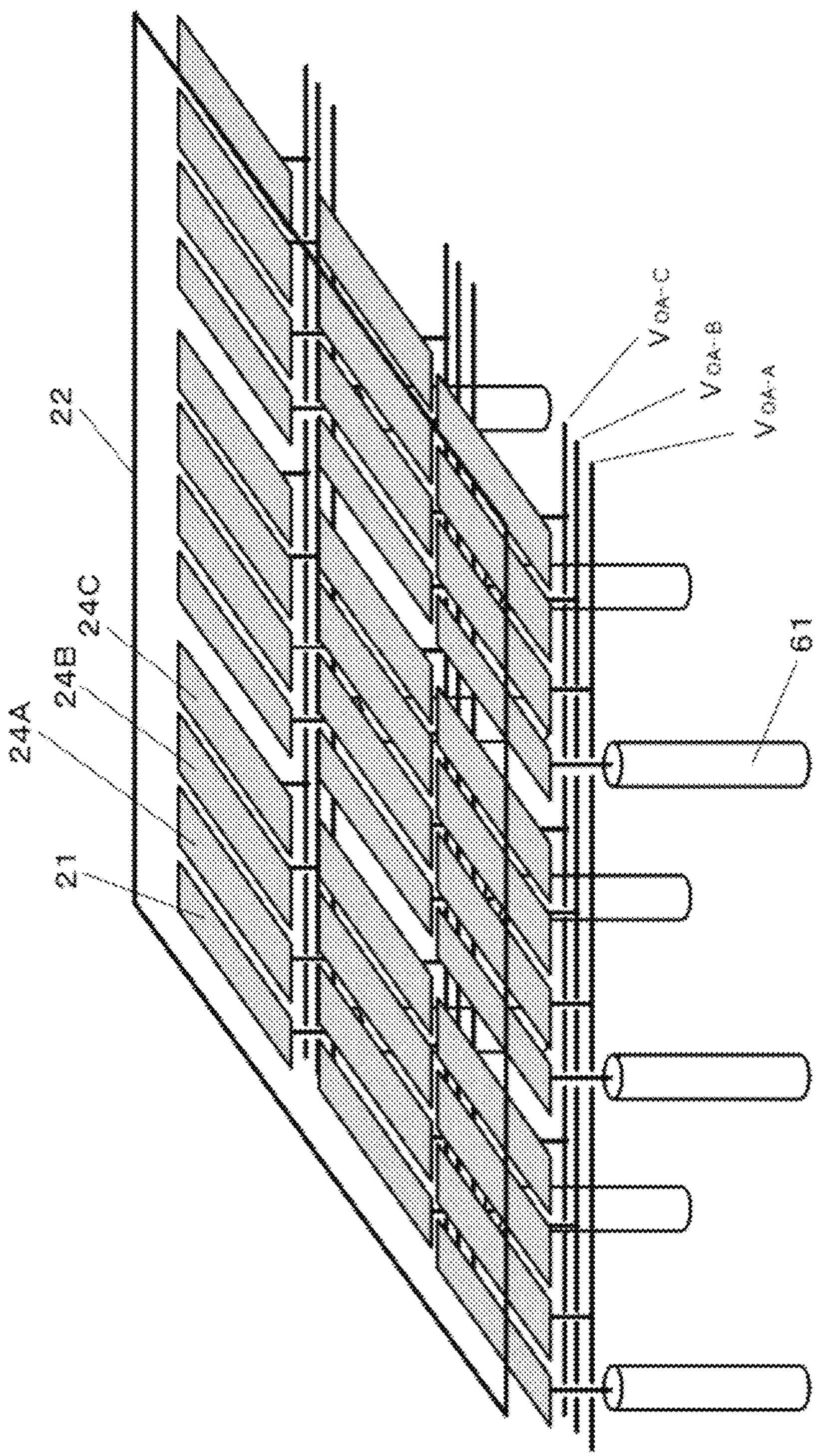
FIG. 75 is a schematic perspective view of the first electrode, the charge accumulation electrode, a second electrode, and a contact hole portion configuring the stacked-type imaging element of the working example 12.

A schematic partial sectional view of part of the stacked-type imaging element of the working example 12 is depicted in FIG. 68; equivalent circuit diagrams of the stacked-type imaging element of the working example 12 are depicted in FIGS. 69 and 70; a schematic layout diagram of a first electrode and a charge accumulation electrode that configure a photoelectric conversion portion including a charge accumulation electrode of the stacked-type imaging element of the working example 12 and transistors configuring a control portion is depicted in FIG. 71; states of the potential at respective portions upon operation of the stacked-type imaging element of the working example 12 are schematically depicted in FIGS. 72 and 73; and an equivalent circuit diagram illustrating respective portions of the stacked-type imaging element of the working example 12 is depicted in FIG. 46C. Further, a schematic layout diagram of the first electrode and the charge accumulation electrode configuring the photoelectric conversion portion including the charge accumulation electrode of the stacked-type imaging element of the working example 12 is depicted in FIG. 74, and a schematic perspective view of the first electrode, the charge accumulation electrode, a second electrode and a contact hole portion is depicted in FIG. 75.

In the working example 12, the charge accumulation electrode 24 includes a plurality of charge accumulation electrode segments 24A, 24B, and 24C. It is sufficient if the number of charge accumulation electrode segments is equal to or greater than 2, and the number in the working example 12 is "3." Further, in the stacked-type imaging element of the working example 12, since the potential of the first electrode 21 is higher than the potential of the second electrode 22, in particular, for example, since a positive potential is applied to the first electrode 21 and a negative potential is applied to the second electrode 22, during a charge transfer period, the potential applied to the charge accumulation electrode segment 24A positioned nearest to the first electrode 21 is higher than the potential applied to the charge accumulation electrode segment 24C positioned most remotely from the first electrode 21. By providing a potential gradient to the charge accumulation electrode 24 in this manner, electrons staying in the region of the photoelectric conversion layer 23 opposing to the charge accumulation electrode 24 are read out to the first electrode 21 and further into the first floating diffusion layer $FD_1$ with a higher degree of certainty. In short, charge accumulated in the photoelectric conversion layer 23 is read out to the control portion.

In the example depicted in FIG. 72, during a charge transfer period, by establishing the relation of the potential of the charge accumulation electrode segment 24C<potential of the charge accumulation electrode segment 24B<potential of the charge accumulation electrode segment 24A, electrons staying in the region of the photoelectric conversion layer 23 are read out all at once into the first floating diffusion layer $FD_1$. On the other hand, in the example depicted in FIG. 73, during a charge transfer period, the potential of the charge accumulation electrode segment 24C, potential of the charge accumulation electrode segment 24B and potential of the charge accumulation electrode segment 24A are made different step by step from each other (namely, changed stepwise or like a slope) such that electrons staying in the region of the photoelectric conversion layer 23 opposing to the charge accumulation electrode segment 24C are moved into the region of the photoelectric conversion layer 23 opposing to the charge accumulation electrode segment 24B and then electrons staying in the region of the photoelectric conversion layer 23 opposing to the charge accumulation electrode segment 24B are moved into the region of the photoelectric conversion layer 23 opposing to the charge accumulation electrode segment 24A, and thereafter, electrons staying in the region of the photoelectric conversion layer 23 opposing to the charge accumulation electrode segment 24A are read out into the first floating diffusion layer $FD_1$ with certainty.

Figure 76:
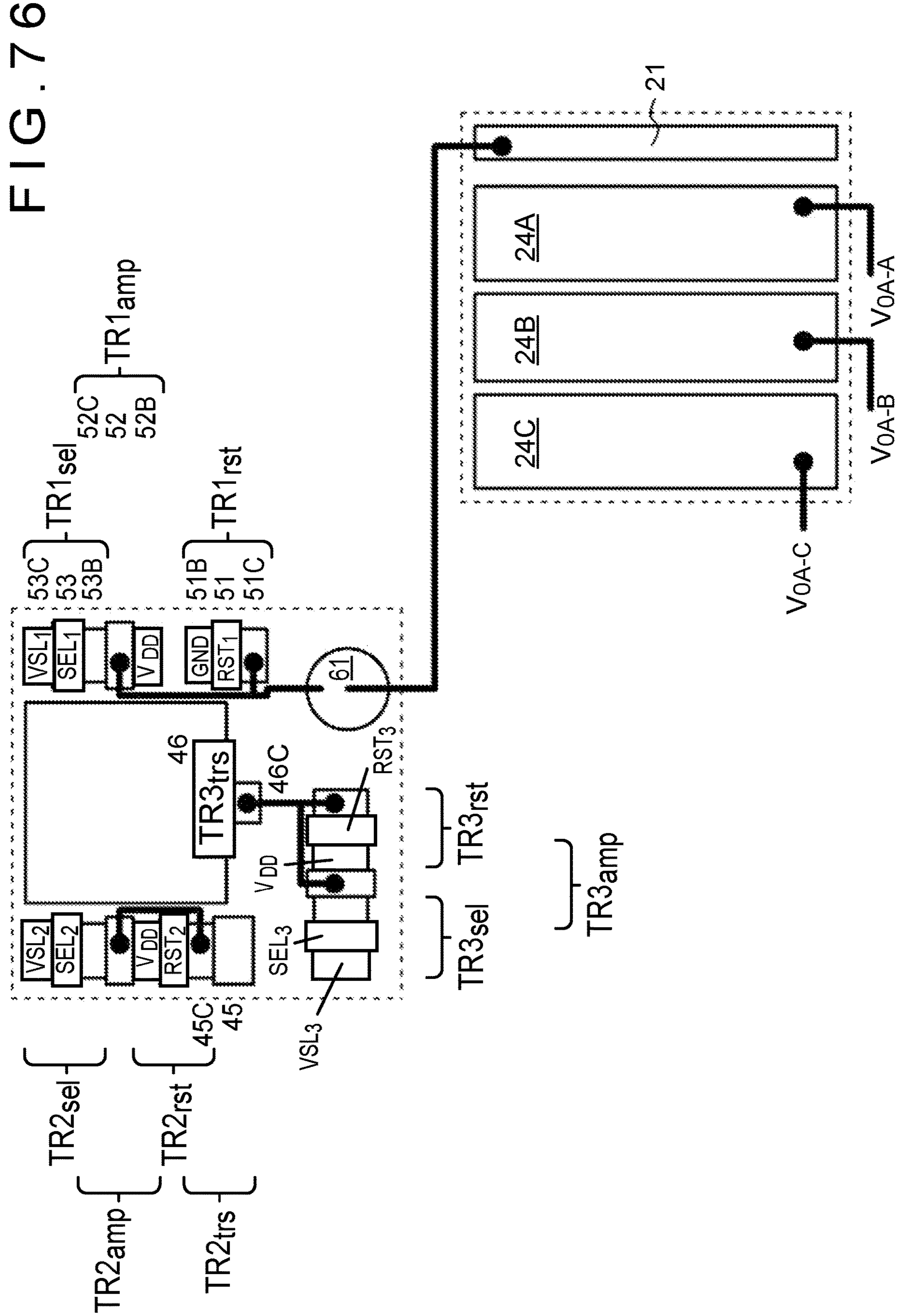
FIG. 76 is a schematic layout diagram of the first electrode and the charge accumulation electrode that configure a modification of the stacked-type imaging element of the working example 12.

As depicted in FIG. 76 that is a schematic layout diagram of the first electrode and the charge accumulation electrode as well as transistors configuring the control portion included the modification of the stacked-type imaging element of the working example 12, the other 51B of the source/drain regions of the reset transistor $\mathbf{TR1}_{rst}$ may be grounded in place of being connected to the power supply $V_{DD}$.

Working Example 13

The working example 13 is a modification of the working examples 7 to 12 and relates to an imaging element of the first and sixth configurations.

Figure 77:
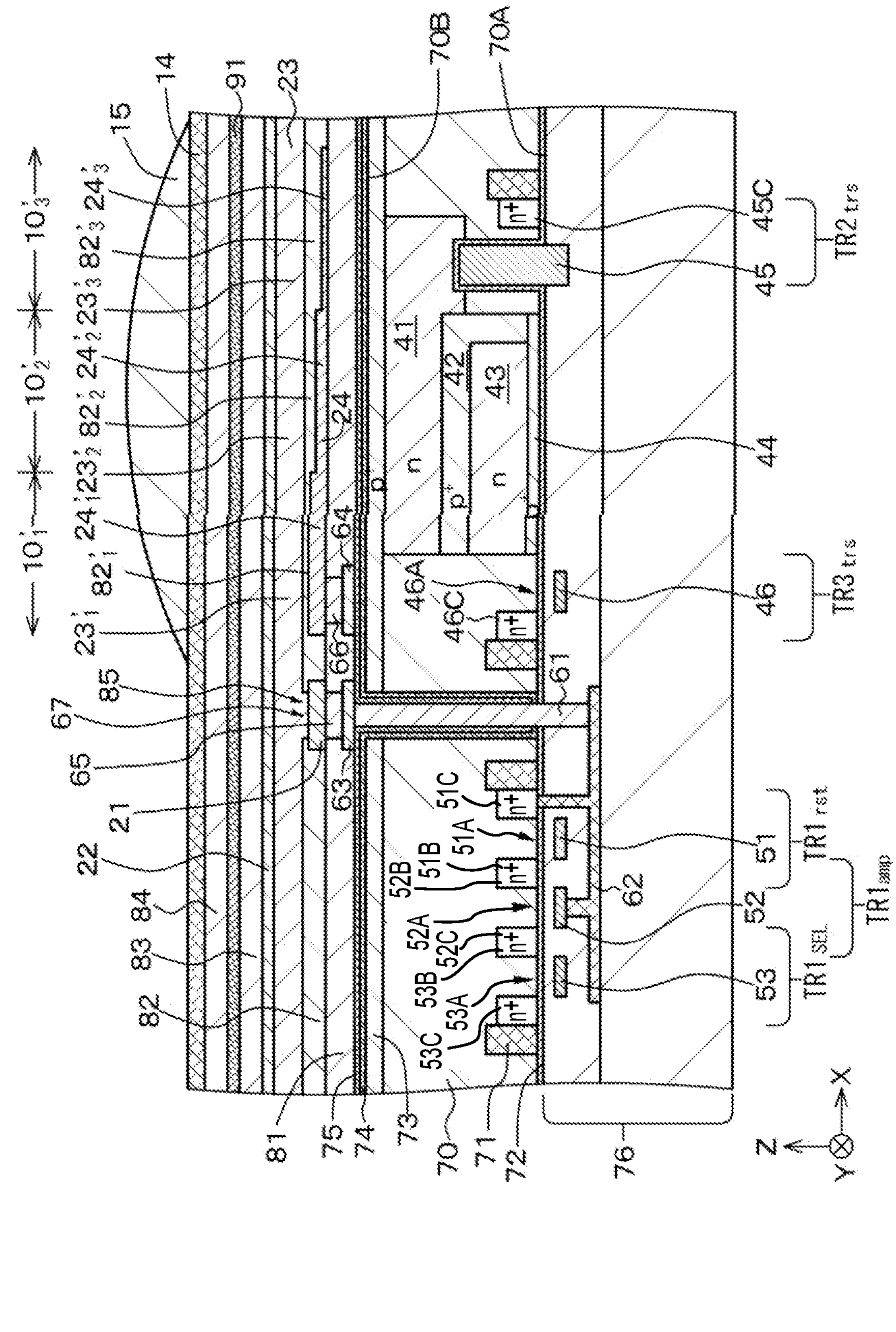
FIG. 77 is a schematic partial sectional view of a stacked-type imaging element of a working example 13.
Figure 78:
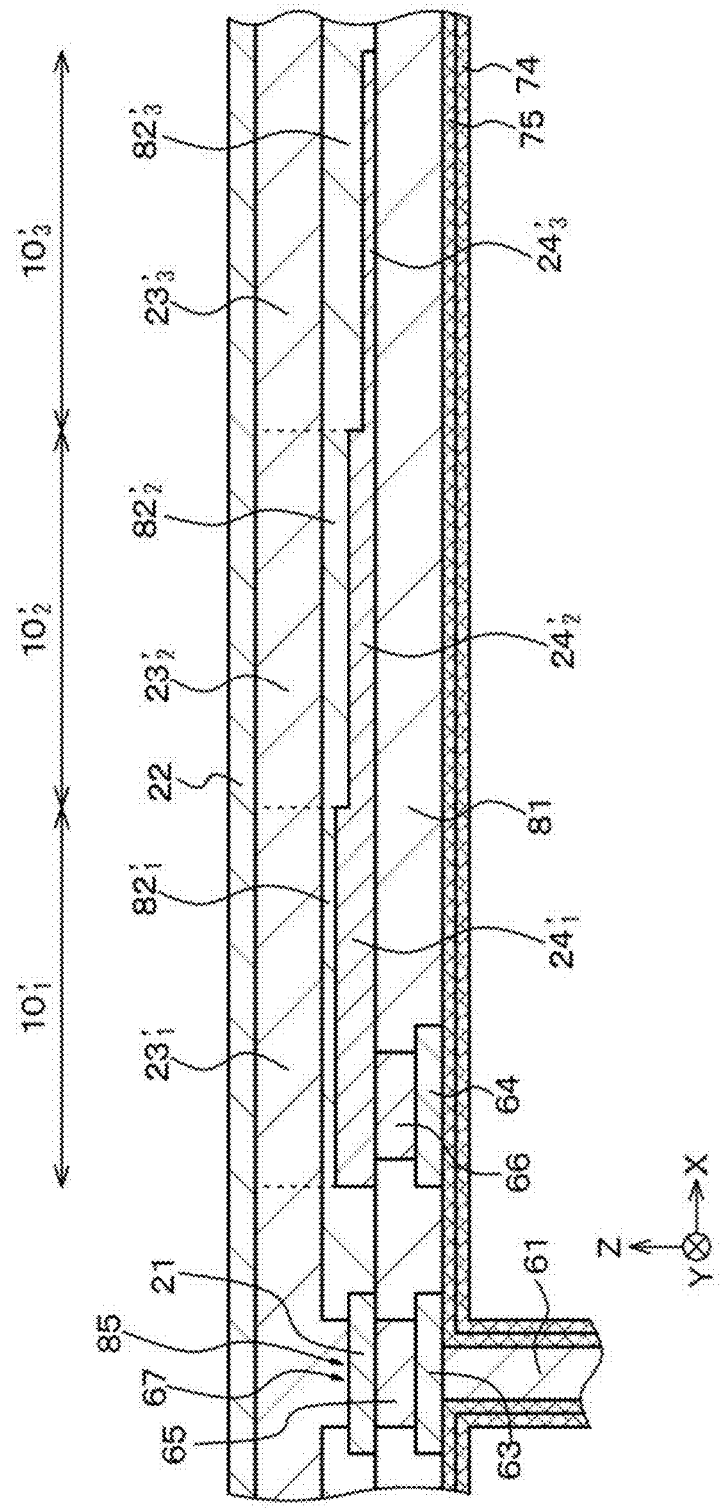
FIG. 78 is a schematic partial sectional view in which a portion at which a charge accumulation electrode, a photoelectric conversion layer, and a second electrode in the stacked-type imaging element of the working example 13 are stacked is enlarged.

A schematic partial sectional view of the stacked-type imaging element of the working example 13 is depicted in FIG. 77, and a schematic partial sectional view is depicted in FIG. 78 in which a location at which a charge accumulation electrode, a photoelectric conversion layer and a second electrode are stacked is enlarged. An equivalent circuit diagram of the stacked-type imaging element of the working example 13 is similar to the equivalent circuit diagrams of the stacked-type imaging element of the working example 7 described hereinabove with reference to FIGS. 42 and 43, and a schematic layout diagram of a first electrode and a charge accumulation electrode that configure a photoelectric conversion portion including a charge accumulation electrode of the stacked-type imaging element of the working example 13 and transistors configuring a control portion is similar to that of the stacked-type imaging element of the working example 7 described hereinabove with reference to FIG. 44. Furthermore, operation of the stacked-type imaging element (first imaging element) of the working example 13 is substantially similar to operation of the stacked-type imaging element of the working example 7.

Here, in the stacked-type imaging element of the working example 13 or stacked-type imaging elements of working examples 14 to 18, the photoelectric conversion portion includes N (where N≤2) photoelectric conversion portion segments (in particular, three photoelectric conversion portion segments $\mathbf{10'}_1$, $\mathbf{10'}_2$, and $\mathbf{10'}_3$), the photoelectric conversion layer 23 includes N photoelectric conversion layer segments (in particular, three photoelectric conversion layer segments $\mathbf{23'}_1$, $\mathbf{23'}_2$, and $\mathbf{23'}_3$), the insulating layer 82 includes N insulating layer segments (in particular, three insulating layer segments 82'$_1$, 82'$_2$, and 82'$_3$), in the working examples 13 to 15, the charge accumulation electrode 24 includes N charge accumulation electrode segments (in particular, in the working examples, three charge accumulation electrode segments 24'$_1$, 24'$_2$, and 24'$_3$), in the working examples 16 to 17, in some cases, in the working example 15, the charge accumulation electrode 24 includes N charge accumulation electrode segments (in particular, three charge accumulation electrode segments 24'$_1$, 24'$_2$, and 24'$_3$) disposed in a spaced relation from each other, the nth (where n=1, 2, 3, . . . , N) photoelectric conversion portion segment 10'$_n$ includes the nth charge accumulation electrode segment 24'$_n$, the nth insulating layer segment 82'$_n$, and the nth photoelectric conversion layer segment 23'$_n$, and the photoelectric conversion portion segment having a higher value of n is positioned more remotely from the first electrode 21.

Alternatively, in the stacked-type imaging element of the working example 13 or stacked-type imaging elements of the working examples 14 and 17 hereinafter described, a photoelectric conversion portion in which a first electrode 21, a photoelectric conversion layer 23 and a second electrode 22 are stacked is provided, the photoelectric conversion portion further includes a charge accumulation electrode 24 disposed in a spaced relation from the first electrode 21 and besides is disposed in an opposing relation to the photoelectric conversion layer 23 with an insulating layer 82 interposed therebetween, and where the stacking direction of the charge accumulation electrode 24, the insulating layer 82, and the photoelectric conversion layer 23 is a Z direction and a direction away from the first electrode 21 is an X direction, the sectional area of a stacked portion at which the charge accumulation electrode 24, the insulating layer 82, and the photoelectric conversion layer 23 are stacked when the stacked portion is cut along a YZ virtual plane varies depending upon the distance from the first electrode.

Further, in the stacked-type imaging element of the working example 13, the thickness of the insulating layer segment indicates a gradual change over from the first photoelectric conversion portion segment 10'$_1$ to the Nth photoelectric conversion portion segment 10'$_N$. In particular, the thickness of the insulating layer segments gradually becomes thicker. Alternatively, in the stacked-type imaging element of the working example 13, the width of the cross sections of the stacked portions is fixed, and the thickness of the cross sections of the stacked portions, particularly, the thickness of the insulating layer segments, gradually becomes thicker depending upon the distance from the first electrode 21. It is to be noted that the thickness of the insulating layer segments indicates a stepwise increase. The thickness of the insulating layer segment 82'$_n$ in the nth photoelectric conversion portion segment 10'$_n$ is fixed. Where the thickness of the insulating layer segment 82'$_n$ in the nth photoelectric conversion portion segment 10'$_n$ is "1," although 2 to 10 can be exemplified as the thickness of the insulating layer segment 82'$_{(n+1)}$ at the (n+1)th photoelectric conversion portion segment 10'$_{(n+1)}$, such a value as just mentioned is not restrictive. In the working example 13, by gradually decreasing the thickness of the charge accumulation electrode segments 24'$_1$, 24'$_2$, and 24'$_3$, the thickness of the insulating layer segments 82'$_1$, 82'$_2$, and 82'$_3$ is gradually increased. The thickness of the photoelectric conversion layer segments 23'$_1$, 23'$_2$, and 23'$_3$ is fixed.

In the following, operation of the stacked-type imaging element of the working example 13 is described.

During a charge accumulation period, from the driving circuit, a potential $V_{11}$ is applied to the first electrode 21 and a potential $V_{12}$ is applied to the charge accumulation electrode 24. Photoelectric conversion is caused in the photoelectric conversion layer 23 by light incident to the photoelectric conversion layer 23. Holes generated by the photoelectric conversion are sent out from the second electrode 22 to the driving circuit through the wiring $V_{OU}$. On the other hand, since the potential of the first electrode 21 is higher than the potential of the second electrode 22, in particular, for example, since a positive potential is applied to the first electrode 21 and a negative potential is applied to the second electrode 22, $V_{12} \geq V_{11}$, preferably, $V_{12} > V_{11}$. Consequently, electrons generated by the photoelectric conversion are attracted to the charge accumulation electrode 24 and stay in the region of the photoelectric conversion layer 23 opposing to the charge accumulation electrode 24. In other words, charge is accumulated into the photoelectric conversion layer 23. Since $V_{12} > V_{11}$, electrons generated in the inside of the photoelectric conversion layer 23 do not move toward the first electrode 21. As time of the photoelectric conversion elapses, the potential in the region of the photoelectric conversion layer 23 opposing to the charge accumulation electrode 24 increases to the negative side.

Since the stacked-type imaging element of the working example 13 adopts the configuration that the thickness of the insulating layer segments gradually becomes thick, if such a state as $V_{12} \geq V_{11}$ is established during a charge accumulation period, the nth photoelectric conversion portion segment 10'$_n$ can accumulate a greater amount of charge than the (n+1)th photoelectric conversion portion segment 10'$_{(n+1)}$ and a stronger electric field is applied, and a flow of charge from the first photoelectric conversion portion segment 10'$_1$ to the first electrode 21 can be prevented with certainty.

In the later stage of the charge accumulation period, reset operation is performed. By the reset operation, the potential of the first floating diffusion layer $FD_1$ is reset and the potential at the first floating diffusion layer $FD_1$ becomes the potential $V_{DD}$ of the power supply.

After completion of the reset operation, reading out of charge is performed. In particular, during a charge transfer period, from the driving circuit, a potential $V_{21}$ is applied to the first electrode 21, and a potential $V_{22}$ is applied to the charge accumulation electrode 24. Here, $V_{21} > V_{22}$. As a result, electrons staying in the region of the photoelectric conversion layer 23 opposing to the charge accumulation electrode 24 are read out to the first electrode 21 and further to the first floating diffusion layer $FD_1$. In other words, charge accumulated in the photoelectric conversion layer 23 is read out to the control portion.

More particularly, if such a state as $V_{21} > V_{22}$ is entered during a charge transfer period, then a flow of charge from the first photoelectric conversion portion segment 10'$_1$ to the first electrode 21 and a flow of charge from the (n+1)th photoelectric conversion portion segment 10'$_{(n+1)}$ to the nth photoelectric conversion portion segment 10'$_n$ can be assured with certainty.

The series of operations of charge accumulation, a reset operation, and charge transfer are completed therewith.

In the stacked-type imaging element of the working example 13, since the thickness of the insulating layer segments indicates a gradual change over from the first photoelectric conversion portion segment to the Nth photoelectric conversion portion segment, or since the cross sectional area of the stacked portion at which the charge accumulation electrode, the insulating layer, and the photoelectric conversion layer are stacked when the stacked portion is cut along a YZ virtual plane varies depending upon the distance from the first electrode, a kind of charge transfer gradient is formed, and charge generated by photoelectric conversion can be transferred more easily and besides with more certainty.

Since the stacked-type imaging element of the working example 13 can be produced by a method substantially similar to that of the stacked-type imaging element of the working example 7, detailed description of the method is omitted.

In the stacked-type imaging element of the working example 13, in formation of the first electrode 21, the charge accumulation electrode 24 and the insulating layer 82, a conductive material layer for forming a charge accumulation electrode 24'$_3$ is deposited (formed) on the interlayer insulating layer 81 first, and the conductive material layer is patterned such that the conductive material layer is left in regions in which the photoelectric conversion portion segments 10'$_1$, 10'$_2$, and 10'$_3$ and the first electrode 21 are to be formed, by which part of the first electrode 21 and the charge accumulation electrode 24'$_3$ can be obtained. Then, an insulating layer for forming the insulating layer segment 82'$_3$ is deposited (formed) over the overall area, and the insulating layer is patterned and a flattening process is performed, by which the insulating layer segment 82'$_3$ can be obtained. Then, a conductive material layer for forming a charge accumulation electrode 24'$_2$ is deposited (formed) over the overall area, and the conductive material layer is patterned such that the conductive material layer is left in regions in which the photoelectric conversion portion segments 10'$_1$ and 10'$_2$ and the first electrode 21 are to be formed, by which part of the first electrode 21 and the charge accumulation electrode 24'$_2$ can be obtained. Then, an insulating layer for forming the insulating layer segment 82'$_2$ is deposited (formed) over the overall area, and the insulating layer is patterned and a flattening process is performed, by which the insulating layer segment 82'$_2$ can be obtained. Then, a conductive material layer for forming a charge accumulation electrode 24'$_1$ is deposited (formed) over the overall area, and the conductive material layer is patterned such that the conductive material layer is left in regions in which the photoelectric conversion portion segment 10'$_1$ and the first electrode 21 are to be formed, by which the first electrode 21 and the charge accumulation electrode 24'$_1$ can be obtained. Thereafter, an insulating layer is deposited (formed) over the overall area and a flattening process is performed, by which the insulating layer segment 82'$_1$ (insulating layer 82) can be obtained. Then, a photoelectric conversion layer 23 is formed on the insulating layer 82. The photoelectric conversion portion segments 10'$_1$, 10'$_2$, and 10'$_3$ can be obtained in this manner.

Figure 79:
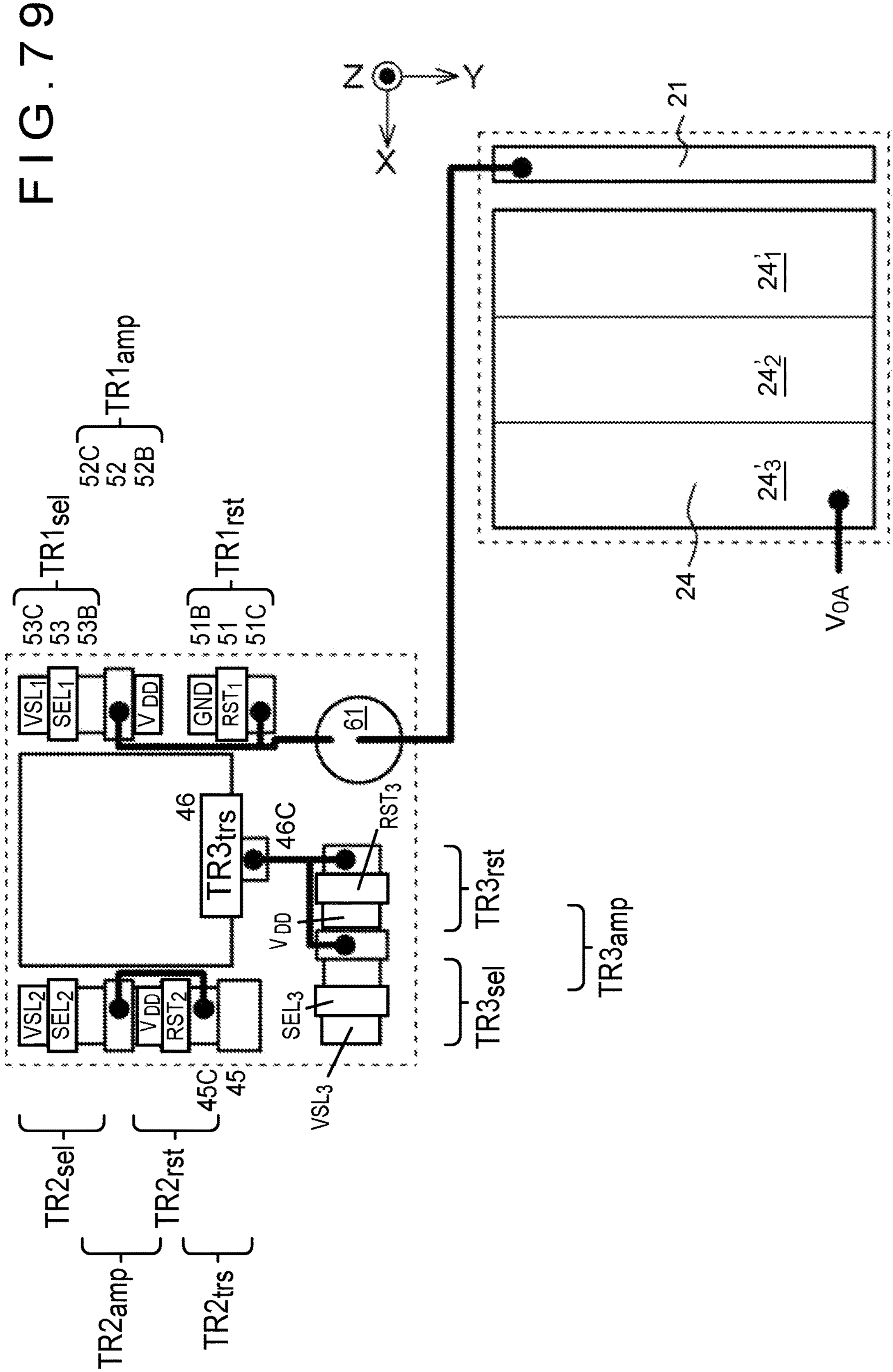
FIG. 79 is a schematic layout diagram of a first electrode and a charge accumulation electrode as well as transistors configuring a control portion, which configure a modification of the stacked-type imaging element of the working example 13.

As depicted in FIG. 79 that is a schematic layout diagram of the first electrode and the charge accumulation electrode as well as the transistors of the control portion, which configure a modification of the stacked-type imaging element of the working example 13, the other 51B of the source/drain regions of the reset transistor TR1$_{rst}$ may be grounded in place of being connected to the power supply $V_{DD}$.

Working Example 14

Figure 80:
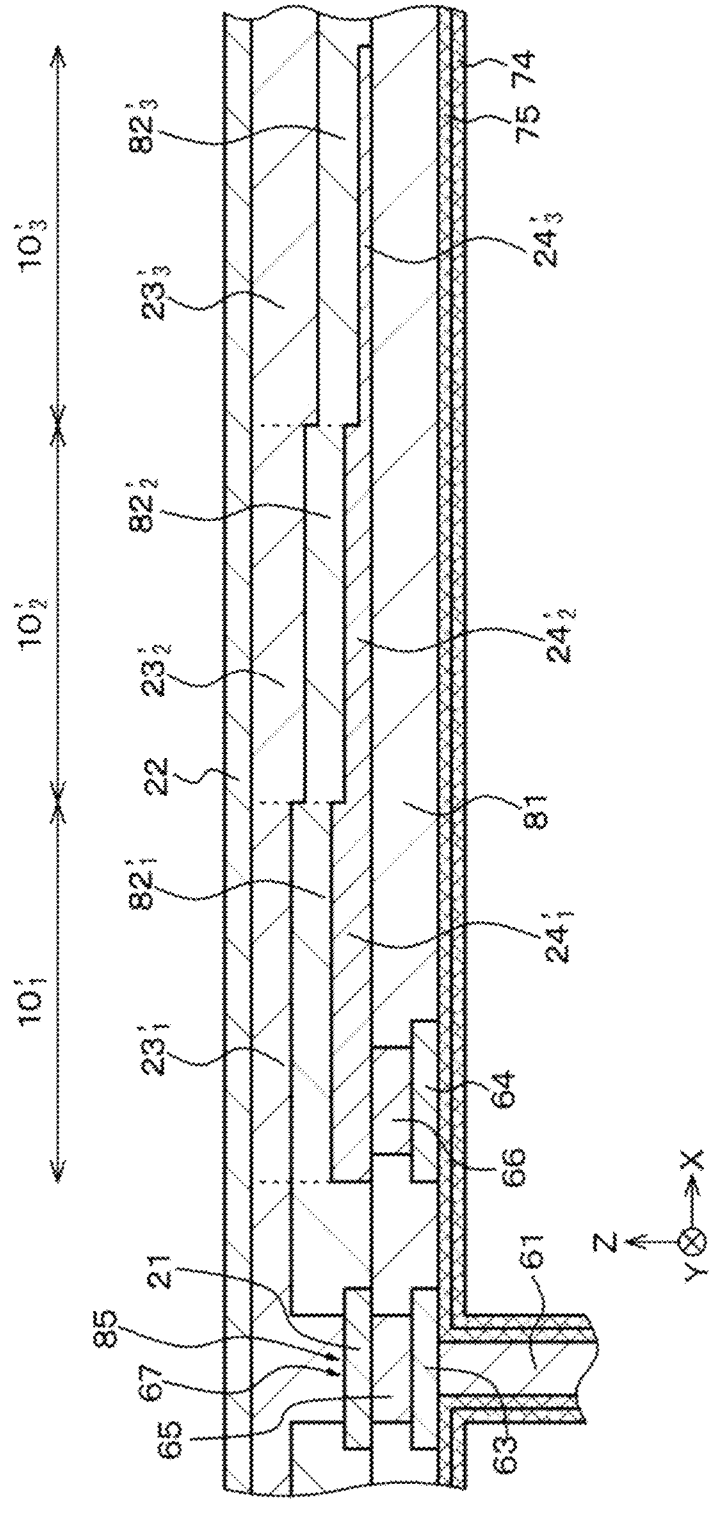
FIG. 80 is a schematic partial sectional view in which a portion at which a charge accumulation electrode, a photoelectric conversion layer, and a second electrode in a stacked-type imaging element of a working example 14 are stacked is enlarged.

The stacked-type imaging element of the working example 14 relates to an imaging element of the second configuration and the sixth configuration of the present disclosure. As depicted in FIG. 80 that is a schematic partial sectional view in which a portion at which the charge accumulation electrode, photoelectric conversion layer and second electrode are stacked is enlarged, in the stacked-type imaging element of the working example 14, the thickness of the photoelectric conversion layer segments indicates a gradual change over from the first photoelectric conversion portion segment 10'$_1$ to the Nth photoelectric conversion portion segment 10'$_N$. Alternatively, in the stacked-type imaging element of the working example 14, the width of the cross section of the stacked portion is fixed while the thickness of the cross section of the stacked portion, particularly the thickness of the photoelectric conversion layer segment, is gradually increased depending upon the distance from the first electrode 21. More particularly, the thickness of the photoelectric conversion layer segment gradually increases. Note that, the thickness of the photoelectric conversion layer segment increases stepwise. The thickness of the photoelectric conversion layer segment 23'$_n$ in the nth photoelectric conversion portion segment 10'$_n$ is fixed. Where the thickness of the photoelectric conversion layer segment 23'$_n$ of the nth photoelectric conversion portion segment 10'$_n$ is represented by "1," although 2 to 10 can be exemplified as the thickness of the photoelectric conversion layer segment 23$_{(n+1)}$ of the (n+1)th photoelectric conversion portion segment 10'$_{(n+1)}$, this value is not restrictive. In the working example 14, the thickness of the photoelectric conversion layer segments 23'$_1$, 23'$_2$, and 23'$_3$ is gradually increased by gradually degreasing the thickness of the charge accumulation electrode segments 24'$_1$, 24'$_2$, and 24'$_3$. The thickness of the insulating layer segments 82'$_1$, 82'$_2$, and 82'$_3$ is fixed.

Since, in the stacked-type imaging element of the working example 14, the thickness of the photoelectric conversion layer segment gradually increases, if such a state as $V_{12} \geq V_{11}$ is entered during a charge accumulation period, then a stronger electric field is applied to the nth photoelectric conversion portion segment 10'$_n$ than to the (n+1)th photoelectric conversion portion segment 10'$_{(n+1)}$, and a flow of charge from the first photoelectric conversion portion segment 10'$_1$ to the first electrode 21 can be prevented with certainty. Then, if such a state as $V_{22} < V_{21}$ is entered during a charge transfer period, then a flow of charge from the first photoelectric conversion portion segment 10'$_1$ to the first electrode 21 and a flow of charge from the (n+1)th photoelectric conversion portion segment 10'$_{(n+1)}$ to the nth photoelectric conversion portion segment 10'$_n$ can be assured with certainty.

In this manner, in the stacked-type imaging element of the working example 14, since the thickness of the photoelectric conversion layer segment indicates a gradual changes over from the first photoelectric conversion portion segment to the Nth photoelectric conversion portion segment, or since the sectional area of a stacked portion at which the charge accumulation electrode, the insulating layer, and the photoelectric conversion layer are stacked when the stacked portion is cut along a YZ virtual plane changes depending upon the distance from the first electrode, a kind of charge transfer gradient is formed, and charge generated by photoelectric conversion can be transmitted more simply and with more certainty.

In the stacked-type imaging element of the working example 14, in formation of the first electrode 21, the charge accumulation electrode 24, the insulating layer 82, and the photoelectric conversion layer 23, a conductive material layer for forming the charge accumulation electrode 24'$_3$ is deposited (formed) on the interlayer insulating layer 81 first, and the conductive material layer is patterned such that the conductive material layer is left in regions in which the photoelectric conversion portion segments 10'$_1$, 10'$_2$, and 10'$_3$ and the first electrode 21 are to be formed, by which part of the first electrode 21 and the charge accumulation electrode 24'$_3$ can be obtained. Then, a conductive material layer for forming the charge accumulation electrode 24'$_2$ is deposited (formed) over the overall area, and the conductive material layer is patterned such that the conductive material layer is left in regions in which the photoelectric conversion portion segments 10'$_1$ and 10'$_2$ and the first electrode 21 are to be formed, by which part of the first electrode 21 and the charge accumulation electrode 24'$_2$ can be obtained. Then, a conductive material layer for forming the charge accumulation electrode 24'$_1$ is deposited (formed) over the overall area, and the conductive material layer is patterned such that the conductive material layer is left in regions in which the first photoelectric conversion portion segment 10'$_1$ and the first electrode 21 are to be formed, by which the first electrode 21 and the charge accumulation electrode 24'$_1$ can be obtained. Then, an insulating layer 82 is deposited (formed) conformally over the overall area. Then, a photoelectric conversion layer 23 is formed on the insulating layer 82, and a flattening process is performed for the photoelectric conversion layer 23. The photoelectric conversion portion segments 10'$_1$, 10'$_2$, and 10'$_3$ can be obtained in this manner.

Working Example 15

Figure 81:
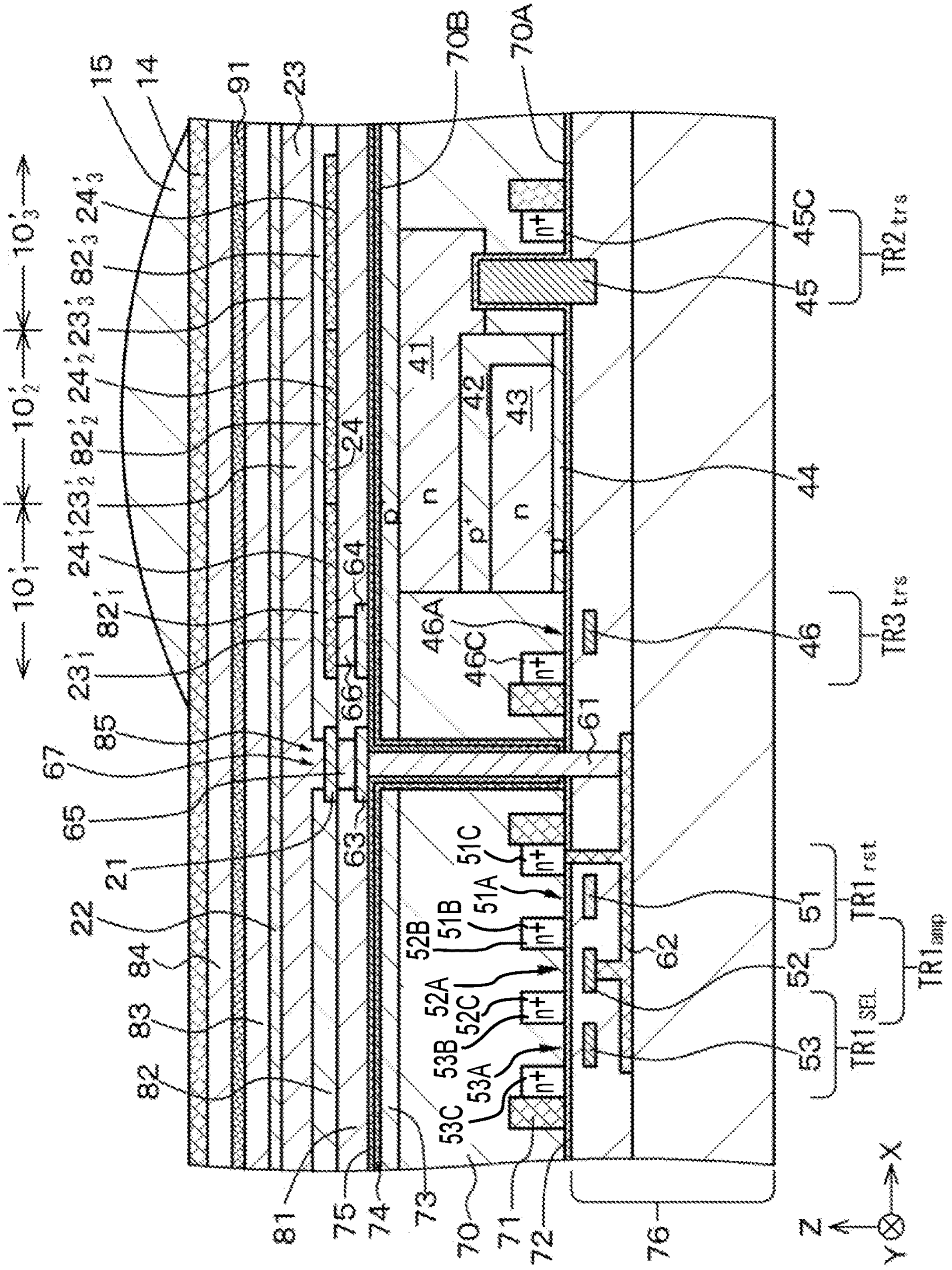
FIG. 81 is a schematic partial sectional view of a stacked-type imaging element of a working example 15.

The working example 15 relates to an imaging element of the third configuration. A schematic partial sectional view of the stacked-type imaging element of the working example 15 is depicted in FIG. 81. In the stacked-type imaging element of the working example 15, the material configuring an insulating layer segment is different between adjacent ones of the photoelectric conversion portion segments. Here, the value of the dielectric constant of a material configuring the insulating layer segment is gradually decreased over from the first photoelectric conversion portion segment 10'$_1$ to the Nth photoelectric conversion portion segment 10'$_n$. In the stacked-type imaging element of the working example 15, a same potential may be applied to all of the N charge accumulation electrode segments or different potentials may be applied individually to the charge accumulation electrode segments. In the latter case, it is sufficient if the charge accumulation electrode segments 24'$_1$, 24'$_2$, and 24'$_3$ disposed in a spaced relation from each other are connected to the vertical driving circuit 112 configuring the driving circuit through pad portions 64$_1$, 64$_2$, and 64$_3$, respectively, similarly as in the description of the working example 16.

By adopting such a configuration as described above, a kind of charge transfer gradient is formed, and if such a state as $V_{12} \geq V_{11}$ is entered during a charge accumulation period, then the nth photoelectric conversion portion segment can accumulate a greater amount of charge than the (n+1)th photoelectric conversion portion segment. Then, if such a state as $V_{22} < V_{21}$ is entered during a charge transfer period, then a flow of charge from the first photoelectric conversion portion segment to the first electrode and a flow of charge from the (n+1)th photoelectric conversion portion segment to the nth photoelectric conversion portion segment can be assured with certainty.

Working Example 16

Figure 82:
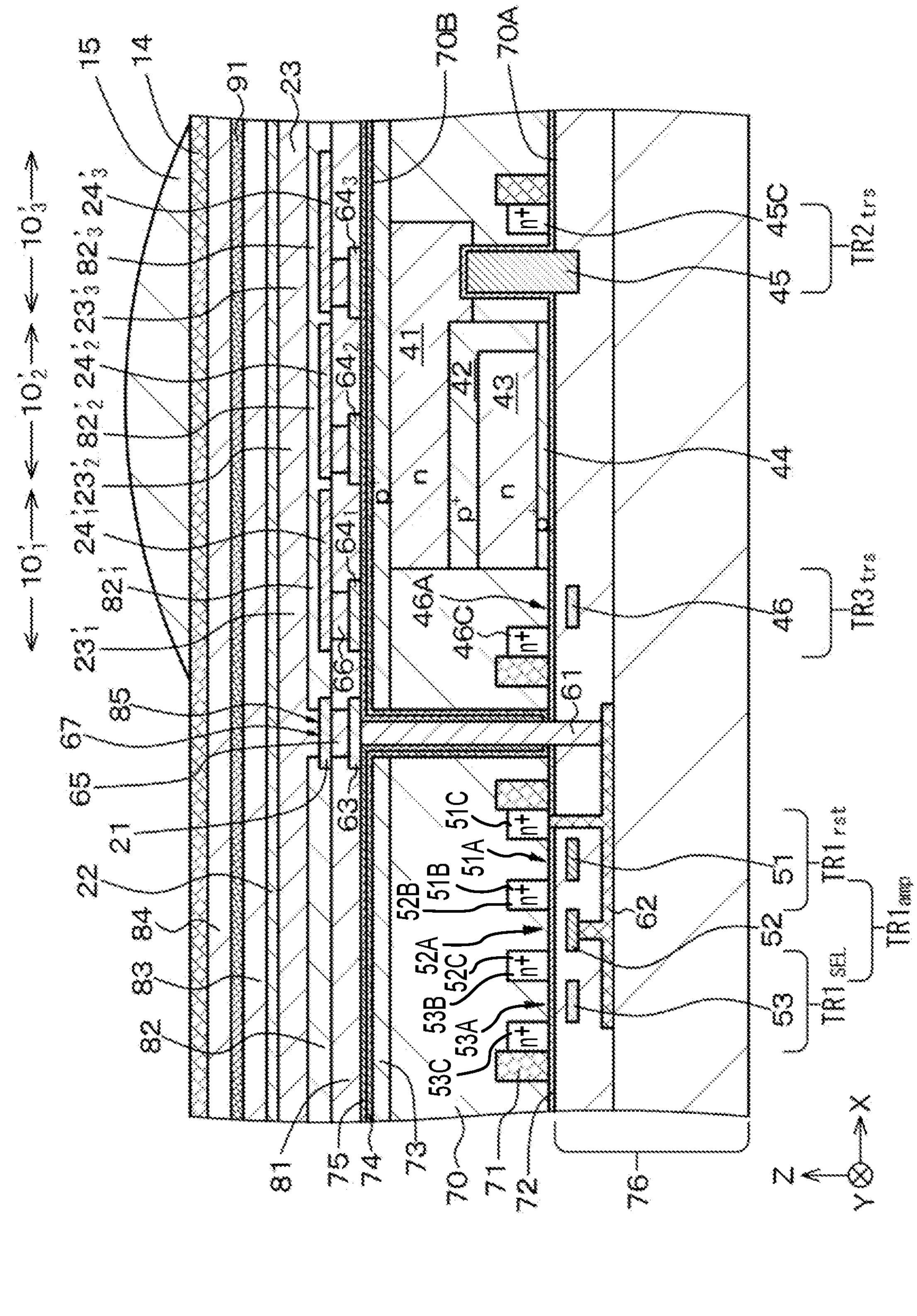
FIG. 82 is a schematic partial sectional view of stacked-type imaging elements of working examples 16 and 17.
Figure 83A:
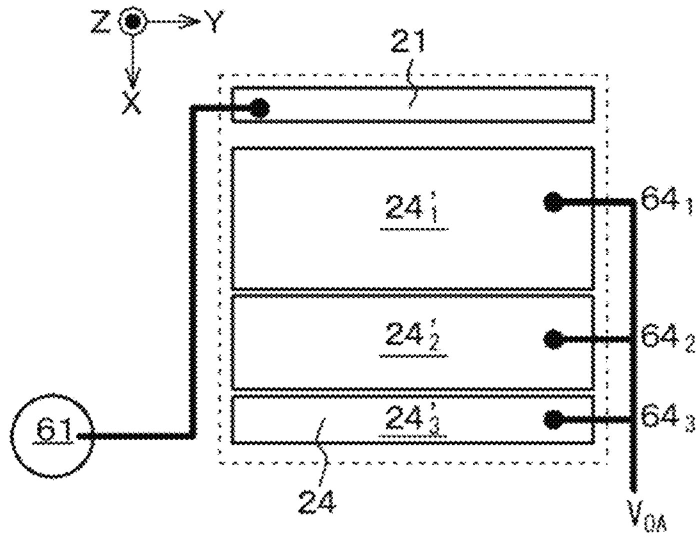
FIGS. 83A and 83B are schematic plan views of a charge accumulation electrode segment in the working example 17.
Figure 83B:
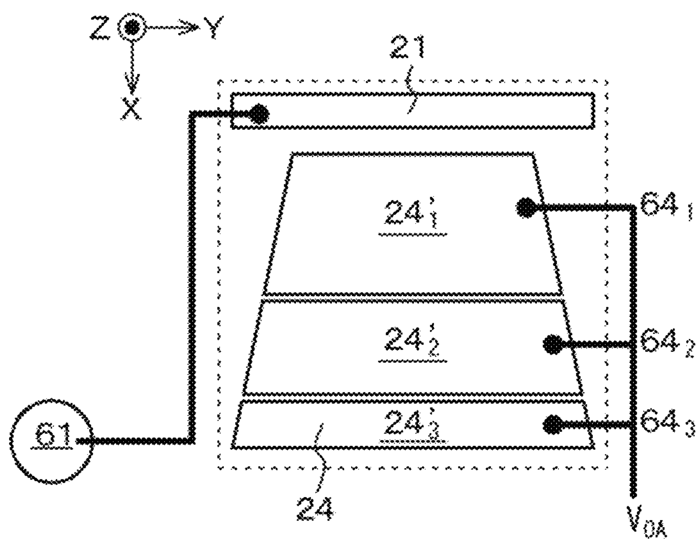
Figure 84A:
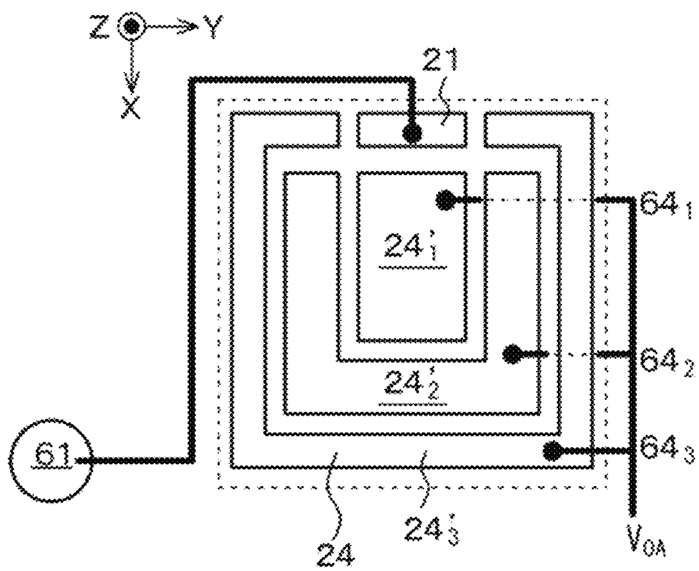
FIGS. 84A and 84B are schematic plan views of a charge accumulation electrode segment in the working example 17.
Figure 84B:
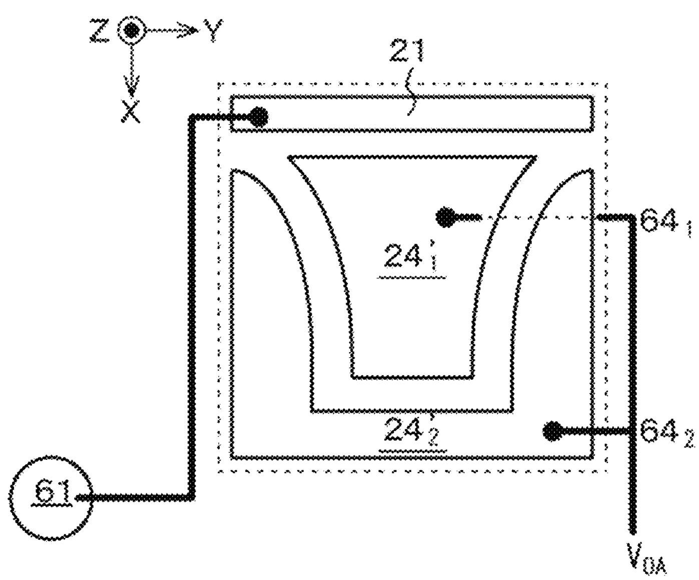

The working example 16 relates to an imaging element of the fourth configuration. A schematic partial sectional view of the stacked-type imaging element of the working example 16 is depicted in FIG. 82. In the stacked-type imaging element of the working example 16, the material configuring the charge accumulation electrode segment is different between adjacent ones of the photoelectric conversion portion segments. Here, the value of the work function of the material configuring the insulating layer segment is gradually increased over from the first photoelectric conversion portion segment 10'$_1$ to the Nth photoelectric conversion portion segment 10'$_N$. In the stacked-type imaging element of the working example 16, a same potential may be applied to all of the N charge accumulation electrode segments or different potentials may be applied individually to the charge accumulation electrode segments. In the latter case, the charge accumulation electrode segments 24'$_1$, 24'$_2$, and 24'$_3$ are connected to the vertical driving circuit 112 configuring the driving circuit through pad portions 64$_1$, 64$_2$, and 64$_3$, respectively.

Working Example 17

Figure 85:
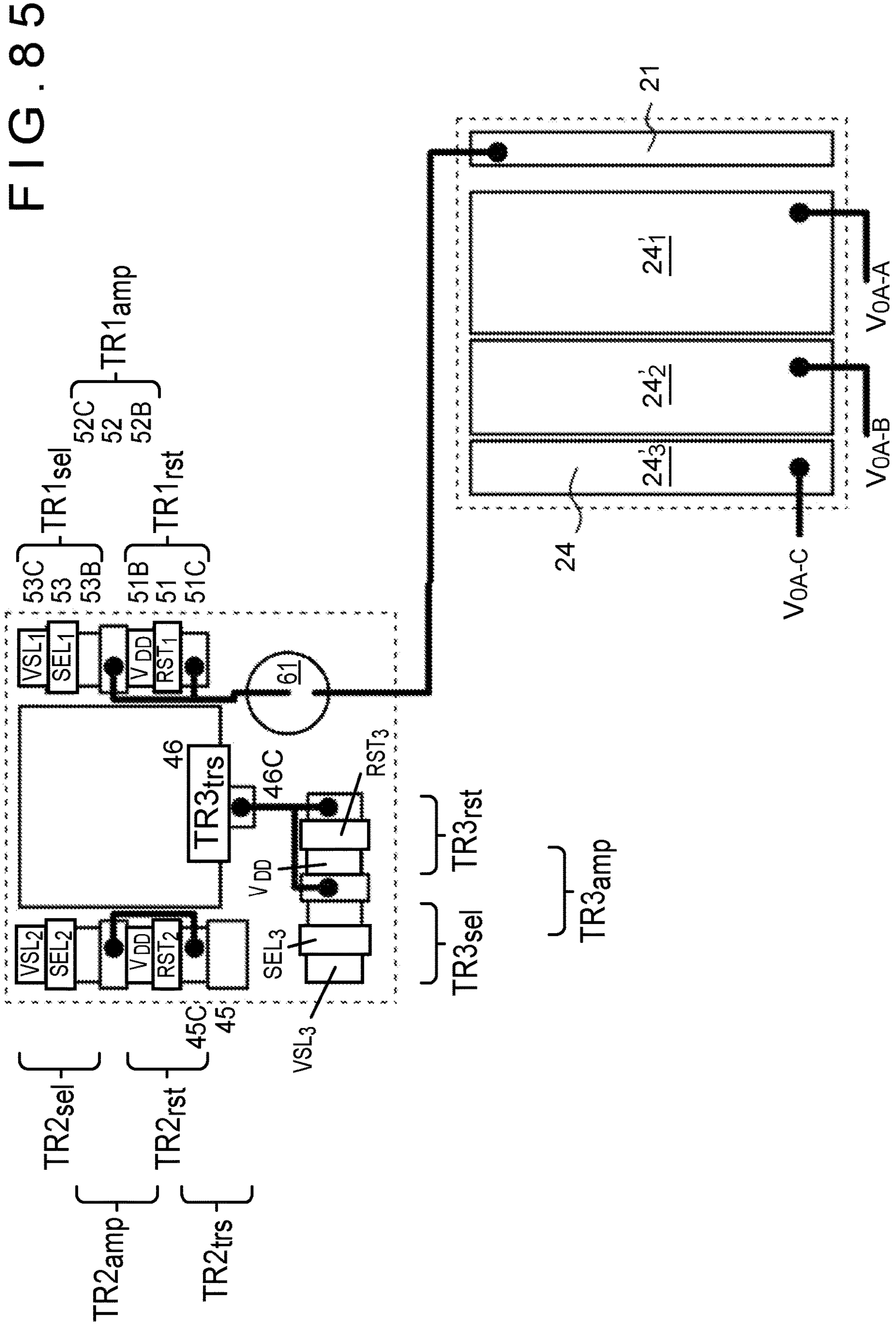
FIG. 85 is a schematic layout diagram of a first electrode and a charge accumulation electrode as well as transistors configuring a control portion, which configure the stacked-type imaging element of the working example 17.

The stacked-type imaging element of the working example 17 relates to an imaging element of the fifth configuration. Schematic plan views of the charge accumulation electrode segments in the working example 17 are depicted in FIGS. 83A, 83B, 84A, and 84B, and a schematic layout diagram of a first electrode and a charge accumulation electrode that configure a photoelectric conversion portion including a charge accumulation electrode of the stacked-type imaging element of the working example 17 and transistors configuring a control portion is depicted in FIG. 85. A schematic partial sectional view of the stacked-type imaging element of the working example 17 is similar to that depicted in FIG. 82 or 87. In the stacked-type imaging element of the working example 17, the area of the charge accumulation electrode segment is gradually degreased over from the first photoelectric conversion portion segment 10'$_1$ to the Nth photoelectric conversion portion segment 10'$_N$. In the stacked-type imaging element of the working example 17, a same potential may be applied to all of the N charge accumulation electrode segments or different potentials may be applied individually to the charge accumulation electrode segments. In particular, it is sufficient if the charge accumulation electrode segments 24'$_1$, 24'$_2$, and 24'3 disposed in a spaced relation from each other are connected to the vertical driving circuit 112 configuring the driving circuit through pad portions 64$_1$, 64$_2$, and 64$_3$, respectively, similarly as in the description of the working example 16.

In the working example 17, the charge accumulation electrode 24 includes a plurality of charge accumulation electrode segments 24'$_1$, 24'$_2$, and 24'$_3$. It is sufficient if the number of charge accumulation electrode segments is equal to or greater than 2, and in the working example 17, the number of charge accumulation electrode segments is "3." Further, since, in the stacked-type imaging element of the working example 17, the potential of the first electrode 21 is higher than the potential of the second electrode 22, namely, for example, since a positive potential is applied to the first electrode 21 and a negative potential is applied to the second electrode 22, the potential applied to the charge accumulation electrode segment 24'$_1$ positioned nearest to the first electrode 21 in the charge transfer period is higher than the potential applied to the charge accumulation electrode segment 24'$_3$ positioned most remotely from the first electrode 21. By providing a potential gradient to the charge accumulation electrode 24 in this manner, electrons staying in the region of the photoelectric conversion layer 23 opposing to the charge accumulation electrode 24 are read out with higher certainty to the first electrode 21 and further to the first floating diffusion layer $FD_1$. In other words, charge accumulated in the photoelectric conversion layer 23 is read out to the control portion.

Then, by establishing the condition of the potential of the charge accumulation electrode segment $24'_3$<potential of the charge accumulation electrode segment $24'_2$<potential of the charge accumulation electrode segment $24'_1$ in a charge transfer period, electrons staying in the region of the photoelectric conversion layer 23 can be read out all at once to the first floating diffusion layer $FD_1$. Alternatively, by changing the potential of the charge accumulation electrode segment $24'_3$, the potential of the charge accumulation electrode segment $24'_2$ and the potential of the charge accumulation electrode segment $24'_1$ gradually during a charge transfer period (namely, by changing the potentials stepwise or like a slope), it is possible to move electrons staying in the region of the photoelectric conversion layer 23 opposing to the charge accumulation electrode segment $24'_3$ to the region of the photoelectric conversion layer 23 opposing to the charge accumulation electrode segment $24'_2$, then move electrons staying in the region of the photoelectric conversion layer 23 opposing to the charge accumulation electrode segment $24'_2$ to the region of the photoelectric conversion layer 23 opposing to the charge accumulation electrode segment $24'_1$ and then read out electrons staying in the region of the photoelectric conversion layer 23 opposing to the charge accumulation electrode segment $24'_1$ to the first floating diffusion layer $FD_1$ with certainty.

Figure 86:
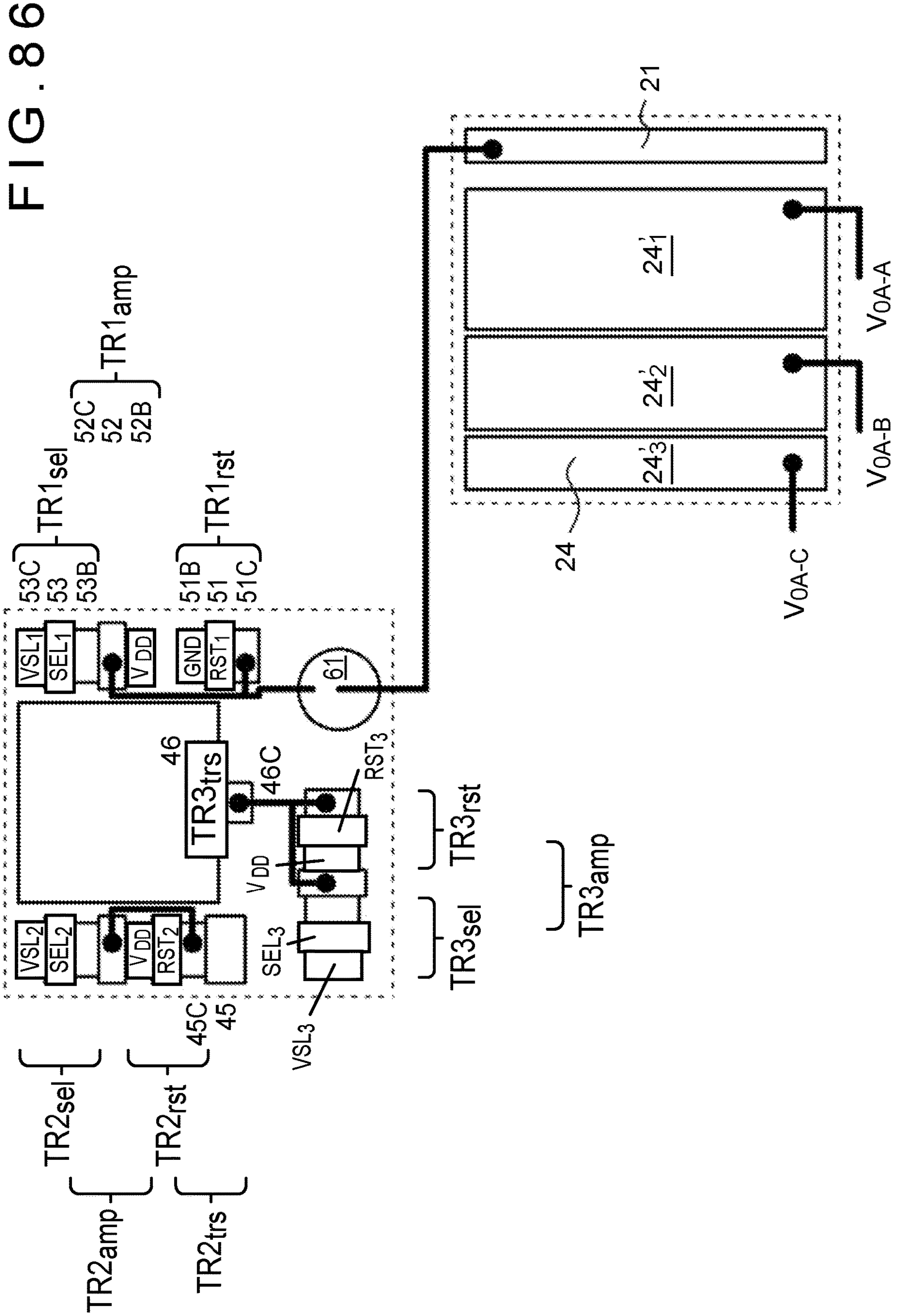
FIG. 86 is a schematic layout diagram of the first electrode and the charge accumulation electrode that configure a modification of the stacked-type imaging element of the working example 17.

As depicted in FIG. 86 that is a schematic layout diagram of the first electrode and the charge accumulation electrode as well as transistors configuring the control portion, which configure a modification of the stacked-type imaging element of the working example 17, the other 51B of the source/drain regions of the reset transistor $TR3_{rst}$ may be grounded in place of being connected to the power supply $V_{DD}$.

Also in the stacked-type imaging element of the working example 17, by adopting such a configuration as described above, a kind of charge transfer gradient is formed. In particular, since the area of the charge accumulation electrode segment gradually decreases over from the first photoelectric conversion portion segment $10'_1$ to the Nth photoelectric conversion portion segment $10'_N$, if such a state as $V_{12} \geq V_{11}$ is entered during a charge accumulation period, then the nth photoelectric conversion portion segment can accumulate a greater amount of charge than the (n+1)th photoelectric conversion portion segment. Then, if such a state as $V_{22}<V_{21}$ is entered during a charge transfer period, then a flow of charge from the first photoelectric conversion portion segment to the first electrode and a flow of charge from the (n+1)th photoelectric conversion portion segment to the nth photoelectric conversion portion segment can be assured with certainty.

Working Example 18

Figure 87:
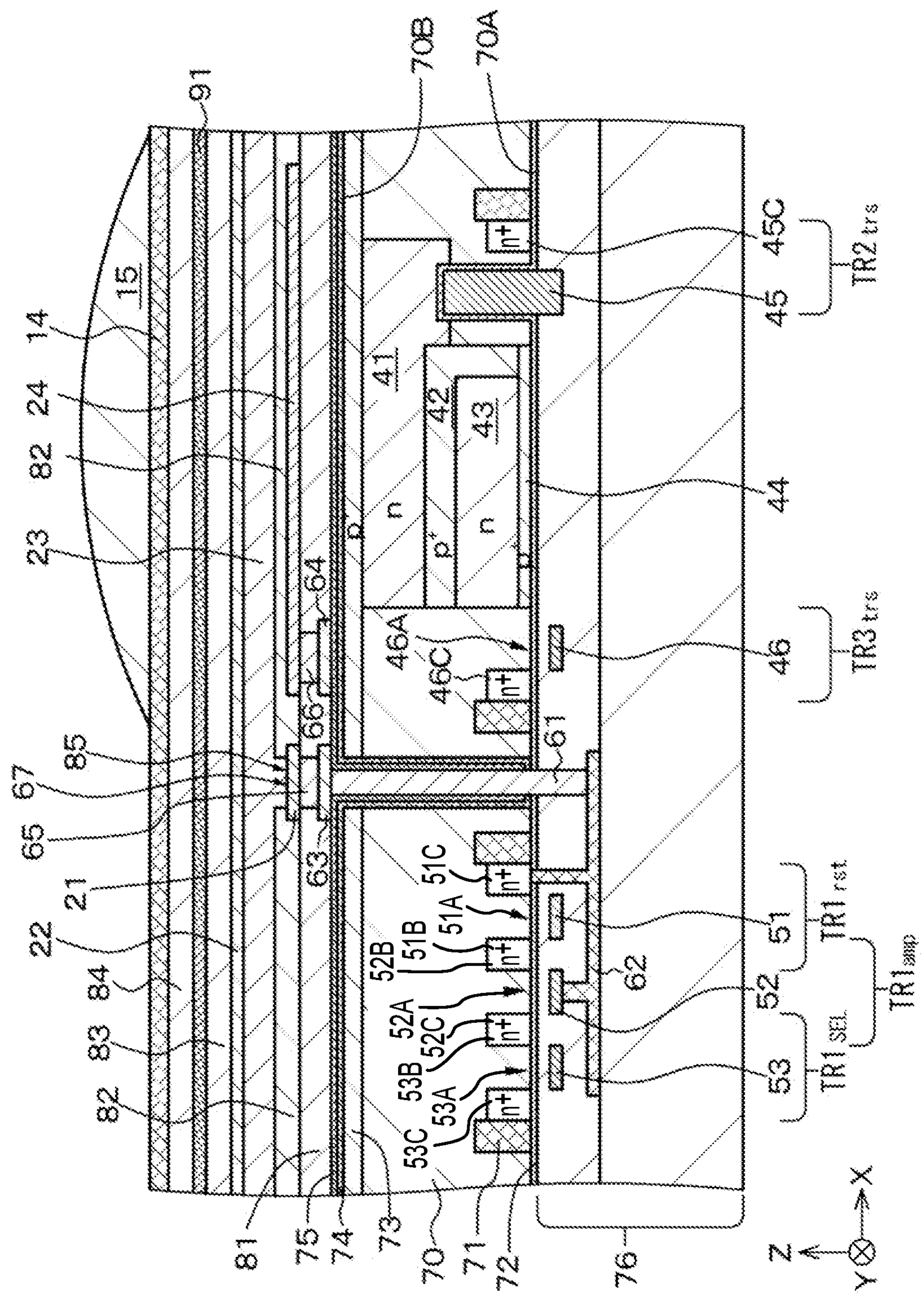
FIG. 87 is a schematic partial sectional view of stacked-type imaging elements of working examples 18 and 17.
Figure 88A:
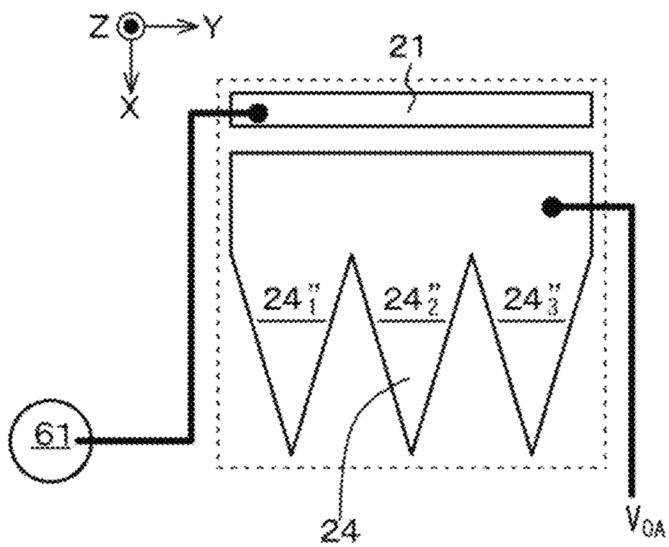
FIGS. 88A and 88B are schematic plan views of a charge accumulation electrode segment in the working example 18.
Figure 88B:
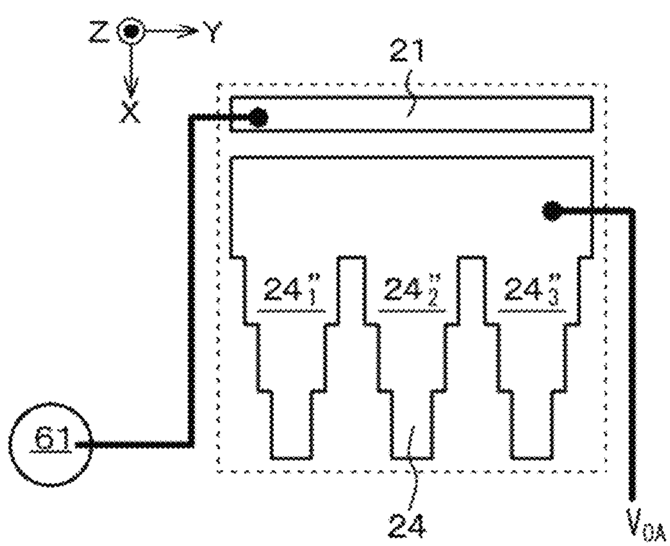

The working example 18 relates to an imaging element of the sixth configuration. A schematic partial sectional view of the stacked-type imaging element of the working example 18 is depicted in FIG. 87. Further, schematic plan views of the charge accumulation electrode segments in the working example 18 are depicted in FIGS. 88A and 88B. The stacked-type imaging element of the working example 18 includes a photoelectric conversion portion in which a first electrode 21, a photoelectric conversion layer 23 and a second electrode 22 are stacked, and the photoelectric conversion portion further includes charge accumulation electrodes 24 (24"$_1$, 24"$_2$, and 24"$_3$) disposed in a spaced relation from the first electrode 21 and besides disposed in an opposing relation with the photoelectric conversion layer 23 with an insulating layer 82 interposed therebetween. Further, where the stacking direction of the charge accumulation electrodes 24 (24"$_1$, 24"$_2$, and 24"$_3$), insulating layer 82 and photoelectric conversion layer 23 is a Z direction and the direction away from the first electrode 21 is an X direction, the cross sectional area of a stacked portion at which the charge accumulation electrodes 24 (24"$_1$, 24"$_2$, and 24"$_3$), insulating layer 82 and photoelectric conversion layer 23 are stacked when the stacked portion is cut along a YZ virtual plane changes depending upon the distance from the first electrode 21.

In particular, in the stacked-type imaging element of the working example 18, the thickness of the cross section of the stacked portion is fixed, and the width of the cross section of the stacked portion decreases as the distance from the first electrode 21 increases. It is to be noted that the width may become narrower continuously (refer to FIG. 88A) or may become narrower stepwise (refer to FIG. 88B).

In this manner, since, in the stacked-type imaging element of the working example 18, the cross sectional area of the stacked portion at which the charge accumulation electrodes 24 (24"$_1$, 24"$_2$, and 24"$_3$), insulating layer 82 and photoelectric conversion layer 23 are stacked when the stacked portion is cut along a YZ virtual plane changes depending upon the distance from the first electrode, a kind of charge transfer gradient is formed, and charge generated by photoelectric conversion can be transferred more readily and with more certainty.

Working Example 19

The working example 19 relates to a solid-state imaging device of the first and second configurations.

The solid-state imaging device of the working example 19 includes a photoelectric conversion portion in which a first electrode 21, a photoelectric conversion layer 23 and a second electrode 22 are stacked, the photoelectric conversion portion includes a plurality of stacked-type imaging elements having a charge accumulation electrode 24 disposed in a spaced relation from the first electrode 21 and besides disposed in an opposing relation to the photoelectric conversion layer 23 with an insulating layer 82 interposed therebetween, an imaging element block includes the plurality of stacked-type imaging elements, and the first electrode 21 is shared by the plurality of stacked-type imaging elements configuring the imaging element block.

Alternatively, the solid-state imaging device of the working example 19 includes a plurality of stacked-type imaging elements described hereinabove in connection with the working examples 7 to 18.

In the working example 19, one floating diffusion layer is provided for a plurality of stacked-type imaging elements. Thus, by appropriately controlling the timing of a charge transfer period, the plurality of stacked-type imaging elements can share the single floating diffusion layer. In this case, it is possible for the plurality of stacked-type imaging elements to share one contact hole portion.

It is to be noted that, except that the first electrode 21 is shared by a plurality of stacked-type imaging elements configuring an imaging element block, the solid-state imaging device of the working example 19 is configured and structured substantially similarly to the solid state imaging devices described hereinabove in connection with the working examples 7 to 18.

Figure 89:
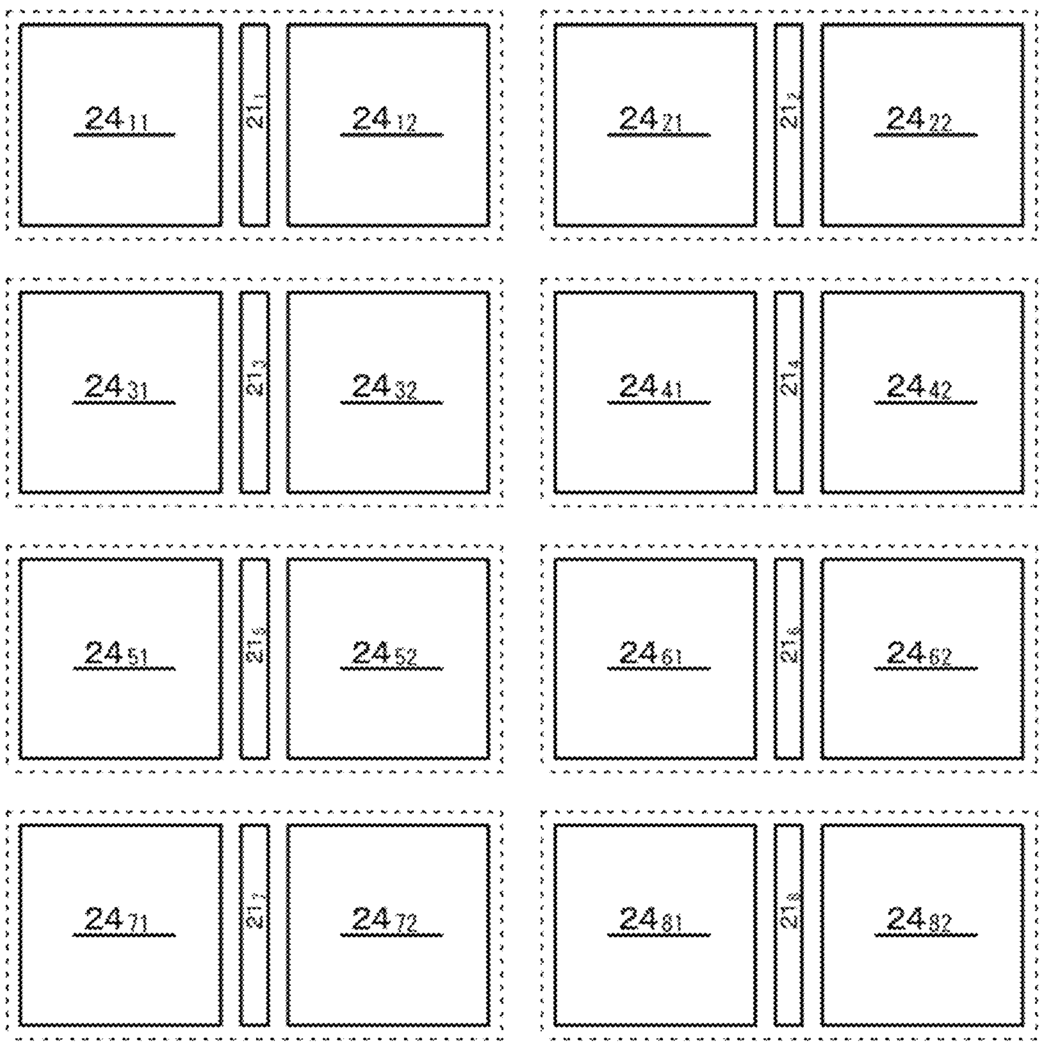
FIG. 89 is a schematic plan view of the first electrode and the charge accumulation electrode segment in a solid-state imaging device of a working example 19.
Figure 90:
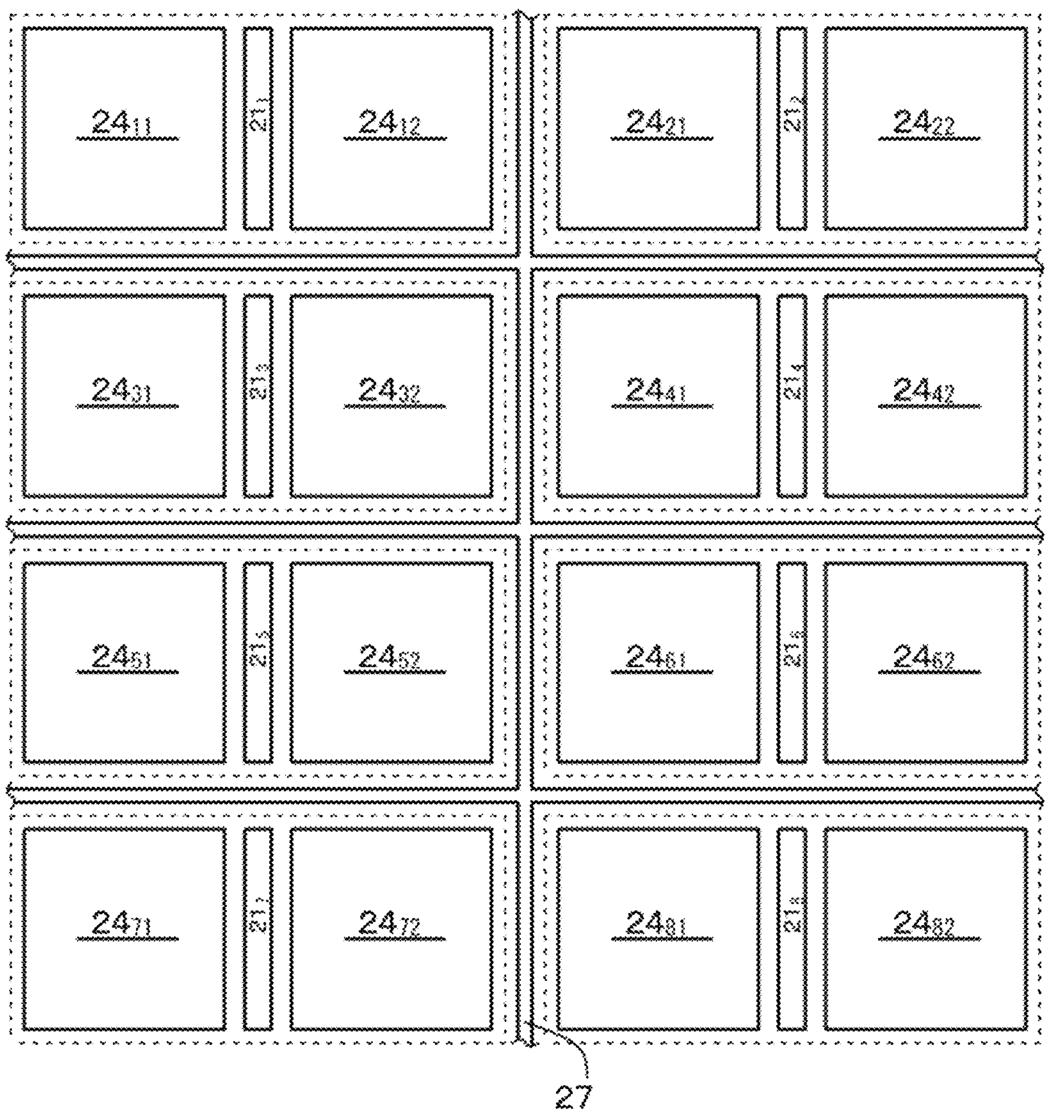
FIG. 90 is a schematic plan view of the first electrode and the charge accumulation electrode segment in a first modification of the solid-state imaging device of the working example 19.
Figure 91:
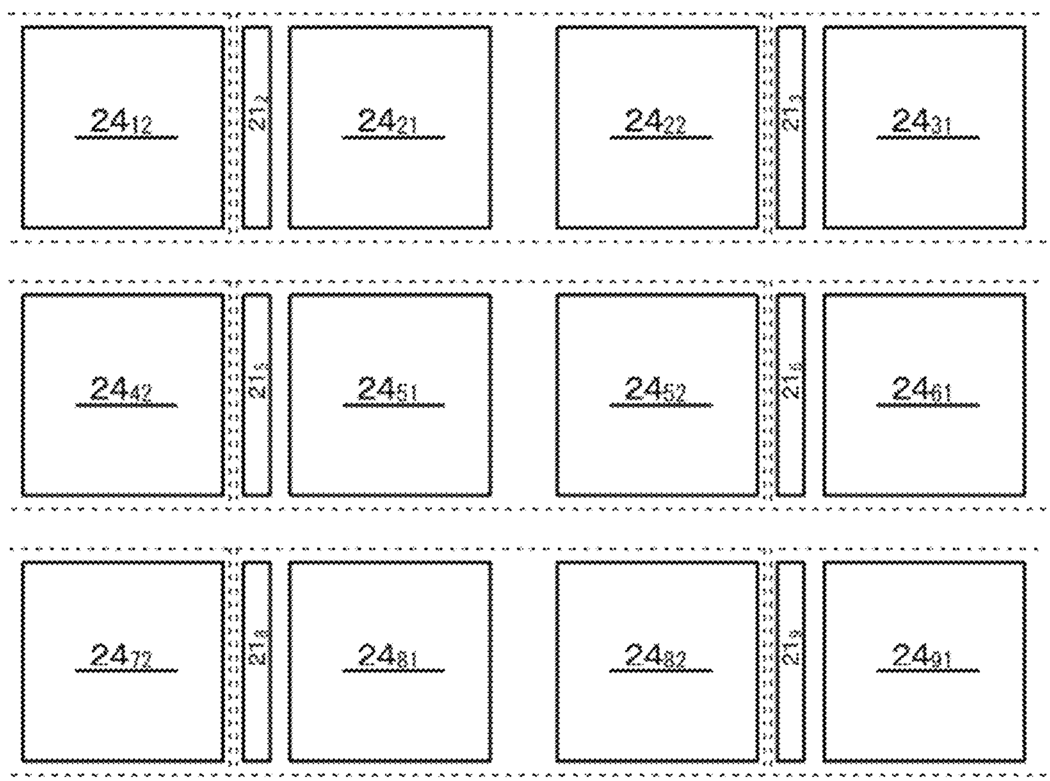
FIG. 91 is a schematic plan view of the first electrode and the charge accumulation electrode segment in a second modification of the solid-state imaging device of the working example 19.
Figure 92:
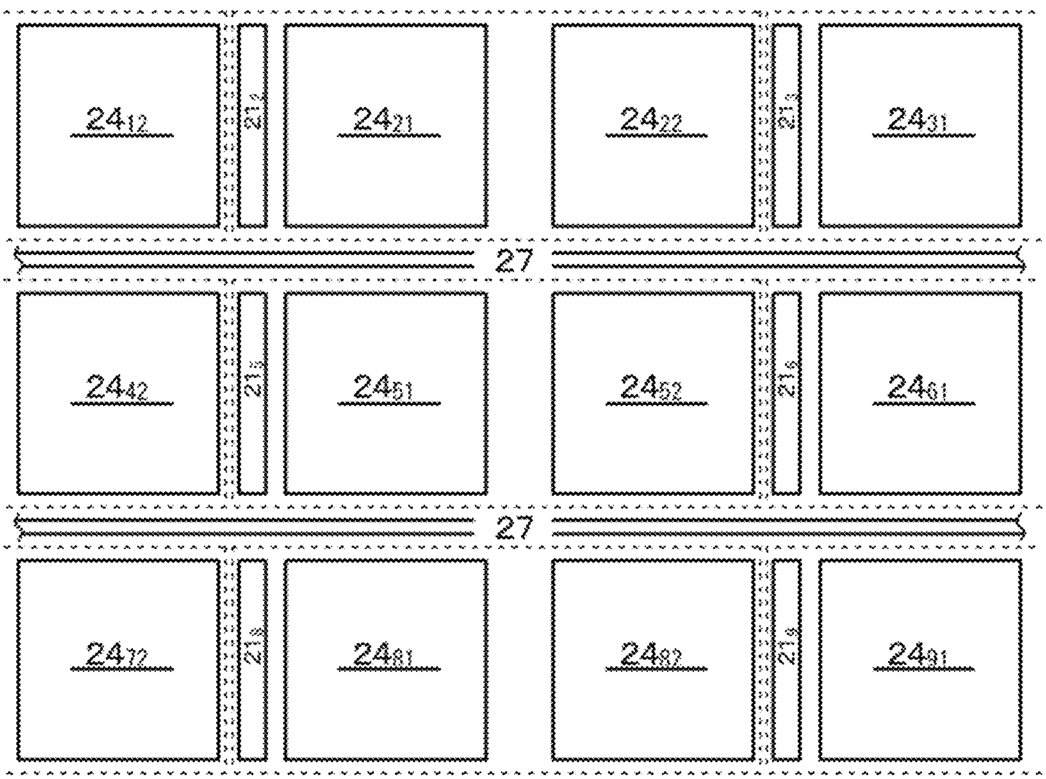
FIG. 92 is a schematic plan view of the first electrode and the charge accumulation electrode segment in a third modification of the solid-state imaging device of the working example 19.
Figure 93:
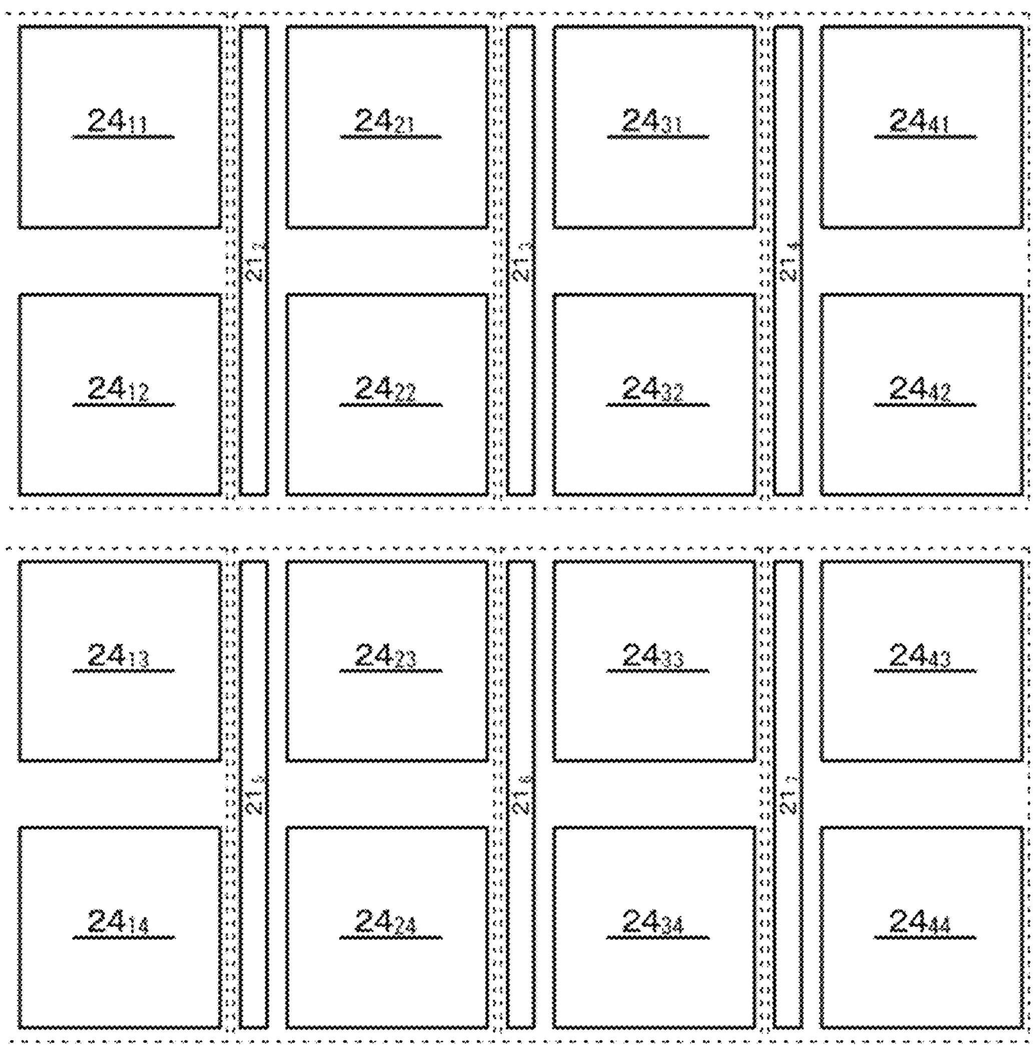
FIG. 93 is a schematic plan view of the first electrode and the charge accumulation electrode segment in a fourth modification of the solid-state imaging device of the working example 19.
Figure 94:
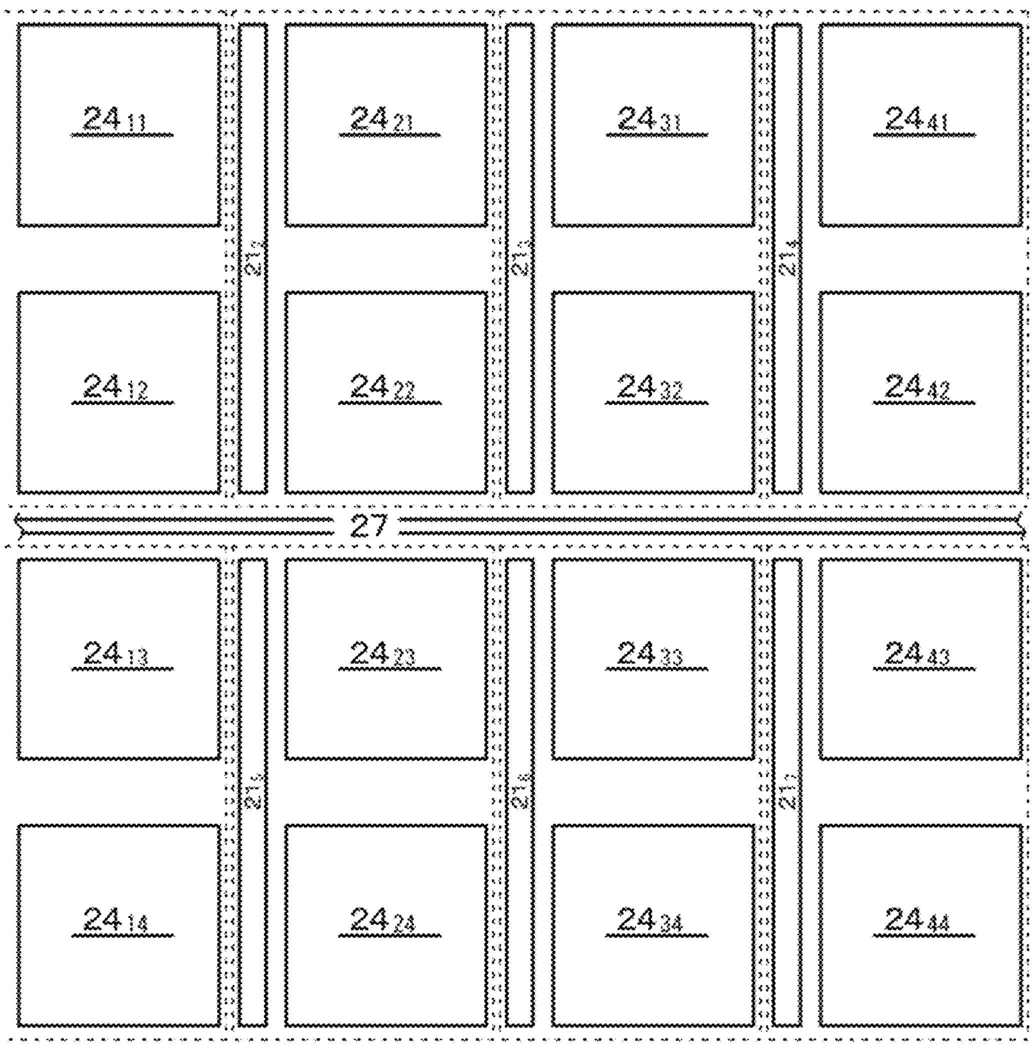
FIG. 94 is a schematic plan view of the first electrode and the charge accumulation electrode segment in a fifth modification of the solid-state imaging device of the working example 19.

A disposition state of the first electrode 21 and the charge accumulation electrode 24 in the solid-state imaging device of the working example 19 is schematically depicted in FIG. 89 (working example 19), FIG. 90 (a first modification of the working example 19), FIG. 91 (a second modification of the working example 19), FIG. 92 (a third modification of the working example 19), and FIG. 93 (a fourth modification of the working example 19). FIGS. 89, 90, 93, and 94 depict 16 stacked-type imaging elements, and FIGS. 91 and 92 depict 12 stacked-type imaging elements. Further, an imaging element block includes two stacked-type imaging elements. An imaging element block is depicted by being surrounded by a dotted line. A subscript added to the first electrode 21 and the charge accumulation electrode 24 is for distinguishing the first electrodes 21 and the charge accumulation electrodes 24. This similarly applies also to the description given hereinbelow. Further, one on-chip microlens (not depicted in FIGS. 89 to 98) is disposed above one stacked-type imaging element. Further, in one imaging element block, two charge accumulation electrodes 24 are disposed across the first electrode 21 (refer to FIGS. 89 and 90). As an alternative, one first electrode 21 is disposed in an opposing relation to two juxtaposed charge accumulation electrodes 24 (refer to FIGS. 93 and 94). In particular, the first electrode is disposed adjacent the charge accumulation electrode of the stacked-type imaging elements. As another alternative, the first electrode is disposed adjacent the charge accumulation period of some of a plurality of stacked-type imaging elements but is not disposed adjacent the remaining charge accumulation electrodes from among the plurality of stacked-type imaging elements (refer to FIGS. 91 and 92). In this case, movement of charge from the remaining ones of the plurality of stacked-type imaging elements to the first electrode is performed via the some of the plurality of stacked-type imaging elements. The distance A between the charge accumulation electrodes configuring a stacked-type imaging element and the charge accumulation electrodes configuring another stacked-type imaging element preferably is greater than the distance B between the first electrode and the charge accumulation electrode in the stacked-type imaging elements adjacent the first electrode in order to make movement of charge from the stacked-type imaging elements to the first electrode sure. Further, the stacked-type imaging element positioned more remotely from the first electrode preferably has a higher value of the distance A. Further, in the examples depicted in FIGS. 90, 92, and 94, a charge movement controlling electrode 27 is disposed between a plurality of stacked-type imaging elements configuring an imaging element block. By disposing the charge movement controlling electrode 27, movement of charge in the imaging element blocks positioned across the charge movement controlling electrode 27 can be suppressed with certainty. It is to be noted that it is sufficient if, where the potential applied to the charge movement controlling electrode 27 is $V_{17}$, a condition of $V_{12}>V_{17}$ (for example, $V_{12\text{-}2}>V_{17}$) is satisfied.

The charge movement controlling electrode 27 may be formed in level with the first electrode 21 or the charge accumulation electrode 24 on the first electrode 21 side or may be formed in a different level (in particular, a level lower than that of the first electrode 21 or the charge accumulation electrode 24). In the former case, since the distance between the charge movement controlling electrode 27 and the photoelectric conversion layer can be made short, control of the potential is facilitated. On the other hand, in the latter case, since the distance between the charge movement controlling electrode 27 and the charge accumulation electrode 24 can be made short, this is advantageous for refinement.

In the following, operation of an imaging element block including a first electrode $\mathbf{21}_2$ and two two charge accumulation electrodes $\mathbf{24}_{21}$ and $\mathbf{24}_{22}$.

Within a charge accumulation period, from the driving circuit, a potential $V_a$ is applied to the first electrode $\mathbf{21}_2$, and a potential $V_A$ is applied to the charge accumulation electrodes $\mathbf{24}_{21}$ and $\mathbf{24}_{22}$. Photoelectric conversion is caused in the photoelectric conversion layer 23 by light incident to the photoelectric conversion layer 23. Holes generated by the photoelectric conversion are sent out from the second electrode 22 to the driving circuit through the wiring $V_{OU}$. On the other hand, since the potential of the first electrode $\mathbf{21}_2$ is higher than the potential of the second electrode 22, in particular, for example, since a positive potential is applied to the first electrode $\mathbf{21}_2$ and a negative potential is applied to the second electrode 22, $V_A \geq V_a$, preferably $V_A>V_a$. Consequently, electrons generated by the photoelectric conversion are attracted to the charge accumulation electrodes $\mathbf{24}_{21}$ and $\mathbf{24}_{22}$ and stay in the regions of the photoelectric conversion layer 23 opposing to the charge accumulation electrodes $\mathbf{24}_{21}$ and $\mathbf{24}_{22}$. In other words, charge is accumulated into the photoelectric conversion layer 23. Since $V_A \geq V_a$, electrons generated in the inside of the photoelectric conversion layer 23 do not move toward the first electrode $\mathbf{21}_2$. As time of the photoelectric conversion elapses, the potential in the regions of the photoelectric conversion layer 23 opposing to the charge accumulation electrodes $\mathbf{24}_{21}$ and $\mathbf{24}_{22}$ increases to the negative side.

In the later stage of the charge accumulation period, reset operation is performed. By this operation, the potential at the first floating diffusion layer is reset, and the potential at the first floating diffusion layer becomes the potential $V_{DD}$ of the power supply.

After completion of the reset operation, reading out of charge is performed. In particular, during a charge transfer period, from the driving circuit, a potential $V_b$ is applied to the first electrode $\mathbf{21}_2$ and a potential $V_{21\text{-}B}$ is applied to the charge accumulation electrode $\mathbf{24}_{21}$ while a potential $V_{22\text{-}B}$ is applied to the charge accumulation electrode $\mathbf{24}_{22}$. Here, $V_{21\text{-}B}<V_b<V_{22\text{-}B}$. Consequently, electrons staying in the region of the photoelectric conversion layer 23 opposing to the charge accumulation electrode $\mathbf{24}_{21}$ are read out to the first electrode $\mathbf{21}_2$ and further to the first floating diffusion layer. In other words, charge accumulated in the region of the photoelectric conversion layer 23 opposing to the charge accumulation electrode $\mathbf{24}_{21}$ is read out to the control portion. After the reading out is completed, $V_{22\text{-}B}$ $V_{21\text{-}B}<V_b$ is entered. It is to be noted that, in the examples depicted in FIGS. 93 and 94, $V_{22\text{-}B}<V_b<V_{21\text{-}B}$ may be established. By this, electrons staying in the region of the photoelectric conversion layer 23 opposing to the charge accumulation electrode $\mathbf{24}_{22}$ are read out to the first electrode $\mathbf{21}_2$ and further into the first floating diffusion layer. Further, in the examples depicted in FIGS. 91 and 92, electrons staying in the region of the photoelectric conversion layer 23 opposing to the charge accumulation electrode $\mathbf{24}_{22}$ may be read out into the first floating diffusion layer via a first electrode $\mathbf{21}_3$ positioned adjacent the charge accumulation electrode $\mathbf{24}_{22}$. In this manner, charge accumulated in the region of the photoelectric conversion layer 23 opposing to the charge accumulation electrode $24_{22}$ is read out to the control portion. It is to be noted that, after reading out of electrons accumulated in the region of the photoelectric conversion layer 23 opposing to the charge accumulation electrode $24_{21}$ to the control portion is completed, the potential of the first floating diffusion layer may be reset.

Figure 99A:
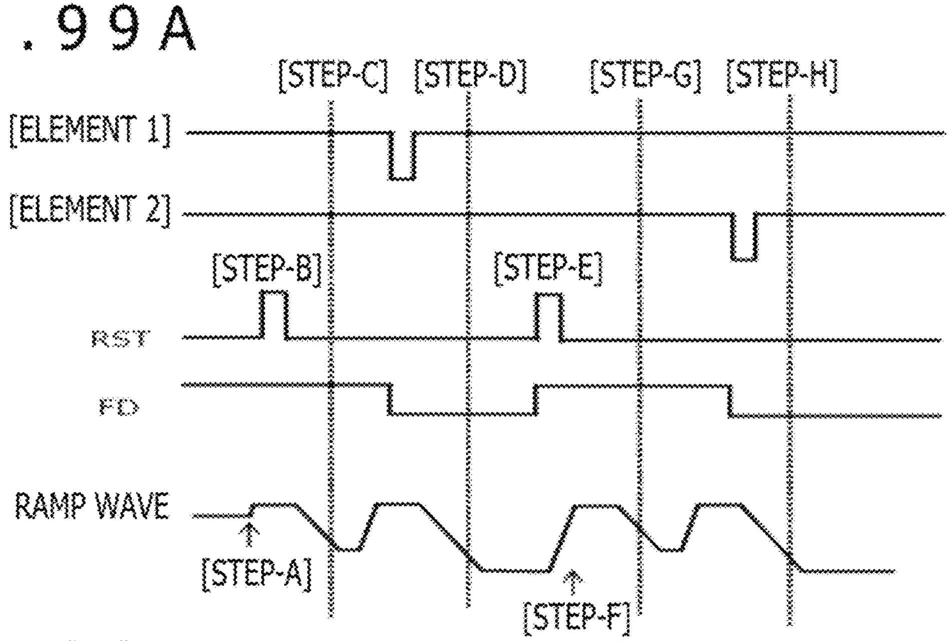
FIGS. 99A, 99B, and 99C are charts depicting reading out drive examples by an imaging element block of the working example 19.

While a reading out driving example in the imaging block of the working example 19 is depicted in FIG. 99A, signals from two stacked-type imaging elements corresponding to the charge accumulation electrode $24_{21}$ and the charge accumulation electrode $24_{22}$ are read out in accordance with a flow of:

[Step-A]

auto-zero signal inputting to a comparator;

[Step-B]

reset operation of one shared floating diffusion layer;

[Step-C]

P phase reading out and movement of charge to the first electrode $21_2$ in the stacked-type imaging element corresponding to the charge accumulation electrode $24_{21}$;

[Step-D]

D phase reading out and movement of charge to the first electrode $21_2$ in the stacked-type imaging element corresponding to the charge accumulation electrode $24_{21}$;

[Step-E]

reset operation of one shared floating diffusion layer;

[Step-F]

auto-zero signal inputting to the comparator;

[Step-G]

P phase reading out and movement of charge to the first electrode $21_2$ in the stacked-type imaging element corresponding to the charge accumulation electrode $24_{22}$; and

[Step-H]

D phase reading out and movement of charge to the first electrode $21_2$ in the stacked-type imaging element corresponding to the charge accumulation electrode $24_{22}$. On the basis of a correlated double sampling (CDS) process, the difference between the P phase reading out at [step-C] and the D phase reading out at [step-D] is a signal from the stacked-type imaging element corresponding to the charge accumulation electrode $24_{21}$, and the difference between the P phase reading out at [step-G] and the D phase reading out at [step-H] is a signal from the stacked-type imaging element corresponding to the charge accumulation electrode $24_{22}$.

Figure 99B:
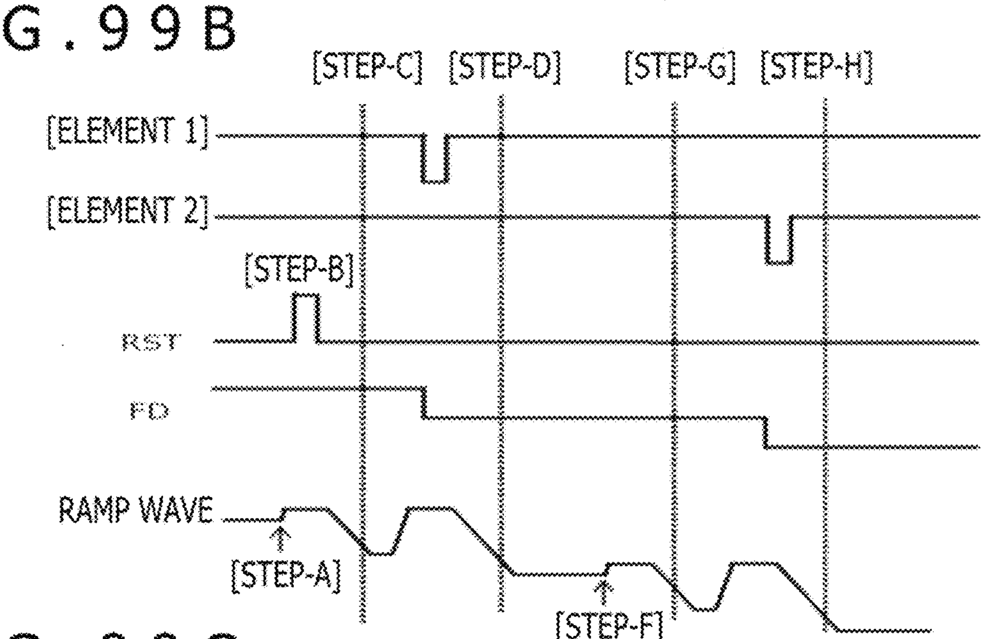
Figure 99C:
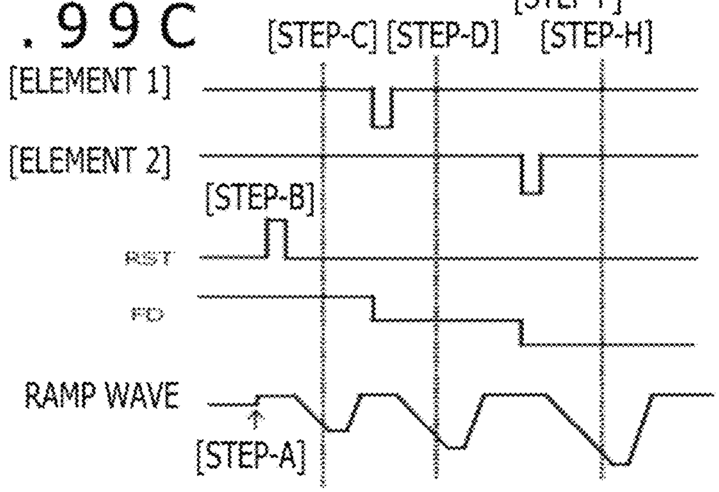
Figure 100:
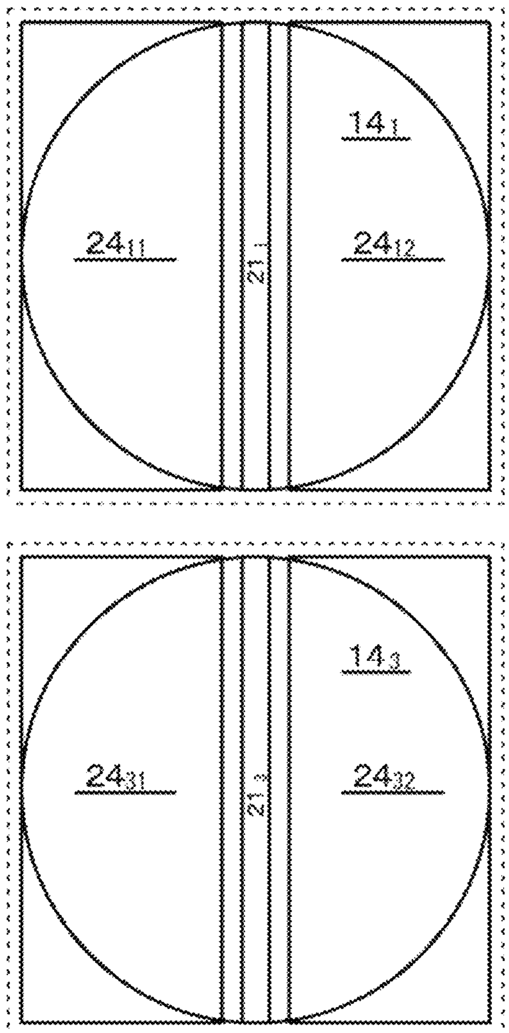
FIG. 100 is a schematic plan view of a first electrode and a charge accumulation electrode segment in a solid-state imaging device of a working example 20.
Figure 101:
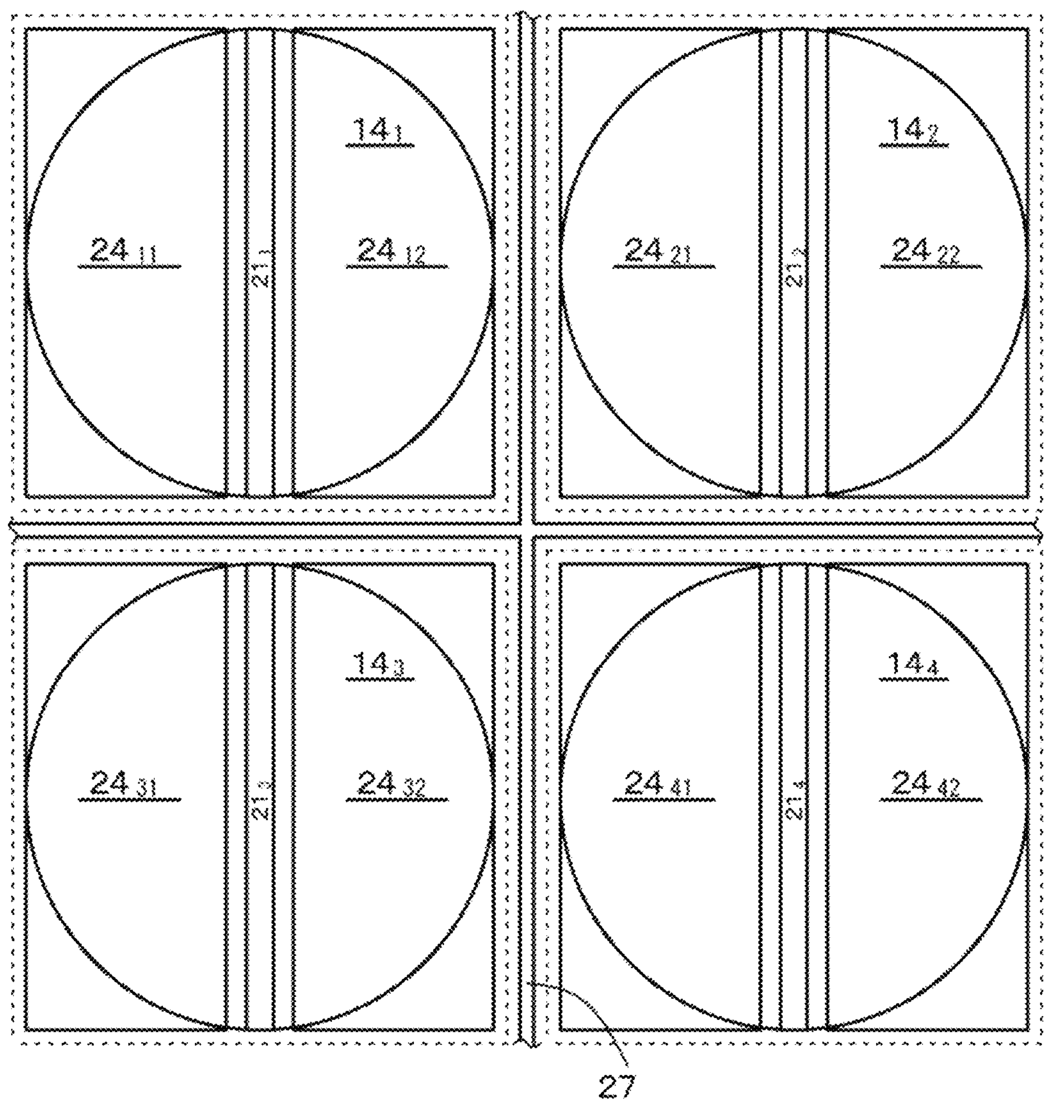
FIG. 101 is a schematic plan view of the first electrode and the charge accumulation electrode segment in a modification of the solid-state imaging device of the working example 20.
Figure 102:
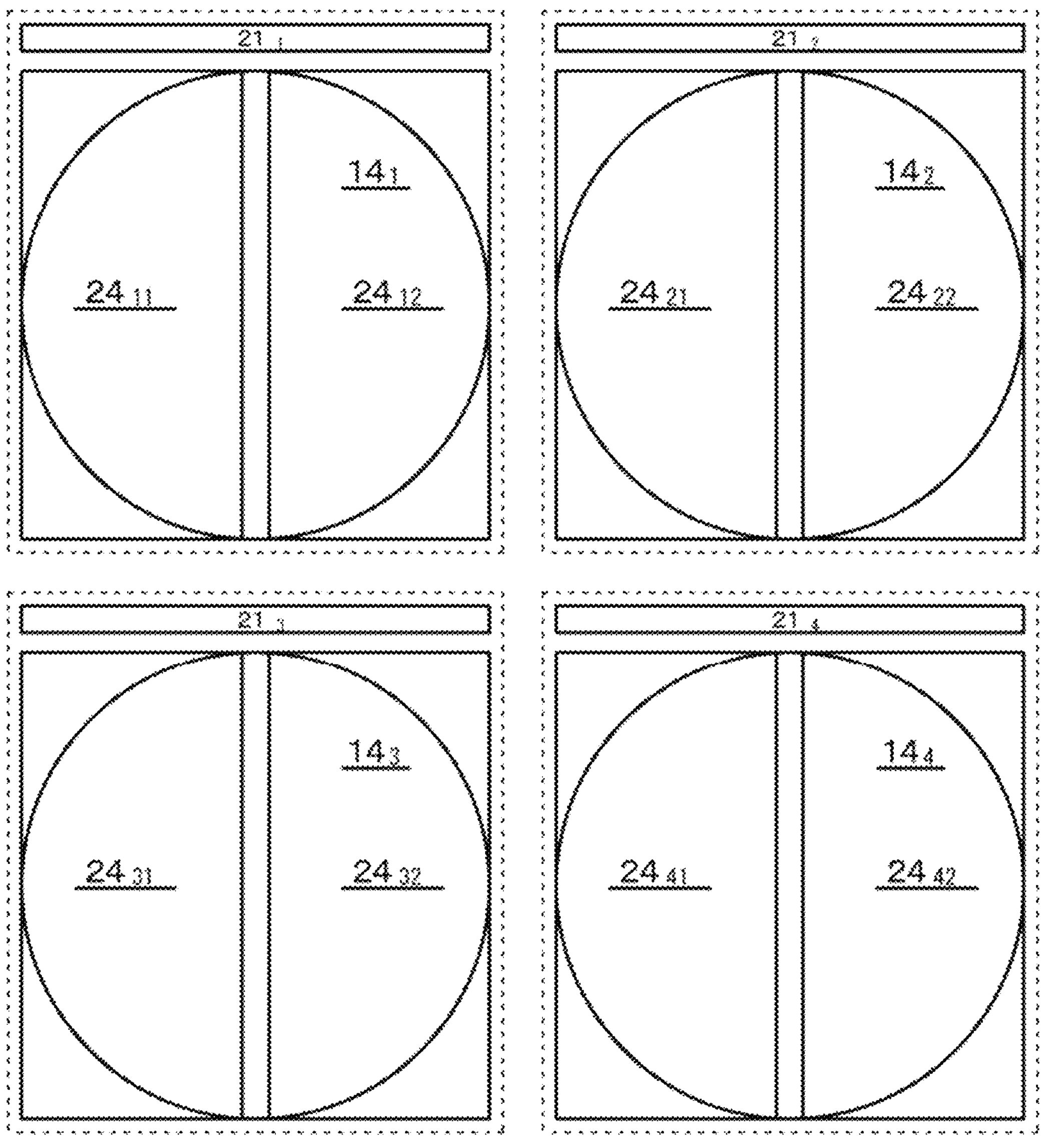
FIG. 102 is a schematic plan view of the first electrode and the charge accumulation electrode segment in a modification of the solid-state imaging device of the working example 20.
Figure 103:
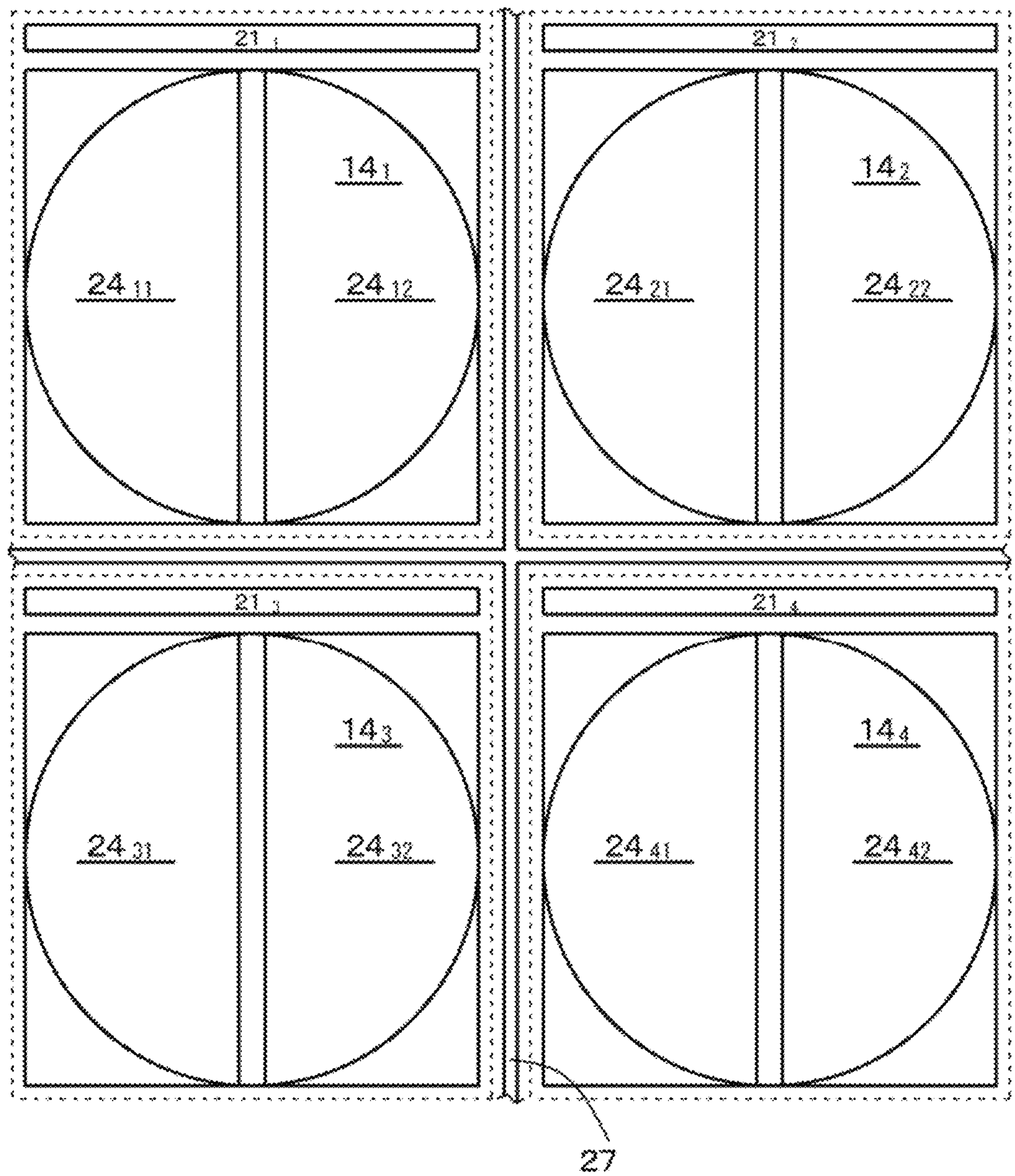
FIG. 103 is a schematic plan view of the first electrode and the charge accumulation electrode segment in a modification of the solid-state imaging device of the working example 20.

It is to be noted that the operation at [step-E] may be omitted (refer to FIG. 99B). Further, the operation at [step-F] may be omitted and, in this case, [step-G] can be omitted (refer to FIG. 99C), and the difference between the P phase reading out at [step-C] and the D phase reading out at [step-D] is a signal from the stacked-type imaging element corresponding to the charge accumulation electrode $24_{21}$ and the difference between the D phase reading out at [step-D] and the D phase reading out at [step-H] is a signal from the stacked-type imaging element corresponding to the charge accumulation electrode $24_{22}$.

Figure 95:
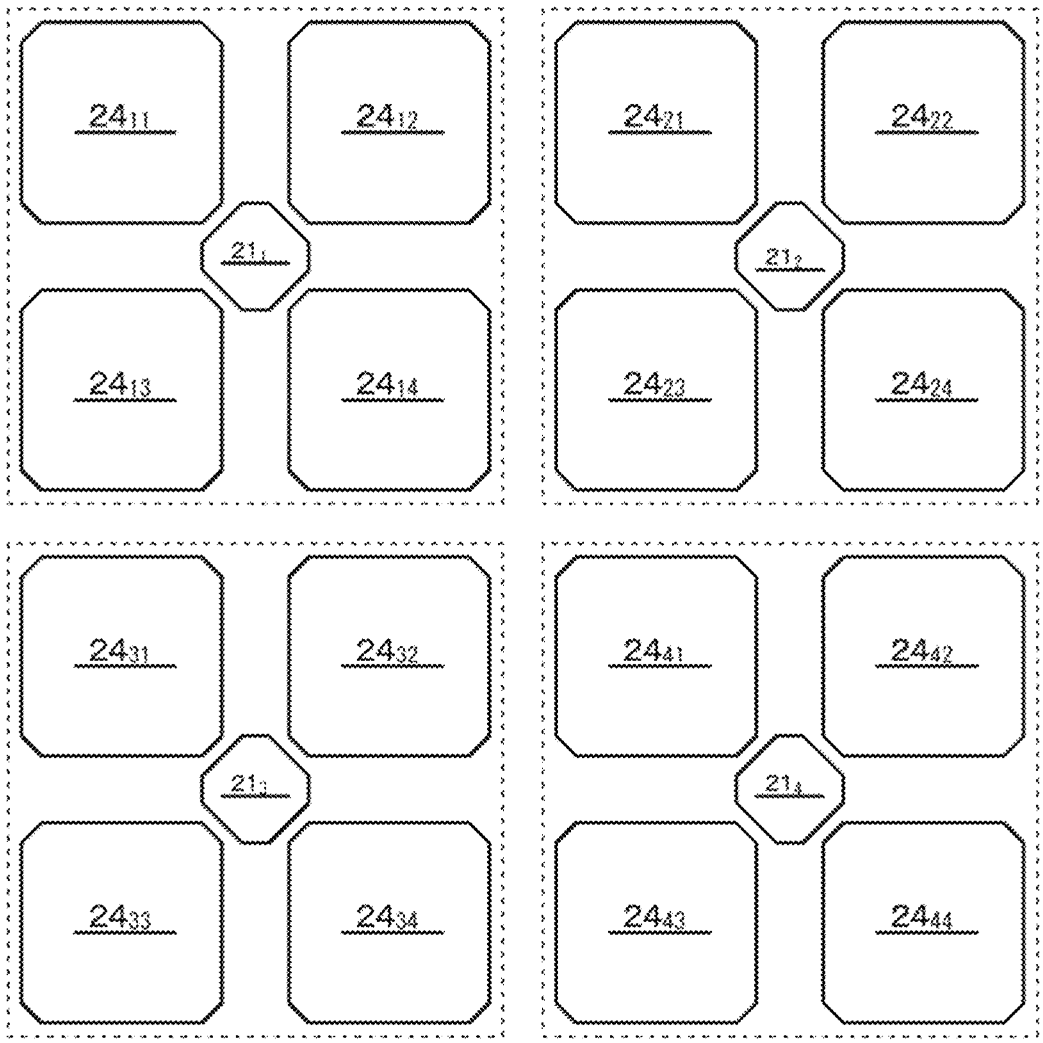
FIG. 95 is a schematic plan view of the first electrode and the charge accumulation electrode segment in a sixth modification of the solid-state imaging device of the working example 19.
Figure 96:
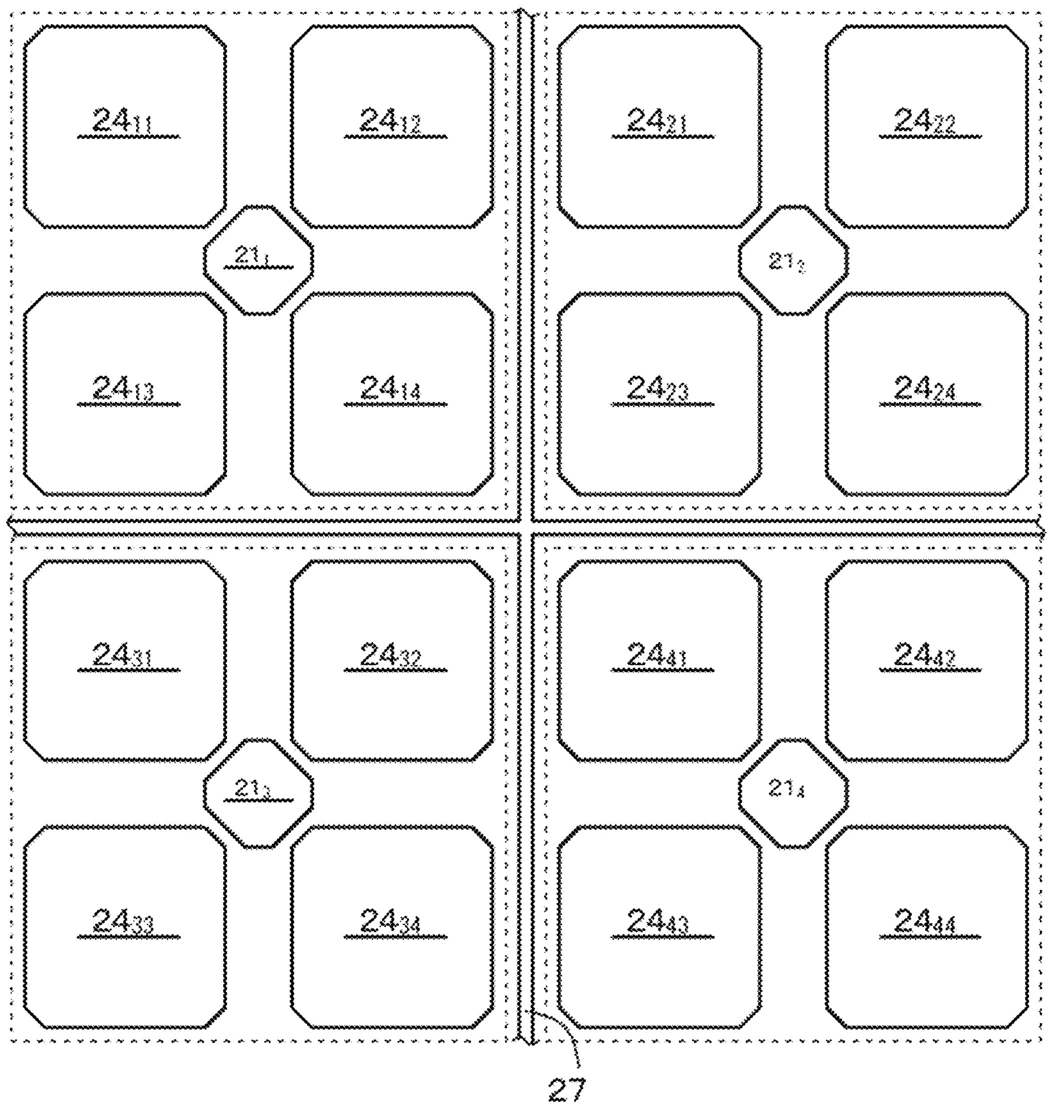
FIG. 96 is a schematic plan view of the first electrode and the charge accumulation electrode segment in a seventh modification of the solid-state imaging device of the working example 19.

In modifications in which the disposition state of the first electrode 21 and the charge accumulation electrode 24 is schematically depicted in FIG. 95 (sixth modification of the working example 19) and FIG. 96 (seventh modification of the working example 19), an imaging element block includes four stacked-type imaging elements. Operation of the solid-state imaging devices can be made substantially similarly to operation of the solid-state imaging devices depicted in FIGS. 89 to 94.

Figure 97:
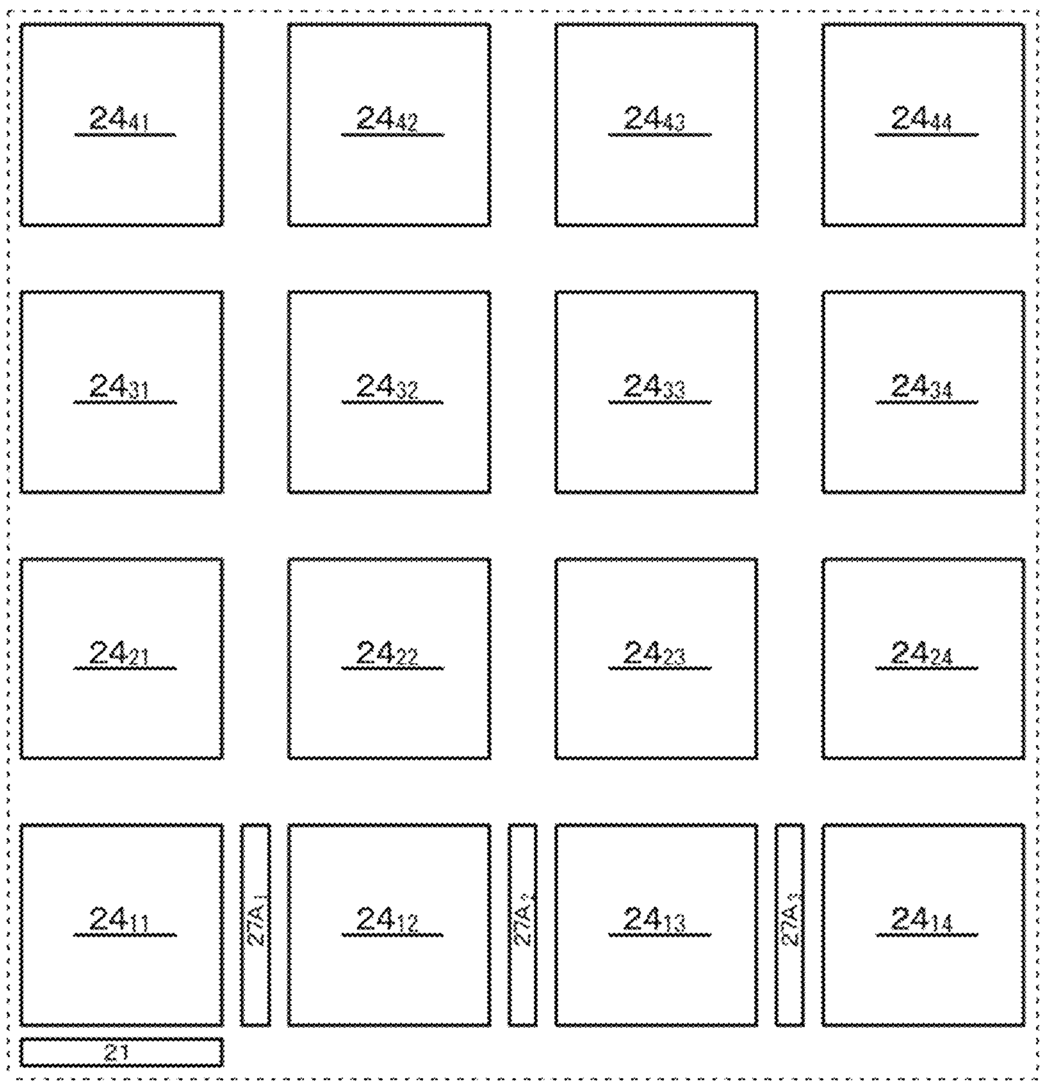
FIG. 97 is a schematic plan view of the first electrode and the charge accumulation electrode segment in an eighth modification of the solid-state imaging device of the working example 19.
Figure 98:
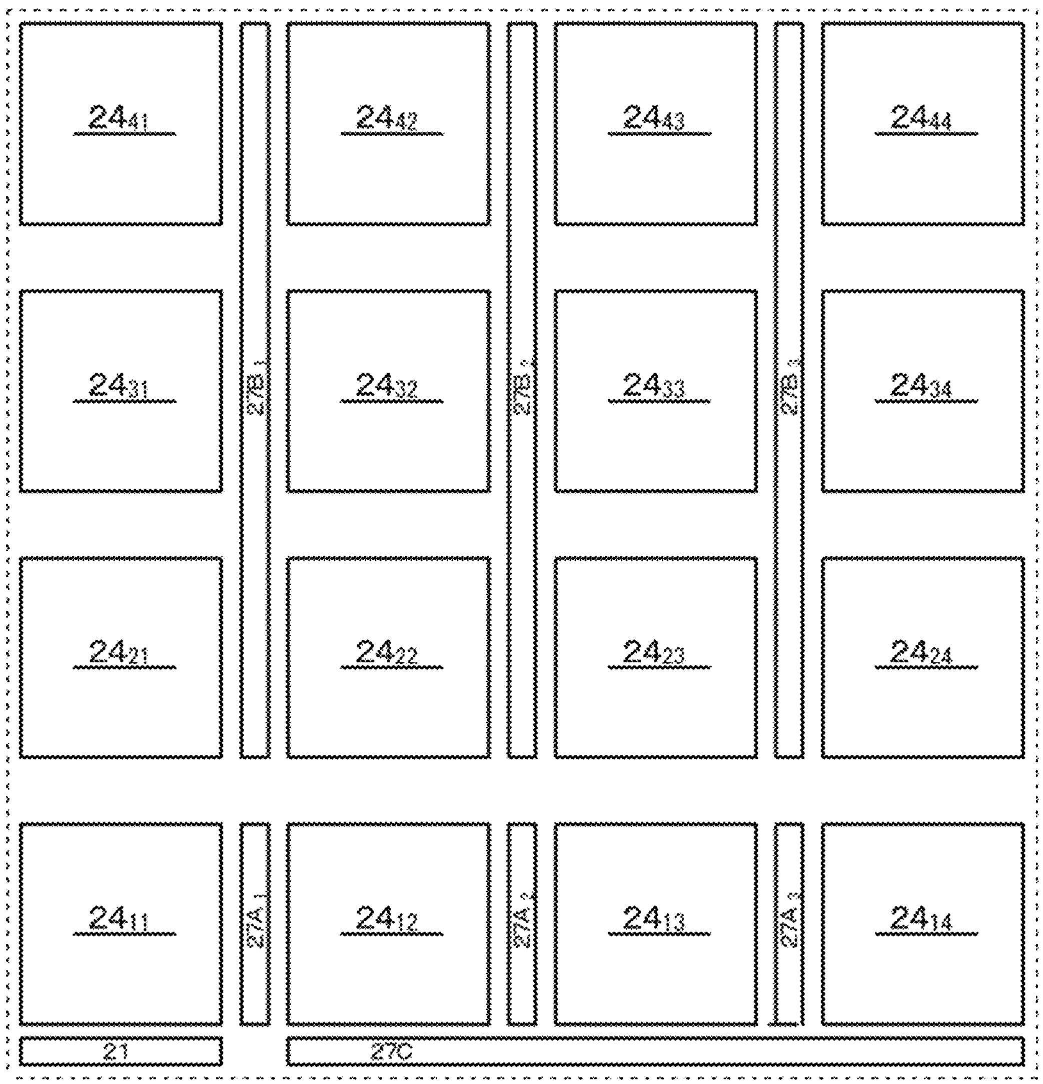
FIG. 98 is a schematic plan view of the first electrode and the charge accumulation electrode segment in a ninth modification of the solid-state imaging device of the working example 19.

In the eighth and ninth modifications whose disposition state of the first electrode 21 and the charge accumulation electrode 24 are schematically depicted in FIGS. 97 and 98, an imaging element block includes 16 stacked-type imaging elements. As depicted in FIGS. 97 and 98, charge movement controlling electrodes $27A_1$, $27A_2$, and $27A_3$ are disposed between the charge accumulation electrode $24_{11}$ and the charge accumulation electrode $24_{12}$, between the charge accumulation electrode $24_{12}$ and the charge accumulation electrode $24_{13}$, and between the charge accumulation electrode $24_{13}$ and the charge accumulation electrode $24_{14}$, respectively. Further, as depicted in FIG. 98, charge movement controlling electrodes $27B_1$, $27B_2$, and $27B_3$ are disposed between the charge accumulation electrodes $24_{21}$, $24_{31}$, and $24_{41}$ and the charge accumulation electrodes $24_{22}$, $24_{32}$, and $24_{42}$, between the charge accumulation electrodes $24_{22}$, $24_{32}$, and $24_{42}$ and the charge accumulation electrodes $24_{23}$, $24_{33}$, and $24_{43}$, and between the charge accumulation electrodes $24_{23}$, $24_{33}$, and $24_{43}$ and the charge accumulation electrode $24_{24}$, $24_{34}$, and $24_{44}$, respectively. Further, a charge movement controlling electrode 27C is disposed between an imaging element block and another imaging element block. Thus, in the solid-state imaging device, by controlling the 16 charge accumulation electrodes 24, charge accumulated in the photoelectric conversion layer 23 can be read out from the first electrode 21.

[Step-10]

In particular, charge accumulated in a region of the photoelectric conversion layer 23 opposing to the charge accumulation electrode $24_{11}$ is read out from the first electrode 21 first. Then, charge accumulated in a region of the photoelectric conversion layer 23 opposing to the charge accumulation electrode $24_{12}$ is read out from the first electrode 21 through the region of the photoelectric conversion layer 23 opposing to the charge accumulation electrode $24_{11}$. Then, charge accumulated in a region of the photoelectric conversion layer 23 opposing to the charge accumulation electrode $24_{13}$ is read out from the first electrode 21 through the regions of the photoelectric conversion layer 23 opposing to the charge accumulation electrode $24_{12}$ and the charge accumulation electrode $24_{11}$.

[Step-20]

Thereafter, the charge accumulated in the region of the photoelectric conversion layer 23 opposing to the charge accumulation electrode $24_{21}$ is moved to the region of the photoelectric conversion layer 23 opposing to the charge accumulation electrode $24_{11}$. The charge accumulated in the region of the photoelectric conversion layer 23 opposing to the charge accumulation electrode $24_{22}$ is moved to the region of the photoelectric conversion layer 23 opposing to the charge accumulation electrode $24_{12}$. The charge accumulated in the region of the photoelectric conversion layer 23 opposing to the charge accumulation electrode $24_{23}$ is moved to the region of the photoelectric conversion layer 23 opposing to the charge accumulation electrode $24_{13}$. The charge accumulated in the region of the photoelectric conversion layer 23 opposing to the charge accumulation electrode $24_{24}$ is moved to the region of the photoelectric conversion layer 23 opposing to the charge accumulation electrode $24_{14}$.

[Step-21]

The charge accumulated in the region of the photoelectric conversion layer 23 opposing to the charge accumulation electrode $24_{31}$ is moved to the region of the photoelectric conversion layer 23 opposing to the charge accumulation electrode $24_{21}$. The charge accumulated in the region of the photoelectric conversion layer 23 opposing to the charge accumulation electrode $24_{32}$ is moved to the region of the photoelectric conversion layer 23 opposing to the charge accumulation electrode $24_{22}$. The charge accumulated in the region of the photoelectric conversion layer 23 opposing to the charge accumulation electrode $24_{33}$ is moved to the region of the photoelectric conversion layer 23 opposing to the charge accumulation electrode $24_{23}$. The charge accumulated in the region of the photoelectric conversion layer 23 opposing to the charge accumulation electrode $24_{34}$ is moved to the region of the photoelectric conversion layer 23 opposing to the charge accumulation electrode $24_{24}$.

[Step-22]

The charge accumulated in the region of the photoelectric conversion layer 23 opposing to the charge accumulation electrode $24_{41}$ is moved to the region of the photoelectric conversion layer 23 opposing to the charge accumulation electrode $24_{31}$. The charge accumulated in the region of the photoelectric conversion layer 23 opposing to the charge accumulation electrode $24_{42}$ is moved to the region of the photoelectric conversion layer 23 opposing to the charge accumulation electrode $24_{32}$. The charge accumulated in the region of the photoelectric conversion layer 23 opposing to the charge accumulation electrode $24_{43}$ is moved to the region of the photoelectric conversion layer 23 opposing to the charge accumulation electrode $24_{33}$. The charge accumulated in the region of the photoelectric conversion layer 23 opposing to the charge accumulation electrode $24_{44}$ is moved to the region of the photoelectric conversion layer 23 opposing to the charge accumulation electrode $24_{34}$.

[Step-30]

Then, by executing [step-10] again, the charge accumulated in the region of the photoelectric conversion layer 23 opposing to the charge accumulation electrode $24_{21}$, charge accumulated in the region of the photoelectric conversion layer 23 opposing to the charge accumulation electrode $24_{22}$, charge accumulated in the region of the photoelectric conversion layer 23 opposing to the charge accumulation electrode $24_{23}$ and charge accumulated in the region of the photoelectric conversion layer 23 opposing to the charge accumulation electrode $24_{24}$ can be read out through the first electrode 21.

[Step-40]

Thereafter, the charge accumulated in the region of the photoelectric conversion layer 23 opposing to the charge accumulation electrode $24_{21}$ is moved to the region of the photoelectric conversion layer 23 opposing to the charge accumulation electrode $24_{11}$. The charge accumulated in the region of the photoelectric conversion layer 23 opposing to the charge accumulation electrode $24_{22}$ is moved to the region of the photoelectric conversion layer 23 opposing to the charge accumulation electrode $24_{12}$. The charge accumulated in the region of the photoelectric conversion layer 23 opposing to the charge accumulation electrode $24_{23}$ is moved to the region of the photoelectric conversion layer 23 opposing to the charge accumulation electrode $24_{13}$. The charge accumulated in the region of the photoelectric conversion layer 23 opposing to the charge accumulation electrode $24_{24}$ is moved to the region of the photoelectric conversion layer 23 opposing to the charge accumulation electrode $24_{14}$.

[Step-41]

The charge accumulated in the region of the photoelectric conversion layer 23 opposing to the charge accumulation electrode $24_{31}$ is moved to the region of the photoelectric conversion layer 23 opposing to the charge accumulation electrode $24_{21}$. The charge accumulated in the region of the photoelectric conversion layer 23 opposing to the charge accumulation electrode $24_{32}$ is moved to the region of the photoelectric conversion layer 23 opposing to the charge accumulation electrode $24_{22}$. The charge accumulated in the region of the photoelectric conversion layer 23 opposing to the charge accumulation electrode $24_{33}$ is moved to the region of the photoelectric conversion layer 23 opposing to the charge accumulation electrode $24_{23}$. The charge accumulated in the region of the photoelectric conversion layer 23 opposing to the charge accumulation electrode $24_{34}$ is moved to the region of the photoelectric conversion layer 23 opposing to the charge accumulation electrode $24_{24}$.

[Step-50]

Then, by executing [step-10] again, the charge accumulated in the region of the photoelectric conversion layer 23 opposing to the charge accumulation electrode $24_{31}$, charge accumulated in the region of the photoelectric conversion layer 23 opposing to the charge accumulation electrode $24_{32}$, charge accumulated in the region of the photoelectric conversion layer 23 opposing to the charge accumulation electrode $24_{33}$ and charge accumulated in the region of the photoelectric conversion layer 23 opposing to the charge accumulation electrode $24_{34}$ can be read out through the first electrode 21.

[Step-60]

Thereafter, the charge accumulated in the region of the photoelectric conversion layer 23 opposing to the charge accumulation electrode $24_{21}$ is moved to the region of the photoelectric conversion layer 23 opposing to the charge accumulation electrode $24_{11}$. The charge accumulated in the region of the photoelectric conversion layer 23 opposing to the charge accumulation electrode $24_{22}$ is moved to the region of the photoelectric conversion layer 23 opposing to the charge accumulation electrode $24_{12}$. The charge accumulated in the region of the photoelectric conversion layer 23 opposing to the charge accumulation electrode $24_{23}$ is moved to the region of the photoelectric conversion layer 23 opposing to the charge accumulation electrode $24_{13}$. The charge accumulated in the region of the photoelectric conversion layer 23 opposing to the charge accumulation electrode $24_{24}$ is moved to the region of the photoelectric conversion layer 23 opposing to the charge accumulation electrode $24_{14}$.

[Step-70]

Then, by executing [step-10] again, the charge accumulated in the region of the photoelectric conversion layer 23 opposing to the charge accumulation electrode $24_{41}$, charge accumulated in the region of the photoelectric conversion layer 23 opposing to the charge accumulation electrode $24_{42}$, charge accumulated in the region of the photoelectric conversion layer 23 opposing to the charge accumulation electrode $24_{43}$ and charge accumulated in the region of the photoelectric conversion layer 23 opposing to the charge accumulation electrode $24_{44}$ can be read out through the first electrode 21.

Since, in the solid-state imaging device of the working example 19, the first electrode is shared by a plurality of stacked-type imaging elements configuring an imaging element block, the configuration and the structure of the pixel region in which a plurality of stacked-type imaging elements are arrayed can be simplified and refined. It is to be noted that the plurality of stacked-type imaging elements provided for one floating diffusion layer may include a plurality of first type imaging elements or may include at least one first type imaging element and one, two or more second type imaging elements.

Working Example 20

The working example 20 is a modification of the working example 19. In the solid-state imaging device of the working example 20 whose disposition state of the first electrode 21 and the charge accumulation electrode 24 is schematically depicted in FIGS. 100, 101, 102, and 103, an imaging element block includes two stacked-type imaging elements. Further, one on-chip microlens 15 is disposed above the imaging element block. It is to be noted that, in the examples depicted in FIGS. 101 and 103, a charge movement controlling electrode 27 is disposed between the plurality of stacked-type imaging elements configuring the imaging element block.

For example, the photoelectric conversion layer corresponding to the charge accumulation electrodes $\mathbf{24}_{11}$, $\mathbf{24}_{21}$, $\mathbf{24}_{31}$, and $\mathbf{24}_{41}$ that configure an imaging element block has high sensitivity to incident light from the upper right in each figure. Meanwhile, the photoelectric conversion layer corresponding to the charge accumulation electrodes $\mathbf{24}_{12}$, $\mathbf{24}_{22}$, $\mathbf{24}_{32}$, and $\mathbf{24}_{42}$ that configure another imaging element block has high sensitivity to incident light from the upper left in each figure. Accordingly, for example, by combining a stacked-type imaging element having the charge accumulation electrode $\mathbf{24}_{11}$ and another stacked-type imaging element having the charge accumulation electrode $\mathbf{24}_{12}$, it becomes possible to acquire an image plane phase difference signal. Further, if a signal from the stacked-type imaging element having the charge accumulation electrode $\mathbf{24}_{11}$ and a signal from the stacked-type imaging element having the charge accumulation electrode $\mathbf{24}_{12}$ are added, then by combination with the stacked-type imaging elements, one stacked-type imaging element can be configured. Although, in the example depicted in FIG. 100, the first electrode 211 is disposed between the charge accumulation electrode $\mathbf{24}_{11}$ and the charge accumulation electrode $\mathbf{24}_{12}$, by disposing one first electrode $\mathbf{21}_1$ in an opposing relation to the two juxtaposed charge accumulation electrodes $\mathbf{24}_{11}$ and $\mathbf{24}_{12}$ as in the example depicted in FIG. 102, further improvement of the sensitivity can be achieved.

Working Example 21

The technology according to the present disclosure (present technology) can be applied to various products. For example, the technology according to the present disclosure may be implemented as a device incorporated in any type of moving body such as an automobile, an electric car, a hybrid electric car, a motorcycle, a bicycle, a personal mobility, an airplane, a drone, a ship, and a robot.

Figure 118:
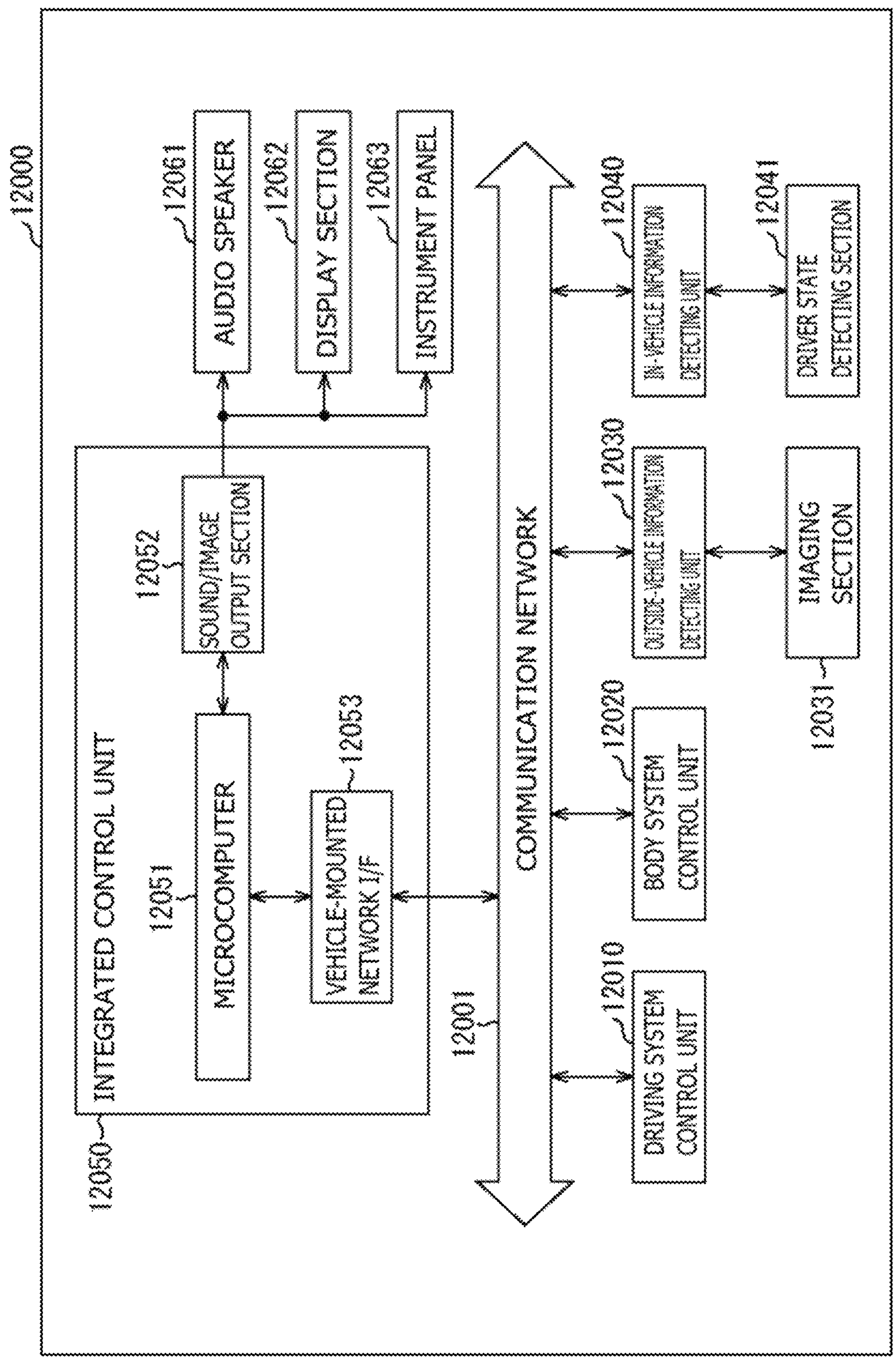
FIG. 118 is a block diagram depicting an example of schematic configuration of a vehicle control system.

FIG. 118 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 118, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 118, an audio speaker 12061, a display section 12062, and an instrument panel 12063 are illustrated as the output device. The display section 12062 may, for example, include at least one of an on-board display and a head-up display.

Figure 119:
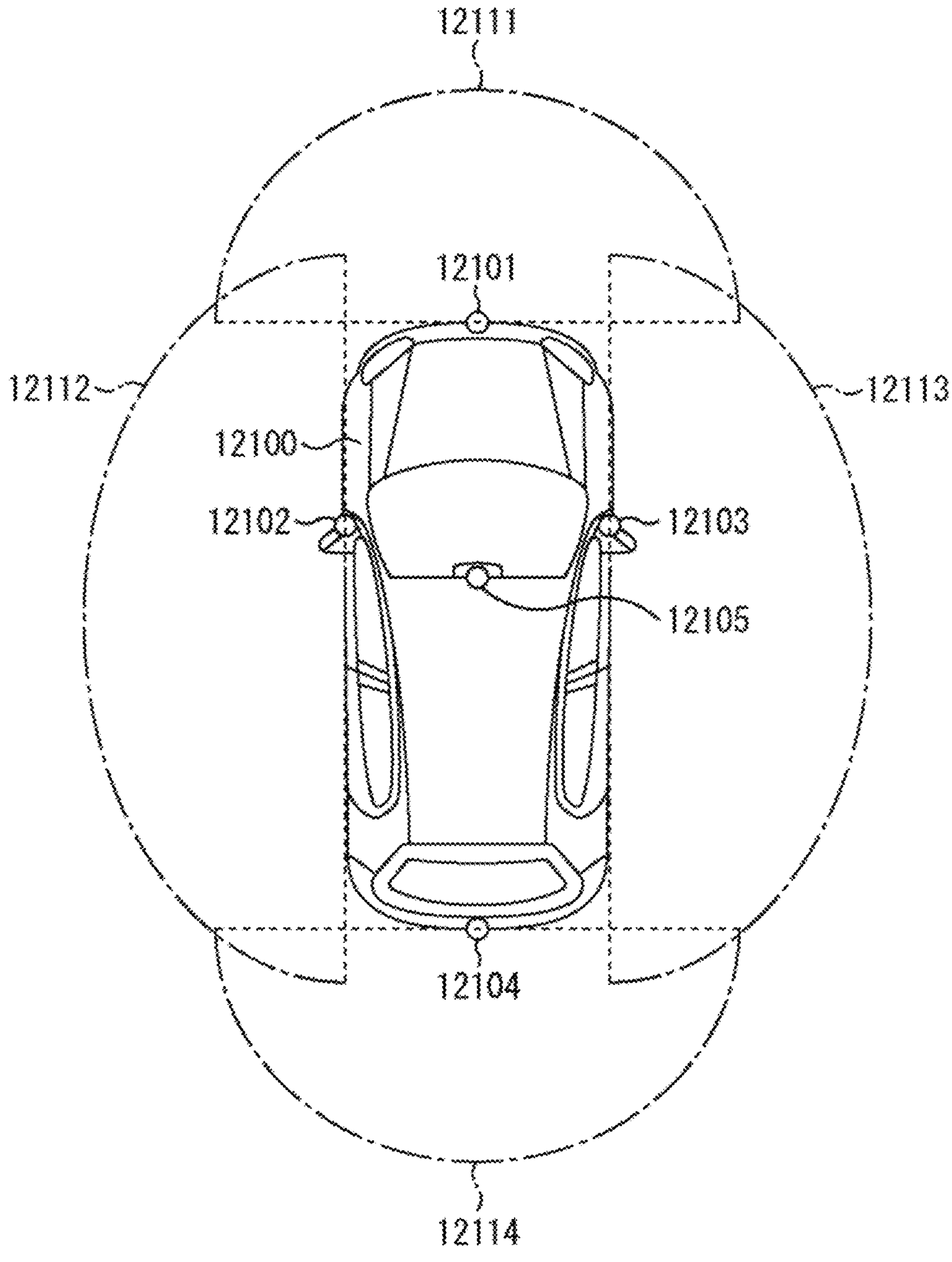
FIG. 119 is a diagram of assistance in explaining an example of installation positions of an outside-vehicle information detecting section and an imaging section.

FIG. 119 is a diagram depicting an example of the installation position of the imaging section 12031.

In FIG. 119, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 119 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

Working Example 22

Further, the technology according to the present disclosure (present technology) can be applied to various products.

For example, the technology according to the present disclosure may be applied to an endoscopic surgery system.

Figure 120:
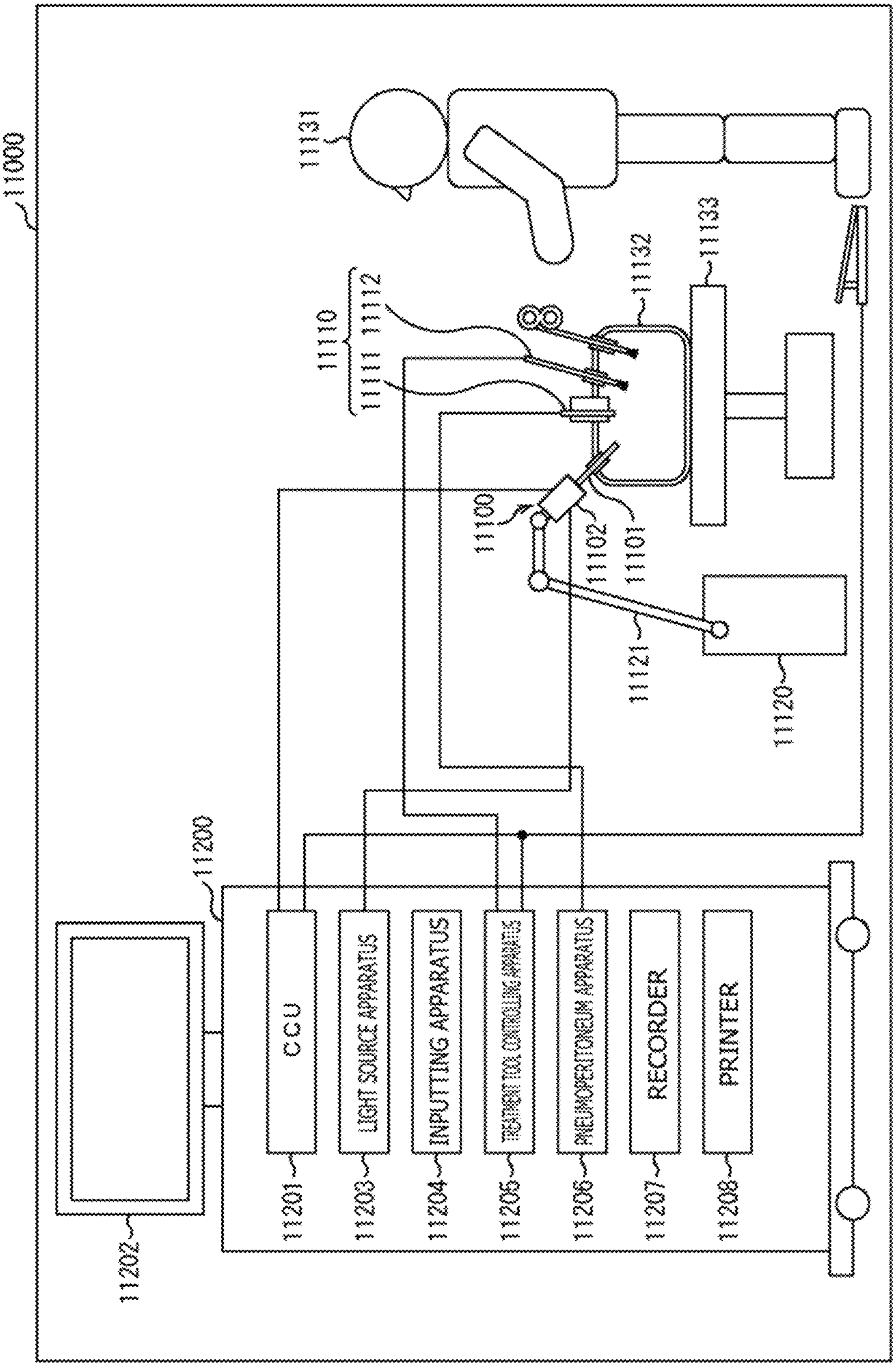

FIG. 120 is a view depicting an example of a schematic configuration of an endoscopic surgery system to which the technology according to an embodiment of the present disclosure (present technology) can be applied.

In FIG. 120, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photoelectrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 121:
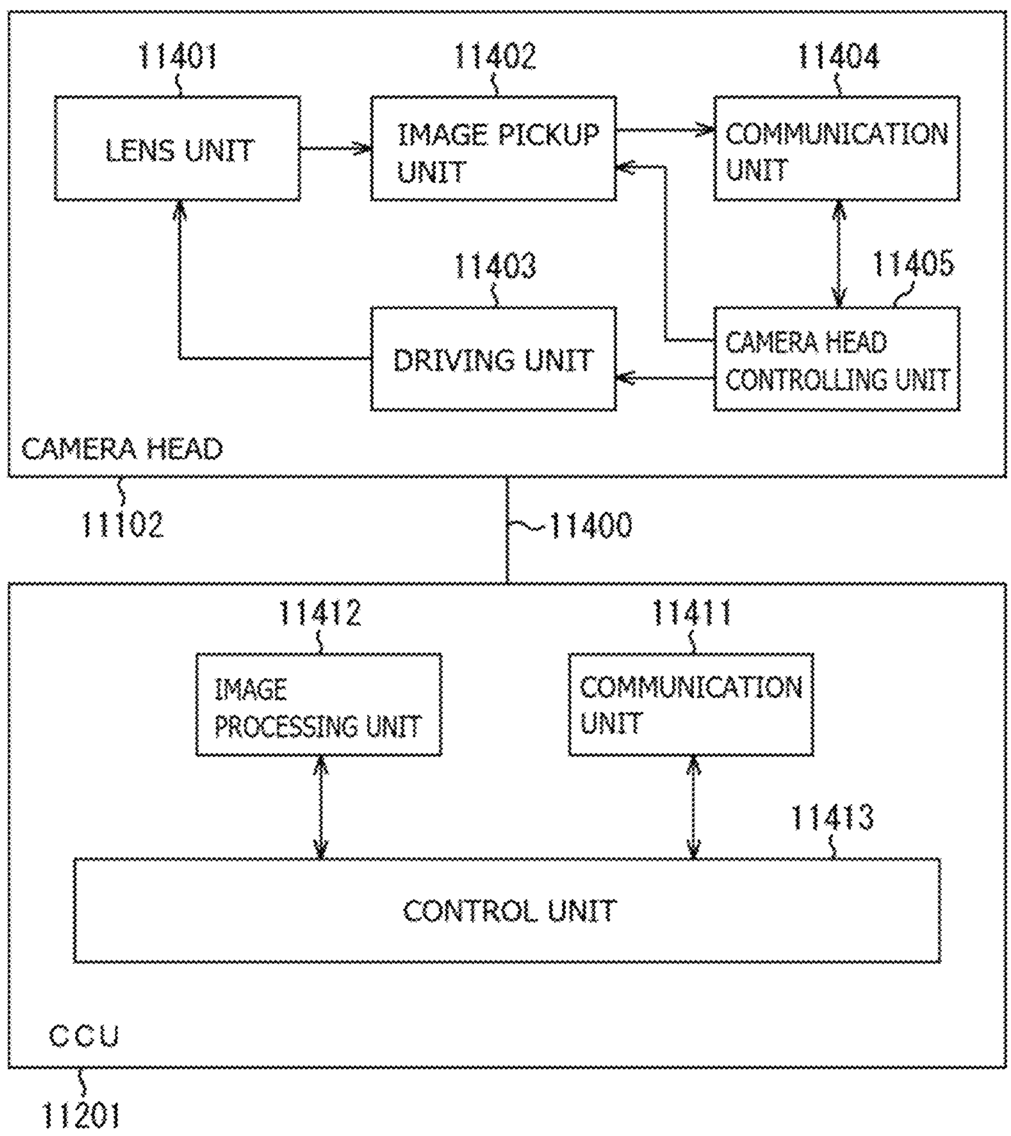

FIG. 121 is a block diagram depicting an example of a functional configuration of the camera head 11102 and the CCU 11201 depicted in FIG. 120.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

Working Example 23

Further, the technology according to the present disclosure (present technology) can be applied to various products. For example, the technology according to the present disclosure may be applied to an endoscopic surgery system.

Figure 122:
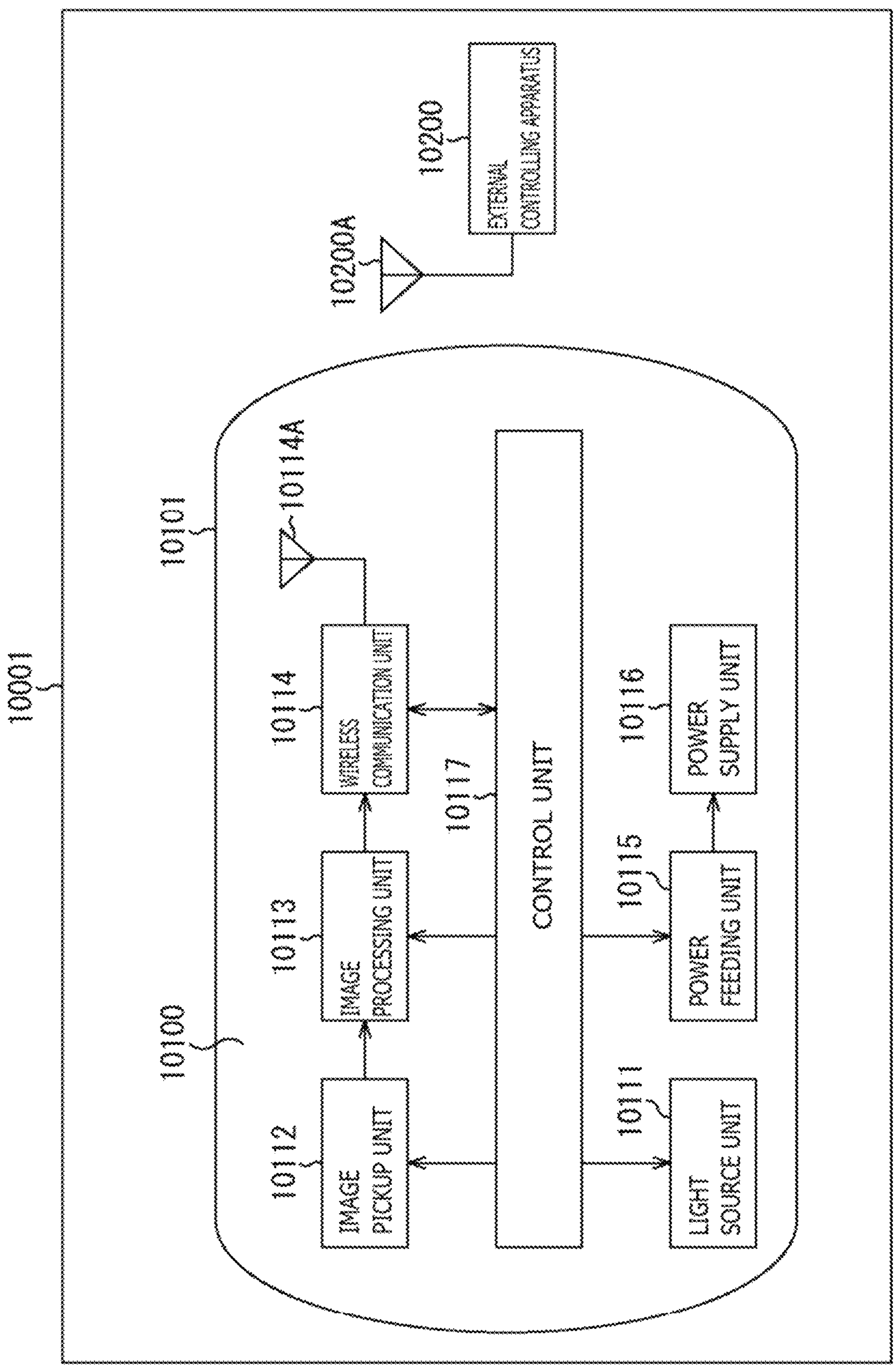
Figure 123A:
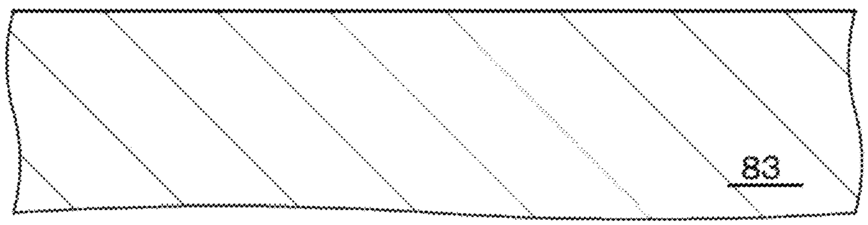
Figure 123B:
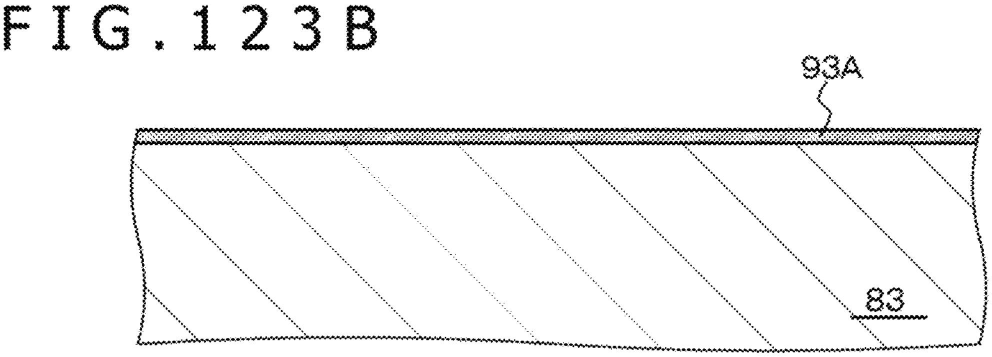
Figure 123C:
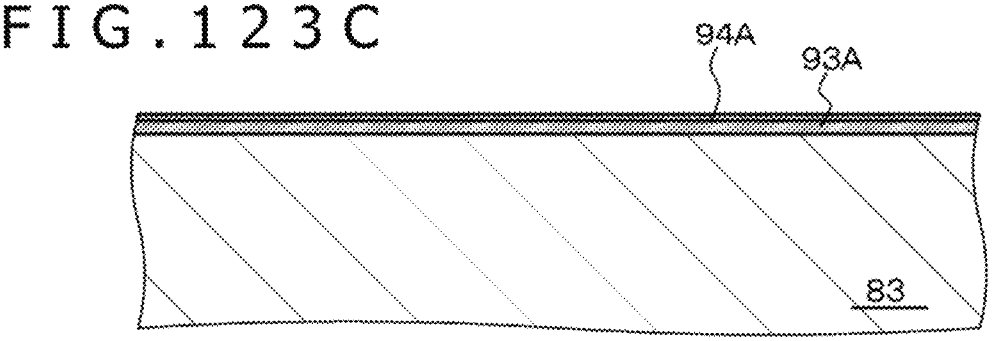
Figure 123D:
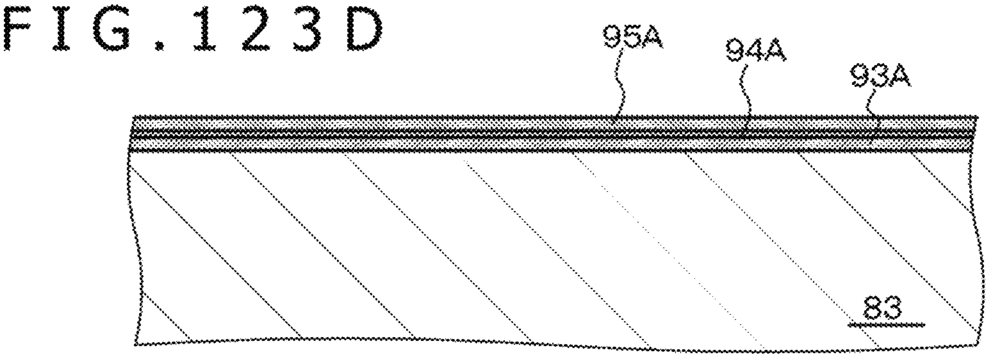

FIG. 122 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 122, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR)

process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

Although the present disclosure has been described on the basis of the preferred working examples, the present disclosure is not restricted to the working examples. The structures and configurations, manufacturing conditions, manufacturing methods and used materials of the imaging elements, stacked-type imaging elements and solid-state imaging devices described hereinabove in connection with the working examples are exemplary and can be altered suitably. The imaging elements and the stacked-type imaging elements of the working examples can be combined suitably. For example, the stacked-type imaging element of the working example 13, the stacked-type imaging element of the working example 14, the stacked-type imaging element of the working example 15, the stacked-type imaging element of the working example 16, and the stacked-type imaging element of the working example 17 and be combined arbitrarily, and the stacked-type imaging element of the working example 13, the stacked-type imaging element of the working example 14, the stacked-type imaging element of the working example 15, the stacked-type imaging element of the working example 16, and the stacked-type imaging element of the working example 18 can be combined arbitrarily. Further, the combination of the wire grid polarizer and the upper layer photoelectric conversion portion or the combination of the wire grid polarizer and the lower layer photoelectric conversion portion described hereinabove in connection with the working example 5 to working example 6 can be applied to the working example 1 to working example 4.

In some cases, it is possible to share the floating diffusion layers $FD_1$, $FD_2$, $FD_3$, 51C, 45C, and 46C.

Figure 104:
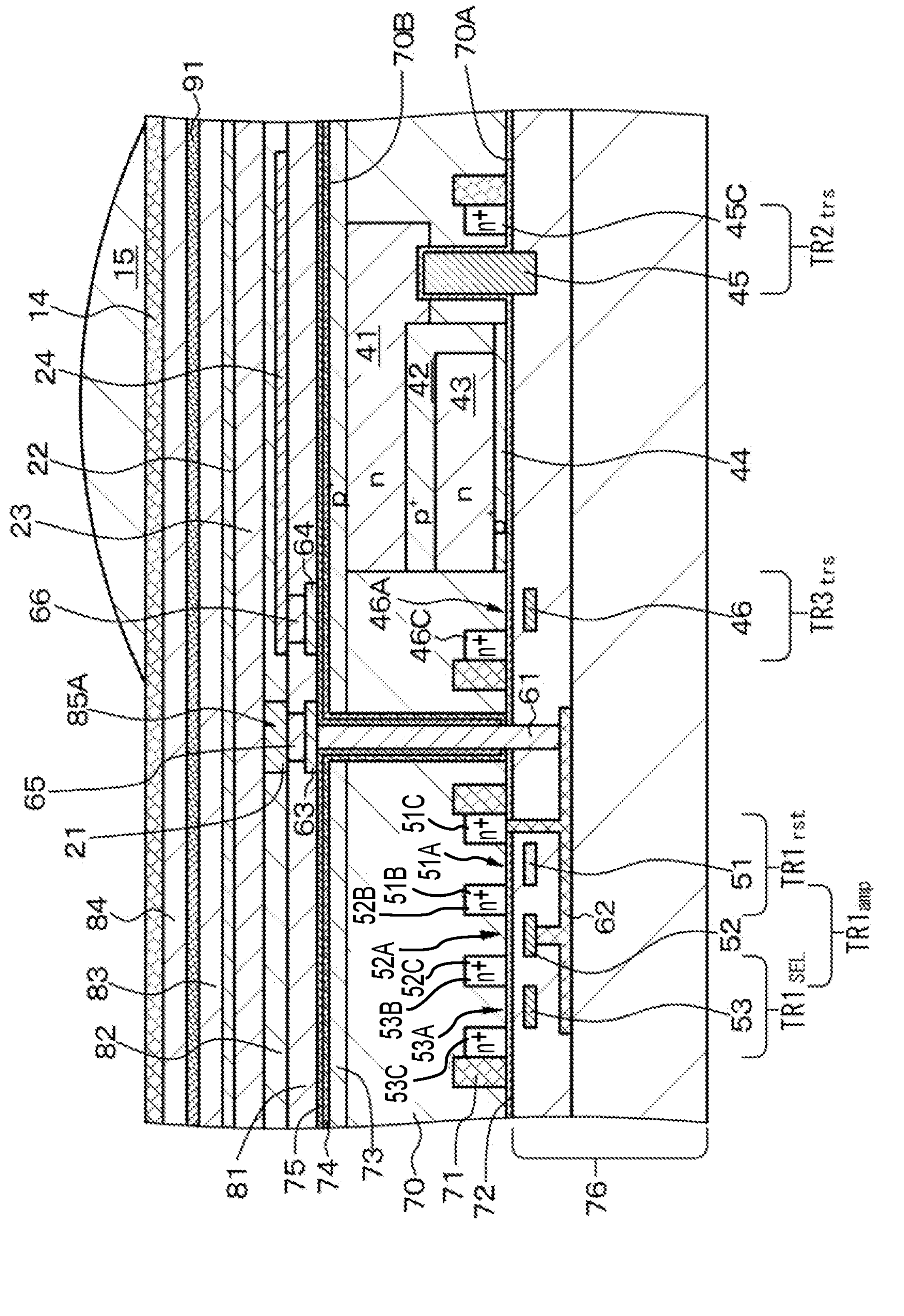
FIG. 104 is a schematic partial sectional view of another modification of the stacked-type imaging element of the working example 7.

As depicted in FIG. 104 that depicts a modification of the stacked-type imaging element described hereinabove, for example, in connection with the working example 7, it is possible to configure the first electrode 21 such that it extends in an opening 85A provided in the insulating layer 82 and is connected to the photoelectric conversion layer 23.

Figure 105:
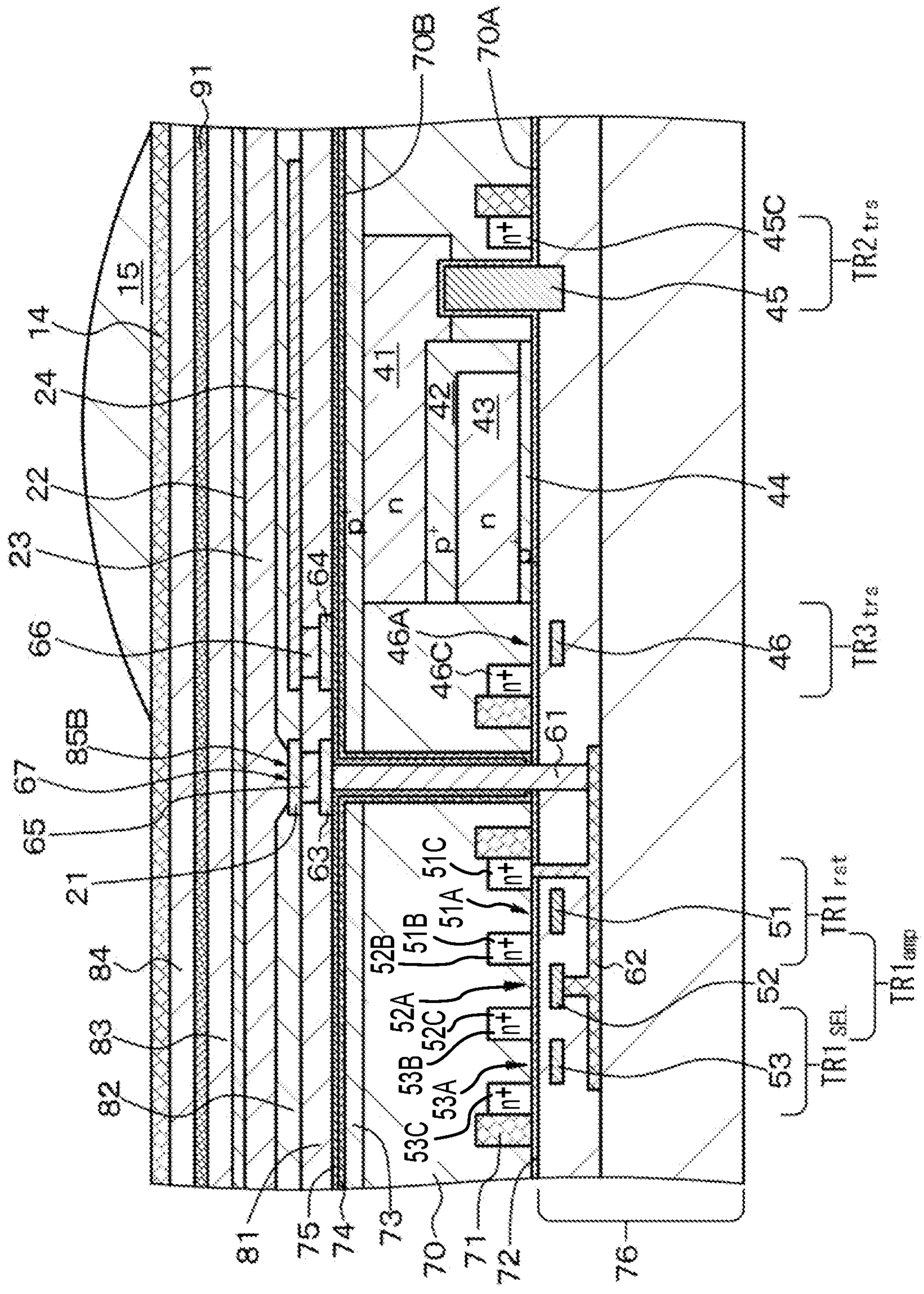
FIG. 105 is a schematic partial sectional view of a further modification of the stacked-type imaging element of the working example 7.
Figure 106A:
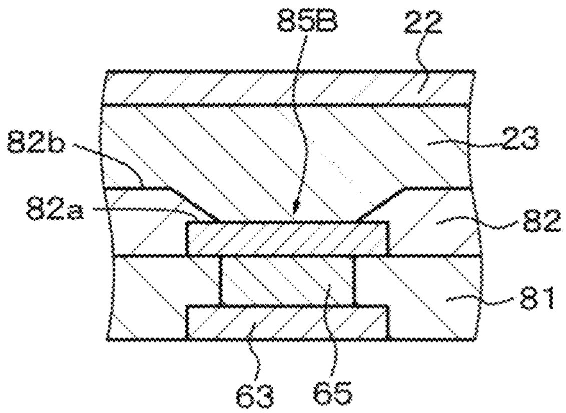
FIGS. 106A, 106B, and 106C are enlarged schematic partial sectional views of a first electrode portion and the like of a still further modification of the stacked-type imaging element of the working example 7.
Figure 106B:
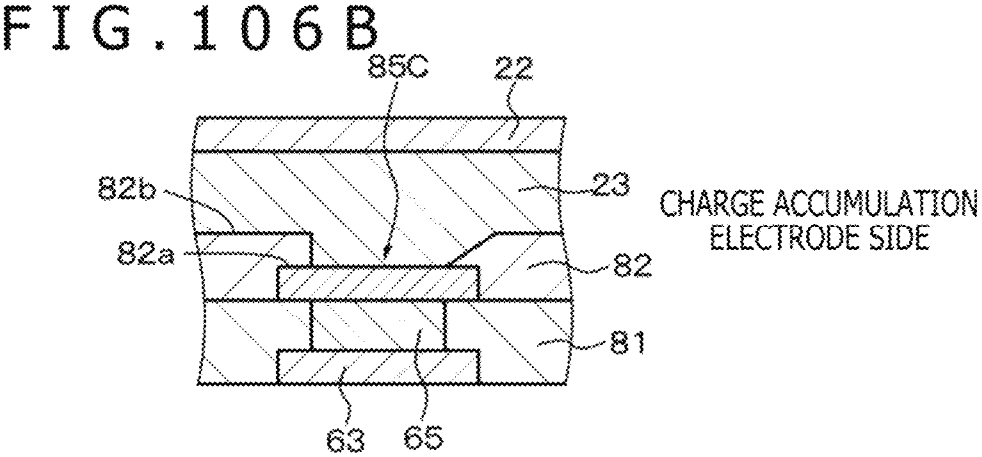
Figure 106C:
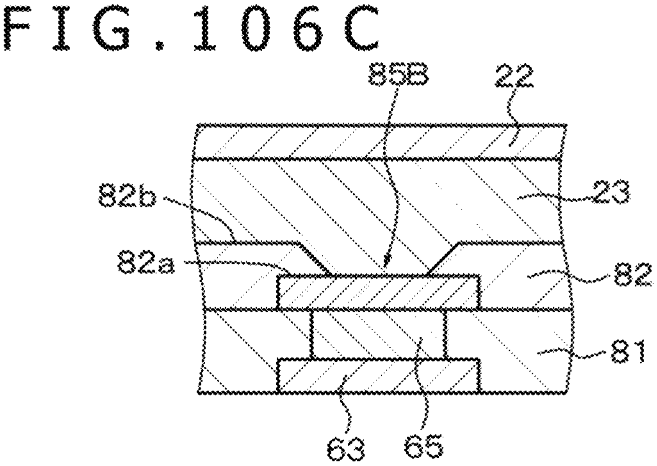

Alternatively, as depicted in FIG. 105 that depicts a modification of the stacked-type imaging element described hereinabove, for example, in connection with the working example 7 and as depicted in FIG. 106A that is an enlarged schematic partial sectional view of a portion of the first electrode and so forth, an edge portion of a top face of the first electrode 21 is covered with the insulating layer 82 and the first electrode 21 is exposed to a bottom face of an opening 85B, and where a face of the insulating layer 82 contacting with the top face of the first electrode 21 is a first face 82*a* and a face of the insulating layer 82 contacting with a portion of the photoelectric conversion layer 23 opposing to the charge accumulation electrode 24 is a second face 82*b*, a side face of the opening 85B has an inclination that expands from the first face 82*a* toward the second face 82*b*. By providing an inclination to the side face of the opening 85B in this manner, movement of charge from the photoelectric conversion layer 23 to the first electrode 21 becomes smoother. It is to be noted that, although, in the example depicted in FIG. 106A, the side face of the opening 85B is rotationally symmetric around the axis of the opening 85B, an opening 85C having an inclination that expands from the first face 82*a* toward the second face 82*b* may be provided otherwise such that a side face of the opening 85C is positioned on the charge accumulation electrode 24 side as depicted in FIG. 106B. By the configuration, movement of charge from a portion of the photoelectric conversion layer 23 on the opposite side to the charge accumulation electrode 24 across the opening 85C becomes less likely to occur. Further, although the side face of the opening 85B has an inclination that expands from the first face 82*a* toward the second face 82*b*, an edge portion of the side face of the opening 85B on the second face 82*b* may be positioned on the outer side with respect to the edge portion of the first electrode 21 as depicted in FIG. 106A or may be positioned on the inner side with respect to the edge portion of the first electrode 21 as depicted in FIG. 106C. By adopting the former configuration, transfer of charge is further facilitated, but by adopting the latter configuration, the dispersion in shape upon formation of the opening can be reduced.

The openings 85B and 85C can be formed by reflow of an etching mask, which includes a resist material and is formed when an opening is formed in an insulating layer on the basis of an etching method, to provide an inclination on an opening side face of the etching mask and etching the insulating layer 82 using this etching mask.

Figure 107:
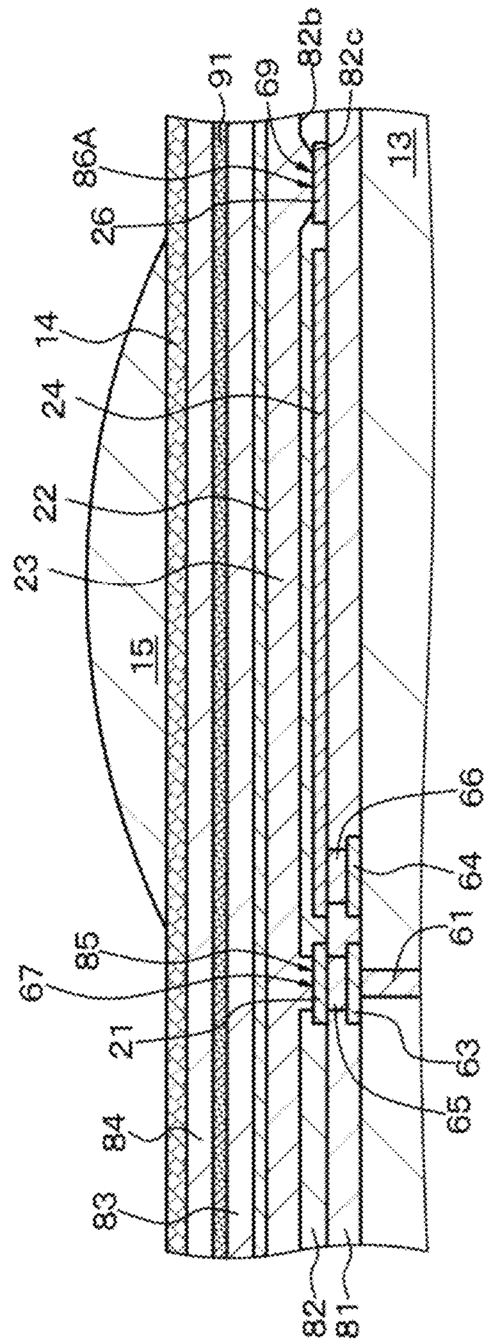
FIG. 107 is a schematic partial sectional view in which a discharging electrode portion and the like in another modification of the stacked-type imaging element of the working example 11 are enlarged.

The discharging electrode 26 described hereinabove in connection with the working example 11 can be formed such that, as depicted in FIG. 107, the photoelectric conversion layer 23 extends in a second opening 86A provided in the insulating layer 82 and is connected to the discharging electrode 26; an edge portion of a top face of the discharging electrode 26 is covered with the insulating layer 82; the discharging electrode 26 is exposed to the bottom face of the second opening 86A; and where the face of the insulating layer 82 contacting with the top face of the discharging electrode 26 is a third face 82*c* and the face of the insulating layer 82 contacting with a portion of the photoelectric conversion layer 23 opposing to the charge accumulation electrode 24 is a second face 82*b*, the side face of the second opening 86A can be formed such that it has an inclination that expands from the third face 82*c* toward the second face 82*c*. It is to be noted that, in FIGS. 108 to 111, the first interlayer insulating layer 83, wire grid polarizer 91 and second interlayer insulating layer 84 are depicted in a simplified form.

Figure 108:
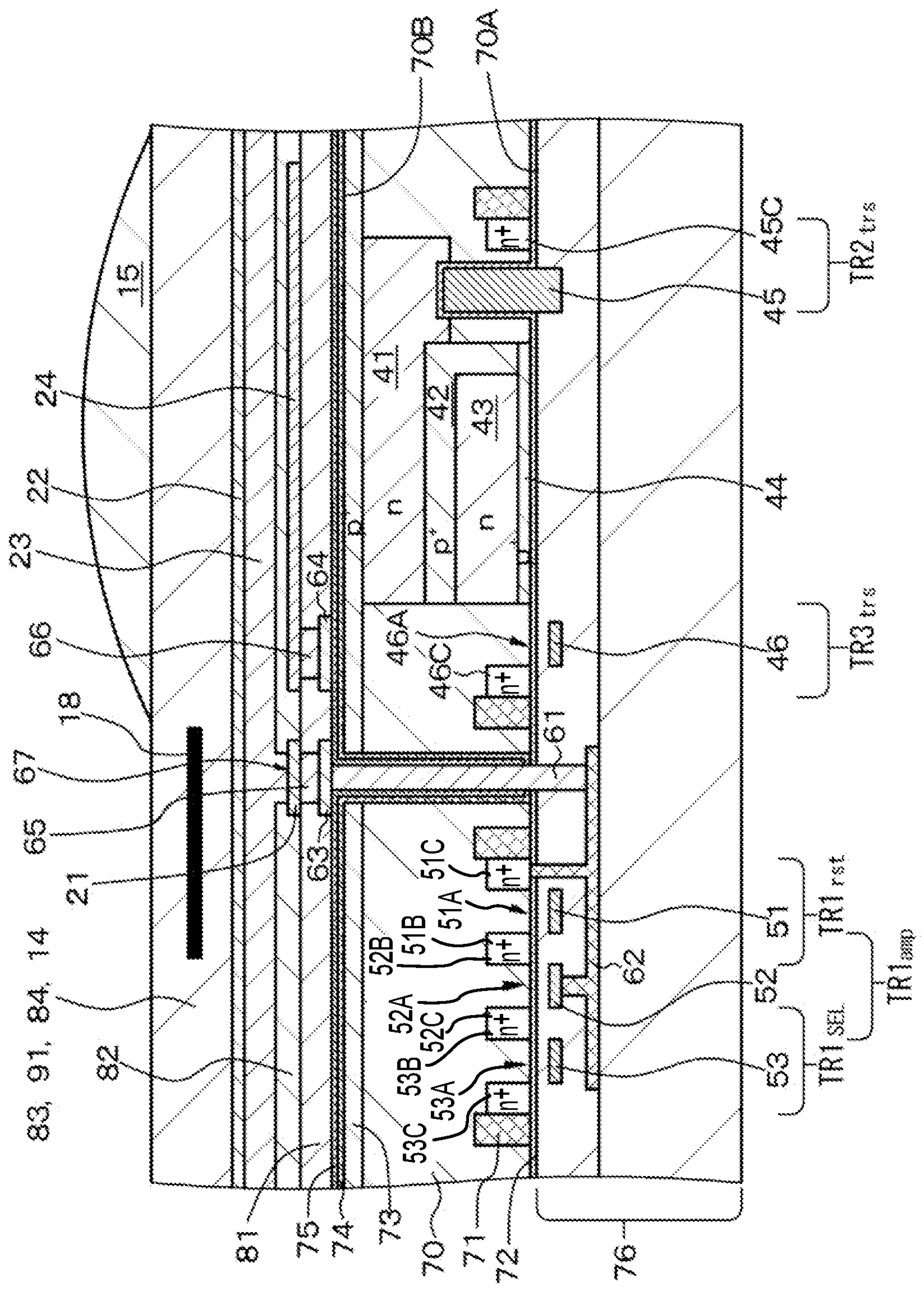
FIG. 108 is a schematic partial sectional view of a yet further modification of the stacked-type imaging element of the working example 7.

As depicted in FIG. 108 that depicts a modification to the stacked-type imaging element described hereinabove in connection with the working example 7, it is possible to configure the same such that light is incident from the second electrode 22 side and the light shielding layer 18 is formed on the light incident side rather near to the second electrode 22. It is to be noted that also it is possible for various wirings provided on the light incident side with respect to the photoelectric conversion layer to function as a light shielding layer.

Figure 109:
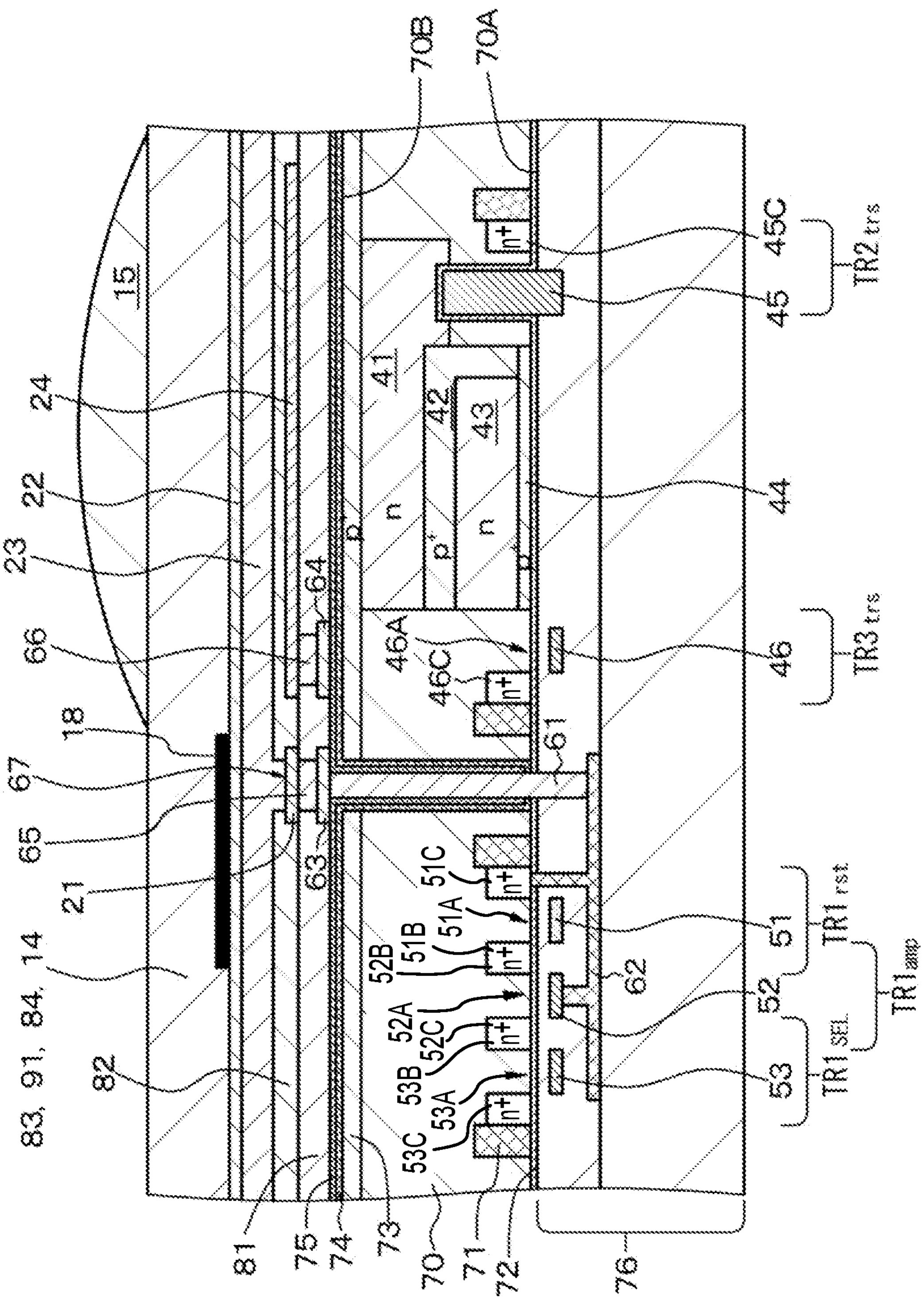
FIG. 109 is a schematic partial sectional view of a yet further modification of the stacked-type imaging element of the working example 7.
Figure 110:
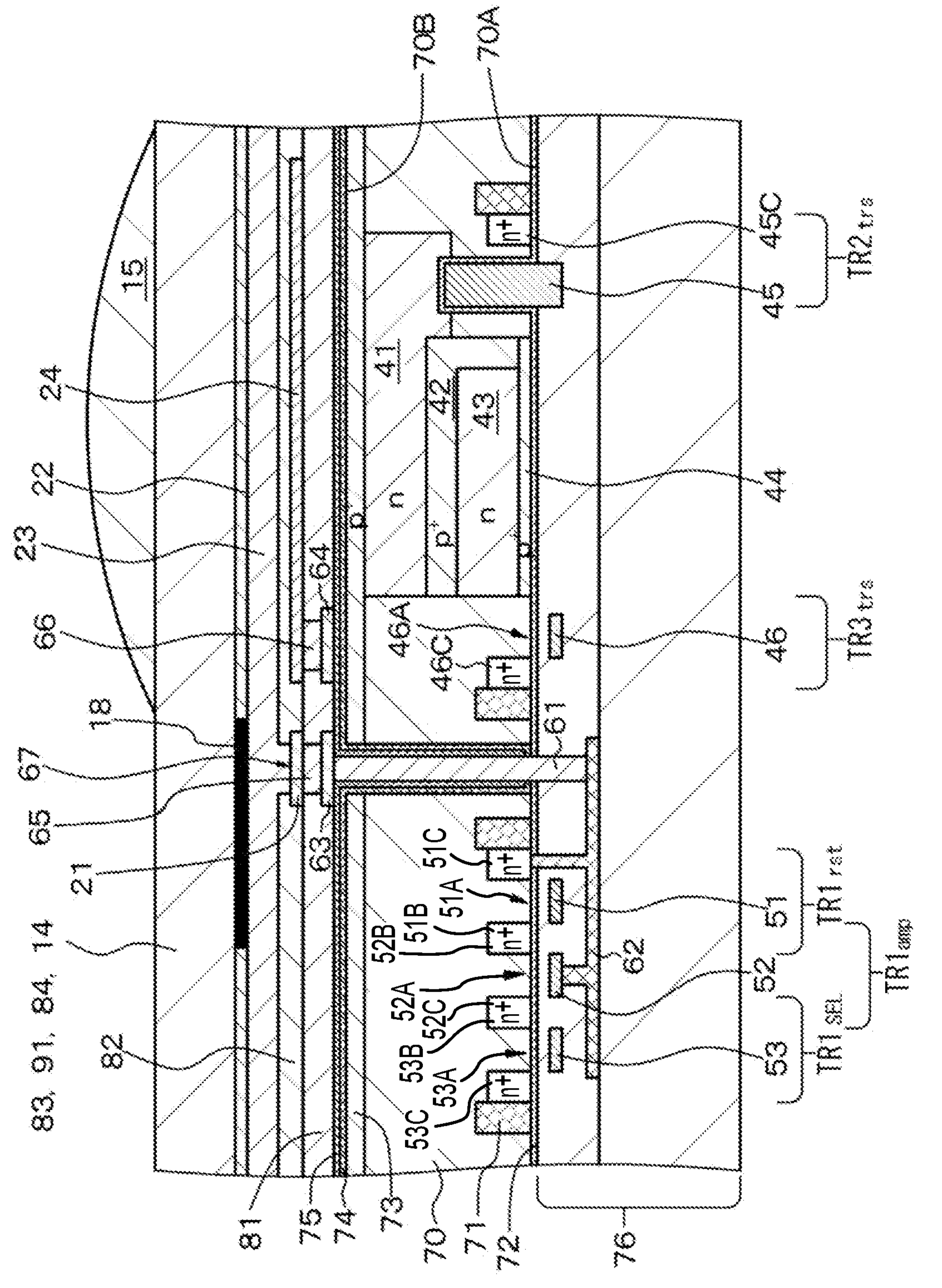
FIG. 110 is a schematic partial sectional view of a yet further modification of the stacked-type imaging element of the working example 7.

It is to be noted that, although, in the example depicted in FIG. 108, the light shielding layer 18 is formed above the second electrode 22, namely, although the light shielding layer 18 is formed above the first electrode 21 on the light incident side rather near to the second electrode 22, it may otherwise be disposed on a face of the second electrode 22 on the light incident side as depicted in FIG. 109. Further, in some cases, the light shielding layer 18 may be formed on the second electrode 22 as depicted in FIG. 110.

Figure 111:
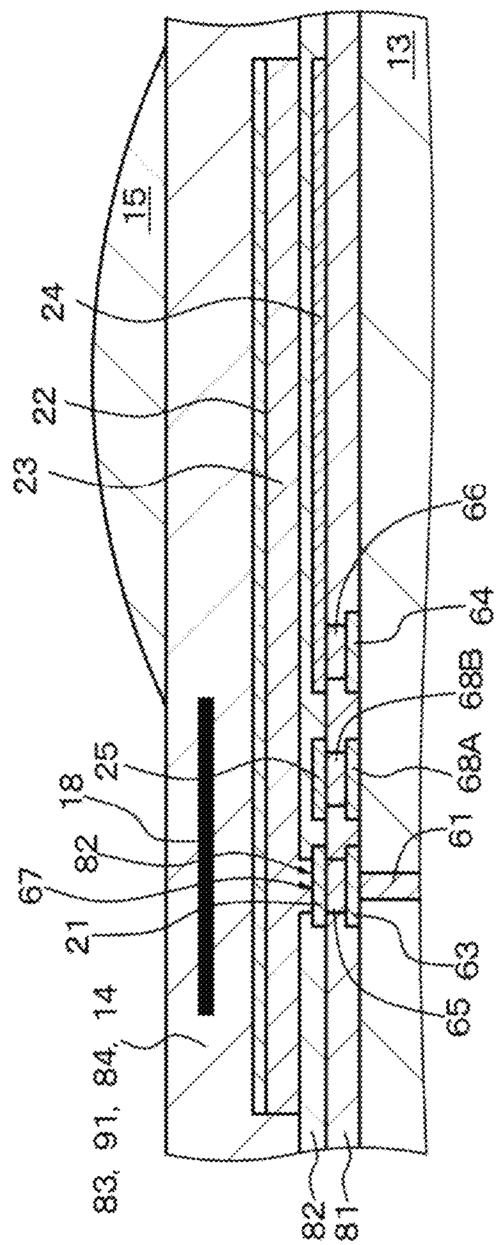
FIG. 111 is a schematic partial sectional view of another modification of the stacked-type imaging element of the working example 10.
Figure 112:
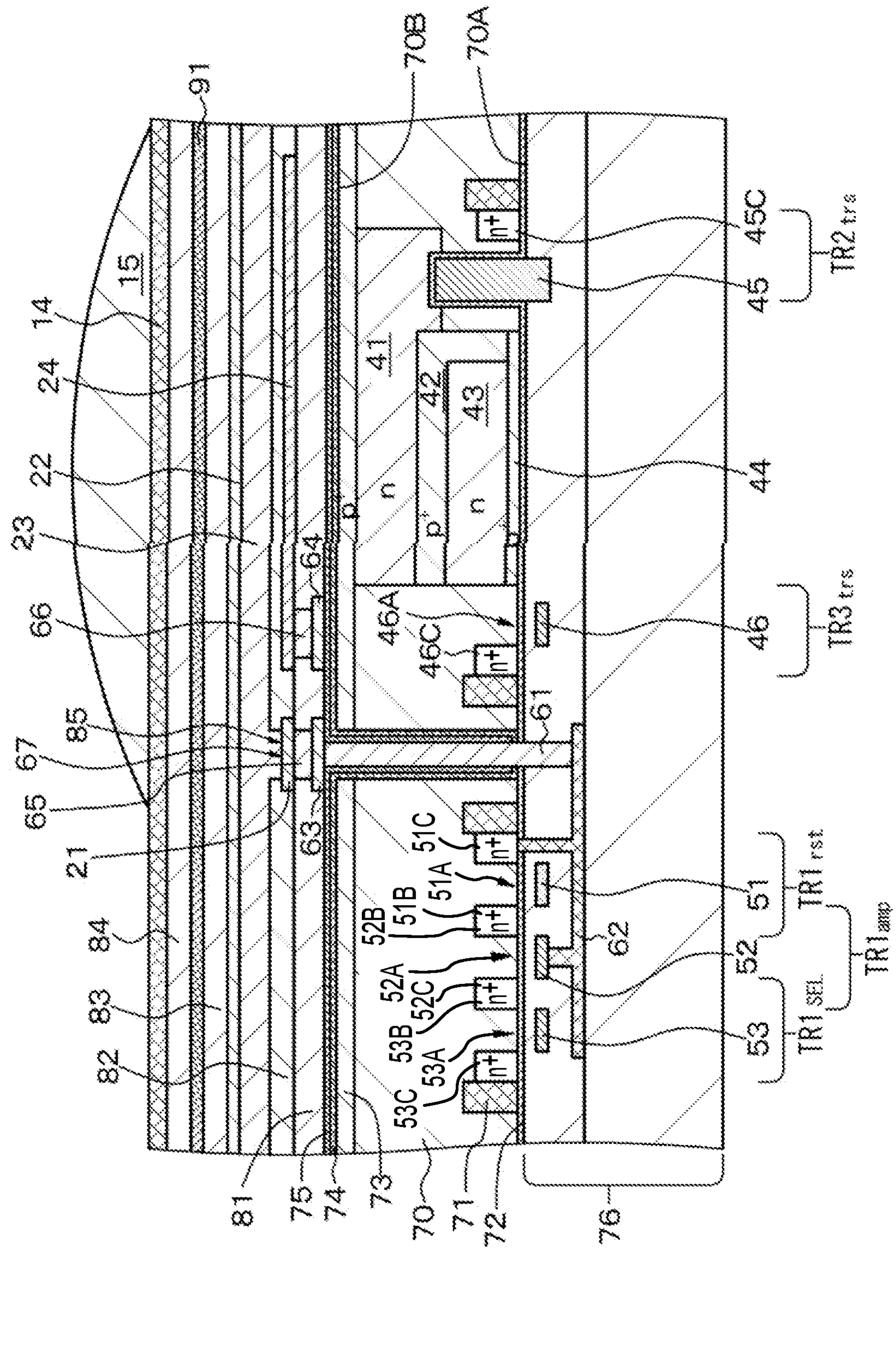
FIG. 112 is a schematic partial sectional view of a yet further modification of the stacked-type imaging element of the working example 7.

As an alternative, also it is possible to structure the stacked-type imaging element such that light is incident from the second electrode 22 side but light is not incident to the first electrode 21. In particular, as depicted in FIG. 108, the light shielding layer 18 is formed above the first electrode 21 on the light incident side rather near to the second electrode 22. As another alternative, as depicted in FIG. 112, also it is possible to structure the stacked-type imaging element such that an on-chip microlens 15 is provided above the charge accumulation electrode 24 and the second electrode 22 such that light incident to the on-chip microlens 15 is condensed by the charge accumulation electrode 24 and does not reach the first electrode 21. It is to be noted that it is possible to form the stacked-type imaging element such that, as described hereinabove in connection with the working example 10, in the case where the transfer controlling electrode 25 is provided, light is not incident to the first electrode 21 and the transfer controlling electrode 25, and particularly, it is possible to structure the stacked-type imaging element such that, as depicted in FIG. 111, the light shielding layer 18 is formed above the first electrode 21 and the transfer controlling electrode 25. As a further alternative, also it is possible to structure the stacked-type imaging element such that light that is incident to the on-chip microlens 15 does not reach the first electrode 21 or the first electrode 21 and the transfer controlling electrode 25.

By adopting such configurations and structures as described above, or by providing the light shielding layer 18 or designing the on-chip microlens 15 such that light is incident only to a portion of the photoelectric conversion layer 23 positioned above the charge accumulation electrode 24, the portion of the photoelectric conversion layer 23 positioned above the first electrode 21 (or above the first electrode 21 and the transfer controlling electrode 25) does not contribute to photoelectric conversion any more, and therefore, all pixels can be reset all at once with higher certainty and the global shutter function can be implemented more easily. In particular, in a driving method for a solid-state imaging device that includes a plurality of stacked-type imaging elements having such configurations and structures as described above, the steps of:

discharging, while charge is accumulated into the photoelectric conversion layer 23 in all stacked-type imaging elements all at once, the charge in the first electrode 21 to the outside of the system; and then transferring the charge accumulated in the photoelectric conversion layer 23 in all stacked-type imaging elements all at once to the first electrode 21 and sequentially reading out, after completion of the transfer, the charge transferred to the first electrode 21 in the stacked-type imaging elements are repeated.

In such a driving method for a solid-state imaging device as described above, each stacked-type imaging element is structured such that light incident from the second electrode side is not incident to the first electrode and, while charge is accumulated into the photoelectric conversion layer, the charge in the first electrode is discharged to the outside of the system all at once in all stacked-type imaging elements. Therefore, in all stacked-type imaging elements, resetting of the first electrode can be performed simultaneously with certainty. Thereafter, in all stacked-type imaging elements, charge accumulated in the photoelectric conversion layers is transferred all at once to the first electrode, and after completion of the transfer, charge transferred to the first electrode is read out sequentially from the stacked-type imaging elements. Therefore, a so-called global shutter function can be implemented easily.

Figure 113:
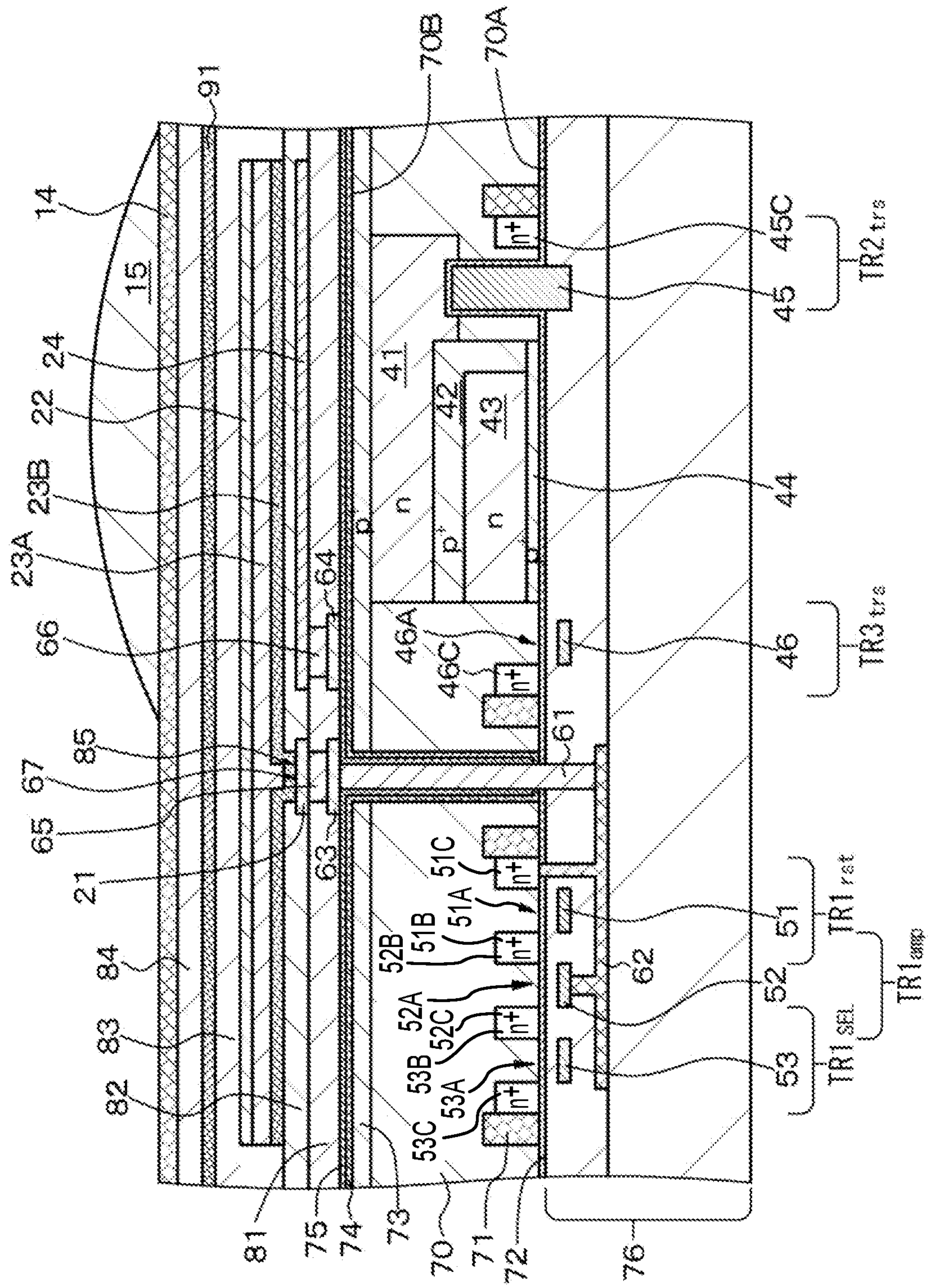
FIG. 113 is a schematic partial sectional view of a yet further modification of the stacked-type imaging element of the working example 7.

The photoelectric conversion layer is not restricted to a configuration from one layer. For example, as depicted in FIG. 113 that depicts a modification of the stacked-type imaging element described hereinabove in connection with the working example 7, the photoelectric conversion layer 23 may have a stacked structure, for example, of a lower layer semiconductor layer 23A including IGZO and an upper layer photoelectric conversion layer 23B including a material from which the photoelectric conversion layer 23 described hereinabove in connection with the working example 7 is configured. By providing the lower layer semiconductor layer 23A in this manner, recombination upon charge accumulation can be prevented, and the transfer efficiency of charge accumulated in the photoelectric conversion layer 23 to the first electrode 21 can be increased and generation of dark current can be suppressed.

Figure 114:
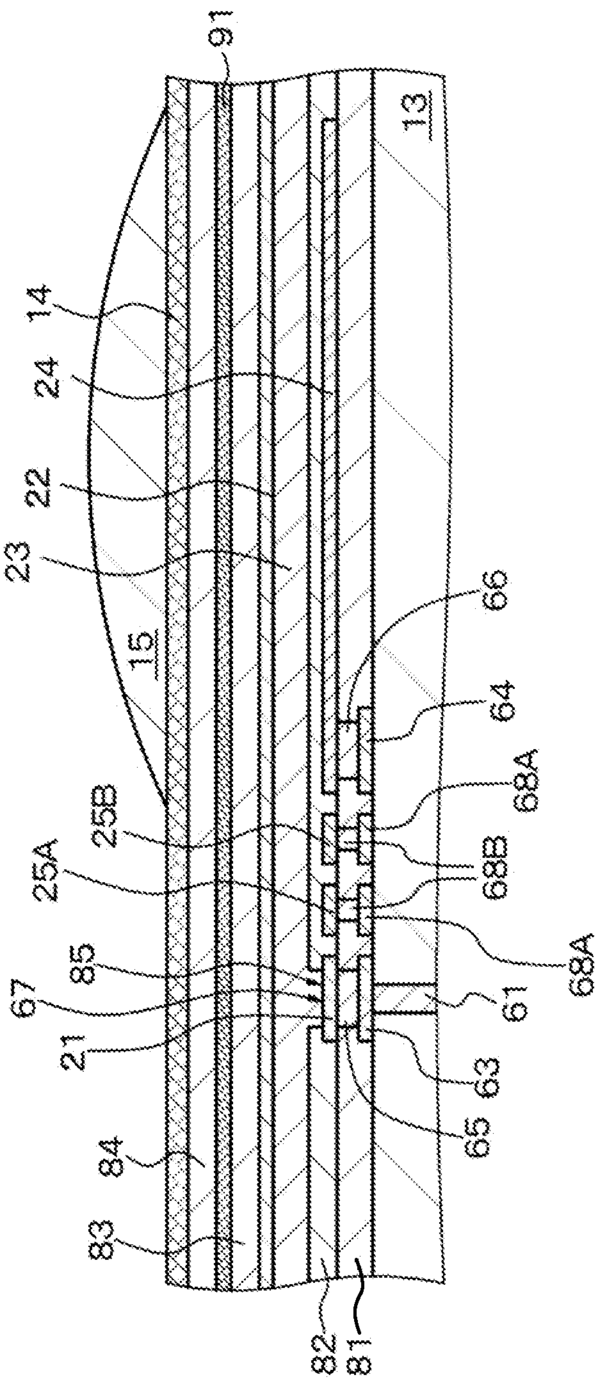
FIG. 114 is a schematic partial sectional view of a further modification of the stacked-type imaging element of the working example 10.

Further, as a modification of the working example 10, a plurality of transfer controlling electrodes may be provided from the position nearest to the first electrode 21 toward the charge accumulation electrode 24 as depicted in FIG. 114. It is to be noted that FIG. 114 depicts an example in which two transfer controlling electrodes 25A and 25B are provided. Further, the stacked-type imaging element can be structured such that an on-chip microlens 15 is provided above the charge accumulation electrode 24 and the second electrode 22 such that light incident to the on-chip microlens 15 is condensed to the charge accumulation electrode 24 and does not reach the first electrode 21 and the transfer controlling electrodes 25A and 25B.

Figure 115:
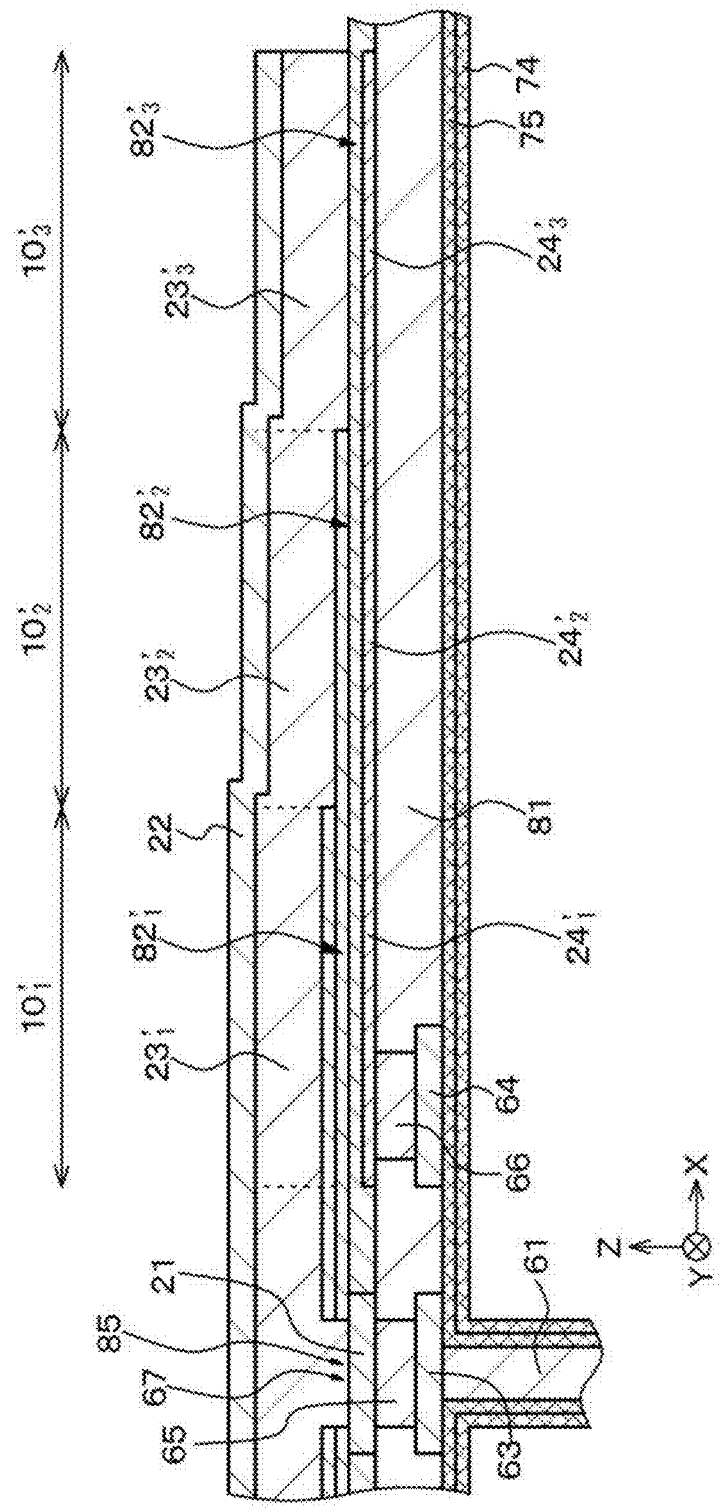
FIG. 115 is a schematic partial sectional view in which a portion at which the charge accumulation electrode, the photoelectric conversion layer, and the second electrode in a modification of the stacked-type imaging element of the working example 13 are stacked is enlarged.

In the working example 13 depicted in FIGS. 77 and 78, the thickness of the charge accumulation electrode segments $\mathbf{24'}_1$, $\mathbf{24'}_2$, and $\mathbf{24'}_3$ is gradually reduced to gradually increase the thickness of the insulating layer segments $\mathbf{82'}_1$, $\mathbf{82'}_2$, and $\mathbf{82'}_3$. On the other hand, as depicted in FIG. 115 that is a schematic partial sectional view in which a portion at which the charge accumulation electrode, photoelectric conversion layer and second electrode are stacked in a modification of the working example 13 is enlarged, the thickness of the charge accumulation electrode segments $\mathbf{24'}_1$, $\mathbf{24'}_2$, and $\mathbf{24'}_3$ may be fixed while the thickness of the insulating layer segments $\mathbf{82'}_1$, $\mathbf{82'}_2$, and $\mathbf{82'}_3$ is gradually increased. It is to be noted that the thickness of the photoelectric conversion layer segments $\mathbf{23'}_1$, $\mathbf{23'}_2$, and $\mathbf{23'}_3$ is fixed.

Figure 116:
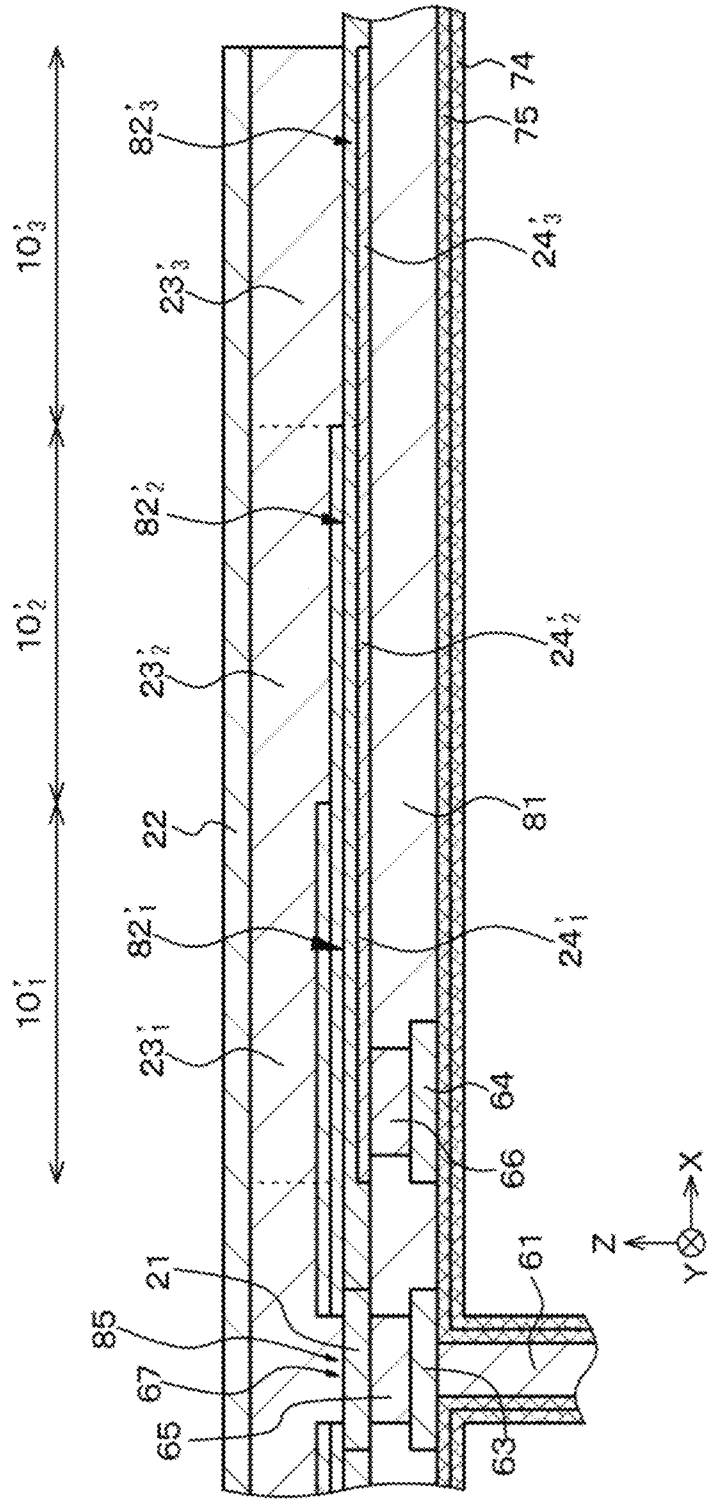
FIG. 116 is a schematic partial sectional view in which a portion at which the charge accumulation electrode, the photoelectric conversion layer, and the second electrode in a modification of the stacked-type imaging element of the working example 14 are stacked is enlarged.

Further, in the working example 14 depicted in FIG. 80, by gradually reducing the thickness of the charge accumulation electrode segments $\mathbf{24'}_1$, $\mathbf{24'}_2$, and $\mathbf{24'}_3$, the thickness of the photoelectric conversion layer segments $\mathbf{23'}_1$, $\mathbf{23'}_2$, and $\mathbf{23'}_3$ is gradually increased. On the other hand, as depicted in FIG. 116 that is a schematic partial sectional view in which a portion at which the charge accumulation electrode, photoelectric conversion layer and second electrode are stacked in a modification of the working example 14 is enlarged, the thickness of the photoelectric conversion layer segments $\mathbf{23'}_1$, $\mathbf{23'}_2$, and $\mathbf{23'}_3$ may be gradually increased by fixing the thickness of the charge accumulation electrode segments $\mathbf{24'}_1$, $\mathbf{24'}_2$, and $\mathbf{24'}_3$ and gradually reducing the thickness of the insulating layer segments $\mathbf{82'}_1$, $\mathbf{82'}_2$, and $\mathbf{82'}_3$.

While, in the working example 7, the wire grid polarizer is provided above the upper layer photoelectric conversion portion, alternatively the wire grid polarizer may be provided below the upper layer photoelectric conversion portion (between the upper layer photoelectric conversion portion and the lower layer photoelectric conversion portion, more particularly, at the interlayer insulating layer 81).

It is a matter of source that the various modifications described above can be applied also to the working example 8 to 20.

While, in the working examples, electrons are used as signal charge and the conductive type of the photoelectric conversion layer formed on the semiconductor substrate is the n-type, the present disclosure can be applied also to a solid-state imaging device in which holes are used as signal charge. In this case, it is sufficient if the semiconductor regions include semiconductor regions of the reverse conductive types, and it is sufficient if the conductive type of the photoelectric conversion layer formed on the semiconductor substrate is the p-type.

Further, while, in the working examples, the wire grid polarizer is used exclusively for acquisition of polarization information of the stacked-type imaging elements having sensitivity to a visible light wavelength band, in the case where the stacked-type imaging element has sensitivity to infrared rays or ultraviolet rays, it is possible to incorporate the wire grid polarizer as a wire grid polarizer that functions in an arbitrary frequency band by increasing or decreasing the formation pitch $P_0$ of the line portions in response to the stacked-type imaging element.

Further, while the working examples are described taking a case in which the present disclosure is applied to a CMOS type solid-state imaging device in which unit pixels that detect signal charge according to the incident light amount as a physical quantity are arrayed in a matrix as an example, the application of the present disclosure is not limited to that to a CMOS solid-state imaging device, and the present disclosure can be applied also to a CCD type solid-state imaging device. In the latter case, signal charge is transferred in the vertical direction by a vertical transfer register of the CCD type structure and is transferred in the horizontal direction by a horizontal transfer register and then is amplified and outputted as a pixel signal (image signal). Further, the present disclosure is not limited to general solid-state imaging device of the column type in which pixels are formed in a two-dimensional matrix and a column signal processing circuit is disposed for each pixel column. Furthermore, in some cases, it is possible to omit the selection transistor.

Furthermore, the stacked-type imaging element of the present disclosure can be applied not only to a solid-state imaging device that detects a distribution of the incident light amount of visible light and captures it as an image but also to a solid-state imaging device that captures a distribution of an incident amount of infrared rays, X rays, particles or the like as an image. Further, in a broad sense, the stacked-type imaging element of the present disclosure can be applied to general solid-state imaging devices (physical quantity distribution detection devices) such as a fingerprint detection sensor for detecting a distribution of any other physical quantity such as pressure, electrostatic capacitance and so forth and capturing the distribution as an image.

Furthermore, the solid-state imaging device of the present disclosure is not limited to a solid-state imaging device that scans unit pixels in an imaging region in order in a unit of a row to read out a pixel signal from each unit pixel. The solid-state imaging device of the present disclosure can be applied also to a solid-state imaging device of the X-Y address type in which an arbitrary pixel is selected in a unit of a pixel and a pixel signal is read out in a unit of a pixel from the selected pixel. The solid-state imaging device may have a form in which it is formed as one chip or may have a form of a module in which an imaging region and a driving circuit or an optical system are collectively packaged so as to have an imaging function.

Further, the present disclosure can be applied not only to a solid-state imaging device but also to an imaging device. Here, the imaging device refers to electronic equipment having an imaging function such as a camera system of a digital still camera, a video camera or the like or a portable telephone set. The imaging apparatus sometimes has a form of a module incorporated in electronic equipment, namely, a camera module is sometimes used as an imaging device.

Figure 117:
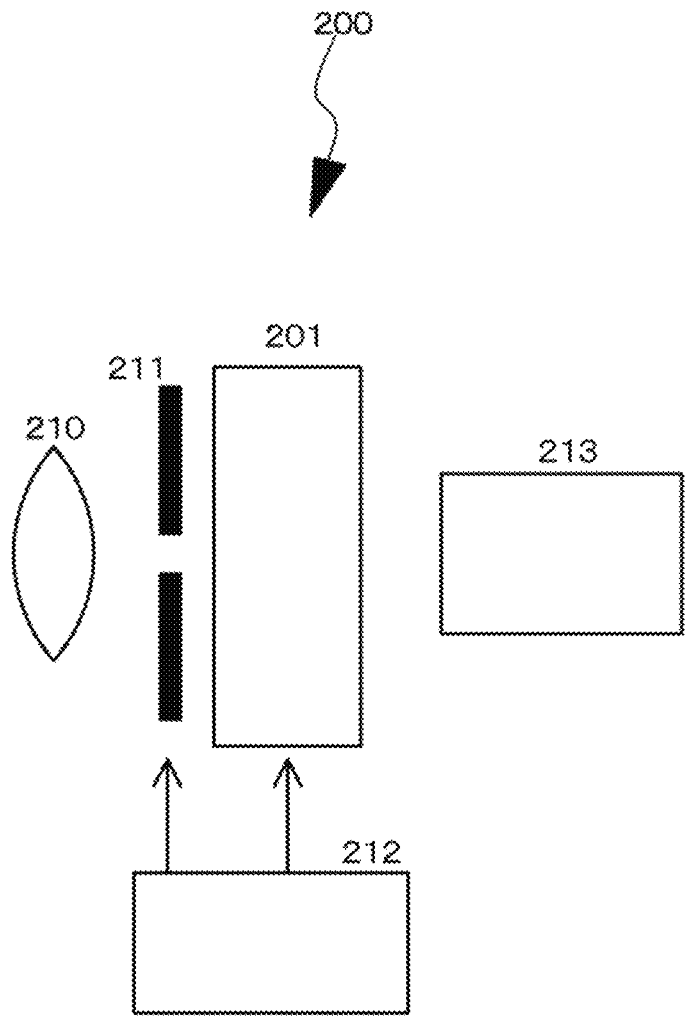
FIG. 117 is a conceptual diagram of an example in which the solid-state imaging device including the stacked-type imaging element of the present disclosure is used in electronic equipment (camera).

An example in which a solid-state imaging device 201 including the stacked-type imaging element of the present disclosure is used in electronic equipment (camera) 200 is depicted in a conceptual diagram of FIG. 117. The electronic equipment 200 includes the solid-state imaging device 201, an optical lens 210, a shutter device 211, a driving circuit 212 and a signal processing circuit 213. The optical lens 210 forms an image of image light (incident light) from an imaging object on an imaging plane of the solid-state imaging device 201. Consequently, signal charge is accumulated into the solid-state imaging device 201 for a fixed period of time. The shutter device 211 controls a light irradiation period and a light shielding period to the solid-state imaging device 201. The driving circuit 212 supplies a driving signal for controlling shutter operation of the shutter device 211 such as transfer operation to the solid-state imaging device 201. In response to a driving signal (timing signal) supplied from the driving circuit 212, signal transfer of the solid-state imaging device 201 is performed. The signal processing circuit 213 performs various signal processes. A video signal for which such signal processes have been performed is stored into a storage medium such as a memory or is outputted to a monitor. In such electronic equipment 200 as described above, since refinement of the pixel size and improvement of the transfer efficiency of the solid-state imaging device 201 can be achieved, the electronic equipment 200 in which improvement in pixel characteristic is achieved can be obtained. The electronic equipment 200 to which the solid-state imaging device 201 can be applied is not limited to a camera, but the solid-state imaging device 201 can be applied to such imaging devices as a digital still camera, a camera module for a mobile apparatus such as a portable telephone set and so forth.

As depicted in FIG. 124 that is a schematic partial sectional view and FIG. 125 that schematically depicts disposition of an effective pixel region 10*a*, an optical black pixel region 10*b* and a peripheral region 10*c* in a solid-state imaging device, the peripheral region 10*c* frequently includes a connection pad portion 19A for connection to an external circuit and so forth. Although the connection pad portion 19A is connected to a wiring provided in a semiconductor substrate 70, this connection state is not depicted in FIG. 124 or FIG. 126 hereinafter described. Here, the connection pad portion 19A is provided, for example, on a top face of a second interlayer insulating layer 84. Thus, an on-chip microlens underlayer 14 including, for example, SiN extends to the peripheral region 10*c*, and an opening 19B is provided at the extension of the on-chip microlens underlayer 14 positioned above the connection pad portion 19A and the connection pad portion 19A is exposed to a bottom portion of the opening 19. By adopting such a structure as described above, moisture or the like can be prevented from invading from the periphery of the connection pad portion 19A. Alternatively, as depicted in a schematic partial sectional view of FIG. 126, in place of extending the on-chip microlens underlayer 14 to the peripheral region 10*c*, such a structure can be adopted that the on-chip microlens underlayer 14 is terminated in the optical black pixel region 10*b* (OPB) while, for example, a SiN thin layer 19C is formed on a connection pad portion 19A provided in the peripheral region 10*c*, a second interlayer insulating layer 84 exposed to the peripheral region 10*c* and an on-chip microlens underlayer 14 and an on-chip microlens 15 formed in the optical black pixel region (OPB) 10_b_ and an opening 19B is provided in the SiN thin layer 19C positioned above the connection pad portion 19A such that the connection pad portion 19A is exposed to a bottom portion of the opening 19B.

In the solid-state imaging devices described hereinabove in connection with the working examples, WL-CSP (Wafer-Level Chip Size Package) may be applied. In particular, on the light incident side of the solid-state imaging devices described hereinabove in connection with the working examples, a lens substrate in which a lens is formed may be stacked on a substrate formed, for example from a silicon semiconductor substrate. This lens substrate is configured such that a plurality of substrates with a lens in which the lens is disposed on the inner side of a through-hole formed in the substrate is directly joined together and stacked. Here, direct joining of the substrates with a lens can be performed on the basis of a plasma joining method and can be performed also on the basis of metal bonding. Further, the lens substrate can be configured such that an anti-reflection film is formed on the joining face of the substrates with a lens and an anti-reflection film is formed on the lens surface. Here, the anti-reflection film formed on the joining face of the substrates with a lens and the anti-reflection film formed on the lens surface may be same as each other. Furthermore, the lens substrate can be configured such that a light shielding film is formed on a side face of the through-hole. Further, the lens substrate can be configured such that a glass cover for protecting the lens is further provided and a light shielding film that functions as an optical aperture is formed on the glass cover. Alternatively, the lens substrate can be configured such that the diameter of the through-hole of one of the plurality of stacked substrates with a lens functions as an optical aperture or may be configured such that a plurality of substrates with a lens and a substrate in which a lens is not formed in a through-hole are stacked and the diameter of the through-hole of the substrate on which no lens is formed functions as an optical aperture. It is to be noted that the lens substrate can be configured such that the diameter of the through-hole that functions as an optical aperture is smaller than the diameter of a curved face portion of a plurality of lenses that configures a stacked lens structure. The lens substrate described above is disclosed in WO2017/022188.

It is to be noted that the present disclosure can have such configurations as described below.

[A01] <<Solid-State Imaging Device: First Aspect>>

A solid-state imaging device including:

an imaging element group in which imaging elements each having a photoelectric conversion portion formed on or above a semiconductor substrate and further having a wire grid polarizer and an on-chip microlens are arrayed in a two-dimensional matrix; and a first interlayer insulating layer and a second interlayer insulating layer provided on a light incident side of the photoelectric conversion portions, in which the wire grid polarizer is provided between the first interlayer insulating layer and the second interlayer insulating layer, the on-chip microlens is provided on the second interlayer insulating layer, the first interlayer insulating layer and the second interlayer insulating layer include an oxide material or a resin material, and the on-chip microlens includes silicon nitride or silicon oxynitride.

[A02] <<Solid-State Imaging Device: Second Aspect>>

A solid-state imaging device including:

an imaging element group in which imaging elements each having a photoelectric conversion portion formed on or above a semiconductor substrate and further having a wire grid polarizer and an on-chip microlens are arrayed in a two-dimensional matrix; and a first interlayer insulating layer and a second interlayer insulating layer provided on a light incident side of the photoelectric conversion portions, in which the wire grid polarizer is provided between the first interlayer insulating layer and the second interlayer insulating layer, the on-chip microlens is provided on the second interlayer insulating layer, and where a refractive index of a material configuring the first interlayer insulating layer is $n_1$, a refractive index of a material configuring the second interlayer insulating layer is $n_2$, and a refractive index of a material configuring the on-chip microlens is $n_0$, $$n_0-n_1 \geq 0 \text{ and}$$

$$n_0-n_2 \geq 0$$

are satisfied.

[A03] The solid-state imaging device according to [A01] or [A02], in which the first interlayer insulating layer is structured such that a first interlayer insulating layer-lower layer and a first interlayer insulating layer-upper layer are stacked, a light shielding portion is provided at a location between the first interlayer insulating layer-lower layer and the first interlayer insulating layer-upper layer positioned above a region between adjacent ones of the imaging elements, the second interlayer insulating layer is structured such that a second interlayer insulating layer-lower layer and a second interlayer insulating layer-upper layer are stacked, and a color filter layer is provided at a location between the second interlayer insulating layer-lower layer and the second interlayer insulating layer-upper layer positioned above each photoelectric conversion portion.

[A04] The solid-state imaging device according to [A01] or [A02], in which the first interlayer insulating layer is structured such that a first interlayer insulating layer-lower layer, a first interlayer insulating layer-intermediate layer, and a first interlayer insulating layer-upper layer are stacked, a light shielding portion is provided at a location between the first interlayer insulating layer-lower layer and the first interlayer insulating layer-intermediate layer positioned above a region between adjacent ones of the imaging elements, and a color filter layer is provided at a location between the first interlayer insulating layer-intermediate layer and the first interlayer insulating layer-upper layer positioned above each photoelectric conversion portion.

[A05] The solid-state imaging device according to [A01] or [A02], in which a light shielding portion extending from the wire grid polarizer is provided at a location between a wire grid polarizer and another wire grid polarizer positioned above a region between adjacent ones of the imaging elements, the second interlayer insulating layer is structured such that a second interlayer insulating layer-lower layer and a second interlayer insulating layer-upper layer are stacked, and a color filter layer is provided at a location between the second interlayer insulating layer-lower layer and the second interlayer insulating layer-upper layer positioned above each photoelectric conversion portion.

[A06] The solid-state imaging device according to [A01] or [A02], in which the first interlayer insulating layer is structured such that a first interlayer insulating layer-lower layer and a first interlayer insulating layer-upper layer are stacked, a color filter layer is provided at a location between the first interlayer insulating layer-lower layer and the first interlayer insulating layer-upper layer positioned above each photoelectric conversion portion, and a light shielding portion extending from the wire grid polarizer is provided at a location between a wire grid polarizer and another wire grid polarizer positioned above a region between adjacent ones of the imaging elements.

[$B_{01}$] The solid-state imaging device according to any one of [A01] to [A06], in which the photoelectric conversion portion includes a plurality of stacked photoelectric conversion portions. [$B_{02}$] The solid-state imaging device according to [$B_{01}$], in which at least one photoelectric conversion portion from among the plurality of stacked photoelectric conversion portions includes a first electrode, a photoelectric conversion layer, and a second electrode stacked on each other and further includes a charge accumulation electrode disposed in a spaced relation from the first electrode and besides disposed in an opposing relation to the photoelectric conversion layer with an insulating layer interposed therebetween.

[$B_{03}$] The solid-state imaging device according to [$B_{02}$], further including:

a semiconductor substrate, in which at least one photoelectric conversion portion from among the plurality of stacked photoelectric conversion portions is positioned above the semiconductor substrate.

[$B_{04}$] The solid-state imaging device according to [$B_{02}$] or [$B_{03}$], in which the first electrode extends in an opening provided in the insulating layer and is connected to the photoelectric conversion layer.

[$B_{05}$] The solid-state imaging device according to [B02] or [B03], in which the photoelectric conversion layer extends in an opening provided in the insulating layer and is connected to the first electrode.

[B06] The solid-state imaging device according to [B05], in which an edge portion of a top face of the first electrode is covered with the insulating layer, the first electrode is exposed to a bottom face of the opening, and where a face of the insulating layer contacting with the top face of the first electrode is a first face and a face of the insulating layer contacting with a portion of the photoelectric conversion layer opposing to the charge accumulation electrode is a second face, a side face of the opening has an inclination that expands from the first face toward the second face.

[B07] The solid-state imaging device according to [B06], in which the side face of the opening having the inclination that expands from the first face toward the second face is positioned on the charge accumulation electrode side.

[B08] <<Control of Potential at First Electrode and Charge Accumulation Electrode>>

The solid-state imaging device according to any one of [B02] to [B07], further including:

a control portion provided on the semiconductor substrate and including a driving circuit, in which the first electrode and the charge accumulation electrode are connected to the driving circuit, during a charge accumulation period, from the driving circuit, a potential $V_{11}$ is applied to the first electrode, a potential $V_{12}$ is applied to the charge accumulation electrode, and charge is accumulated into the photoelectric conversion layer, and during a charge transfer period, from the driving circuit, a potential $V_{21}$ is applied to the first electrode, a potential $V_{22}$ is applied to the charge accumulation electrode, and charge accumulated in the photoelectric conversion layer is read out to the control portion via the first electrode, where, in the case where the potential of the first electrode is higher than the potential of the second electrode, $$V_{12} \geq V_{11}, \text{ and } V_{22} < V_{21}$$

are satisfied, but in the case where the potential of the first electrode is lower than the potential of the second electrode, $$V_{12} \leq V_{11}, \text{ and } V_{22} > V_{21}$$

are satisfied.

[B09] <<Transfer Controlling Electrode>>

The solid-state imaging device according to any one of [B02] to [B07], further including:

a transfer controlling electrode disposed in a spaced relation from the first electrode and the charge accumulation electrode between the first electrode and the charge accumulation electrode and besides disposed in an opposing relation to the photoelectric conversion layer with the insulating layer interposed therebetween.

[B10] <<Control of Potential of First Electrode, Charge Accumulation Electrode, and Transfer Controlling Electrode>>

The solid-state imaging device according to [B09], further including:

a control portion provided on the semiconductor substrate and including a driving circuit, in which the first electrode, the charge accumulation electrode, and the transfer controlling electrode are connected to the driving circuit, during a charge accumulation period, from the driving circuit, a potential $V_{11}$ is applied to the first electrode, a potential $V_{12}$ is applied to the charge accumulation electrode, a potential $V_{13}$ is applied to the transfer controlling electrode, and charge is accumulated into the photoelectric conversion layer, and during a charge transfer period, from the driving circuit, a potential $V_{21}$ is applied to the first electrode, a potential $V_{22}$ is applied to the charge accumulation electrode, a potential $V_{23}$ is applied to the transfer controlling electrode, and charge accumulated in the photoelectric conversion layer is read out to the control portion via the first electrode, where, in the case where the potential of the first electrode is higher than the potential of the second electrode, $$V_{12} > V_{13}, \text{ and } V_{22} \leq V_{23} \leq V_{21}$$

are satisfied, but in the case where the potential of the first electrode is lower than the potential of the second electrode, $$V_{12} < V_{13}, \text{ and } V_{22} \geq V_{23} \geq V_{21}$$

are satisfied.

[B11] <<Discharging Electrode>>

The solid-state imaging device according to any one of [B02] to [B10], further including:

a discharging electrode connected to the photoelectric conversion layer and disposed in a spaced relation from the first electrode and the charge accumulation electrode.

[B12] The solid-state imaging device according to [B11], in which the discharging electrode is disposed so as to surround the first electrode and the charge accumulation electrode.

[B13] The solid-state imaging device according to [B11] or [B12], in which the photoelectric conversion layer extends in a second opening provided in the insulating layer and is connected to the discharging electrode, an edge portion of a top face of the discharging electrode is covered with the insulating layer, the discharging electrode is exposed to a bottom face of the second opening, and where a face of the insulating layer contacting with the top face of the discharging electrode is a third face and a face of the insulating layer contacting with a portion of the photoelectric conversion layer opposing to the charge accumulation electrode is a second face, a side face of the second opening has an inclination that expands from the third face toward the second face.

[B14] <<Control of Potential of First Electrode, Charge Accumulation Electrode, and Discharging Electrode>>

The solid-state imaging device according to any one of [B11] to [B13], further including:

a control portion provided on the semiconductor substrate and including a driving circuit, in which the first electrode, the charge accumulation electrode, and the discharging electrode are connected to the driving circuit, during a charge accumulation period, from the driving circuit, a potential $V_{11}$ is applied to the first electrode, a potential $V_{12}$ is applied to the charge accumulation electrode, a potential $V_{14}$ is applied to the discharging electrode, and charge is accumulated into the photoelectric conversion layer, and during a charge transfer period, from the driving circuit, a potential $V_{21}$ is applied to the first electrode, a potential $V_{22}$ is applied to the charge accumulation electrode, a potential $V_{24}$ is applied to the discharging electrode, and charge accumulated in the photoelectric conversion layer is read out to the control portion via the first electrode, where, in the case where the potential of the first electrode is higher than the potential of the second electrode, $$V_{14}>V_{11}, \text{ and } V_{24}<V_{21}$$

are satisfied, but in the case where the potential of the first electrode is lower than the potential of the second electrode, $$V_{14}<V_{11}, \text{ and } V_{24}>V_{21}$$

are satisfied.

[B15] <<Charge Accumulation Electrode Segment>>

The solid-state imaging device according to any one of [B02] to [B14], in which the charge accumulation electrode includes a plurality of charge accumulation electrode segments.

[B16] The solid-state imaging device according to [B15], in which in the case where the potential of the first electrode is higher than the potential of the second electrode, the potential applied to a charge accumulation electrode segment positioned nearest to the first electrode during a charge transfer period is higher than the potential applied to a charge accumulation electrode segment positioned most remotely from the first electrode, and in the case where the potential of the first electrode is lower than the potential of the second electrode, the potential applied to the charge accumulation electrode segment positioned nearest to the first electrode during a charge transfer period is lower than the potential applied to the charge accumulation electrode segment positioned most remotely from the first electrode.

[B17] The solid-state imaging device according to any one of [B02] to [B16], in which at least a floating diffusion layer and an amplification transistor that configure the control portion are provided on the semiconductor substrate, and the first electrode is connected to the floating diffusion layer and a gate portion of the amplification transistor.

[B18] The solid-state imaging device according to [B17], in which a reset transistor and a selection transistor that configure the control portion are further provided on the semiconductor substrate, the floating diffusion layer is connected to one of source/drain regions of the reset transistor, and one of source/drain regions of the amplification transistor is connected to one of source/drain regions of the selection transistor, and the other of the source/drain regions of the selection transistor is connected to a signal line.

[B19] The solid-state imaging device according to any one of [B02] to [B18], in which the charge accumulation electrode has a size greater than that of the first electrode.

[B20] The solid-state imaging device according to any one of [B02] to [B19], in which light is incident from the second electrode side, and a light shielding layer is formed on the light incident side rather near to the second electrode.

[B21] The solid-state imaging device according to any one of [B02] to [B19], in which light is incident from the second electrode side, and light is not incident to the first electrode.

[B22] The solid-state imaging device according to [B21], in which a light shielding layer is formed on the light incident side rather near to the second electrode above the first electrode.

[B23] The solid-state imaging device according to [B21], in which light incident to the on-chip microlens is condensed to the charge accumulation electrode.

[B24] <<Stacked-Type Imaging Element: First Configuration>>

The solid-state imaging device according to any one of [B02] to [B23], in which at least one of the photoelectric conversion portions includes N (where N≥2) photoelectric conversion portion segments, the photoelectric conversion layer includes N photoelectric conversion layer segments, the insulating layer includes N insulating layer segments, the charge accumulation electrode includes N charge accumulation electrode segments, the nth (where n=1, 2, 3, . . . , N) photoelectric conversion portion segment includes the nth charge accumulation electrode segment, the nth insulating layer segment, and the nth photoelectric conversion layer segment, the photoelectric conversion portion segment having a higher value of n is positioned more remotely from the first electrode, and the thickness of the insulating layer segment indicates a gradual change over from the first photoelectric conversion portion segment to the Nth photoelectric conversion portion segment.

[B25] <<Stacked-Type Imaging Element: Second Configuration>>

The solid-state imaging device according to any one of [B02] to [B23], in which at least one of the photoelectric conversion portions includes N (where N≥2) photoelectric conversion portion segments, the photoelectric conversion layer includes N photoelectric conversion layer segments, the insulating layer includes N insulating layer segments, the charge accumulation electrode includes N charge accumulation electrode segments, the nth (where n=1, 2, 3, . . . , N) photoelectric conversion portion segment includes the nth charge accumulation electrode segment, the nth insulating layer segment, and the nth photoelectric conversion layer segment, the photoelectric conversion portion segment having a higher value of n is positioned more remotely from the first electrode, and the thickness of the photoelectric conversion layer segment indicates a gradual change over from the first photoelectric conversion portion segment to the Nth photoelectric conversion portion segment.

[B26] <<Stacked-Type Imaging Element: Third Configuration>>

The solid-state imaging device according to any one of [B02] to [B23], in which at least one of the photoelectric conversion portions includes N (where N≥2) photoelectric conversion portion segments, the photoelectric conversion layer includes N photoelectric conversion layer segments, the insulating layer includes N insulating layer segments, the charge accumulation electrode includes N charge accumulation electrode segments, the nth (where n=1, 2, 3, . . . , N) photoelectric conversion portion segment includes the nth charge accumulation electrode segment, the nth insulating layer segment, and the nth photoelectric conversion layer segment, the photoelectric conversion portion segment having a higher value of n is positioned more remotely from the first electrode, and a material configuring the insulating layer segment is different between adjacent ones of the photoelectric conversion portion segments.

[B27] <<Stacked-Type Imaging Element: Fourth Configuration>>

The solid-state imaging device according to any one of [B02] to [B23], in which at least one of the photoelectric conversion portions includes N (where N≥2) photoelectric conversion portion segments, the photoelectric conversion layer includes N photoelectric conversion layer segments, the insulating layer includes N insulating layer segments, the charge accumulation electrode includes N charge accumulation electrode segments disposed in a spaced relation from each other, the nth (where n=1, 2, 3, . . . , N) photoelectric conversion portion segment includes the nth charge accumulation electrode segment, the nth insulating layer segment, and the nth photoelectric conversion layer segment, the photoelectric conversion portion segment having a higher value of n is positioned more remotely from the first electrode, and a material configuring the charge accumulation electrode segment is different between adjacent ones of the photoelectric conversion portion segments.

[B28] <<Stacked-Type Imaging Element: Fifth Configuration>>

The solid-state imaging device according to any one of [B02] to [B23], in which at least one of the photoelectric conversion portions includes N (where N≥2) photoelectric conversion portion segments, the photoelectric conversion layer includes N photoelectric conversion layer segments, the insulating layer includes N insulating layer segments, the charge accumulation electrode includes N charge accumulation electrode segments disposed in a spaced relation from each other, the nth (where n=1, 2, 3, . . . , N) photoelectric conversion portion segment includes the nth charge accumulation electrode segment, the nth insulating layer segment, and the nth photoelectric conversion layer segment, the photoelectric conversion portion segment having a higher value of n is positioned more remotely from the first electrode, and an area of the charge accumulation electrode segment indicates a gradual decrease over from the first photoelectric conversion portion segment to the Nth photoelectric conversion portion segment.

[B29] <<Stacked-Type Imaging Element: Sixth Configuration>>

The solid-state imaging device according to any one of [B02] to [B23], in which where a stack direction of the charge accumulation electrode, the insulating layer, and the photoelectric conversion layer is a Z direction and a direction away from the first electrode is an X direction, a cross sectional area of a stacked portion at which the charge accumulation electrode, the insulating layer, and the photoelectric conversion layer are stacked when the stacked portion is cut along a YZ virtual plane changes depending upon the distance from the first electrode.

[B30] The solid-state imaging device according to any one of [A01] to [B29], in which the wire grid polarizer includes four polarizer segments including a first polarizer segment, a second polarizer segment, a third polarizer segment, and a fourth polarizer segment and arrayed in 2×2, a polarization direction of light to be transmitted by the first polarizer segment is $\alpha$ degrees, a polarization direction of light to be transmitted by the second polarizer segment is ($\alpha$+45) degrees, a polarization direction of light to be transmitted by the third polarizer segment is ($\alpha$+90) degrees, and a polarization direction of light to be transmitted by the fourth polarizer segment is ($\alpha$+135) degrees.

[B31] The solid-state imaging device according to any one of [A01] to [B30], in which the plurality of photoelectric conversion portions includes a photoelectric conversion portion having sensitivity to white light and another photoelectric conversion portion having sensitivity to near infrared light.

[B32] The solid-state imaging device according to any one of [A01] to [B30], in which the plurality of photoelectric conversion portions includes a photoelectric conversion portion having sensitivity to red light, green light, or blue light and another photoelectric conversion portion having sensitivity to near infrared light.

[B33] The solid-state imaging device according to [B32], in which the photoelectric conversion portion having sensitivity to red light, green light, or blue light includes two different photoelectric conversion portions selected from a group including a red light photoelectric conversion portion having sensitivity to red light, a green light photoelectric conversion portion having sensitivity to green light, and a blue light photoelectric conversion portion having sensitivity to blue light and stacked on each other.

[B34] The solid-state imaging device according to any one of [A01] to [B33], in which a protective film is formed at least on a side face of a line portion that faces a space portion of the wire grid polarizer.

[B35] The solid-state imaging device according to any one of [A01] to [B34], further including:

a frame portion surrounding the wire grid polarizer, in which the frame portion and a line portion of the wire grid polarizer are connected to each other, and the frame portion has a structure same as that of the line portion of the wire grid polarizer.

[B36] The solid-state imaging device according to any one of [A01] to [B34], in which a driving circuit for driving the photoelectric conversion portion is formed on one of faces of the substrate, the photoelectric conversion portion is formed on the other of the faces of the substrate, and a groove portion is formed, at an edge portion of the stacked-type imaging element, extending from the one face of the substrate to the other face of the substrate and further to below the wire grid polarizer and having an insulating material or a light shielding material filled therein.

[B37] The solid-state imaging device according to any one of [A01] to [B36], in which a line portion of the wire grid polarizer includes a stack structure in which a light reflection layer including a first conductive material, an insulating film, and a light absorption layer including a second conductive material are stacked from the photoelectric conversion portion side.

[B38] The solid-state imaging device according to [B37], in which an underlayer is formed between the photoelectric conversion portion and the light reflection layer.

[B39] The solid-state imaging device according to [B37] or [B38], in which an extension of the light reflection layer is electrically connected to the substrate or the photoelectric conversion portion.

[B40] The solid-state imaging device according to any one of [B37] to [B39], in which an insulating film is formed over an overall area of a top face of the light reflection layer and a light absorption layer is formed over an overall area of a top face of the insulating film.

[C01] The solid-state imaging device according to any one of [A01] to [B40], in which imaging element units each including four stacked-type imaging elements arrayed in 2×2 and including a first stacked-type imaging element, a second stacked-type imaging element, a third stacked-type imaging element, and a fourth stacked-type imaging element are arrayed in a two-dimensional matrix, and each of the imaging element units further includes a wire grid polarizer at least on the light incident side of the fourth stacked-type imaging element.

[C02] The solid-state imaging device according to [C01], in which in each of the imaging element units, the first stacked-type imaging element includes a photoelectric conversion portion having sensitivity to red light and another photoelectric conversion portion having sensitivity to near infrared light, the second stacked-type imaging element includes a photoelectric conversion portion having sensitivity to green light and another photoelectric conversion portion having sensitivity to near infrared light, the third stacked-type imaging element includes a photoelectric conversion portion having sensitivity to blue light and another photoelectric conversion portion having sensitivity to near infrared light, and the first stacked-type imaging element, the second stacked-type imaging element, and the third stacked-type imaging element include no wire grid polarizer.

[C03] The solid-state imaging device according to [C02], in which the fourth stacked-type imaging element includes a photoelectric conversion portion having sensitivity to white light and another photoelectric conversion portion having sensitivity to near infrared light.

[C04] The solid-state imaging device according to [C01], in which each of the imaging element units further includes a wire grid polarizer on the light incident side of the first stacked-type imaging element, the second stacked-type imaging element, and the third stacked-type imaging element, and the wire grid polarizers provided in the first stacked-type imaging element, the second stacked-type imaging element, the third stacked-type imaging element, and the fourth stacked-type imaging element have a same polarization direction.

[C05] The solid-state imaging device according to [C04], in which the polarization direction the wire grid polarizer has is different between adjacent ones of the imaging element units.

[C06] The solid-state imaging device according to [C01], in which the first stacked-type imaging element includes a photoelectric conversion portion having sensitivity to red light and another photoelectric conversion portion having sensitivity to near infrared light, the second stacked-type imaging element includes a photoelectric conversion portion having sensitivity to green light and another photoelectric conversion portion having sensitivity to near infrared light, the third stacked-type imaging element includes a photoelectric conversion portion having sensitivity to blue light and another photoelectric conversion portion having sensitivity to near infrared light, an imaging element unit group includes four imaging element units arrayed in 2×2 and including a first imaging element unit, a second imaging element unit, a third imaging element unit, and a fourth imaging element unit, a polarization direction of light to be transmitted by a first wire grid polarizer provided in the first imaging element unit is $\alpha$ degrees, a polarization direction of light to be transmitted by a second wire grid polarizer provided in the second imaging element unit is $(\alpha+45)$ degrees, a polarization direction of light to be transmitted by a third wire grid polarizer provided in the third imaging element unit is (α+90) degrees, and a polarization direction of light to be transmitted by a fourth wire grid polarizer provided in the fourth imaging element unit is (α+135) degrees.

[C07] The solid-state imaging device according to [C01], in which the first stacked-type imaging element includes a photoelectric conversion portion having sensitivity to red light and another photoelectric conversion portion having sensitivity to near infrared light, the second stacked-type imaging element includes a photoelectric conversion portion having sensitivity to green light and another photoelectric conversion portion having sensitivity to near infrared light, the third stacked-type imaging element includes a photoelectric conversion portion having sensitivity to blue light and another photoelectric conversion portion having sensitivity to near infrared light, the fourth stacked-type imaging element includes a photoelectric conversion portion having sensitivity to white light and another photoelectric conversion portion having sensitivity to near infrared light, the wire grid polarizer provided on the light incident side of the fourth stacked-type imaging element includes four polarizer segments arrayed in 2×2 and including a fourth-first polarizer segment, a fourth-second polarizer segment, a fourth-third polarizer segment, and a fourth-fourth polarizer segment, a polarization direction of light to be transmitted by the fourth-first polarizer segment is α degrees, a polarization direction of light to be transmitted by the fourth-second polarizer segment is (α+45) degrees, a polarization direction of light to be transmitted by the fourth-third polarizer segment is (α+90) degrees, and a polarization direction of light to be transmitted by the fourth-fourth polarizer segment is (α+135) degrees.

[C08] The solid-state imaging device according to [C07], in which each of the imaging element units further includes a wire grid polarizer on the light incident side of each of the first stacked-type imaging element, the second stacked-type imaging element, and the third stacked-type imaging element, the wire grid polarizer provided on the light incident side of the first stacked-type imaging element includes four polarizer segments arrayed in 2×2 and including a first-first polarizer segment, a first-second polarizer segment, a first-third polarizer segment, and a first-fourth polarizer segment, a polarization direction of light to be transmitted by the first-first polarizer segment is ρ degrees, a polarization direction of light to be transmitted by the first-second polarizer segment is (β+45) degrees, a polarization direction of light to be transmitted by the first-third polarizer segment is (β+90) degrees, a polarization direction of light to be transmitted by the first-fourth polarizer segment is (β+135) degrees, the wire grid polarizer provided on the light incident side of the second stacked-type imaging element includes four polarizer segments arrayed in 2×2 and including a second-first polarizer segment, a second-second polarizer segment, a second-third polarizer segment, and a second-fourth polarizer segment, a polarization direction of light to be transmitted by the second-first polarizer segment is γ degrees, a polarization direction of light to be transmitted by the second-second polarizer segment is (γ+45) degrees, a polarization direction of light to be transmitted by the second-third polarizer segment is (γ+90) degrees, a polarization direction of light to be transmitted by the second-fourth polarizer segment is (γ+135) degrees, the wire grid polarizer provided on the light incident side of the third stacked-type imaging element includes four polarizer segments arrayed in 2×2 and including a third-first polarizer segment, a third-second polarizer segment, a third-third polarizer segment, and a third-fourth polarizer segment, a polarization direction of light to be transmitted by the third-first polarizer segment is δ degrees, a polarization direction of light to be transmitted by the third-second polarizer segment is (δ+45) degrees, a polarization direction of light to be transmitted by the third-third polarizer segment is (δ+90) degrees, and a polarization direction of light to be transmitted by the third-fourth polarizer segment is (δ+135) degrees.

[C09] The solid-state imaging device according to [C08], in which

α=β=γ=δ is satisfied.

[D01] <<Solid-State Imaging Device: First Configuration>>

A solid-state imaging device including:

a photoelectric conversion portion in which a first electrode, a photoelectric conversion layer, and a second electrode are stacked, in which the photoelectric conversion portion includes a plurality of imaging elements according to any one of [B01] to [B40], an imaging element block includes the plurality of imaging elements, and the first electrode is shared by the plurality of imaging elements that configures the imaging element block.

[D02] <<Solid-State Imaging Device: Second Configuration>>

A solid-state imaging device including:

a plurality of imaging elements according to any one of [B01] to [B40], in which an imaging element block includes the plurality of imaging elements, and a first electrode is shared by the plurality of imaging elements that configures the imaging element block.

[D03] The solid-state imaging device according to [D01] or [D02], in which one on-chip microlens is disposed above one imaging element.

[D04] The solid-state imaging device according to [D01] or [D02], in which the imaging element block includes two imaging elements, and one on-chip microlens is disposed above the imaging element block.

[D05] The solid-state imaging device according to any one of [D01] to [D04], in which one floating diffusion layer is provided for a plurality of imaging elements.

[D06] The solid-state imaging device according to any one of [D01] to [D05], in which the first electrode is disposed adjacent the charge accumulation electrode of each imaging element.

[D07] The solid-state imaging device according to any one of [D01] to [D06], in which the first electrode is disposed adjacent the charge accumulation electrode of some of the plurality of imaging elements but is not disposed adjacent the charge accumulation electrode of the remaining ones of the plurality of imaging elements.

[D08] The solid-state imaging device according to [D07], in which a distance between a charge accumulation electrode configuring an imaging element and another charge accumulation electrode configuring the imaging element is greater than a distance between the first electrode and the charge accumulation electrode in the imaging element adjacent the first electrode.

[E01] <<Driving Method for Solid-State Imaging Device>>

A driving method for a solid-state imaging device that includes a photoelectric conversion portion in which a first electrode, a photoelectric conversion layer, and a second electrode are stacked, the photoelectric conversion portion further including a charge accumulation electrode disposed in a spaced relation from the first electrode and besides disposed in an opposing relation to the photoelectric conversion layer with an insulating layer interposed therebetween, the solid-state imaging device including a plurality of imaging elements structured such that light is incident from the second electrode side but light is not incident to the first electrode, the driving method repeating the steps of:

discharging, while charge is accumulated into the photoelectric conversion layer all at once in all imaging elements, the charge in the first electrode to the outside of the system; and transferring the charge accumulated in the photoelectric conversion layer in all imaging elements all at once to the first electrode and, after completion of the transfer, sequentially reading out the charge transferred to the first electrode from the imaging elements.

REFERENCE SIGNS LIST

10, 10R, 10G, 10B, 10W, 10*i*R . . . Photoelectric conversion portion, 10'$_1$, 10'$_2$, 10'$_3$ . . . Photoelectric conversion portion segment, 10$_1$, 11$_1$ . . . First stacked-type imaging element, 10$_2$, 11$_2$ . . . Second stacked-type imaging element, 10$_3$, 11$_3$ . . . Third stacked-type imaging element, 10$_4$, 11$_4$ . . . Fourth stacked-type imaging element, 10R$_1$, 10R$_2$, 10R$_3$, 10R$_4$, 10G$_1$, 10G$_2$, 10G$_3$, 10G$_4$, 10B$_1$, 10B$_2$, 10B$_3$, 10B$_4$, 10W$_1$, 10W$_2$, 10W$_3$, 10W$_4$ . . . Photoelectric conversion portion (photoelectric conversion element), 10*i*R$_{11}$, 10*i*R$_{12}$, 10*i*R$_{13}$, 10*i*R$_{14}$, 10*i*R$_{21}$, 10*i*R$_{22}$, 10*i*R$_{23}$, 10*i*R$_{24}$, 10*i*R$_{31}$, 10*i*R$_{32}$, 10*i*R$_{33}$, 10*i*R$_{34}$, 10*i*R$_{41}$, 10*i*R$_{42}$, 10*i*R$_{43}$, 10*i*R$_{44}$ . . . Photoelectric conversion portion having sensitivity to near infrared light, 10$_a$ . . . Effective pixel region, 10$_b$ . . . Optical black pixel region (OPB), 12$_1$ . . . First imaging element unit, 12$_2$ . . . Second imaging element unit, 12$_3$ . . . Third imaging element unit, 12$_4$ . . . Fourth imaging element unit, 13 . . . Various imaging element components positioned below interlayer insulating layer, 14 . . . On-chip microlens underlayer, 15 . . . On-chip microlens (OCL), 16, 16R, 16G, 16B . . . Color filter layer (wavelength selection means), 17A, 17B . . . Light shielding portion, 18 . . . Light shielding layer, 21 . . . First electrode, 22 . . . Second electrode, 23 . . . Photoelectric conversion layer, 23A . . . Lower layer semiconductor layer, 23B . . . Upper layer photoelectric conversion layer, 23'$_1$, 23'$_2$, 23'$_3$ . . . Photoelectric conversion layer segment, 24, 24"$_1$, 24"$_2$, 24"$_3$ . . . Charge accumulation electrode, 24A, 24B, 24C, 24'$_1$, 24'$_2$, 24'$_3$ . . . Charge accumulation electrode segment, 25, 25A, 25B . . . Transfer controlling electrode (charge transfer electrode), 26 . . . Discharging electrode, 27, 27A$_1$, 27A$_2$, 27A$_3$, 27B$_1$, 27B$_2$, 27B$_3$, 27C . . . Charge movement controlling electrode, 31, 33, 41, 43 . . . n-type semiconductor region, 32, 34, 42, 44, 73 . . . $p^+$ layer, 35, 36, 45, 46 . . . Gate portion of transfer transistor, 35C, 36C . . . Region of semiconductor substrate, 36A . . . Transfer channel, 41 . . . n-type semiconductor region, 42, 44 . . . $p^+$ layer, 43 . . . n-type semiconductor region, 45 . . . Gate portion of transfer transistor TR2$_{trs}$, 45C . . . Region of semiconductor substrate in proximity of gate portion of transfer transistor TR2$_{trs}$, 46 . . . Gate portion of transfer transistor TR3$_{trs}$, 46A . . . Transfer channel, 46C . . . Region of semiconductor substrate in proximity of gate portion of transfer transistor TR3$_{trs}$, 51 . . . Gate portion of reset transistor TR1$_{rst}$, 51A . . . Channel formation region of reset transistor TR1$_{rst}$, 51B, 51C . . . Source/drain regions of reset transistor TR1$_{rst}$, 52 . . . Gate portion of amplification transistor TR1$_{amp}$, 52A . . . Channel formation region of amplification transistor TR1$_{amp}$, 52B, 52C . . . Source/drain regions of amplification transistor TR1$_{amp}$, 53 . . . Gate portion of selection transistor TR1$_{sel}$, 53A . . . Channel formation region of selection transistor TR1$_{sel}$, 53B, 53C . . . Source/drain regions of selection transistor TR1$_{sel}$, 61 . . . Contact hole portion, 62 . . . Wiring layer, 63, 64, 68A . . . Pad portion, 65, 68B . . . Connection hole, 66, 67, 69 . . . Connection portion, 70 . . . Semiconductor substrate, 70A . . . First face (front face) of semiconductor substrate, 70B . . . Second face (rear face) of semiconductor substrate, 71 . . . Element isolation region, 72 . . . Oxide film, 74 . . . $HfO_2$ film, 75 . . . Insulating material film, 76, 77, 78, 81 . . . Interlayer insulating layer, 82 . . . Insulating layer, 82'$_1$, 82'$_2$, 82'$_3$ . . . Insulating layer segment, 82*a* . . . First face of insulating layer, 82*b* . . . Second face of insulating layer, 82*c* . . . Third face of insulating layer, 83 . . . First interlayer insulating layer, 83A . . . First interlayer insulating layer-lower layer, 83B . . . First interlayer insulating layer-upper layer, 83A' . . . First interlayer insulating layer-lower layer, 83B' . . . First interlayer insulating layer-intermediate layer, 83C' . . . First interlayer insulating layer-upper layer, 83A" . . . First interlayer insulating layer-lower layer, 83B" . . . First interlayer insulating layer-upper layer, 84 . . . Second interlayer insulating layer, 84A . . . Second interlayer insulating layer-lower layer, 84B . . . Second interlayer insulating layer-upper layer, 84C, 83D', 83C" . . . Color filter layer-underlayer, 85, 85A, 85B, 85C . . . Opening, 86, 86A . . . Second opening, 87 . . . Low refractive index layer, 88 . . . Protective layer, 90, 90R, 90G, 90B, 90R$_1$, 90R$_2$, 90R$_3$, 90R$_4$, 90G$_1$, 90G$_2$, 90G$_3$, 90G$_4$, 90B$_1$, 90B$_2$, 90B$_3$, 90B$_4$ . . . Color filter layer (wavelength selection means), 90W . . . Transparent resin layer, 91, 91$_1$, 91$_2$, 91$_3$, 91$_4$, 91W, 91W$_1$, 91W$_2$, 91W$_3$, 91W$_4$ . . . Wire grid polarizer (polarizer), 91'R$_1$, 91'R$_2$, 91'R$_3$, 91'R$_4$, 91'G$_1$, 91'G$_2$, 91'G$_3$, 91' G$_4$, 91' B$_1$, 91' B$_2$, 91' B$_3$, 91' B$_4$, 91' W$_1$, 91' W$_2$, 91' W$_3$, 91'W$_4$ . . . Polarizer segment, 92 . . . Line portion (stack structure), 93 . . . Light reflection layer, 93A . . . Light reflection layer formation layer, 94 . . . Insulating film, 94A . . . Insulating film formation layer, 94*a* . . . Cutaway portion of insulating film, 95 . . . Light absorption layer, 95A . . . Light absorption layer formation layer, 96 . . . Space portion (gap between a stack structure and another stack structure), 97 . . . Protective film, 98 . . . Frame portion, 100 . . . Solid-state imaging device, 101 . . . Stacked-type imaging element, 111 . . . Imaging region, 112 . . . Vertical driving circuit, 113 . . . Column signal processing circuit, 114 . . . Horizontal driving circuit, 115 . . . Outputting circuit, 116 . . . Driving controlling circuit, 117 . . . Signal line (data output line), 118 . . . Horizontal signal line, 200 . . . Electronic equipment (camera), 201 . . . Solid-state imaging device, 210 . . . Optical lens, 211 . . . Shutter device, 212 . . . Driving circuit, 213 . . . Signal processing circuit, $FD_1$, $FD_2$, $FD_3$, 46C, 46C . . . Floating diffusion layer, $TR1_{trs}$, $TR2_{trs}$, $TR3_{trs}$ . . . Transfer transistor, $TR1_{rst}$, $TR2_{rst}$, $TR3_{rst}$, Reset transistor, $TR1_{amp}$, $TR2_{amp}$, $TR3_{amp}$ . . . Amplification transistor, $TR1_{sel}$, $TR3_{sel}$, $TR3_{sel}$ . . . Selection transistor, $V_{DD}$ . . . Power supply, $TG_1$, $TG_2$, $TG_3$ . . . Transfer gate line, $RST_1$, $RST_2$, $RST_3$ . . . Reset line, $SEL_1$, $SEL_2$, $SEL_3$ Selection line, VSL, $VSL_1$, $VSL_2$, $VSL_3$ . . . Signal line (data output line), $V_{OA}$, $V_{OT}$, $V_{OU}$ . . . Wiring

The invention claimed is:

1. A solid-state imaging device comprising:

an imaging element group in which imaging elements each having a photoelectric conversion portion formed on or above a semiconductor substrate and further having a wire grid polarizer and an on-chip microlens are arrayed in a two-dimensional matrix; and a first interlayer insulating layer and a second interlayer insulating layer provided on a light incident side of the photoelectric conversion portions, wherein the wire grid polarizer is provided between the first interlayer insulating layer and the second interlayer insulating layer, the on-chip microlens is provided on the second interlayer insulating layer, the first interlayer insulating layer is disposed below the wire grid polarizer and includes an oxide material and the second interlayer insulating layer is disposed above the wire grid polarizer and includes a resin material, the on-chip microlens includes silicon nitride or silicon oxynitride, the first interlayer insulating layer is structured such that a first interlayer insulating layer-lower layer and a first interlayer insulating layer-upper layer are stacked, a light shielding portion is provided at a location between the first interlayer insulating layer-lower layer and the first interlayer insulating layer-upper layer positioned above a region between adjacent ones of the imaging elements, the second interlayer insulating layer is structured such that a second interlayer insulating layer-lower layer and a second interlayer insulating layer-upper layer are stacked, and a color filter layer is provided at a location between the second interlayer insulating layer-lower layer and the second interlayer insulating layer-upper layer positioned above each photoelectric conversion portion.

2. The solid-state imaging device according to claim 1 wherein the first interlayer insulating layer is made of a first material, wherein the second interlayer insulating layer is made of a second material that is different from the first material, and wherein a refractive index of a material configuring the first interlayer insulating layer is $n_1$, a refractive index of a material configuring the second interlayer insulating layer is $n_2$, and a refractive index of a material configuring the on-chip microlens is $n_0$, $$n_0-n_1\geq 0 \text{ and}$$

$$n_0-n_2\geq 0$$

are satisfied.

3. The solid-state imaging device according to claim 2, wherein the first interlayer insulating layer is structured such that the first interlayer insulating layer-lower layer, a first interlayer insulating layer-intermediate layer, and flail the first interlayer insulating layer-upper layer are stacked.

4. The solid-state imaging device according to claim 2, wherein the light shielding portion extends from the wire grid polarizer and is provided at a location between the wire grid polarizer and another wire grid polarizer.

5. A solid-state imaging device comprising:

an imaging element group in which imaging elements each having a photoelectric conversion portion formed on or above a semiconductor substrate and further having a wire grid polarizer and an on-chip microlens are arrayed in a two-dimensional matrix; and a first interlayer insulating layer and a second interlayer insulating layer provided on a light incident side of the photoelectric conversion portions, wherein the wire grid polarizer is provided between the first interlayer insulating layer and the second interlayer insulating layer, the on-chip microlens is provided on the second interlayer insulating layer, the first interlayer insulating layer is disposed below the wire grid polarizer and includes an oxide material and the second interlayer insulating layer is disposed above the wire grid polarizer and includes a resin material, the on-chip microlens includes silicon nitride or silicon oxynitride, the first interlayer insulating layer is structured such that a first interlayer insulating layer-lower layer, a first interlayer insulating layer-intermediate layer, and a first interlayer insulating layer-upper layer are stacked, a light shielding portion is provided at a location between the first interlayer insulating layer-lower layer and the first interlayer insulating layer-intermediate layer positioned above a region between adjacent ones of the imaging elements, and a color filter layer is provided at a location between the first interlayer insulating layer-intermediate layer and the first interlayer insulating layer-upper layer positioned above each photoelectric conversion portion.

6. A solid-state imaging device comprising:

an imaging element group in which imaging elements each having a photoelectric conversion portion formed on or above a semiconductor substrate and further having a wire grid polarizer and an on-chip microlens are arrayed in a two-dimensional matrix; and a first interlayer insulating layer and a second interlayer insulating layer provided on a light incident side of the photoelectric conversion portions, wherein the wire grid polarizer is provided between the first interlayer insulating layer and the second interlayer insulating layer, the on-chip microlens is provided on the second interlayer insulating layer, the first interlayer insulating layer is disposed below the wire grid polarizer and includes an oxide material and the second interlayer insulating layer is disposed above the wire grid polarizer and includes a resin material, the on-chip microlens includes silicon nitride or silicon oxynitride, a light shielding portion extending from the wire grid polarizer is provided at a location between a wire grid polarizer and another wire grid polarizer positioned above a region between adjacent ones of the imaging elements, the second interlayer insulating layer is structured such that a second interlayer insulating layer-lower layer and a second interlayer insulating layer-upper layer are stacked, and a color filter layer is provided at a location between the second interlayer insulating layer-lower layer and the second interlayer insulating layer-upper layer positioned above each photoelectric conversion portion.

7. A solid-state imaging device comprising:

an imaging element group in which imaging elements each having a photoelectric conversion portion formed on or above a semiconductor substrate and further having a wire grid polarizer and an on-chip microlens are arrayed in a two-dimensional matrix; and a first interlayer insulating layer and a second interlayer insulating layer provided on a light incident side of the photoelectric conversion portions, wherein the wire grid polarizer is provided between the first interlayer insulating layer and the second interlayer insulating layer, the on-chip microlens is provided on the second interlayer insulating layer, the first interlayer insulating layer is disposed below the wire grid polarizer and includes an oxide material and the second interlayer insulating layer is disposed above the wire grid polarizer and includes a resin material, the on-chip microlens includes silicon nitride or silicon oxynitride, the first interlayer insulating layer is structured such that a first interlayer insulating layer-lower layer and a first interlayer insulating layer-upper layer are stacked, a color filter layer is provided at a location between the first interlayer insulating layer-lower layer and the first interlayer insulating layer-upper layer positioned above each photoelectric conversion portion, and a light shielding portion extending from the wire grid polarizer is provided at a location between a wire grid polarizer and another wire grid polarizer positioned above a region between adjacent ones of the imaging elements.

* * * * *